US011415887B2

(12) United States Patent
Hatakeyama et al.

(10) Patent No.: US 11,415,887 B2
(45) Date of Patent: Aug. 16, 2022

(54) RESIST COMPOSITION AND PATTERNING PROCESS

(71) Applicant: Shin-Etsu Chemical Co., Ltd., Tokyo (JP)

(72) Inventors: Jun Hatakeyama, Joetsu (JP); Masaki Ohashi, Joetsu (JP); Takayuki Fujiwara, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 341 days.

(21) Appl. No.: 16/787,743

(22) Filed: Feb. 11, 2020

(65) Prior Publication Data

US 2020/0272048 A1 Aug. 27, 2020

(30) Foreign Application Priority Data

Feb. 27, 2019 (JP) ............................ JP2019-033684

(51) Int. Cl.

| | |
|---|---|
| ***G03F 7/004*** | (2006.01) |
| ***G03F 7/039*** | (2006.01) |
| ***G03F 7/038*** | (2006.01) |
| *G03F 7/30* | (2006.01) |
| *G03F 7/16* | (2006.01) |
| *G03F 7/20* | (2006.01) |

(52) U.S. Cl.

CPC .......... *G03F 7/0045* (2013.01); *G03F 7/0382* (2013.01); *G03F 7/0392* (2013.01); *G03F 7/162* (2013.01); *G03F 7/2004* (2013.01); *G03F 7/30* (2013.01)

(58) Field of Classification Search

CPC .... G03F 7/0045; G03F 7/0382; G03F 7/0392; G03F 7/162; G03F 7/2004; G03F 7/30

See application file for complete search history.

(56) References Cited

U.S. PATENT DOCUMENTS

| | | | | |
|---|---|---|---|---|
| 8,921,026 | B2 | 12/2014 | Hatakeyama et al. | |
| 2008/0241736 | A1 * | 10/2008 | Kobayashi ............ | G03F 7/0397 430/322 |
| 2014/0370441 | A1 * | 12/2014 | Hatakeyama ......... | G03F 7/0046 430/326 |
| 2016/0048076 | A1 * | 2/2016 | Hatakeyama ......... | G03F 7/0397 430/326 |

FOREIGN PATENT DOCUMENTS

| | | | |
|---|---|---|---|
| JP | 2001-166476 | A | 6/2001 |
| JP | 2001-194776 | A | 7/2001 |
| JP | 2002-226470 | A | 8/2002 |
| JP | 2002-363148 | A | 12/2002 |
| JP | 2012-137729 | A | 7/2012 |
| WO | 2008/066011 | A1 | 6/2008 |

* cited by examiner

*Primary Examiner* — Peter L Vajda
*Assistant Examiner* — Richard David Champion
(74) *Attorney, Agent, or Firm* — WHDA, LLP

(57) ABSTRACT

A resist composition comprising a base polymer and a quencher in the form of a salt of a cyclic ammonium cation with a carboxylate, sulfonamide, halogenated phenoxide or halide anion offers a high sensitivity and minimal LWR or improved CDU, independent of whether it is of positive or negative tone.

13 Claims, No Drawings

RESIST COMPOSITION AND PATTERNING PROCESS

CROSS-REFERENCE TO RELATED APPLICATION

This non-provisional application claims priority under 35 U.S.C. § 119(a) on Patent Application No. 2019-033684 filed in Japan on Feb. 27, 2019, the entire contents of which are hereby incorporated by reference.

TECHNICAL FIELD

This invention relates to a resist composition and a pattern forming process.

BACKGROUND ART

To meet the demand for higher integration density and operating speed of LSIs, the effort to reduce the pattern rule is in rapid progress. In particular, the enlargement of the logic memory market to comply with the wide-spread use of smart phones drives forward the miniaturization technology. As the advanced miniaturization technology, manufacturing of microelectronic devices at the 10-nm node by double patterning of the ArF immersion lithography has been implemented in a mass scale. Manufacturing of 7-nm node devices as the next generation by the double patterning technology is approaching to the verge of high-volume application. The candidate for 5-nm node devices as the next generation but one is EUV lithography.

With the progress of miniaturization in logic devices, the flash memory now takes the form of devices having stacked layers of gate, known as 3D-NAND. The capacity is increased by increasing the number of stacked layers. As the number of stacked layers increases, the hard mask used in processing of layers becomes thicker and the photoresist film also becomes thicker. While the resist for logic devices becomes thinner, the resist for 3D-NAND becomes thicker.

As the pattern feature size is reduced, approaching to the diffraction limit of light, light contrast lowers. In the case of positive resist film, a lowering of light contrast leads to reductions of resolution and focus margin of hole and trench patterns. The trend of the resist toward thicker films suggests that the thickness of resist film for previous generation devices is resumed. As more dimensional uniformity is required, the previous photoresist cannot accommodate the requirements. For preventing a reduction of resolution of resist pattern due to a lowering of light contrast as a result of size reduction, or for improving dimensional uniformity in the trend toward thicker resist film, an attempt is made to enhance the dissolution contrast of resist film.

Chemically amplified resist compositions comprising an acid generator capable of generating an acid upon exposure to light or EB include chemically amplified positive resist compositions wherein deprotection reaction takes place under the action of acid and chemically amplified negative resist compositions wherein polarity switch or crosslinking reaction takes place under the action of acid. Quenchers are often added to these resist compositions for the purpose of controlling the diffusion of the acid to unexposed region to improve the contrast. The addition of quenchers is fully effective to this purpose. A number of amine quenchers were proposed as disclosed in Patent Documents 1 and 2.

There are known amine quenchers for inviting a polarity switch under the action of acid catalyst. Patent Document 3 proposes an amine quencher having an acid labile group. This amine compound generates a carboxylic acid via the acid-aided deprotection reaction of a tertiary ester having a carbonyl group positioned on the nitrogen atom side whereby alkaline solubility increases. In this case, however, since the molecular weight on the nitrogen atom side is not increased, the acid diffusion controlling ability is low, and the contrast improving effect is faint. Patent Document 4 describes a quencher having a tert-butoxycarbonyl group which undergoes deprotection reaction with the aid of acid, to generate an amino group. This mechanism is adapted to generate a quencher upon light exposure, achieving a reverse effect to contrast enhancement. The contrast is enhanced by the mechanism that the quencher disappears or loses its quenching ability upon light exposure or under the action of acid. Patent Document 5 discloses a quencher in the form of an amine compound which cyclizes under the action of acid to form a lactam structure. The conversion of the strong base amine compound to the weak base lactam compound causes the acid to change its activity whereby the contrast is improved.

With respect to the acid labile group used in (meth) acrylate polymers for the ArF lithography resist material, deprotection reaction takes place when a photoacid generator capable of generating a sulfonic acid having fluorine substituted at α-position (referred to "α-fluorinated sulfonic acid") is used, but not when an acid generator capable of generating a sulfonic acid not having fluorine substituted at α-position (referred to "α-non-fluorinated sulfonic acid") or carboxylic acid is used. If a sulfonium or iodonium salt capable of generating an α-fluorinated sulfonic acid is combined with a sulfonium or iodonium salt capable of generating an α-non-fluorinated sulfonic acid, the sulfonium or iodonium salt capable of generating an α-non-fluorinated sulfonic acid undergoes ion exchange with the α-fluorinated sulfonic acid. Through the ion exchange, the α-fluorinated sulfonic acid thus generated by light exposure is converted back to the sulfonium or iodonium salt while the sulfonium or iodonium salt of an α-non-fluorinated sulfonic acid or carboxylic acid functions as a quencher. Patent Document 6 discloses a resist composition comprising a sulfonium or iodonium salt capable of generating carboxylic acid as a quencher.

Sulfonium and iodonium salt type quenchers are photodecomposable like photoacid generators. That is, the amount of quencher in the exposed region is reduced. Since acid is generated in the exposed region, the reduced amount of quencher leads to a relatively increased concentration of acid and hence, an improved contrast. However, the acid diffusion in the exposed region is not suppressed, indicating the difficulty of acid diffusion control.

Since a sulfonium or iodonium salt type quencher absorbs ArF radiation of wavelength 193 nm, a resist film in which the quencher is combined with a sulfonium or iodonium salt type acid generator has a reduced transmittance to that radiation. As a result, in the case of a resist film having a thickness of at least 100 nm, the cross-sectional profile of a pattern as developed becomes tapered. For resist films having a thickness of at least 100 nm, especially at least 150 nm, a highly transparent quencher is necessary.

Lowering the PEB temperature is effective for suppressing acid diffusion. However, the dissolution contrast is reduced, inviting degradations of resolution and LWR. There is the need for a resist composition of new concept featuring controlled acid diffusion and a high contrast.

CITATION LIST

Patent Document 1: JP-A 2001-194776
Patent Document 2: JP-A 2002-226470

Patent Document 3: JP-A 2002-363148

Patent Document 4: JP-A 2001-166476

Patent Document 5: JP-A 2012-137729 (U.S. Pat. No. 8,921,026)

Patent Document 6: WO 2008/066011

DISCLOSURE OF INVENTION

For the acid-catalyzed chemically amplified resist material, it is desired to develop a quencher capable of reducing the LWR of line patterns or improving the CDU of hole patterns and increasing sensitivity. To this end, it is necessary to reduce the distance of acid diffusion significantly and to increase the contrast at the same time, that is, to improve ambivalent properties at the same time.

An object of the invention is to provide a resist composition which exhibits a high sensitivity and a reduced LWR or improved CDU, independent of whether it is of positive tone or negative tone; and a pattern forming process using the same.

The inventors have found that using a cyclic ammonium salt having a tertiary ester structure as the quencher, a resist material having a reduced LWR, improved CDU, high contrast, improved resolution, and wide process margin is obtainable.

In one aspect, the invention provides a resist composition comprising a base polymer and a quencher, the quencher containing a salt of a cyclic ammonium cation having the following formula (A-1) or (A-2) with a carboxylate, sulfonamide, halogenated phenoxide or halide anion.

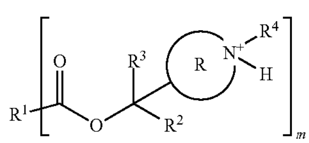

(A-1)

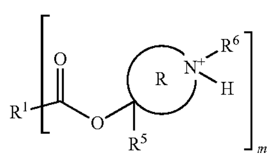

(A-2)

Herein $R^1$ is a single bond or a $C_1$-$C_{30}$ m-valent hydrocarbon group which may contain at least one moiety selected from among hydroxyl, thiol, ester bond, thioester bond, thionoester bond, ether bond, sulfide bond, halogen, nitro, amino, amide bond, sulfonyl, sulfonate bond, sultone ring, lactam ring, and carbonate, exclusive of an aromatic group having iodine bonded to the aromatic ring. $R^2$ and $R^3$ are each independently a $C_1$-$C_6$ alkyl group, $R^2$ and $R^3$ may bond together to form a ring with the carbon atom to which they are attached. $R^1$ and $R^6$ are each independently hydrogen, a $C_1$-$C_4$ straight or branched alkyl group, or $C_2$-$C_{12}$ straight or branched alkoxycarbonyl group. $R^5$ is a $C_1$-$C_6$ alkyl group, $C_2$-$C_6$ alkenyl group, $C_2$-$C_6$ alkynyl group or $C_6$-$C_{12}$ aryl group. R is a $C_2$-$C_{10}$ alicyclic group to form a ring with the nitrogen atom, and m is an integer of 1 to 6.

Preferably, the carboxylate anion has the formula (B-1) or (B-2), the sulfonamide anion has the formula (B-3), and the halogenated phenoxide anion has the formula (B-4), shown below.

(B-1)

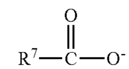

(B-2)

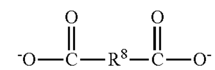

(B-3)

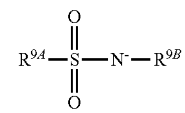

(B-4)

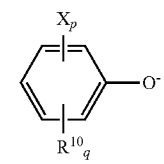

Herein $R^7$ is hydrogen or a $C_1$-$C_{30}$ monovalent hydrocarbon group which may contain a heteroatom. $R^8$ is a $C_1$-$C_{30}$ divalent hydrocarbon group which may contain a heteroatom. $R^{9A}$ is fluorine, or a $C_1$-$C_{10}$ fluorinated alkyl group or fluorinated phenyl group which may contain a hydroxyl, ether bond or ester bond, $R^{9B}$ is hydrogen or a $C_1$-$C_{10}$ monovalent hydrocarbon group which may contain a hydroxyl, ether bond or ester bond, $R^{9A}$ and $R^{9B}$ may bond together to form a ring with the atoms to which they are attached. X is fluorine, trifluoromethyl, 1,1,1,3,3,3-hexafluoro-2-propanol, chlorine, bromine or iodine. $R^{10}$ is hydrogen, hydroxyl, an optionally halogenated $C_1$-$C_6$ alkyl group, optionally halogenated $C_1$-$C_6$ alkoxy group, optionally halogenated $C_2$-$C_6$ acyloxy group, optionally halogenated $C_1$-$C_4$ alkylsulfonyloxy group, fluorine, chlorine, bromine, amino, nitro, cyano, —$NR^{10A}$—C(═O)—$R^{10B}$, or —$NR^{10A}$—C(═O)—O—$R^{10B}$, $R^{10A}$ is hydrogen or a $C_1$-$C_6$ alkyl group, $R^{10B}$ is a $C_1$-$C_6$ alkyl group or $C_2$-$C_8$ alkenyl group. The subscript p is an integer of 1 to 5, q is an integer of 0 to 3, $1 \le p+q \le 5$.

The resist composition may further comprise an acid generator capable of generating a sulfonic acid, imide acid or methide acid, and/or an organic solvent.

In a preferred embodiment, the base polymer comprises recurring units having the formula (a1) or recurring units having the formula (a2).

(a1)

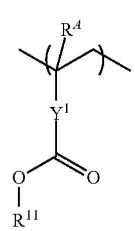

-continued

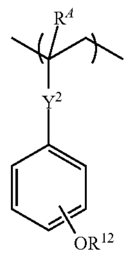

(a2)

Herein $R^A$ is each independently hydrogen or methyl, $R^{11}$ and $R^{12}$ each are an acid labile group. $Y^1$ is a single bond, phenylene group, naphthylene group, or $C_1$-$C_{12}$ linking group containing at least one moiety selected from ester bond and lactone ring, and $Y^2$ is a single bond or ester bond. The resist composition is a chemically amplified positive resist composition.

In another preferred embodiment, the base polymer is free of an acid labile group. The resist composition is a chemically amplified negative resist composition.

The resist composition may further comprise a surfactant.

In a preferred embodiment, the base polymer further comprises recurring units of at least one type selected from recurring units having the formulae (f1) to (f3).

(f1)

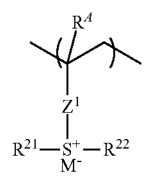

(f2)

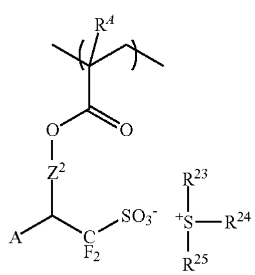

(f3)

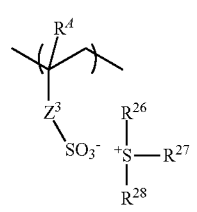

Herein $R^A$ is each independently hydrogen or methyl. $Z^1$ is a single bond, phenylene group, —O—$Z^{11}$—, —C(═O)—O—$Z^{11}$— or —C(═O)—NH—$Z^{11}$—, wherein $Z^{11}$ is a $C_1$-$C_6$ alkanediyl group, $C_2$-$C_6$ alkenediyl group, or phenylene group, which may contain a carbonyl, ester bond, ether bond or hydroxyl moiety. $Z^2$ is a single bond, —$Z^{21}$—C(═O)—O—, —$Z^{21}$—O— or —$Z^{21}$—O—C(═O)—, wherein $Z^{21}$ is a $C_1$-$C_{12}$ alkanediyl group which may contain a carbonyl moiety, ester bond or ether bond. $Z^3$ is a single bond, methylene, ethylene, phenylene, fluorinated phenylene, —O—$Z^{31}$—, —C(═O)—O—$Z^{31}$—, or —C(═O)—NH—Z—, wherein $Z^{31}$ is a $C_1$-$C_6$ alkanediyl group, $C_2$-$C_6$ alkenediyl group, phenylene group, fluorinated phenylene group, or trifluoromethyl-substituted phenylene group, which may contain a carbonyl moiety, ester bond, ether bond or hydroxyl moiety. $R^{21}$ to $R^{28}$ are each independently a $C_1$-$C_{20}$ monovalent hydrocarbon group which may contain a heteroatom, any two of $R^{23}$, $R^{24}$ and $R^{25}$ or any two of $R^{26}$, $R^{27}$ and $R^{28}$ may bond together to form a ring with the sulfur atom to which they are attached. "A" is hydrogen or trifluoromethyl. $M^-$ is a non-nucleophilic counter ion.

In another aspect, the invention provides a process for forming a pattern comprising the steps of applying the resist composition defined above to form a resist film on a substrate, exposing the resist film to high-energy radiation, and developing the exposed resist film in a developer.

Typically, the high-energy radiation is i-line of wavelength 365 nm, ArF excimer laser radiation of wavelength 193 nm, KrF excimer laser radiation of wavelength 248 nm, EB, or EUV of wavelength 3 to 15 nm.

Advantageous Effects of Invention

The cyclic ammonium salt is a quencher capable of suppressing acid diffusion by virtue of nitrogen. Since the compound also has an acid-decomposable tertiary ester structure, it is decomposed with acid in the exposed region and converted to a cyclic ammonium salt having a lower molecular weight. As a result, the acid in the exposed region becomes more active and the contrast is improved. There are obtained advantages including low diffusion, high contrast, high sensitivity, low LWR, and improved CDU. Thus a resist composition having a high sensitivity, low LWR and improved CDU is designed.

DESCRIPTION OF EMBODIMENTS

As used herein, the singular forms "a," "an" and "the" include plural referents unless the context clearly dictates otherwise. The notation ($C_n$-$C_m$) means a group containing from n to m carbon atoms per group. In chemical fonnulae, Me stands for methyl, and Ac for acetyl.

The abbreviations and acronyms have the following meaning.

EB: electron beam

EUV: extreme ultraviolet

Mw: weight average molecular weight

Mn: number average molecular weight

Mw/Mn: molecular weight dispersity

GPC: gel permeation chromatography

PEB: post-exposure bake

PAG: photoacid generator

LWR: line width roughness

CDU: critical dimension uniformity

Resist Composition

The resist composition of the invention is defined as comprising a base polymer and a quencher containing a cyclic ammonium salt having a tertiary ester structure.

Heterocyclic Amine Compound

The cyclic ammonium salt having a tertiary ester structure is a salt of a cyclic ammonium cation having the formula (A-1) or (A-2), shown below, with a carboxylate, sulfonamide, halogenated phenoxide or halide anion.

(A-1)

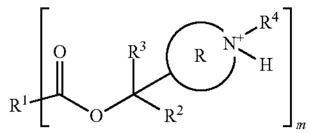

(A-2)

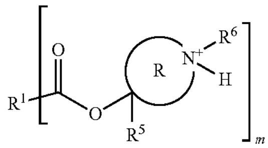

In formulae (A-1) and (A-2), $R^1$ is a single bond or a $C_1$-$C_{30}$ m-valent hydrocarbon group which may contain at least one moiety selected from among hydroxyl, thiol, ester bond, thioester bond, thionoester bond, ether bond, sulfide bond, halogen, nitro, amino, amide bond, sulfonyl, sulfonate bond, sultone ring, lactam ring, and carbonate, the hydrocarbon group being exclusive of an aromatic group having iodine bonded to the aromatic ring.

The m-valent hydrocarbon group may be straight, branched or cyclic and may also be saturated or unsaturated while m is an integer of 1 to 6. Examples thereof include $C_1$-$C_{30}$ alkanes, $C_2$-$C_{30}$ alkenes, $C_2$-$C_{30}$ alkynes, $C_3$-$C_{30}$ cyclic saturated hydrocarbons, $C_3$-$C_{30}$ cyclic unsaturated hydrocarbons, and $C_6$-$C_{30}$ aromatic hydrocarbons, from which the number (m) of hydrogen atoms are eliminated.

In formulae (A-1) and (A-2), $R^2$ and $R^3$ are each independently a $C_1$-$C_6$ alkyl group. $R^2$ and $R^3$ may bond together to form a ring with the carbon atom to which they are attached. $R^1$ and $R^6$ are each independently hydrogen, a $C_1$-$C_4$ straight or branched alkyl group, or $C_2$-$C_{12}$ straight or branched alkoxycarbonyl group. $R^5$ is a $C_1$-$C_6$ alkyl group. $C_2$-$C_6$ alkenyl group, $C_2$-$C_6$ alkynyl group or $C_6$-$C_{12}$ aryl group.

The $C_1$-$C_6$ alkyl group may be straight, branched or cyclic, and examples thereof include methyl ethyl, n-propyl, isopropyl, cyclopropyl, n-butyl, isobutyl, sec-butyl, tert-butyl, cyclobutyl, n-pentyl, cyclopentyl, n-hexyl, and cyclohexyl. Examples of the $C_1$-$C_4$ straight or branched alkyl group include methyl, ethyl n-propyl, isopropyl, n-butyl, isobutyl, sec-butyl and tert-butyl.

Examples of the $C_2$-$C_{12}$ straight or branched alkoxycarbonyl group include methoxycarbonyl, ethoxycarbonyl, n-propyloxycarbonyl, isopropyloxycarbonyl, n-butyloxycarbonyl, isobutyloxycarbonyl, sec-butyloxycarbonyl, tert-butyloxycarbonyl, n-pentyloxycarbonyl, sec-peutyloxycarbonyl, tert-pentyloxycarbonyl, neopentyloxycarbonyl, n-hexyloxycarbonyl, n-heptyloxycarbonyl, n-octyloxycarbonyl, 2-ethylhexyloxycarbonyl, n-nonyloxycarbonyl, n-decyloxycarbonyl, n-undecyloxycarbonyl, n-dodecyloxycarbonyl, n-tridecyloxycarbonyl, n-pentadecyloxycarbonyl, vinyloxycarbanyl, 1-propenyloxycarbonyl, and 2-propenyloxycarbonyl.

The $C_2$-$C_6$ alkenyl group may be straight, branched or cyclic and examples thereof include vinyl, 1-propenyl, 2-propenyl, butenyl, hexenyl, and cyclohexenyl. The $C_2$-$C_6$ alkynyl group may be straight, branched or cyclic and examples thereof include ethynyl, propynyl, and butynyl. Examples of the $C_6$-$C_{12}$ aryl group include phenyl, tolyl, xylyl, 1-naphthyl and 2-naphthyl.

Inter alia, $R^2$ and $R^3$ are preferably selected from $C_1$-$C_3$ alkyl groups; $R^5$ is preferably selected from $C_1$-$C_6$ alkyl groups, $C_2$-$C_4$ alkenyl groups, and $C_2$-$C_4$ alkynyl groups; $R^4$ and $R^6$ are preferably selected from hydrogen, $C_1$-$C_4$ straight or branched alkyl groups, and $C_2$-$C_6$ straight or branched alkoxycarbonyl groups.

In formulae (A-1) and (A-2), R is a $C_2$-$C_{10}$ alicyclic group to form a ring with the nitrogen atom in the formula. Examples of the ring R include cyclic hydrocarbons such as cyclopropane, cyclopentane, cyclohexane, norbomane and adamantane, in which one carbon atom is replaced by nitrogen atom.

In formulae (A-1) and (A-2), m is an integer of 1 to 6, preferably an integer of 1 to 4, more preferably 1 or 2, and most preferably 1.

Examples of the cation having formula (A-1) are shown below, but not limited thereto.

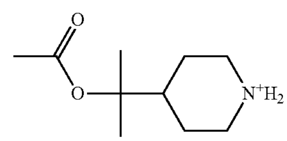

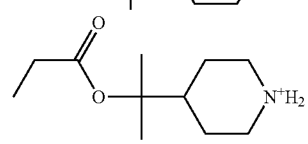

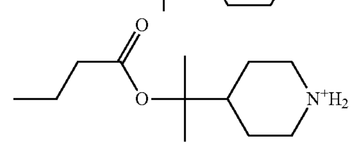

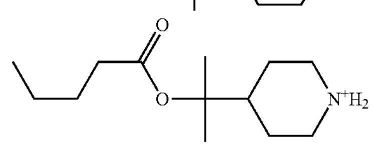

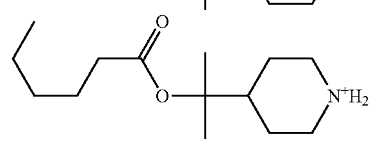

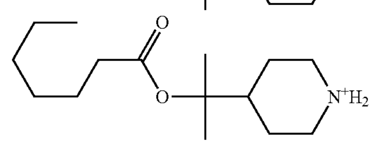

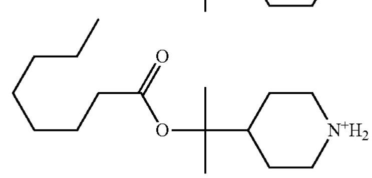

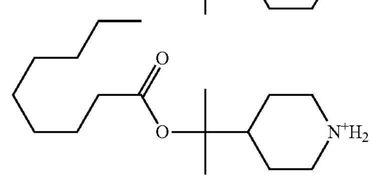

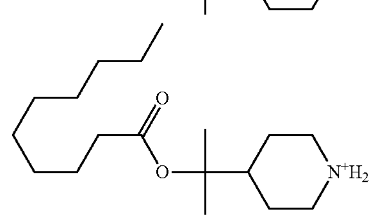

-continued
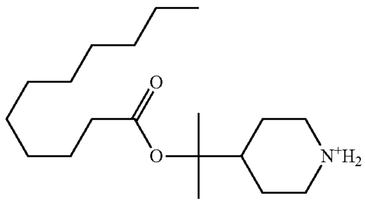
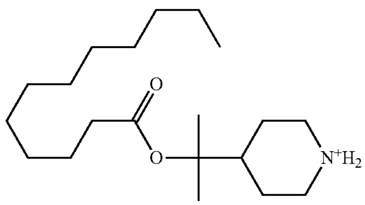
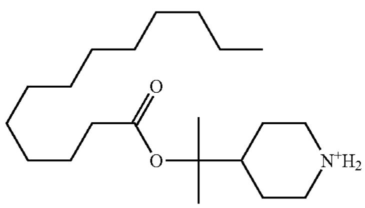
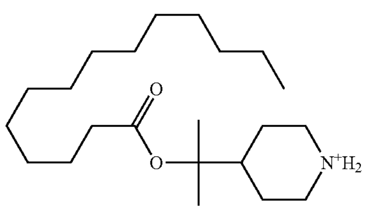
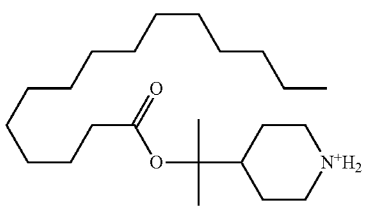
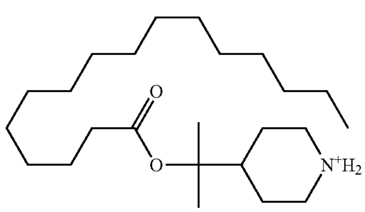
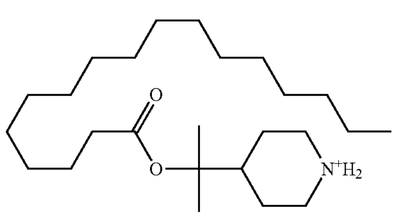
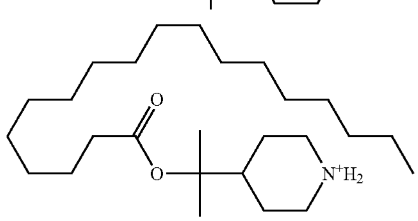
-continued
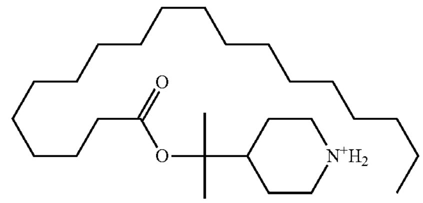
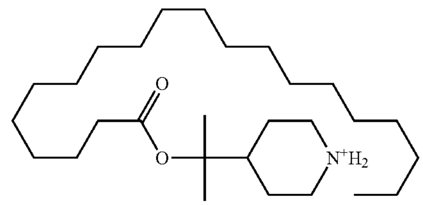
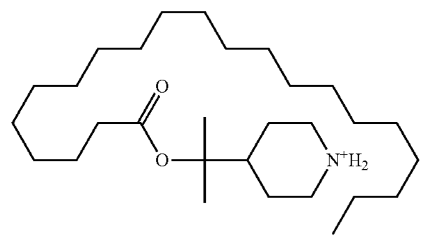
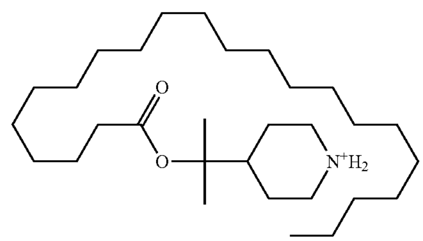
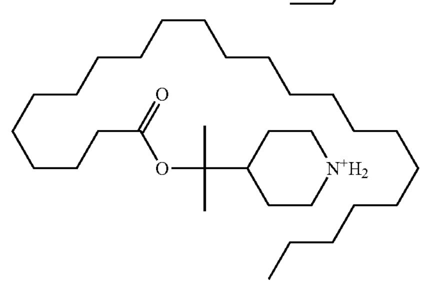
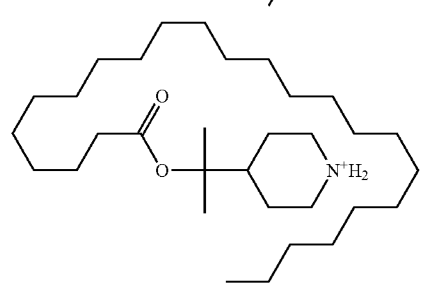
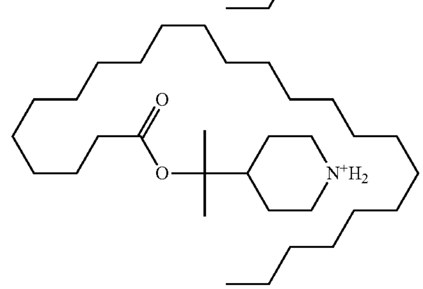

-continued
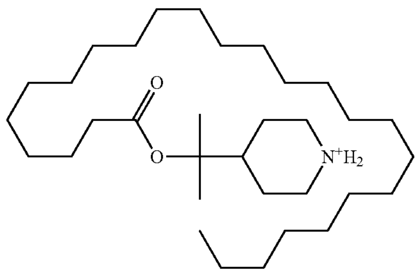
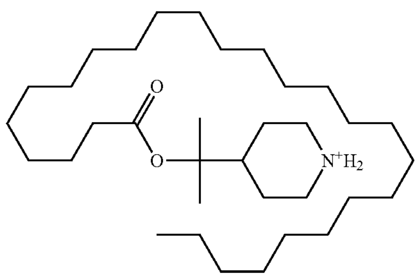
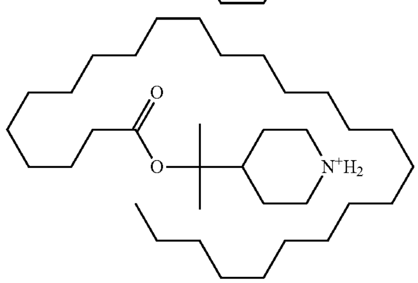
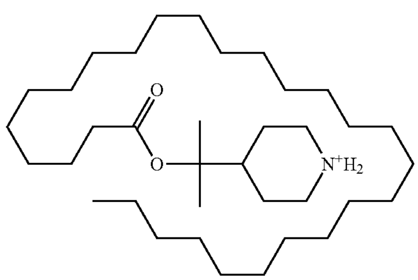
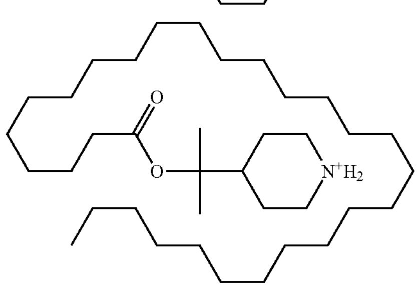
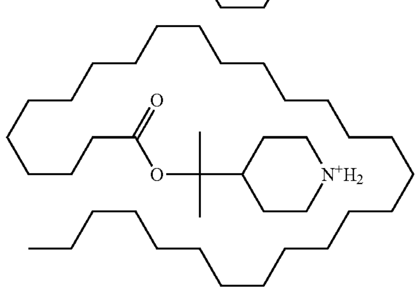
-continued
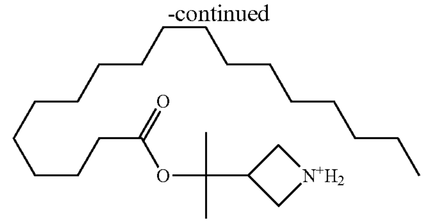
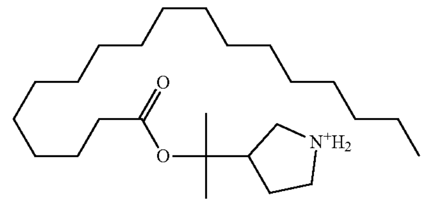
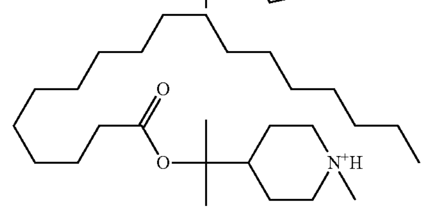
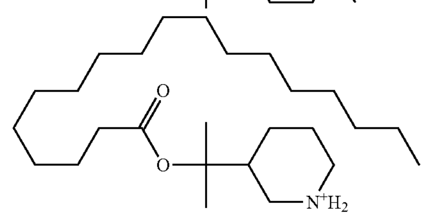
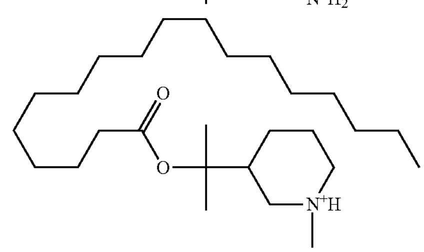
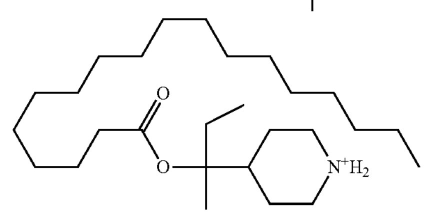
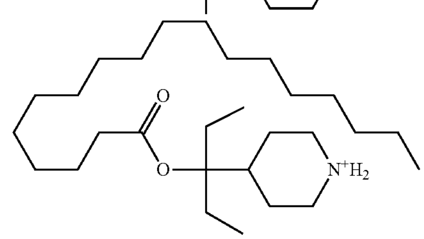
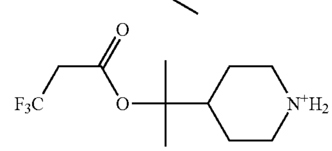
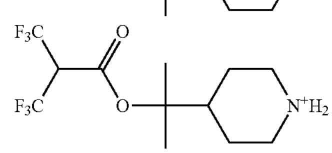

-continued
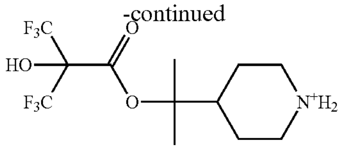
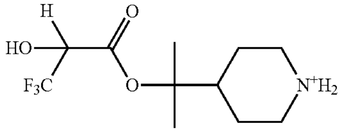
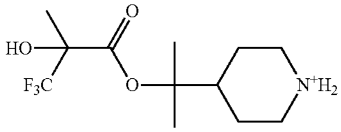
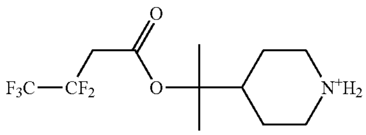
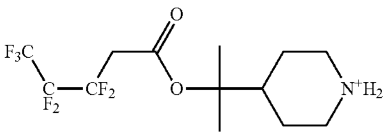
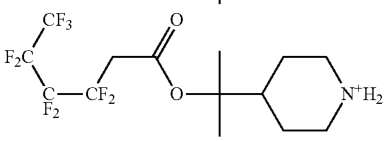
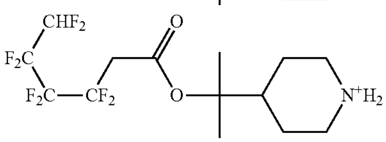
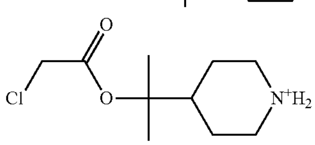
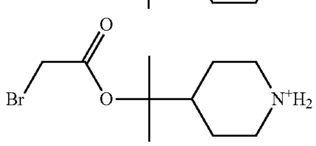
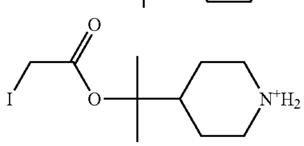
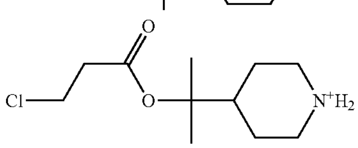
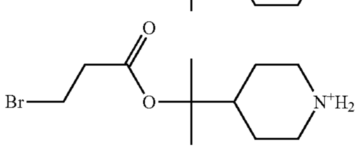
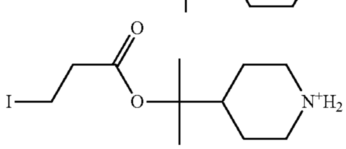
-continued
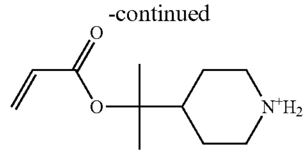
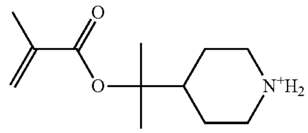
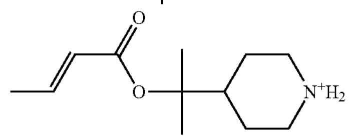
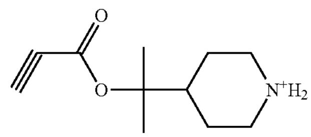
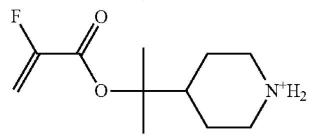
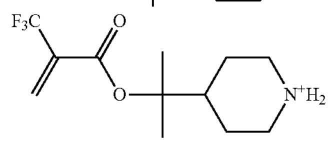
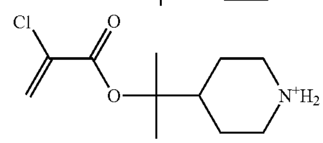
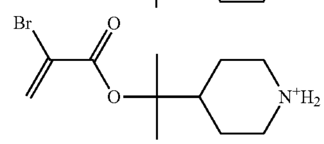
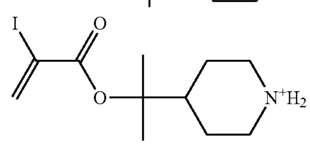
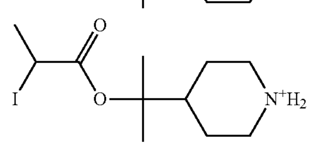
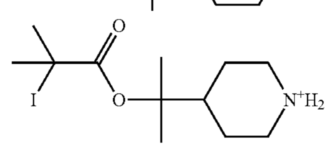
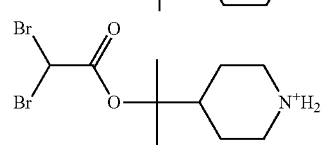
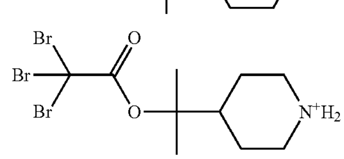

-continued
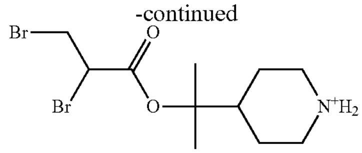
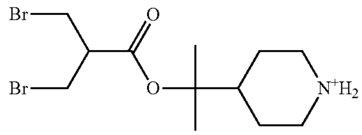
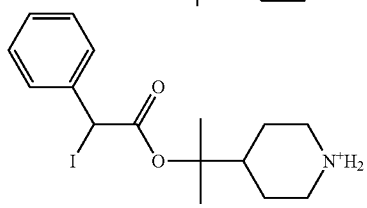
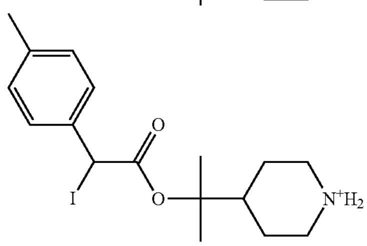
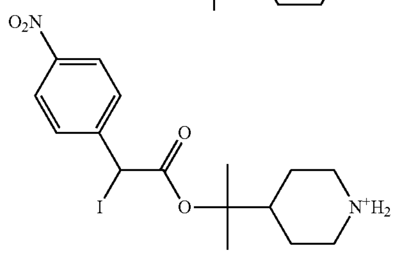
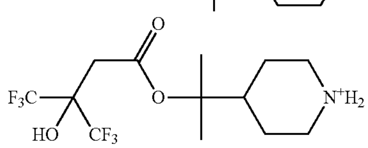
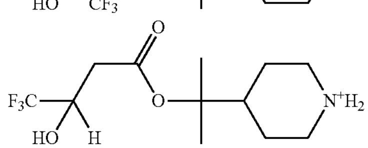
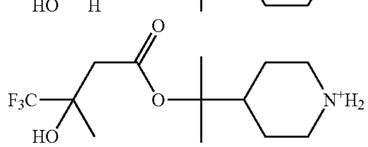
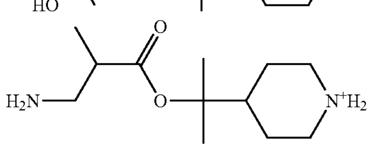
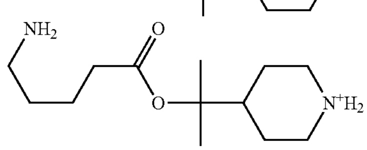
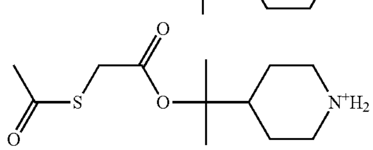
-continued
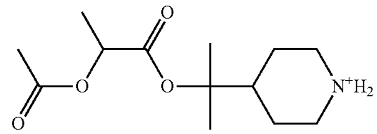
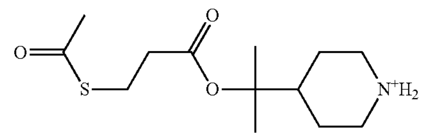
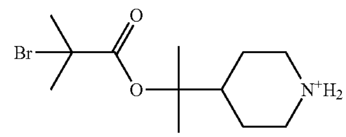
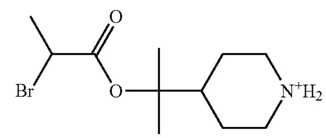
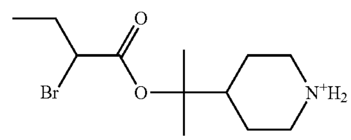
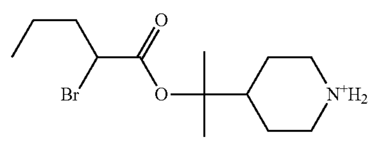
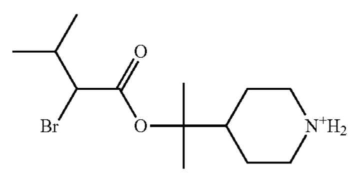
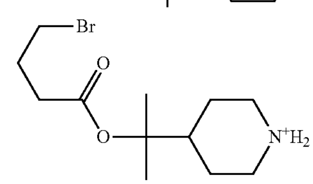
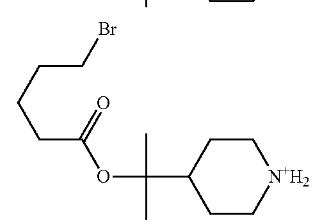
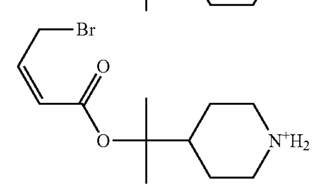
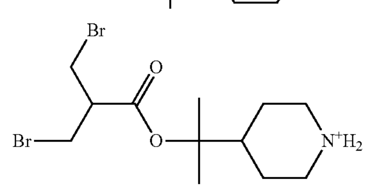

-continued
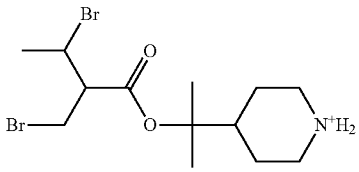
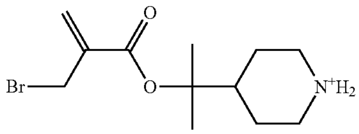
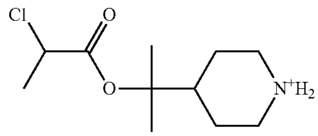
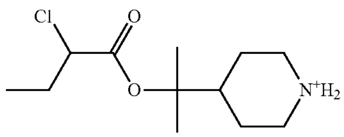
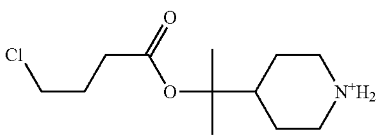
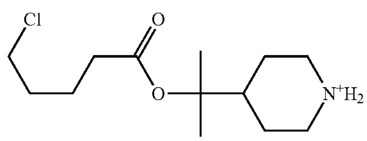
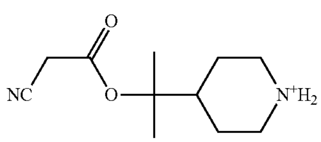
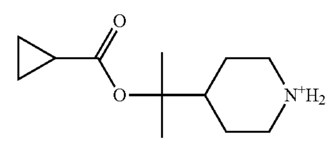
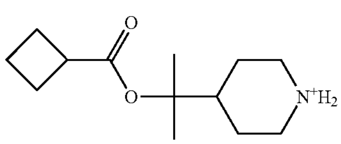
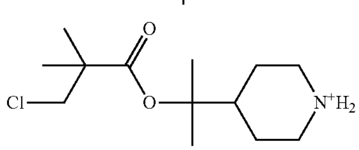
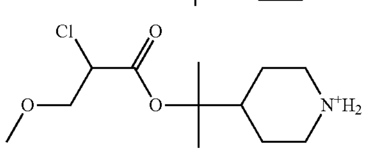
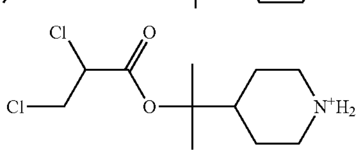
-continued
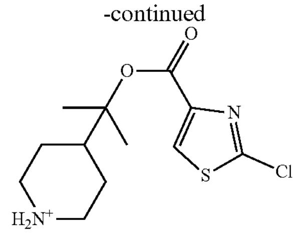
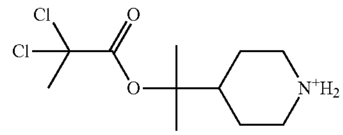
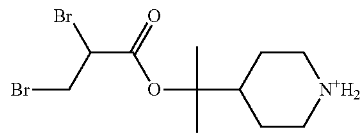
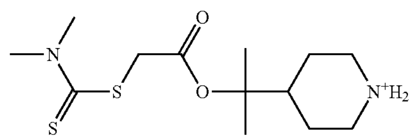
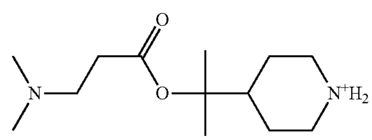
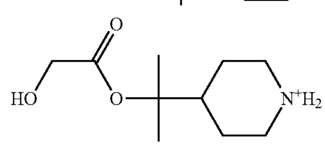
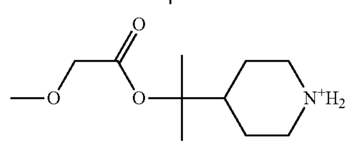
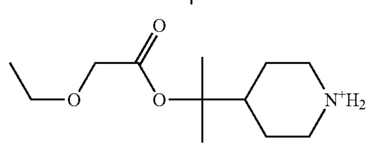
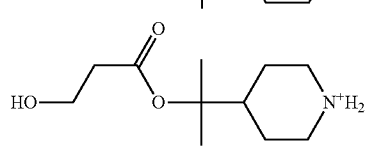
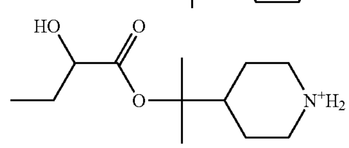
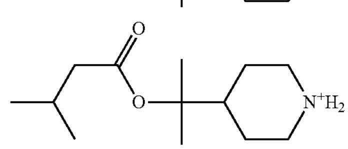
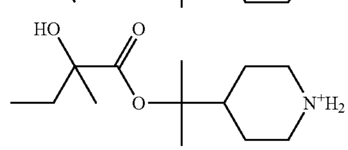

-continued
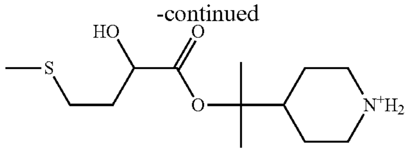
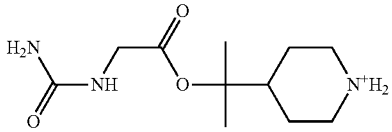
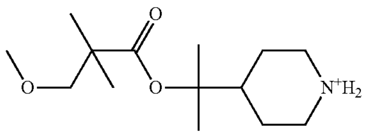
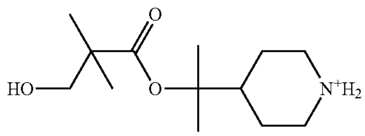
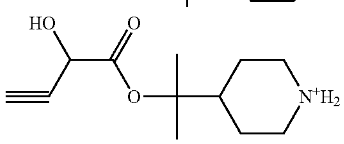
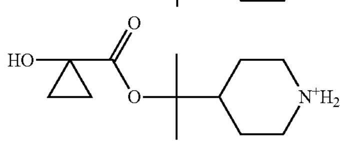
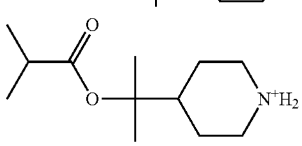
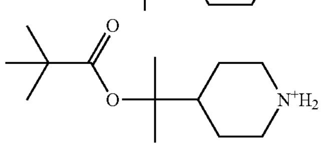
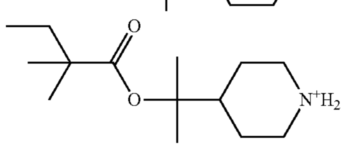
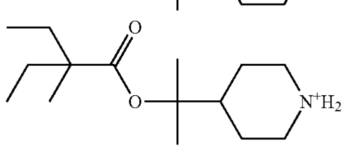
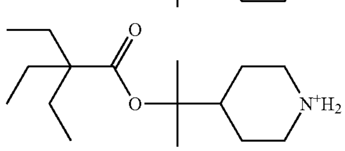
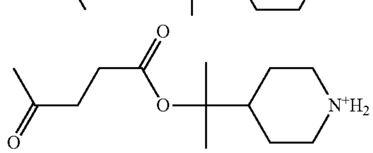
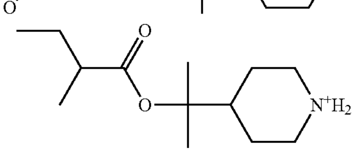
-continued
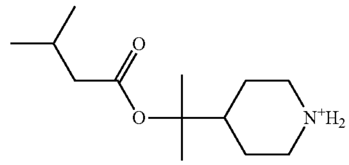
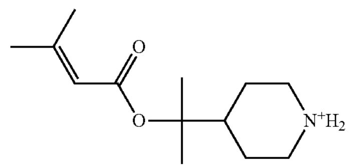
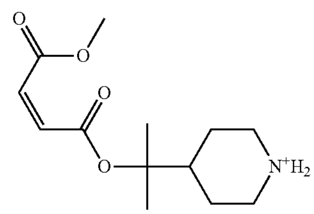
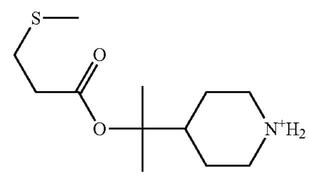
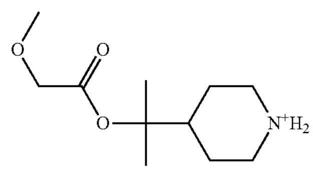
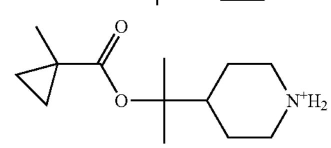
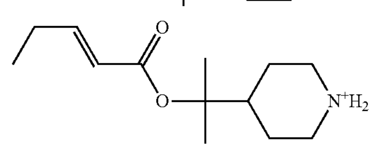
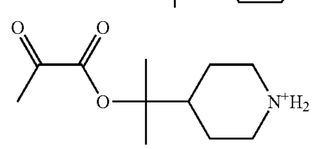
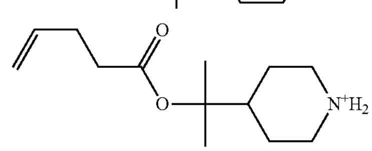
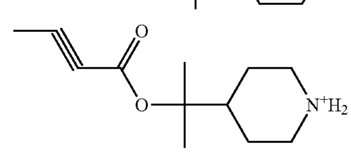
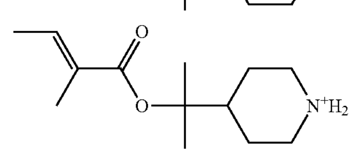

-continued
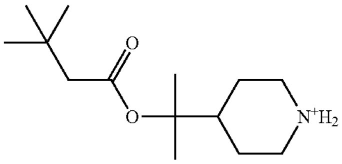
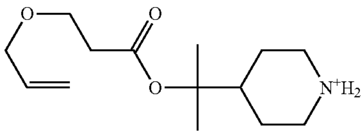
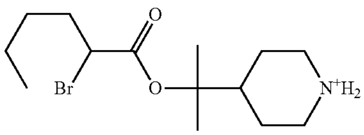
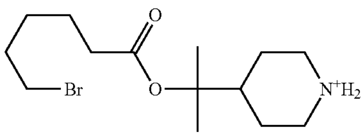
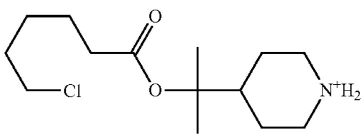
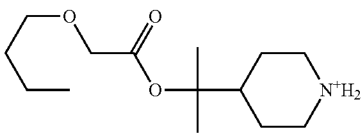
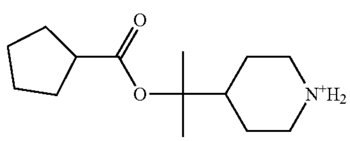
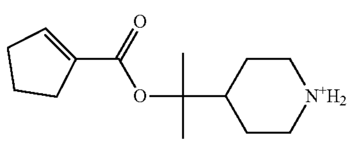
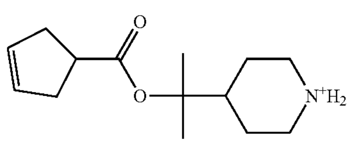
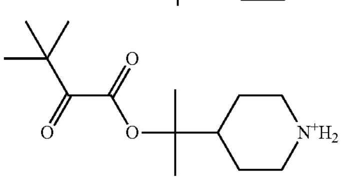
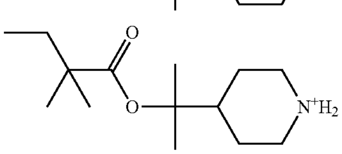
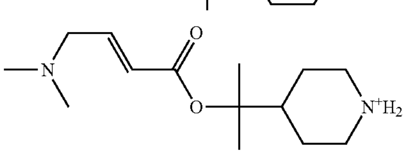
-continued
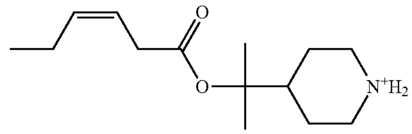
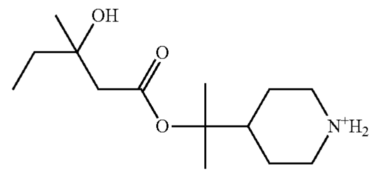
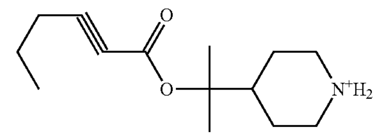
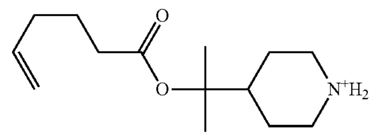
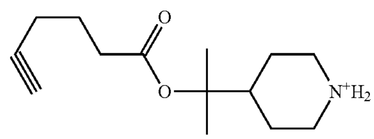
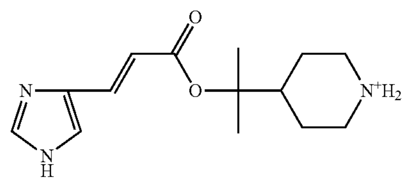
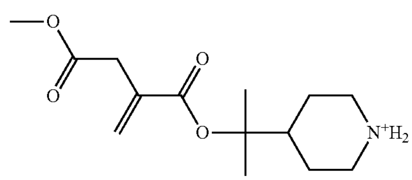
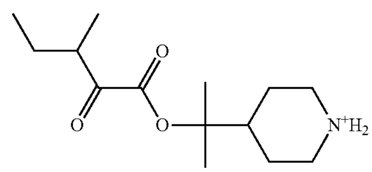
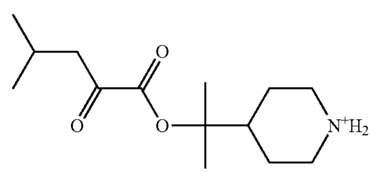
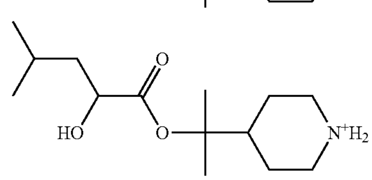
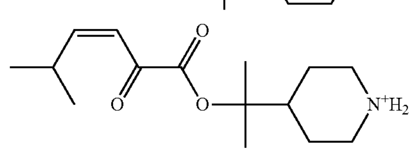

-continued
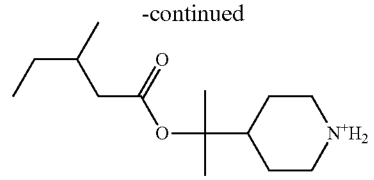
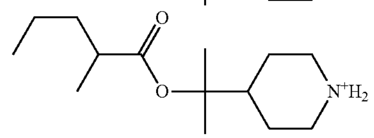
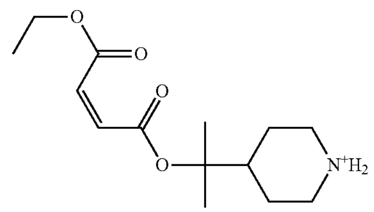
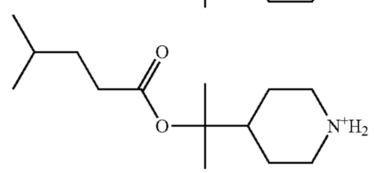
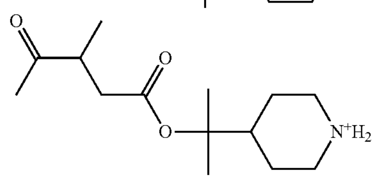
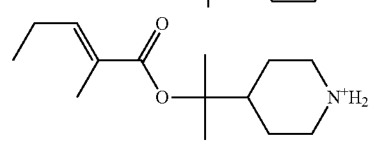
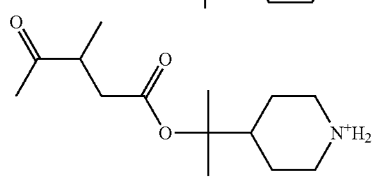
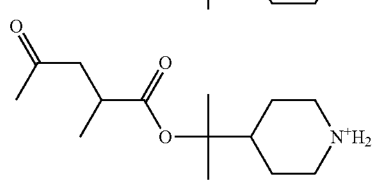
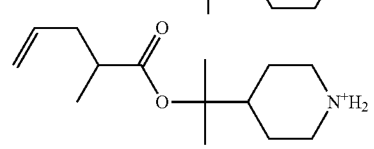
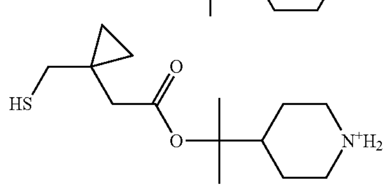
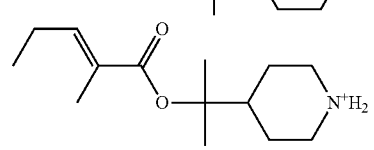
-continued
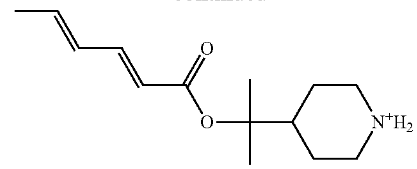
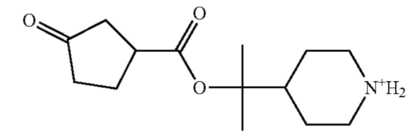
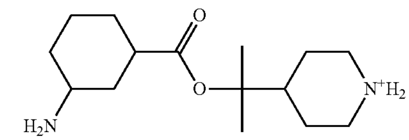
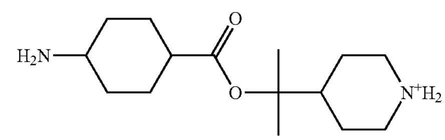
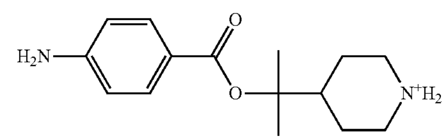
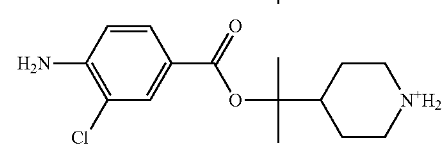
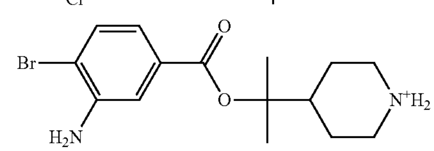
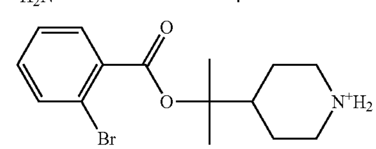
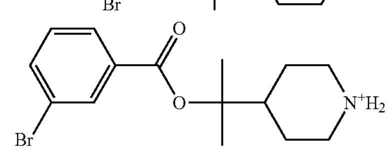
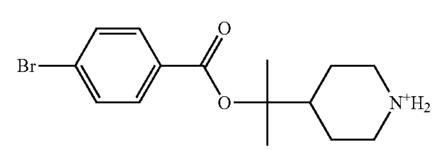
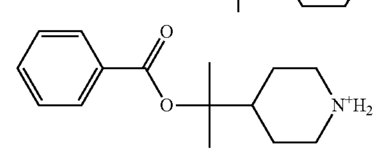
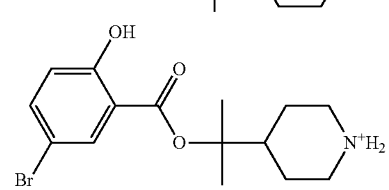

-continued
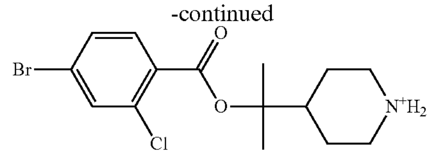
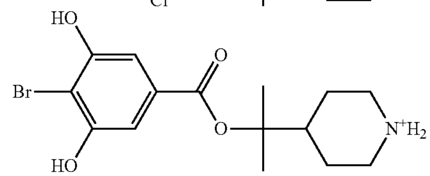
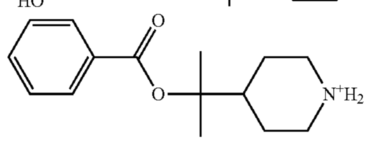
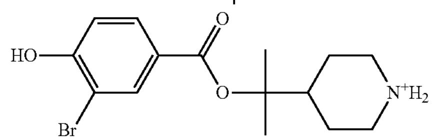
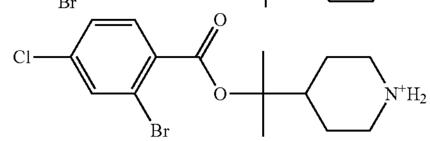
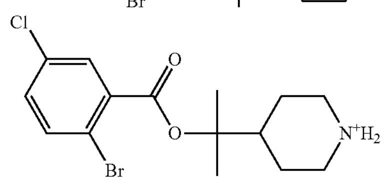
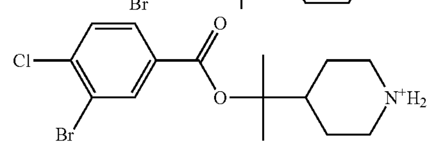
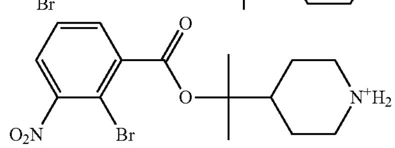
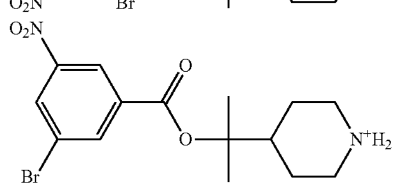
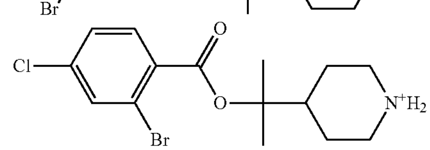
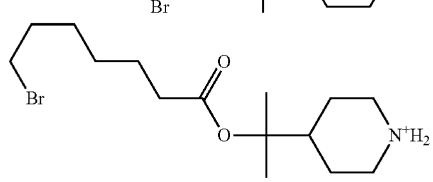
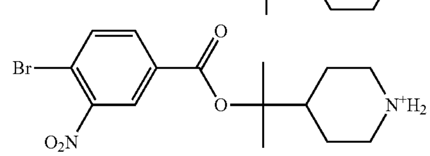
-continued
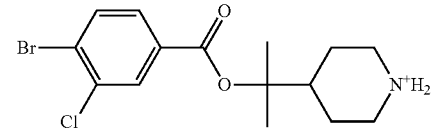
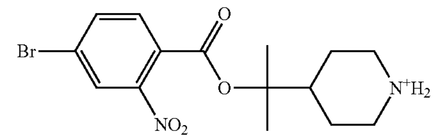
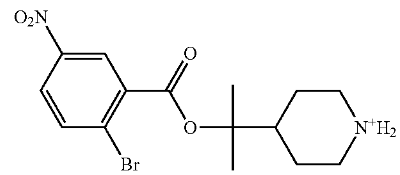
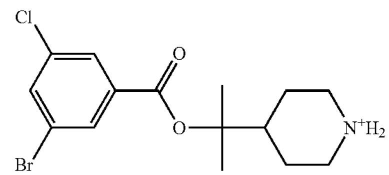
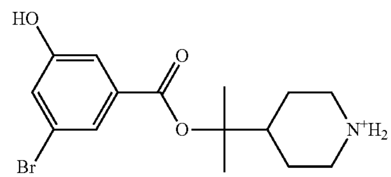
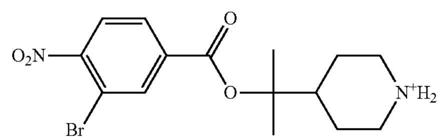
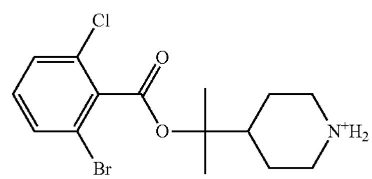
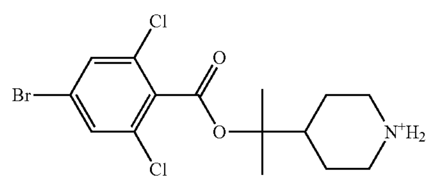
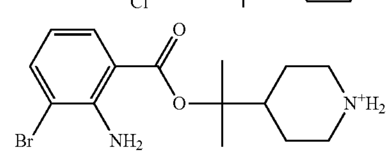
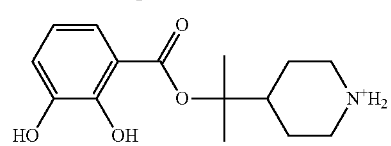
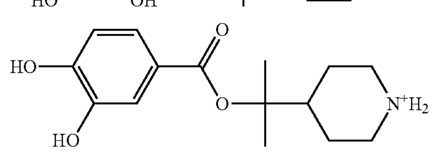

-continued
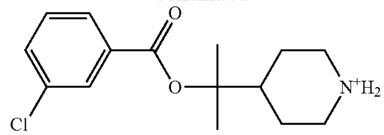
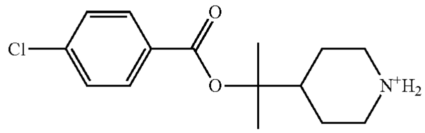
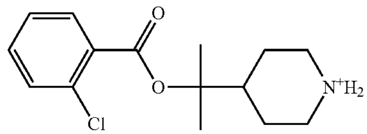
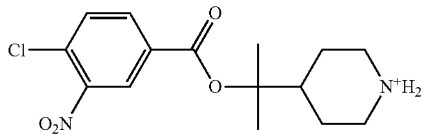
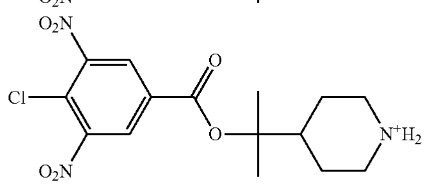
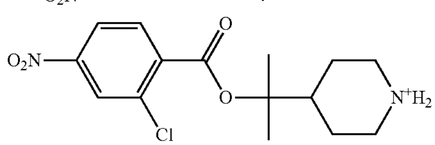
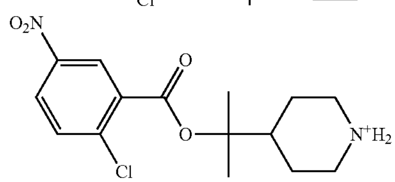
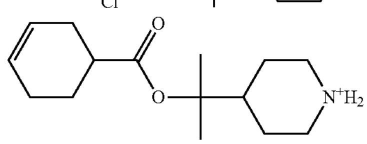
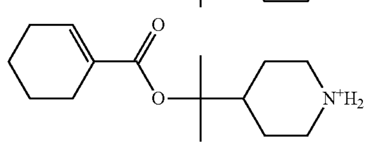
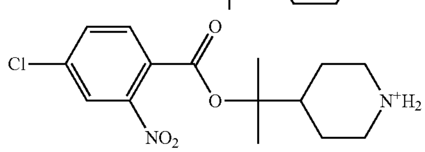
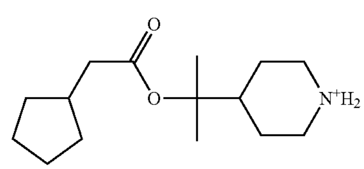
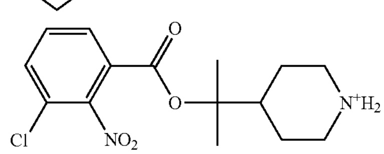
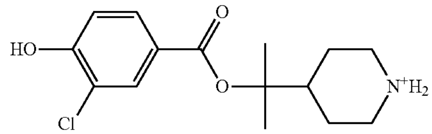
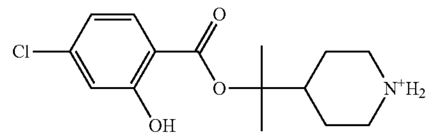
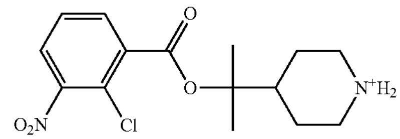
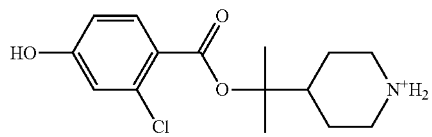
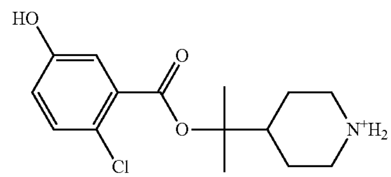
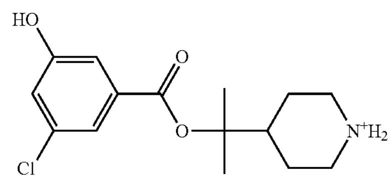
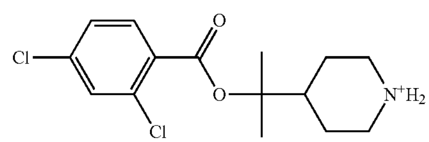
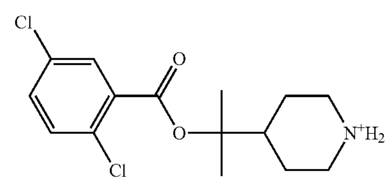
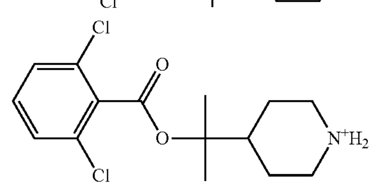
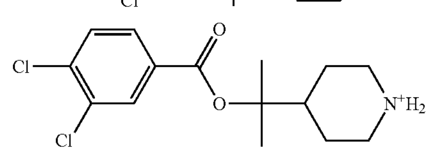
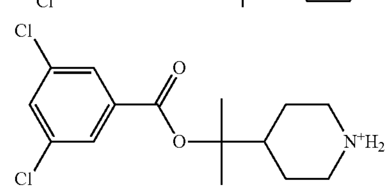

-continued
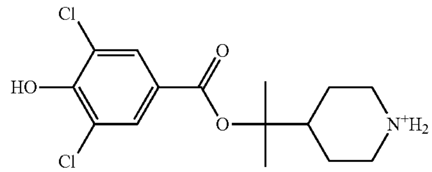
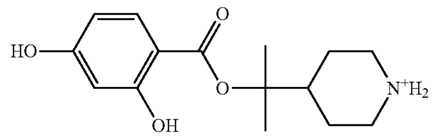
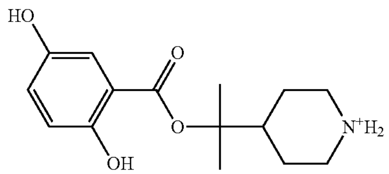
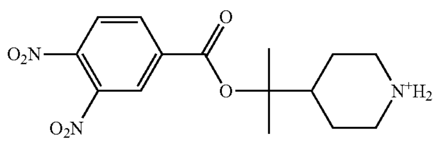
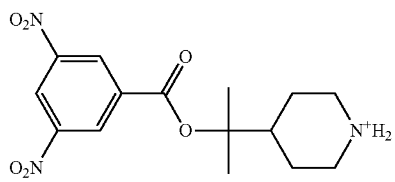
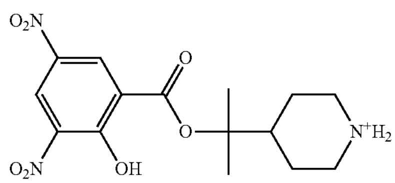
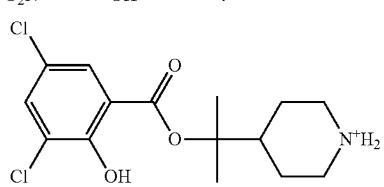
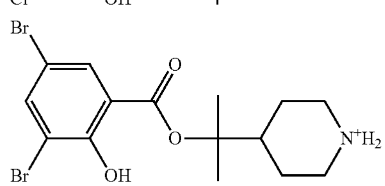
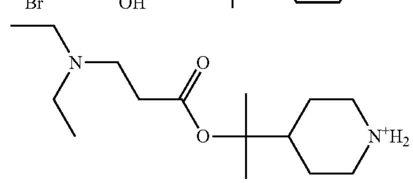
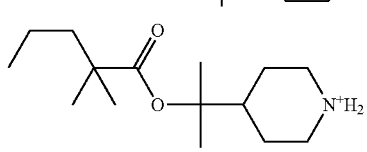
-continued
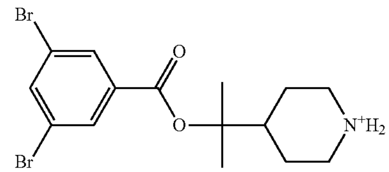
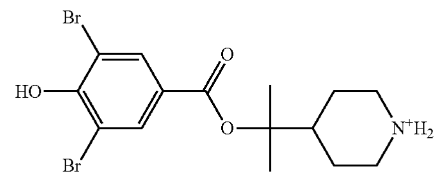
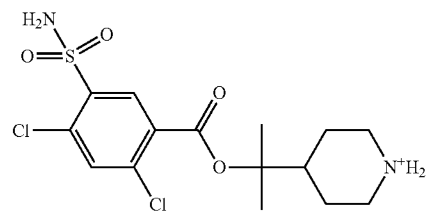
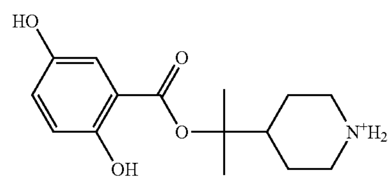
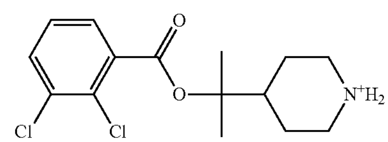
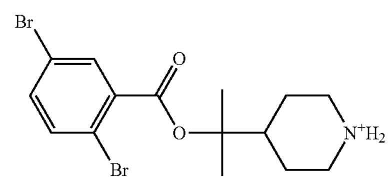
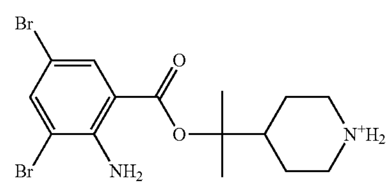
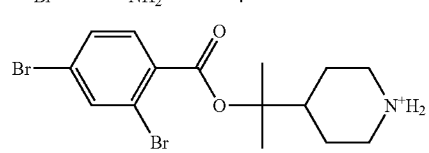
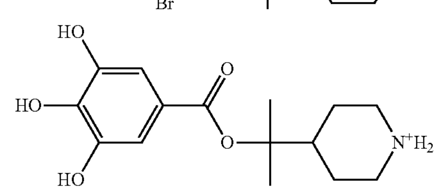

-continued
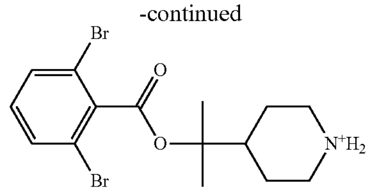
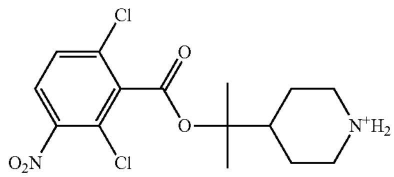
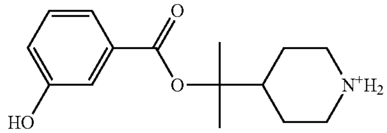
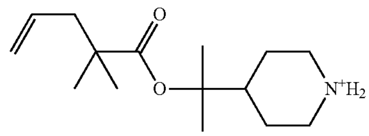
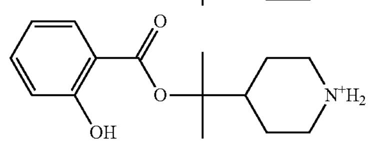
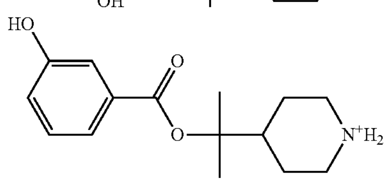
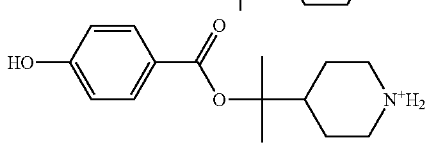
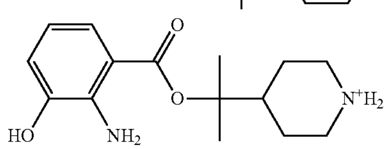
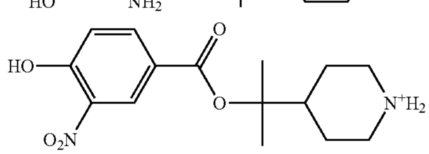
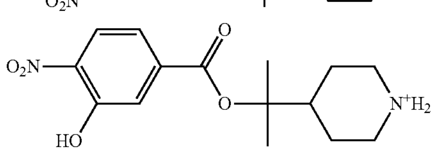
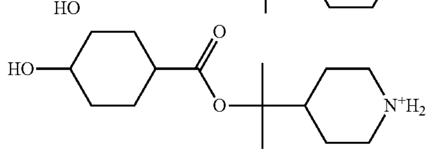
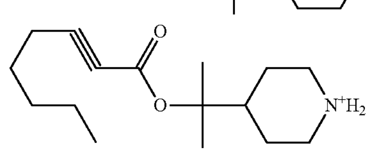
-continued
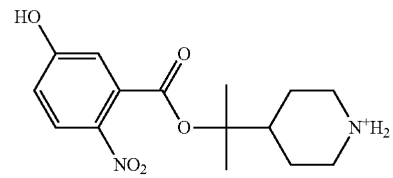
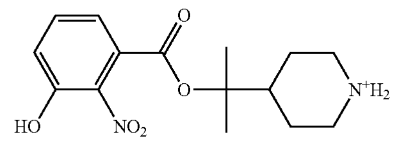
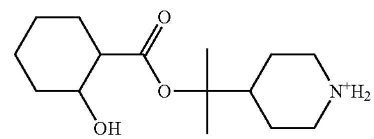
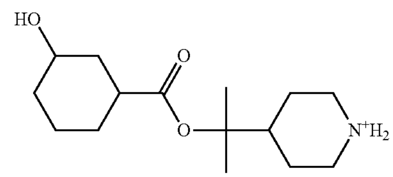
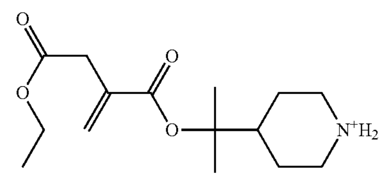
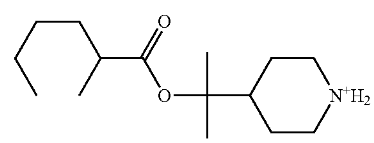
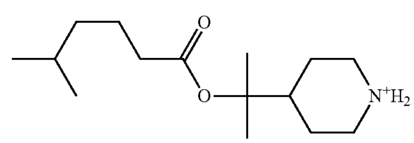
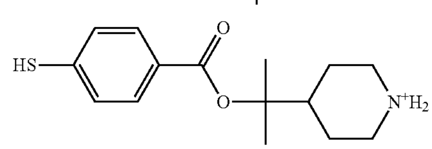
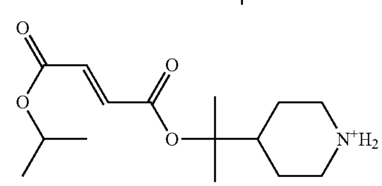
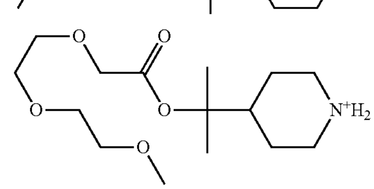
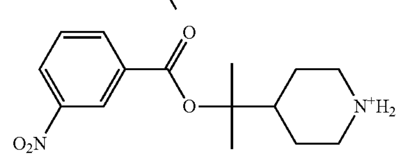

-continued
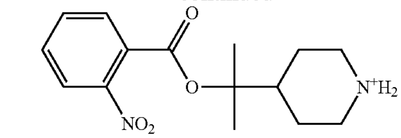
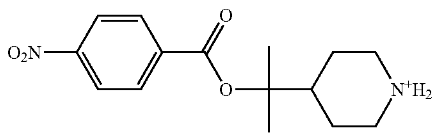
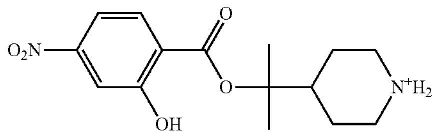
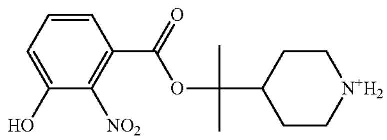
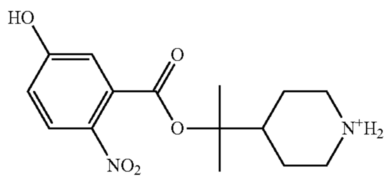
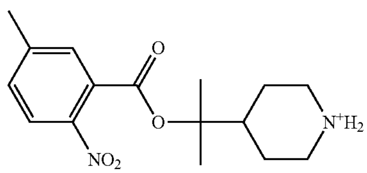
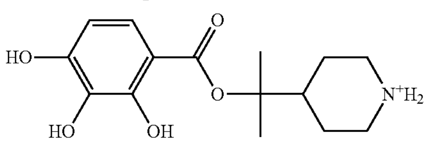
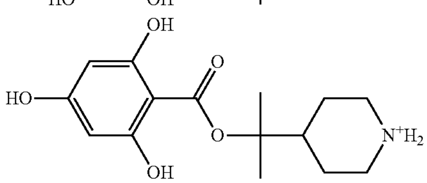
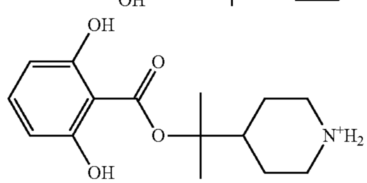
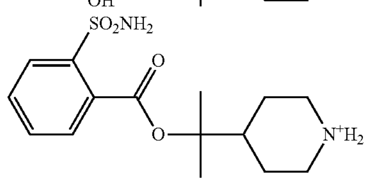
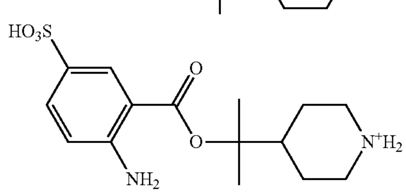
-continued
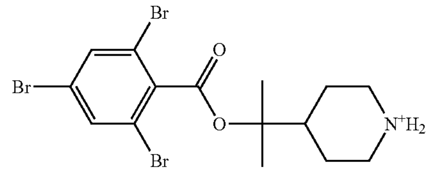
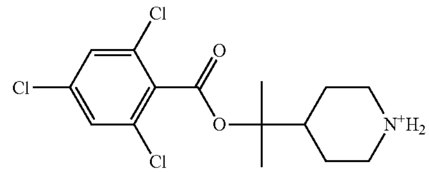
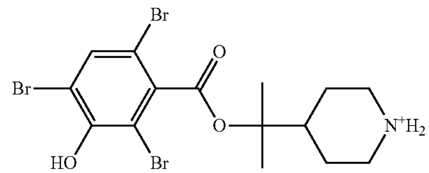
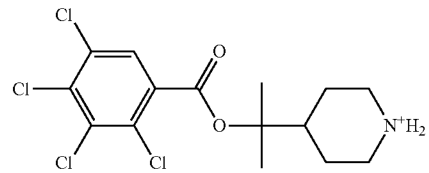
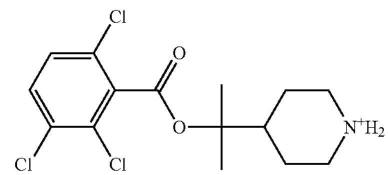
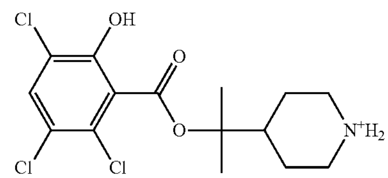
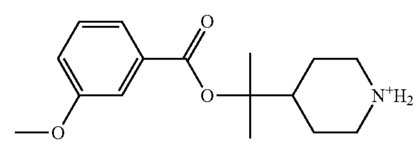
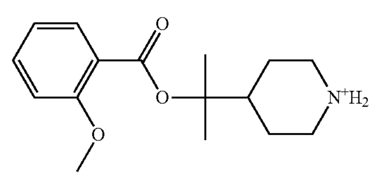
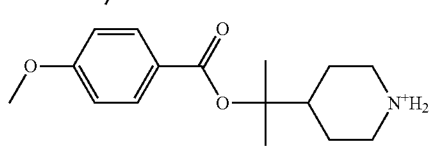
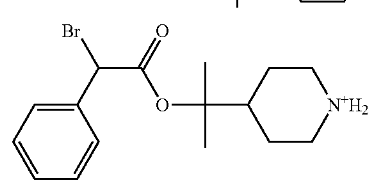

-continued
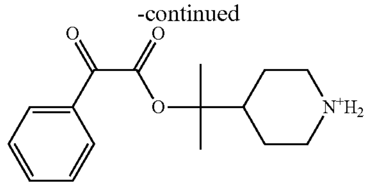
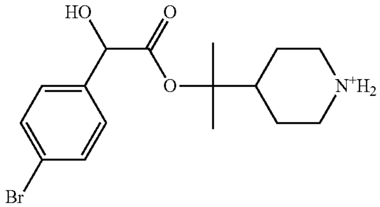
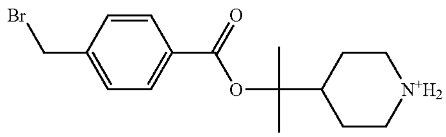
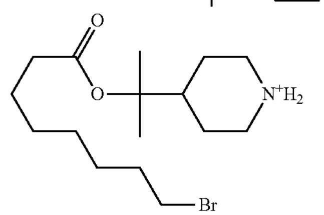
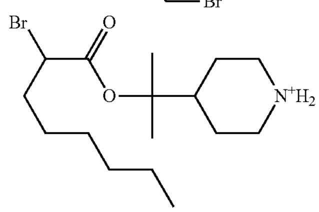
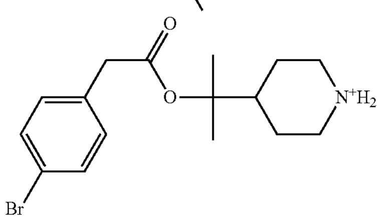
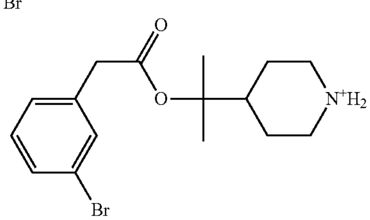
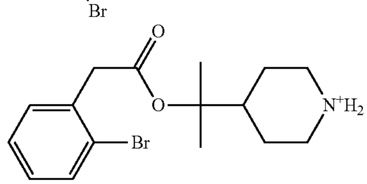
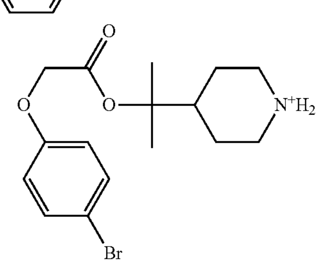
-continued
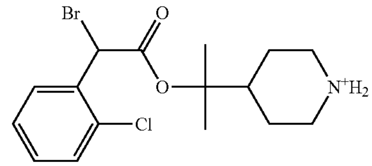
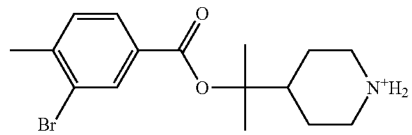
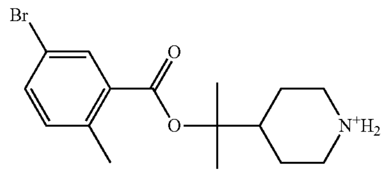
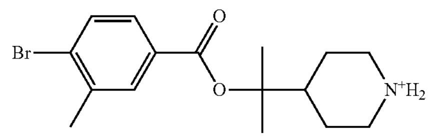
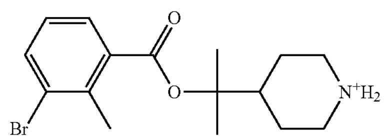
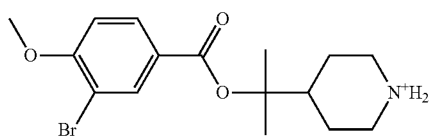
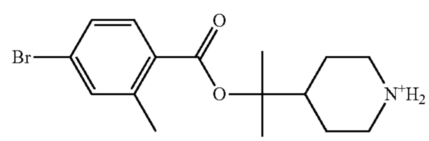
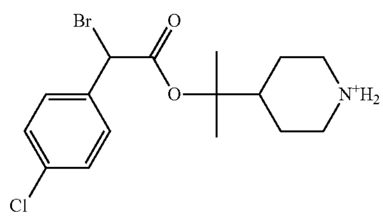
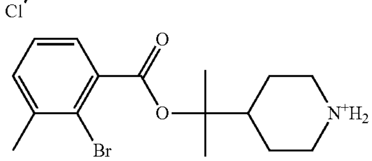
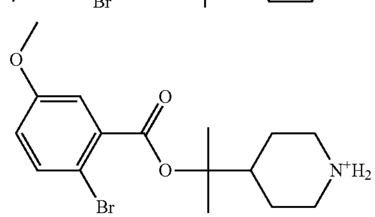
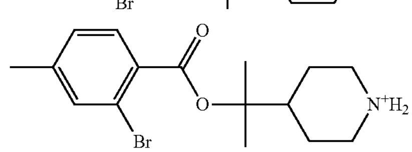

-continued
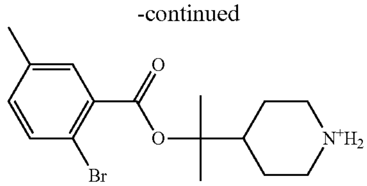
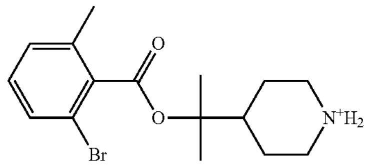
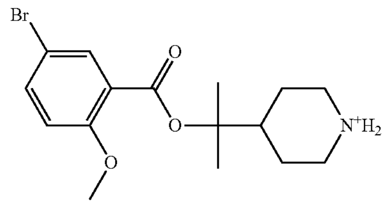
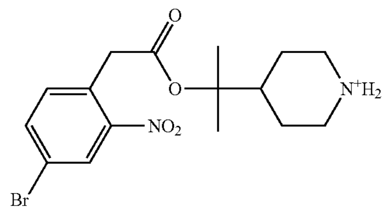
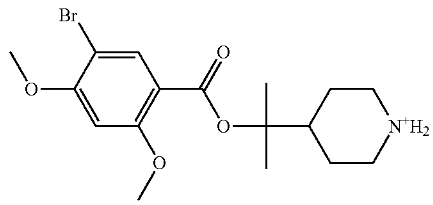
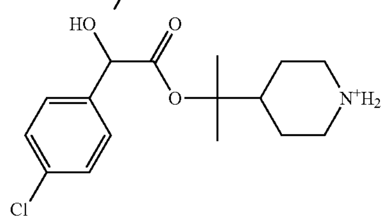
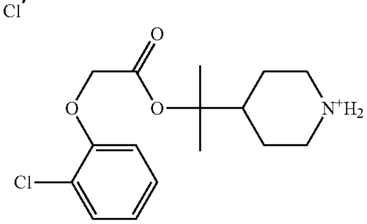
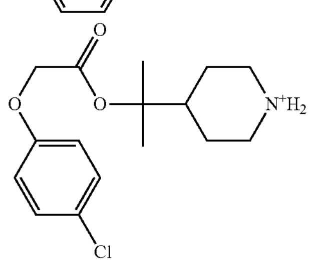
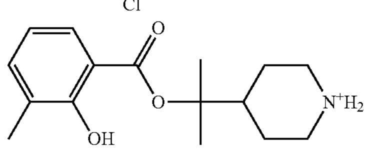
-continued
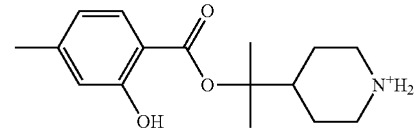
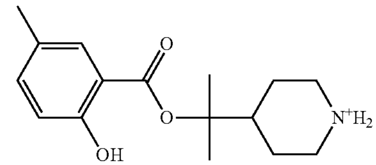
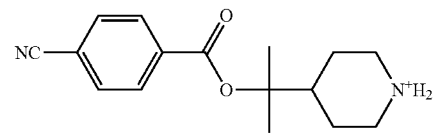
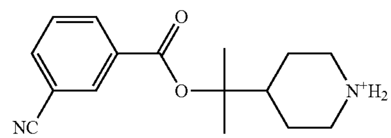
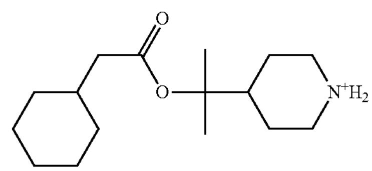
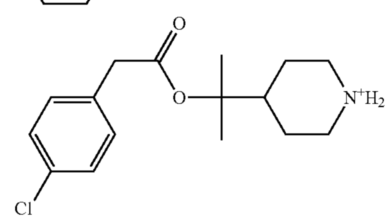
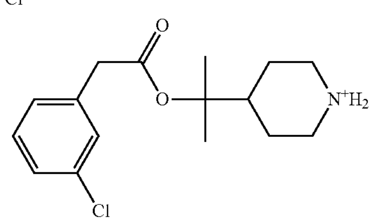
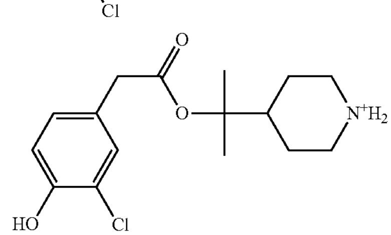
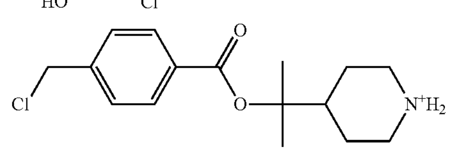
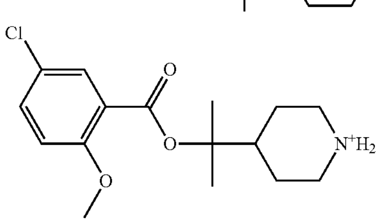

-continued
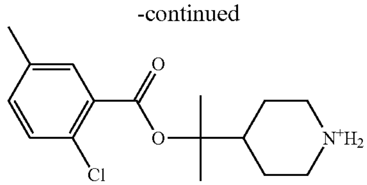
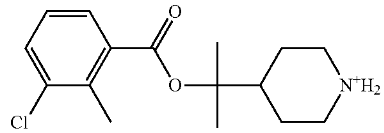
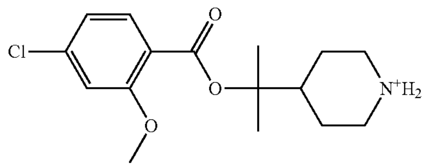
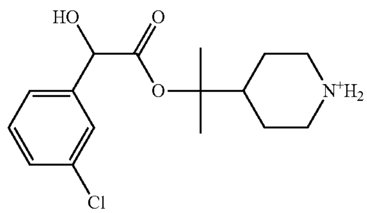
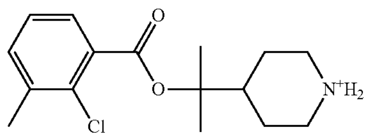
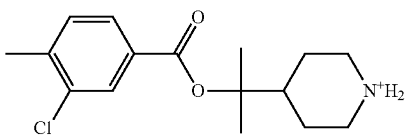
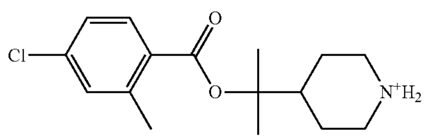
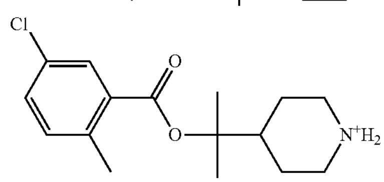
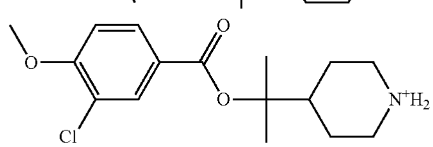
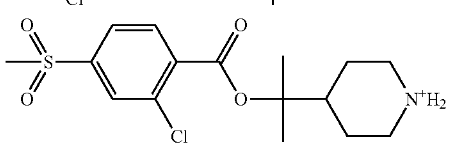
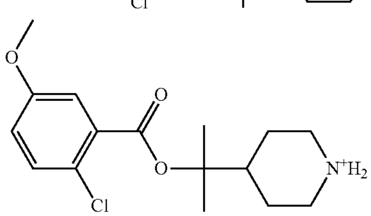
-continued
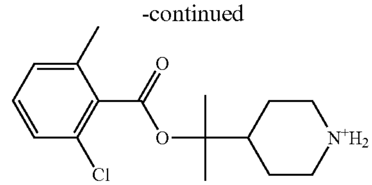
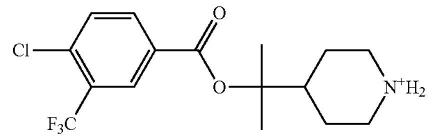
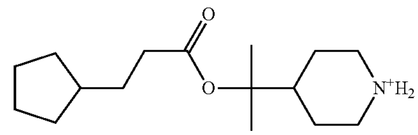
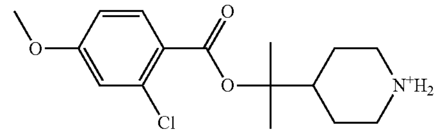
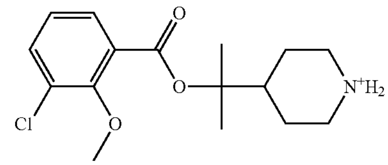
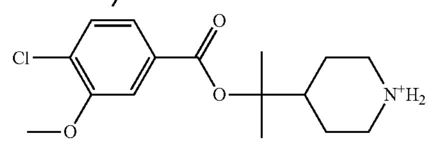
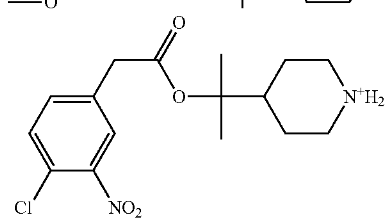
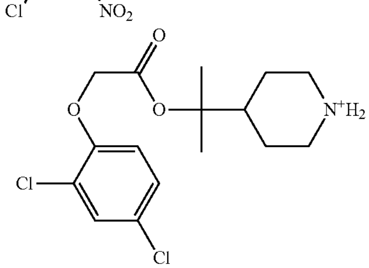
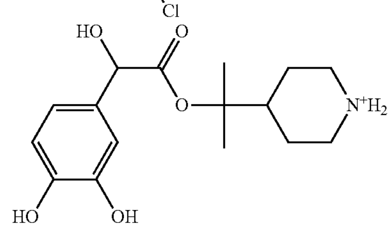
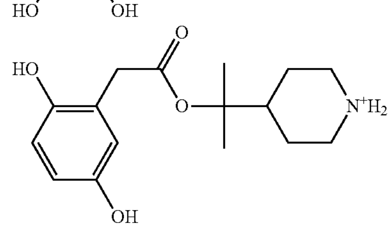

-continued
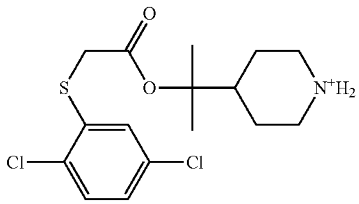
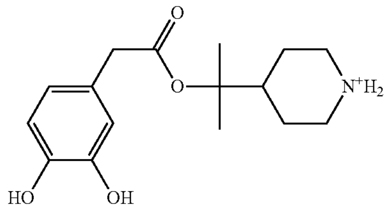
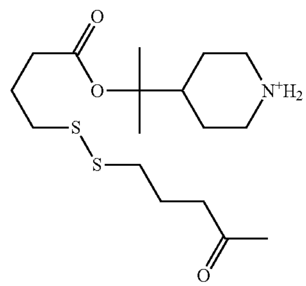
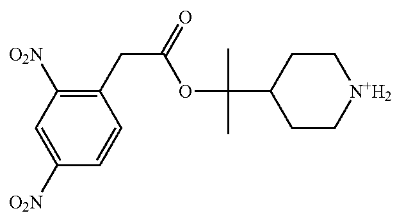
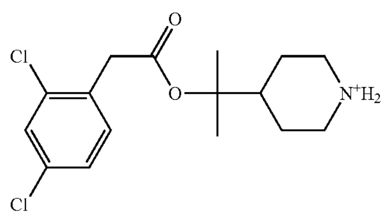
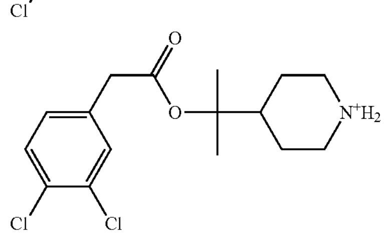
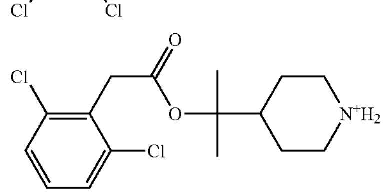
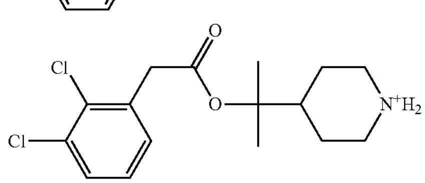
-continued
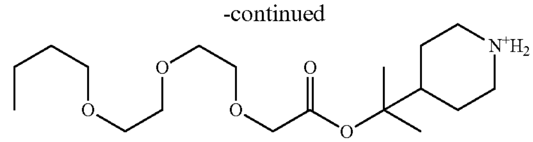
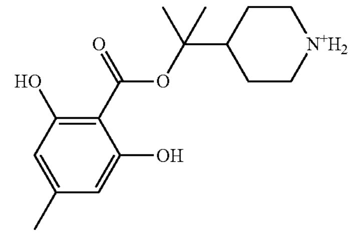
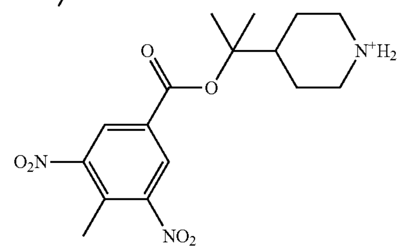
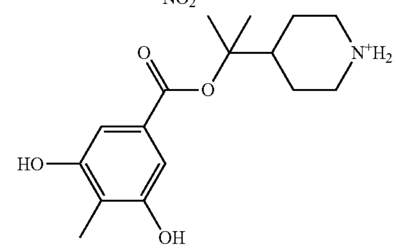
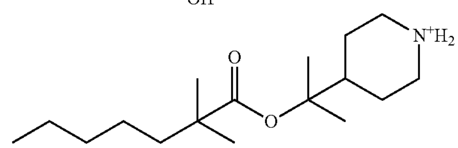
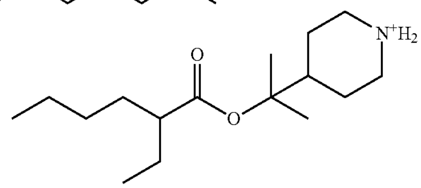
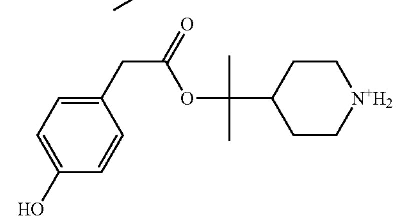
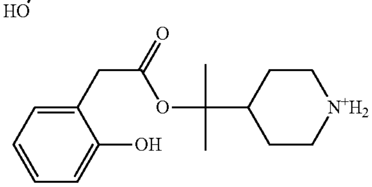
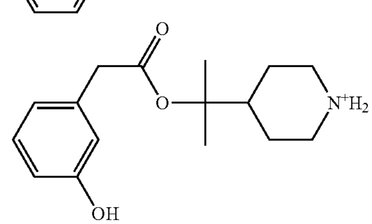

-continued
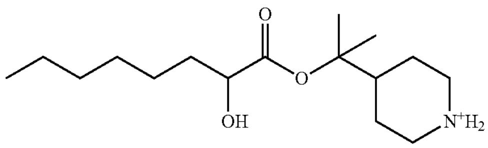
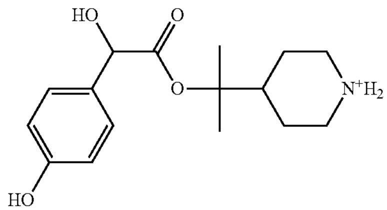
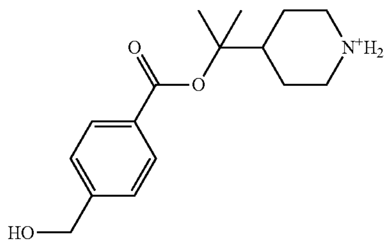
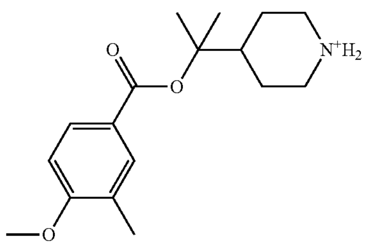
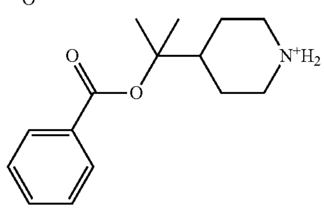
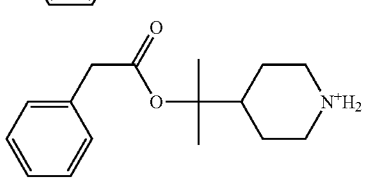
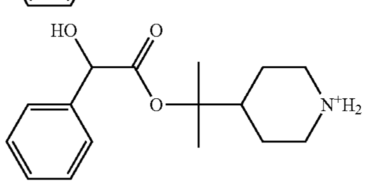
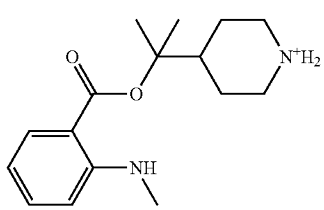
-continued
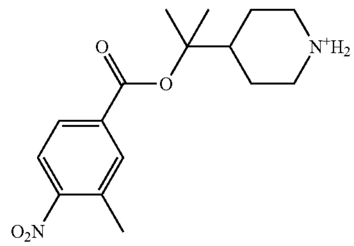
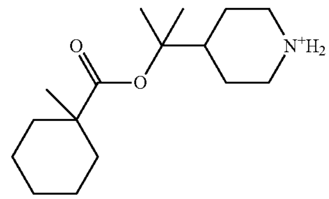
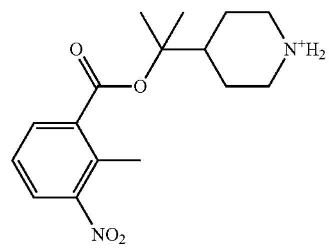
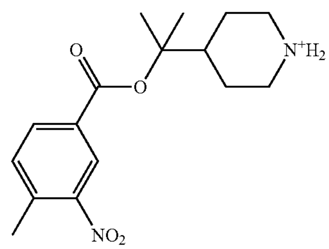
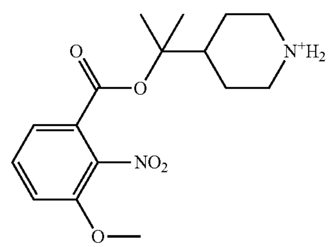
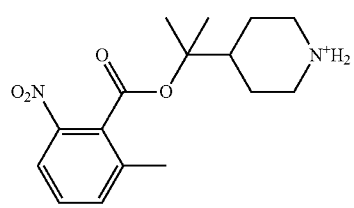
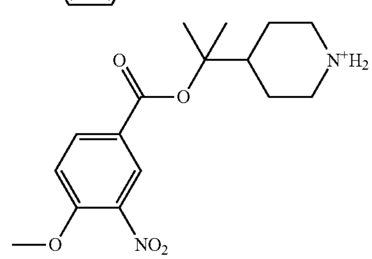

-continued
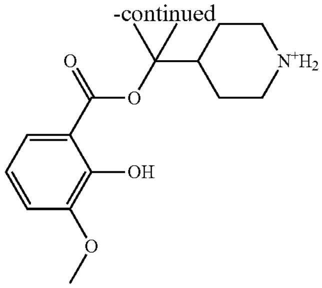
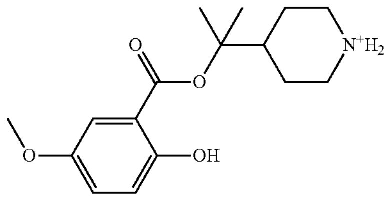
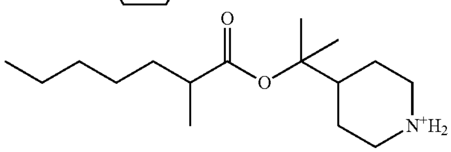
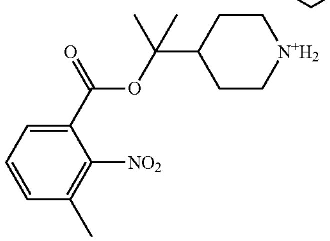
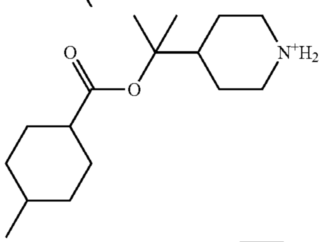
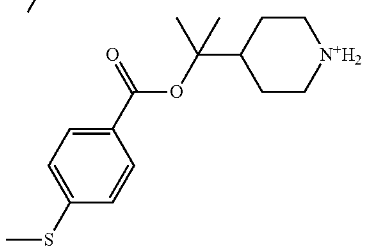
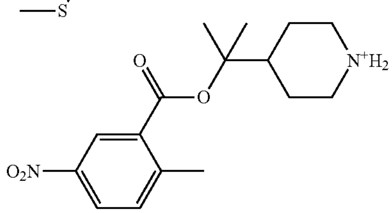
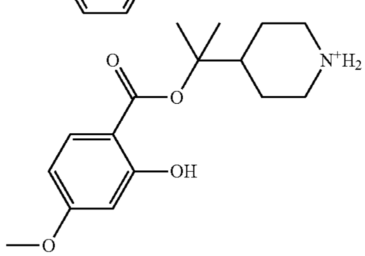
-continued
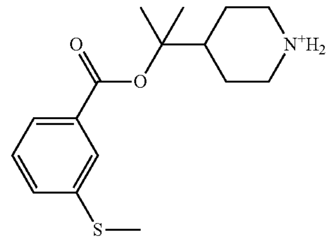
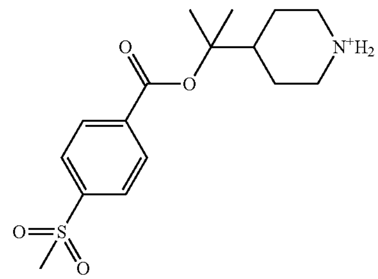
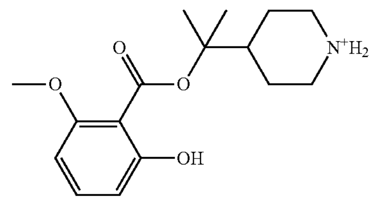
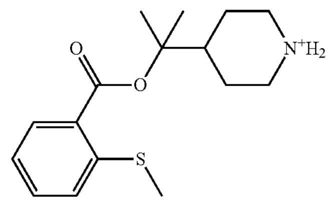
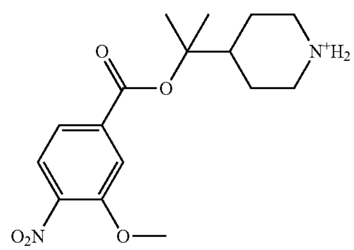
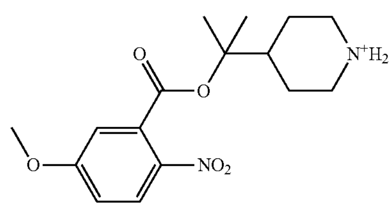
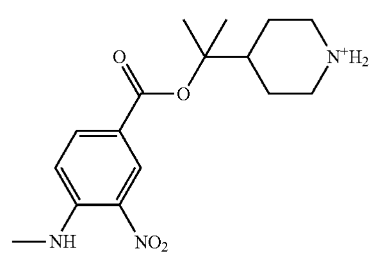

-continued
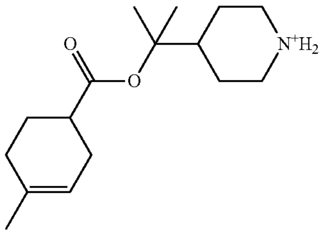
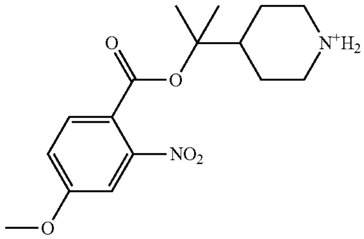
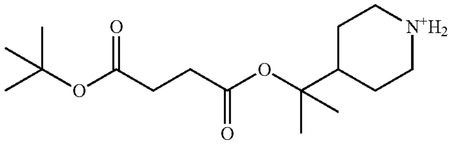
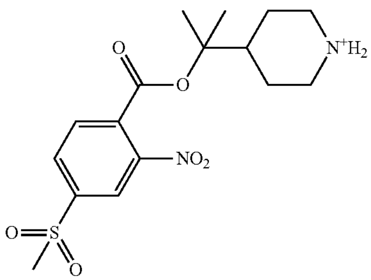
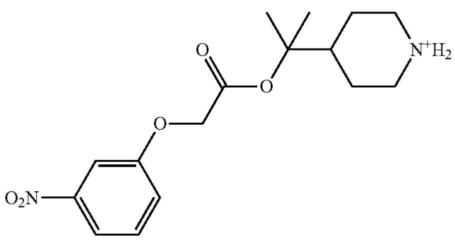
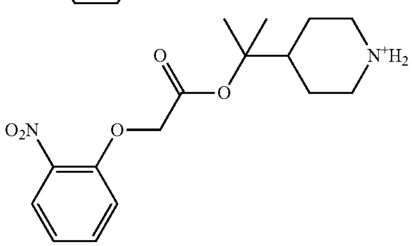
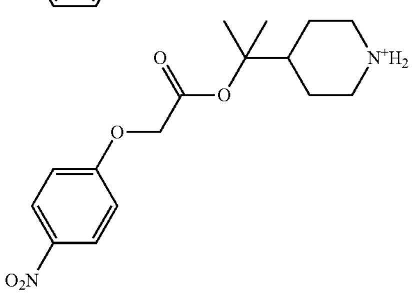
-continued
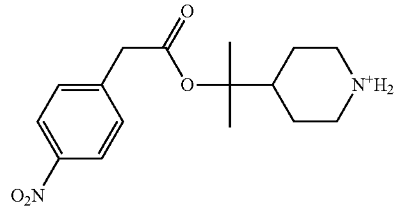
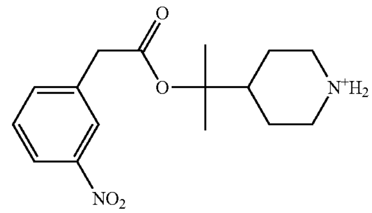
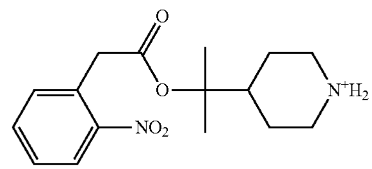
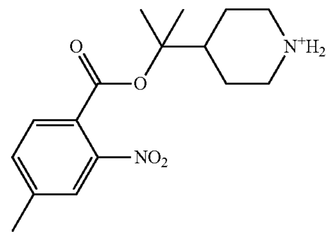
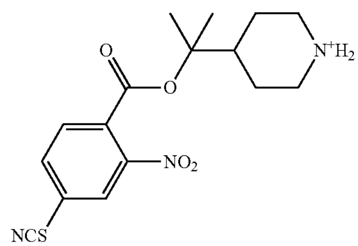
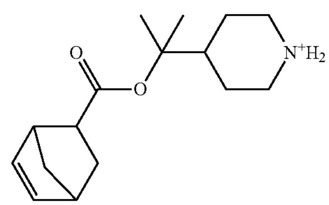
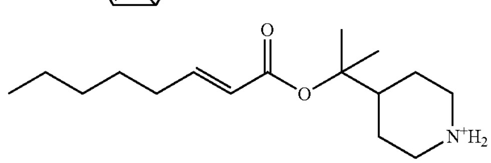
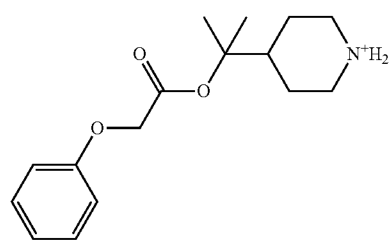

-continued
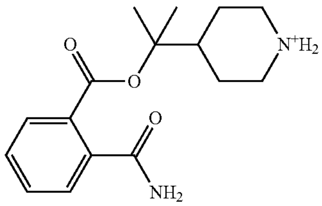
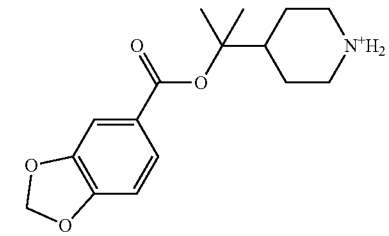
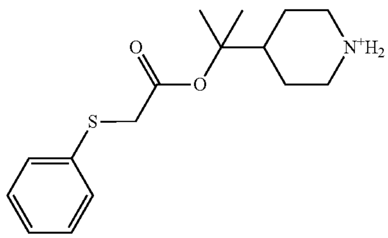
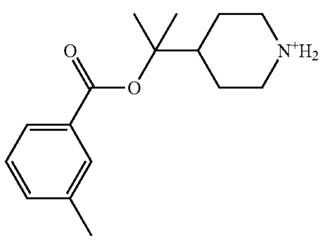
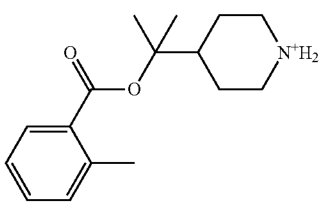
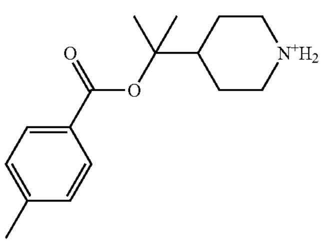
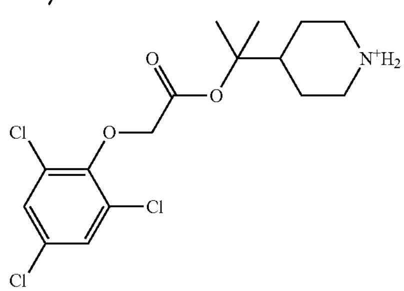
-continued
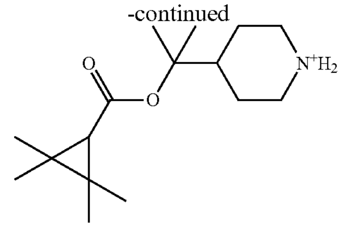
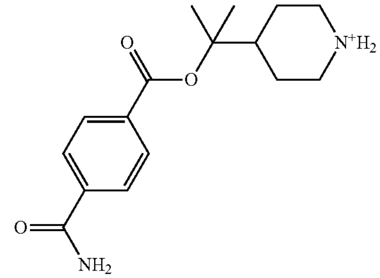
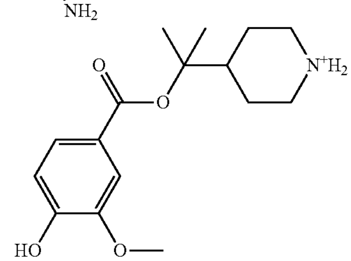
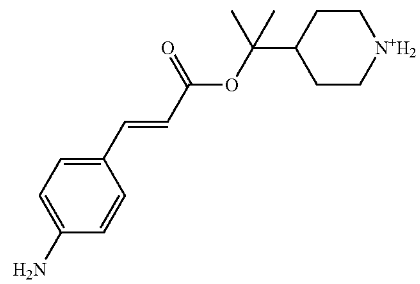
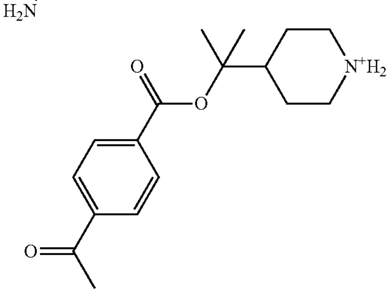
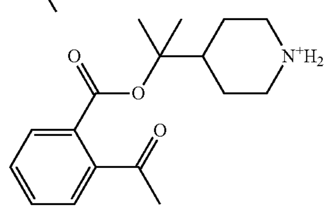
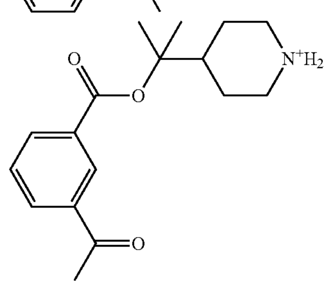

-continued
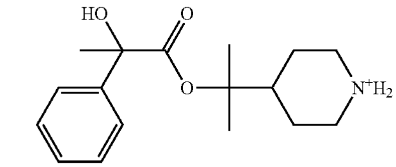
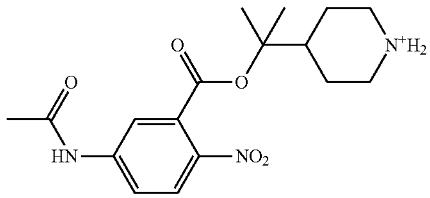
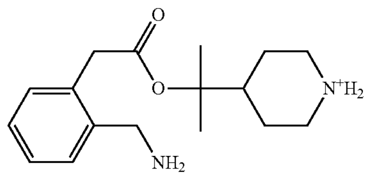
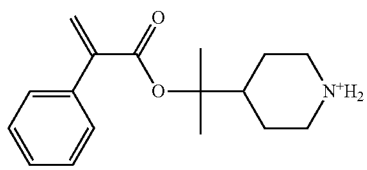
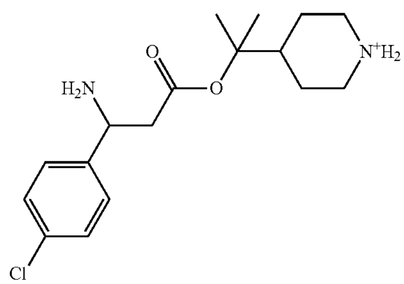
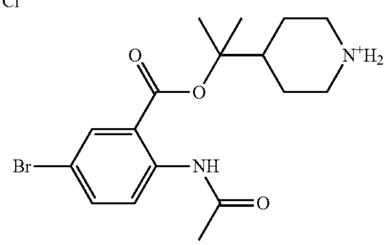
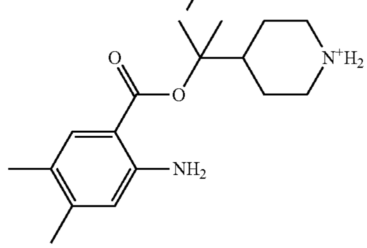
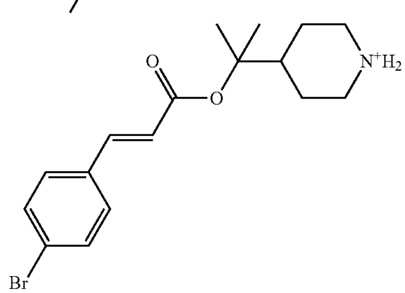
-continued
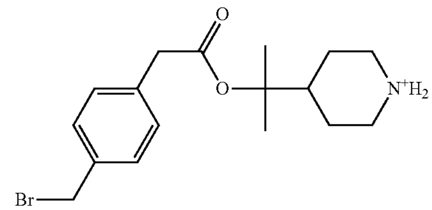
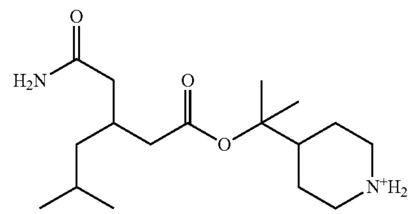
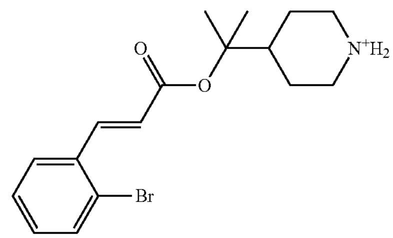
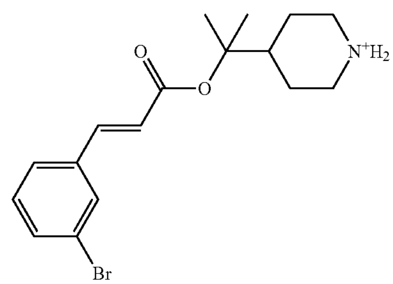
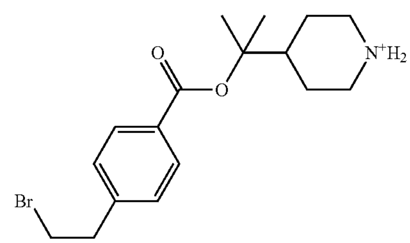
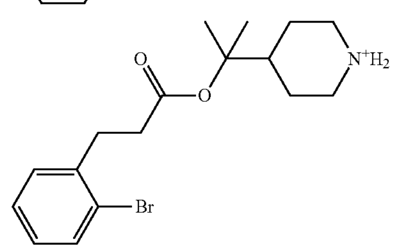
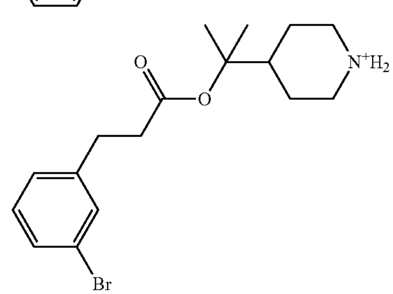

-continued
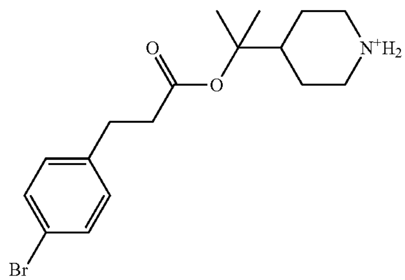
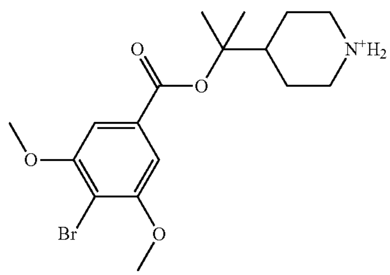
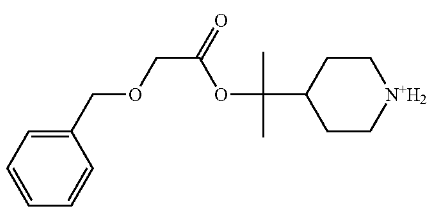
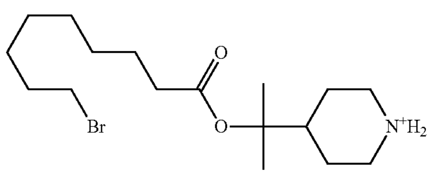
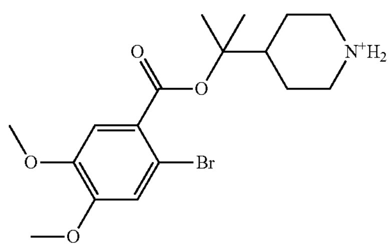
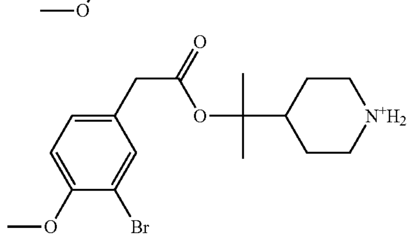
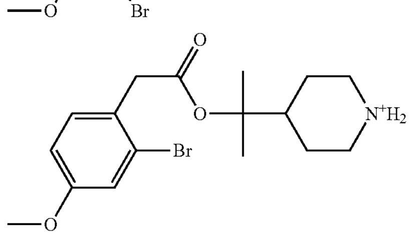
-continued
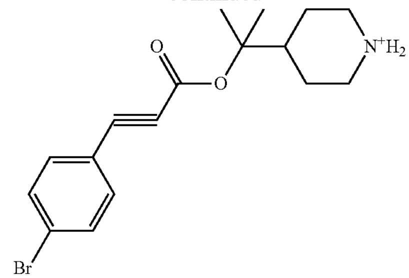
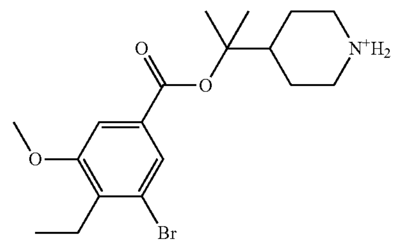
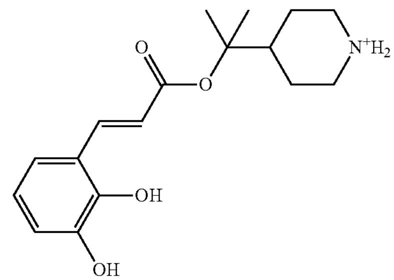
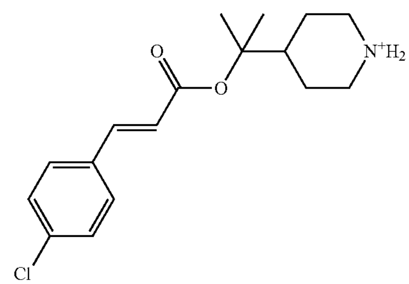
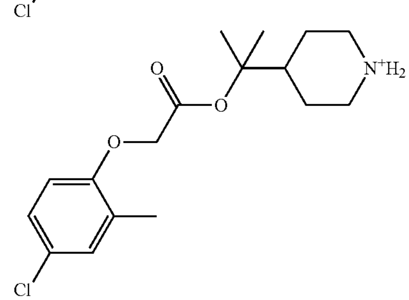
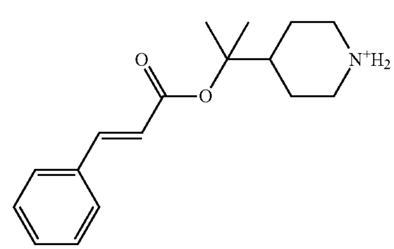

-continued
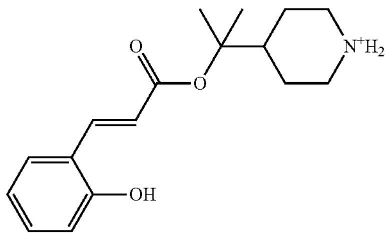
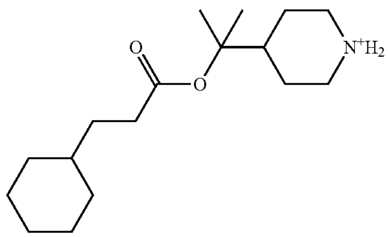
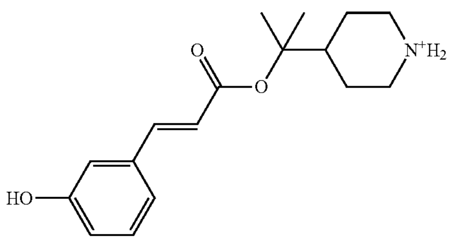
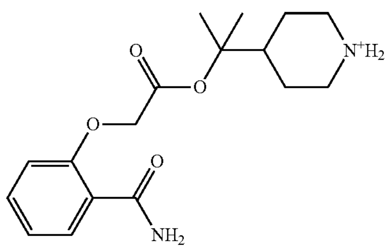
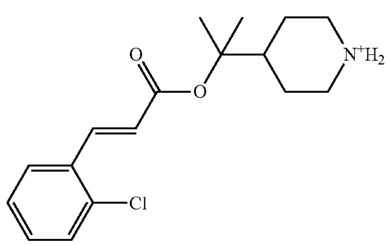
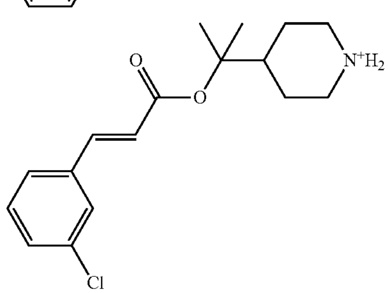
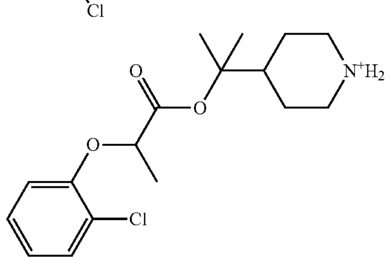
-continued
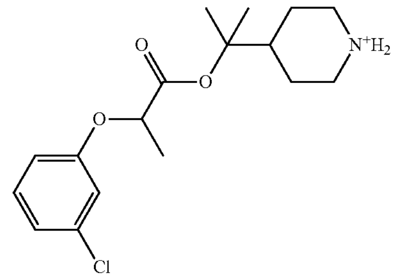
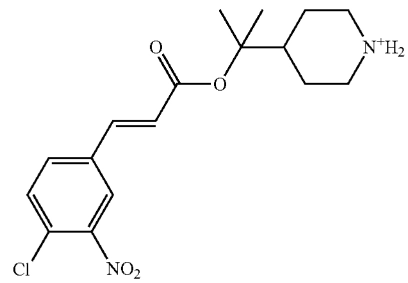
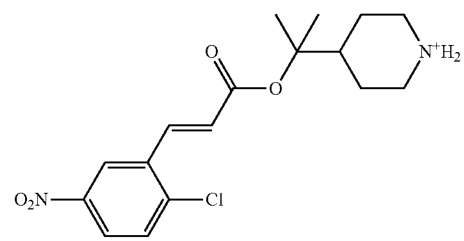
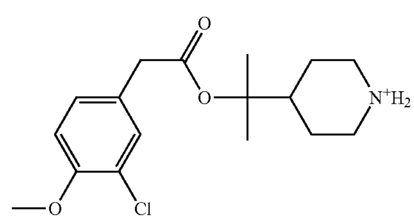
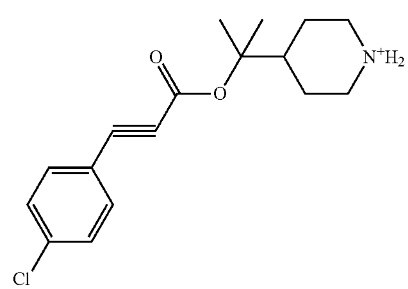
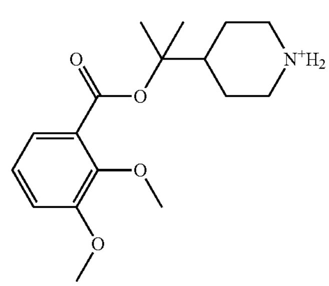

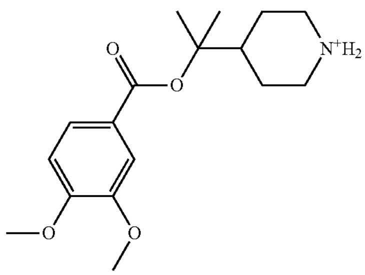
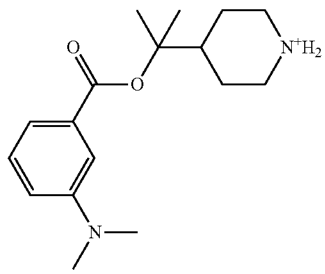
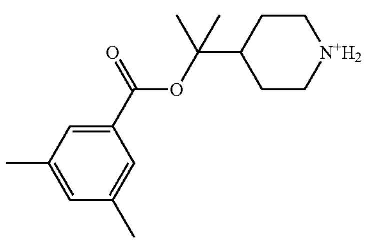
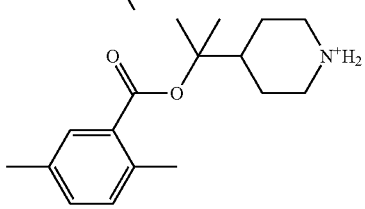
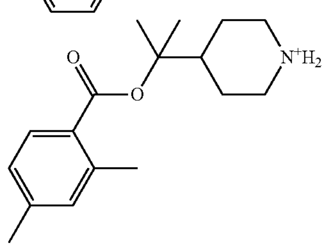
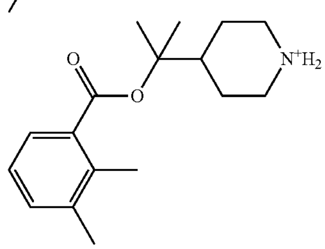
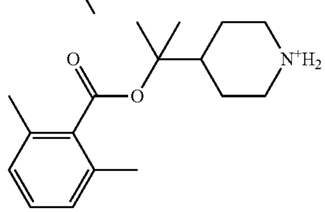
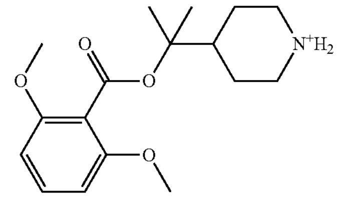
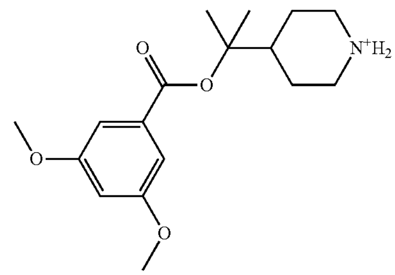
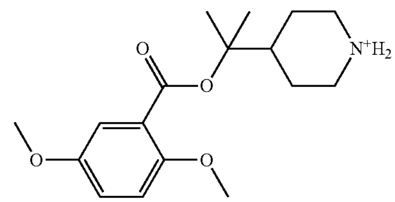
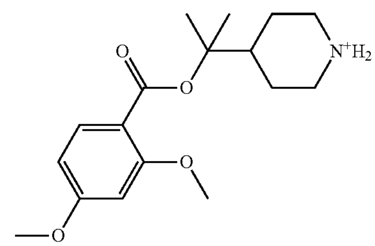
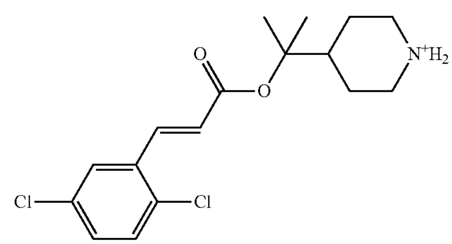
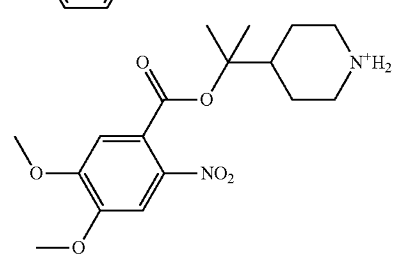
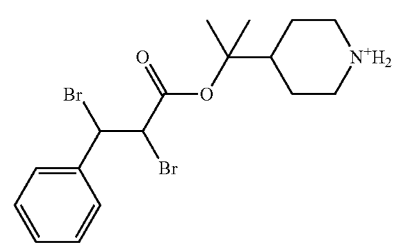

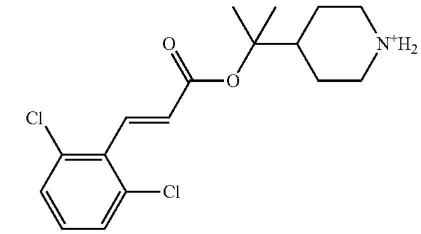
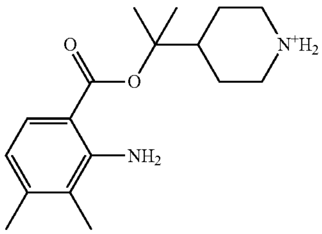
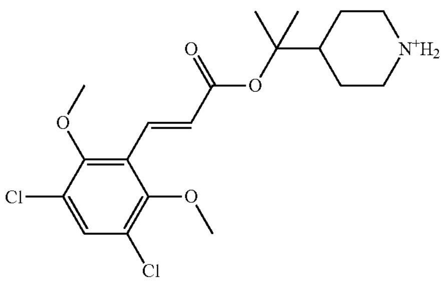
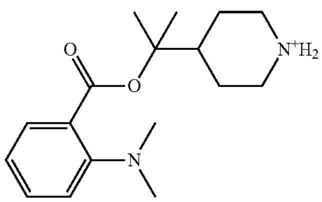
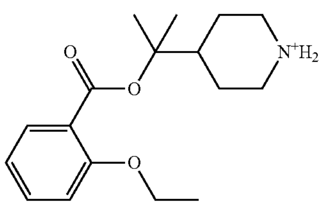
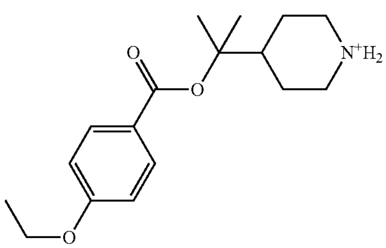
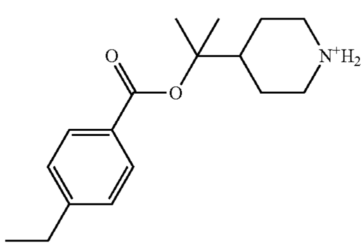
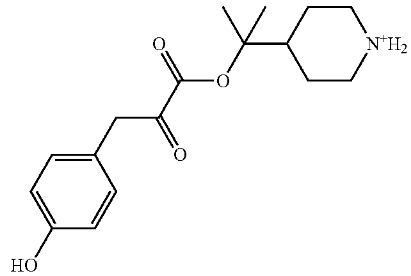
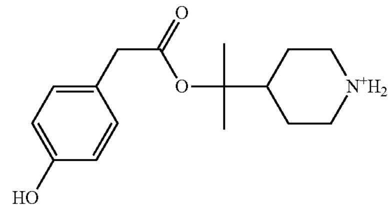
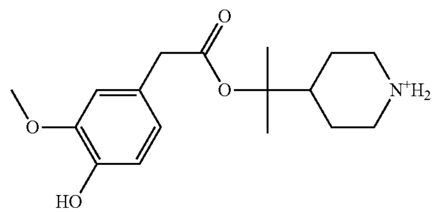
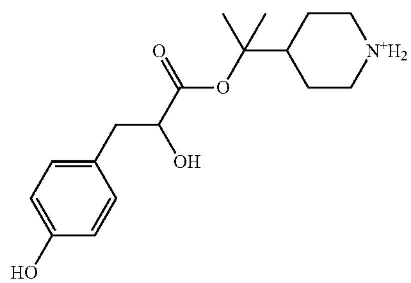
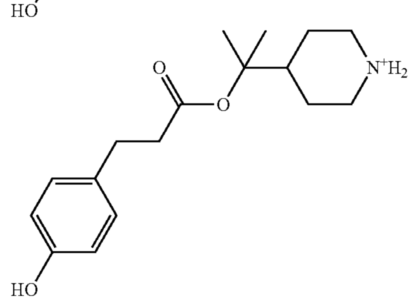
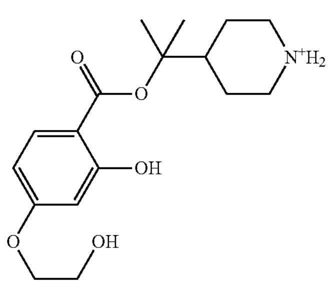

-continued
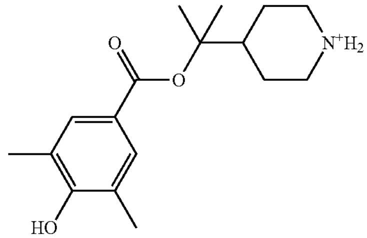
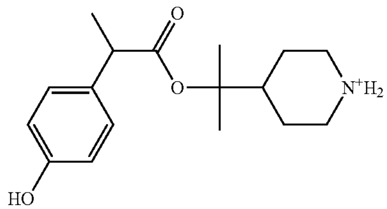
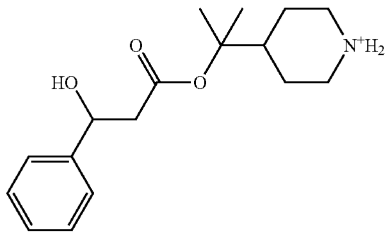
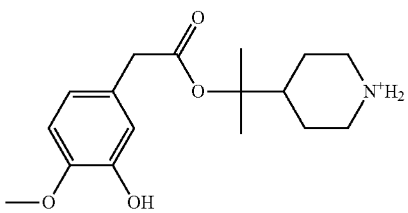
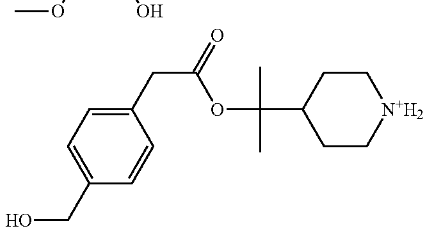
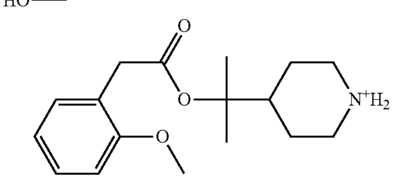
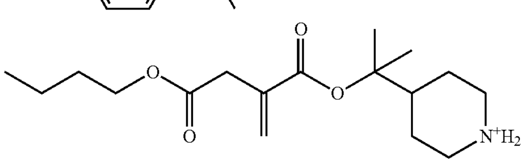
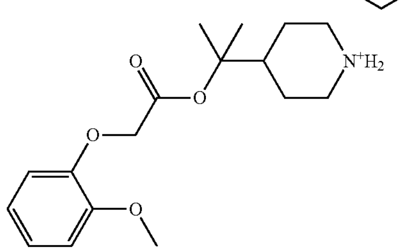
-continued
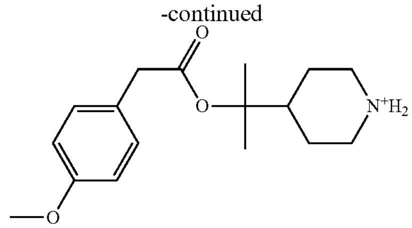
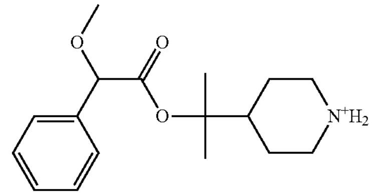
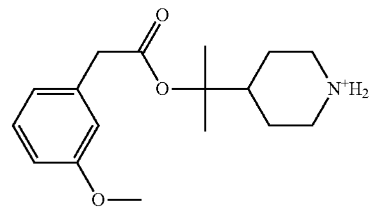
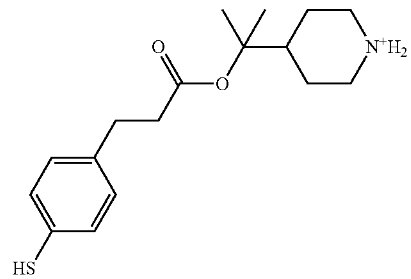
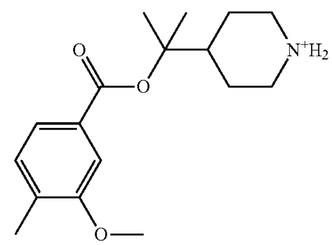
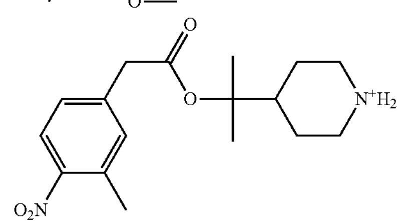
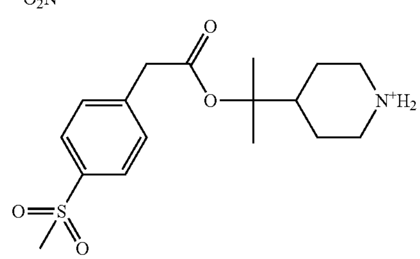
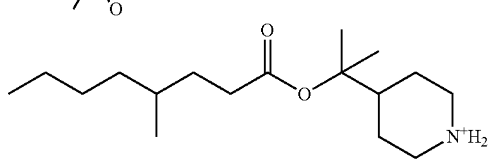

-continued
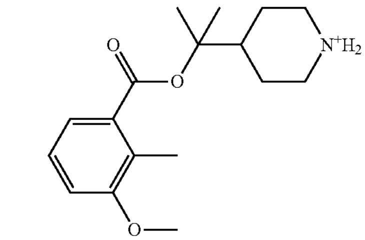
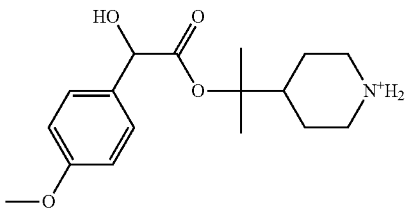
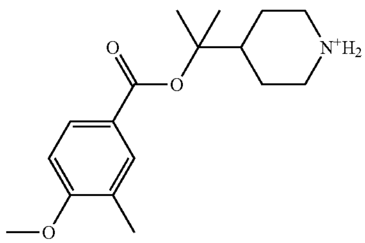
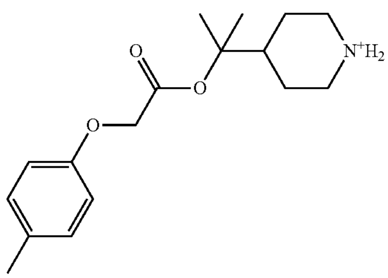
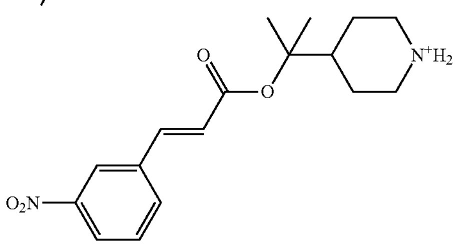
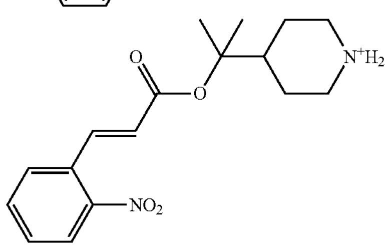
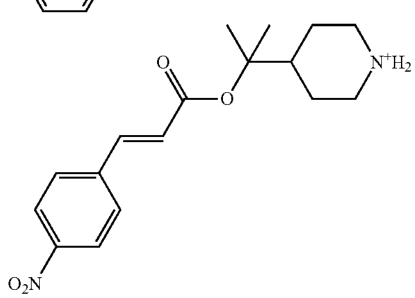
-continued
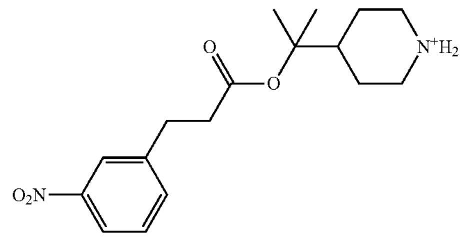
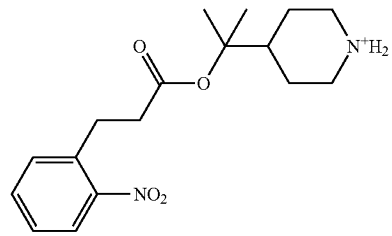
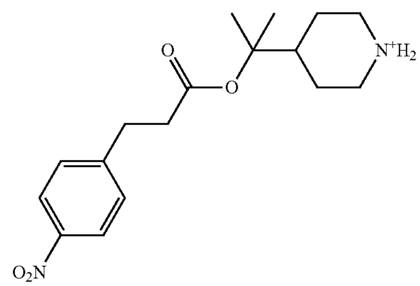
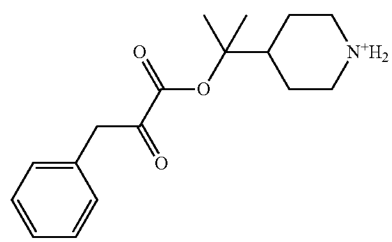
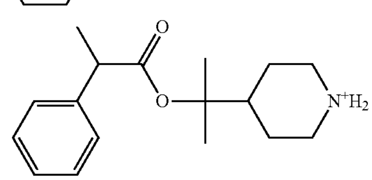
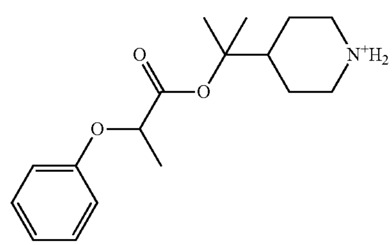
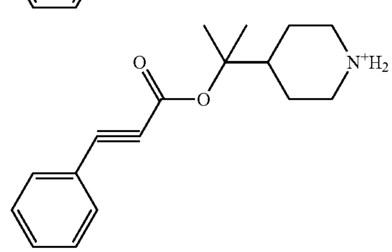

-continued
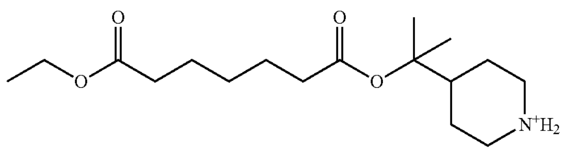
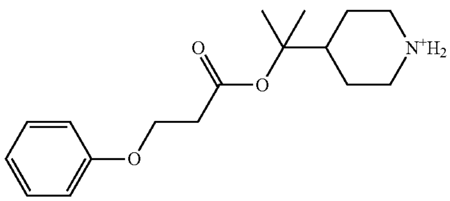
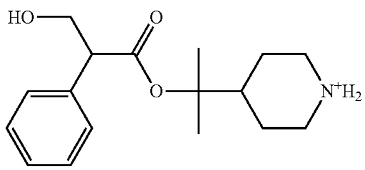
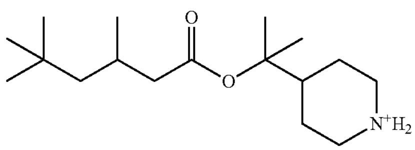
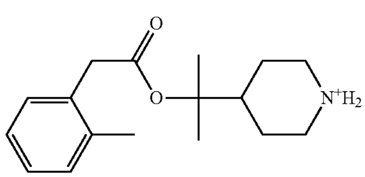
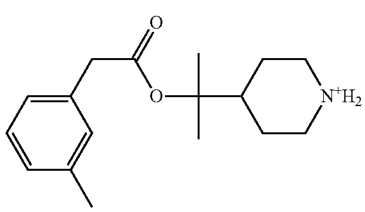
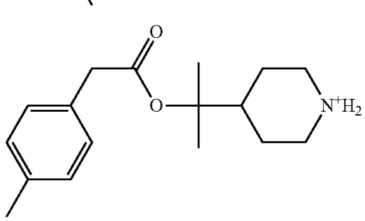
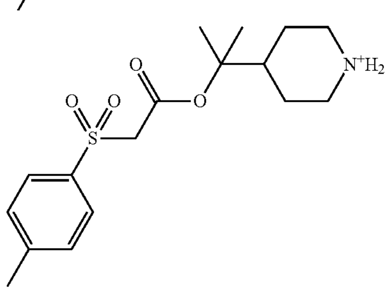
-continued
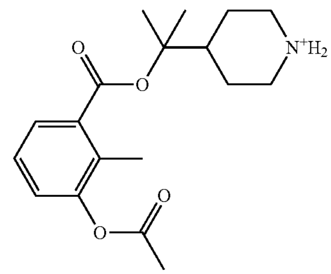
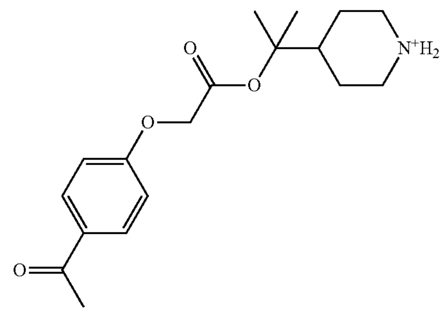
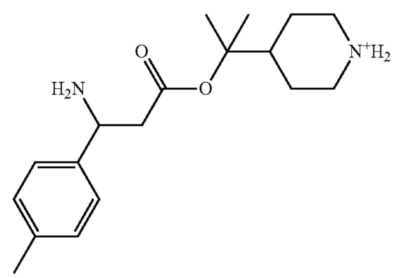
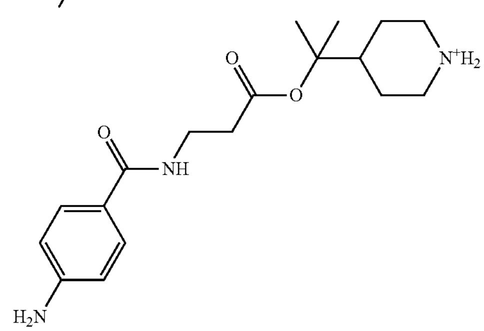
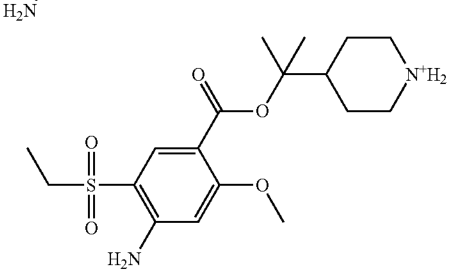
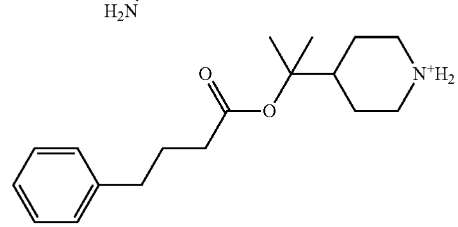

-continued
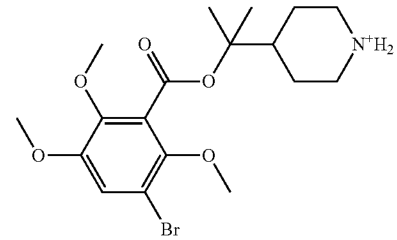
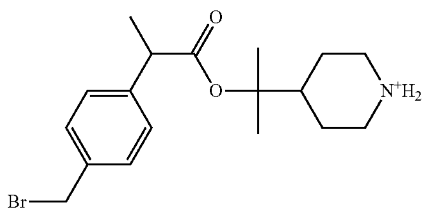
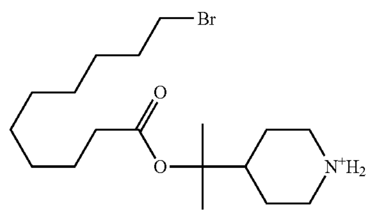
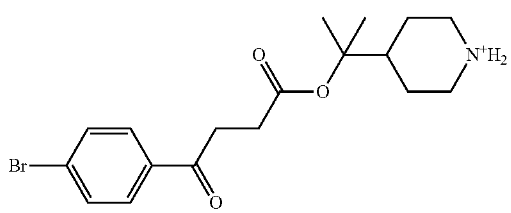
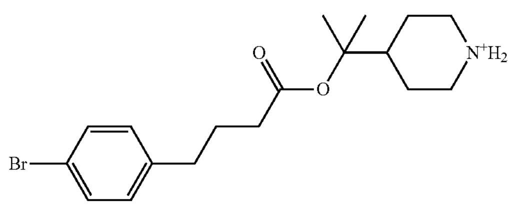
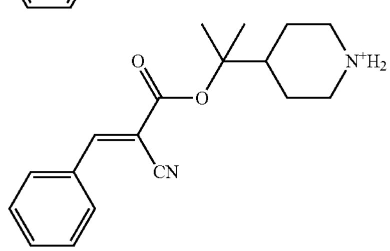
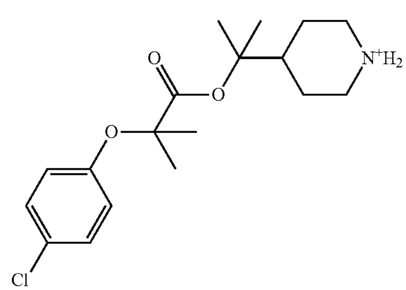
-continued
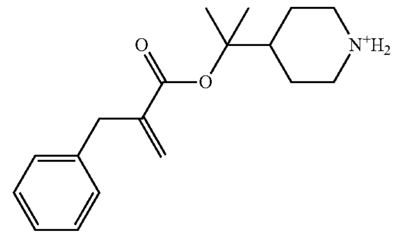
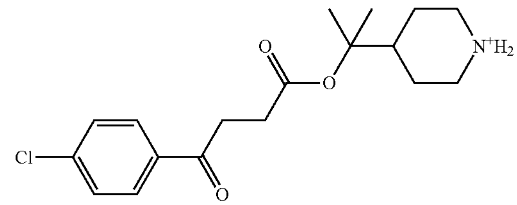
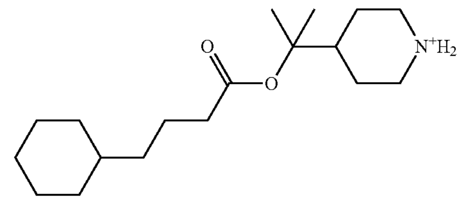
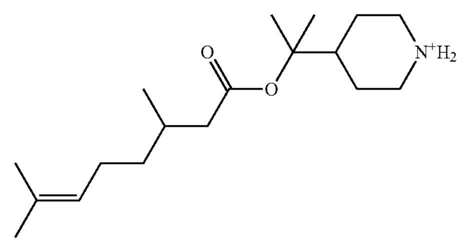
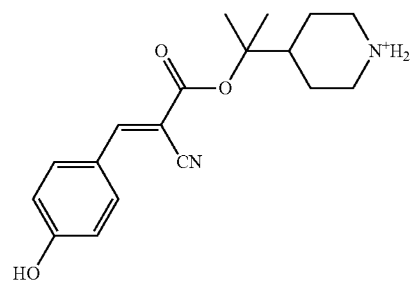
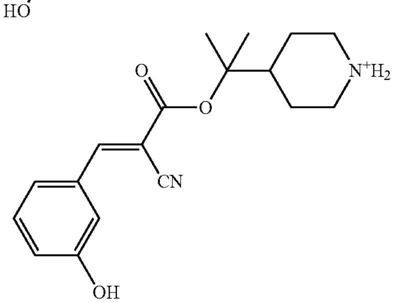
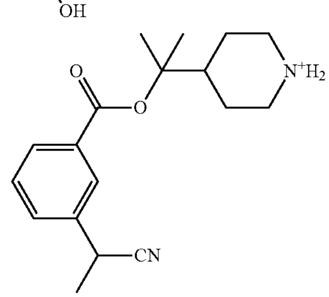

-continued
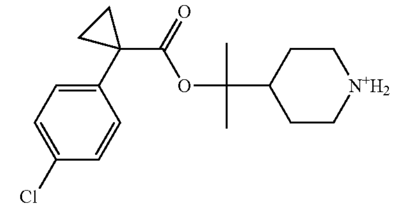
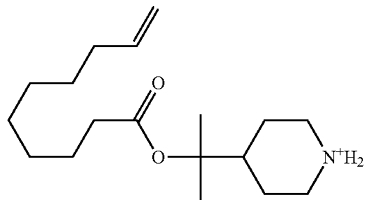
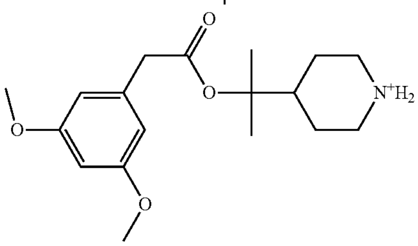
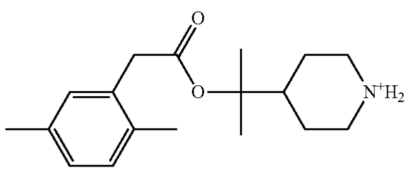
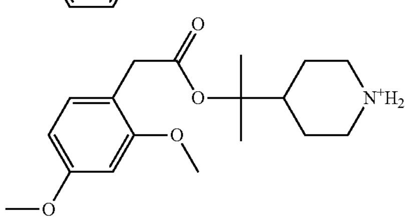
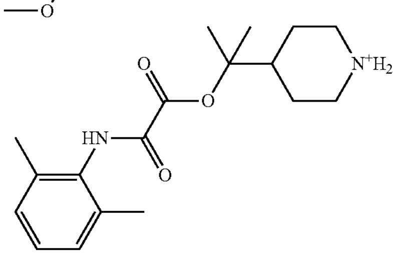
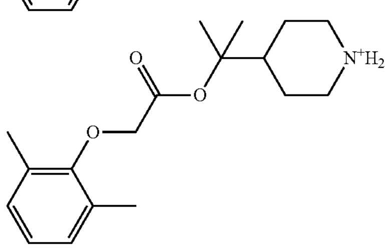
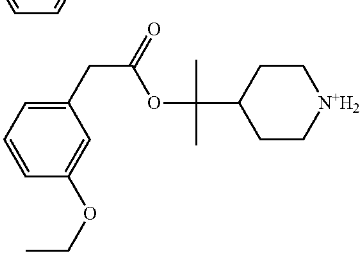
-continued
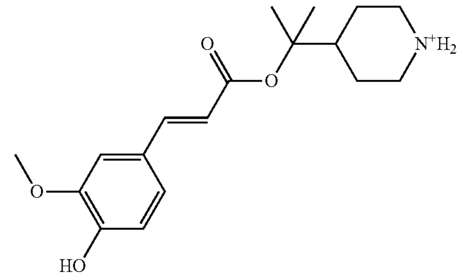
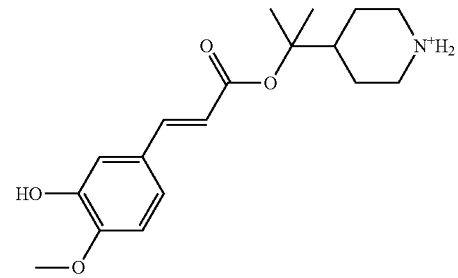
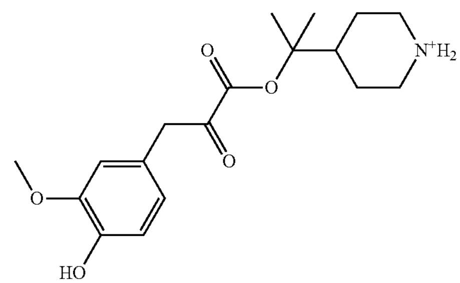
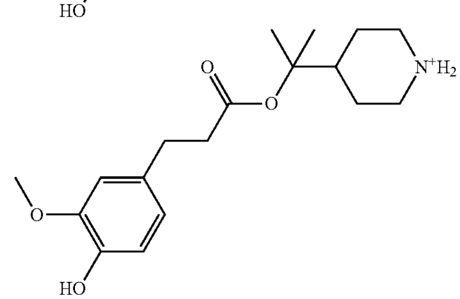
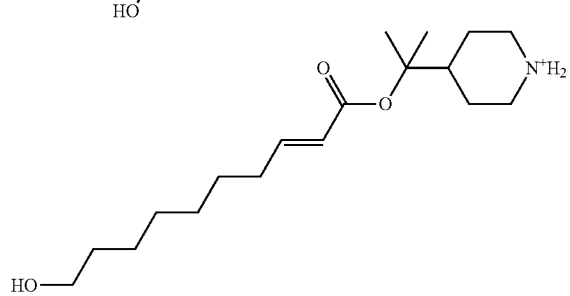
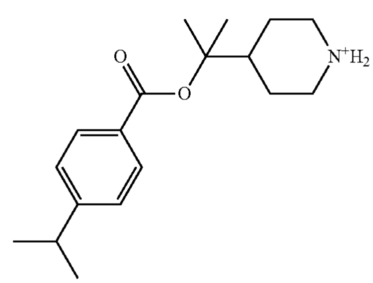

-continued
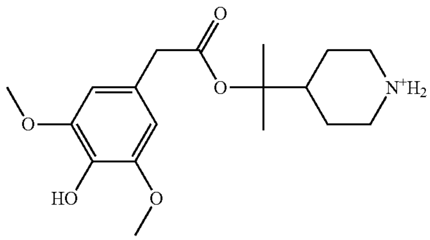
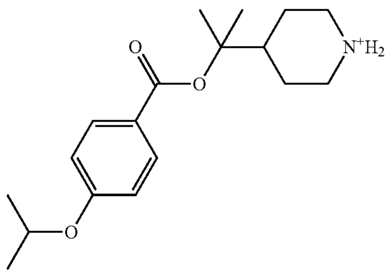
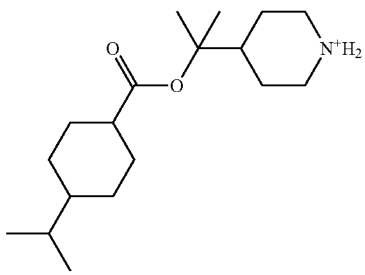
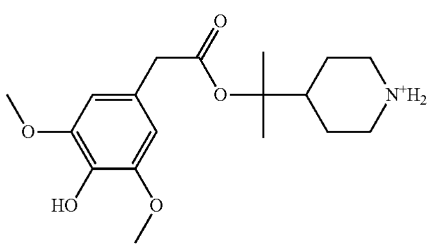
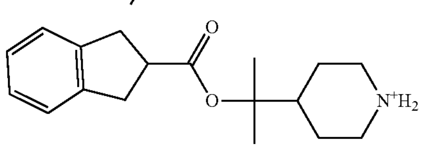
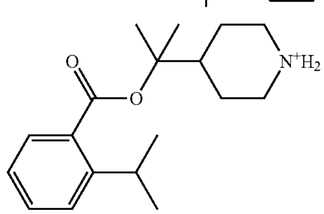
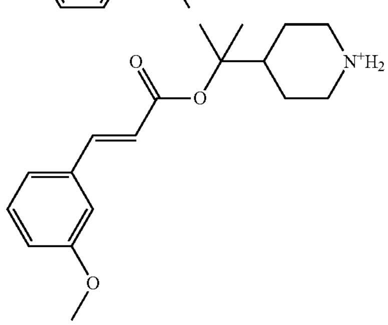
-continued
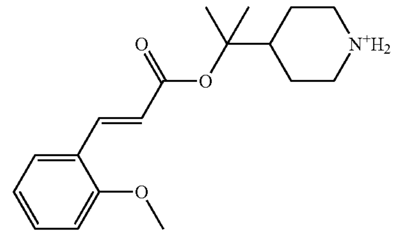
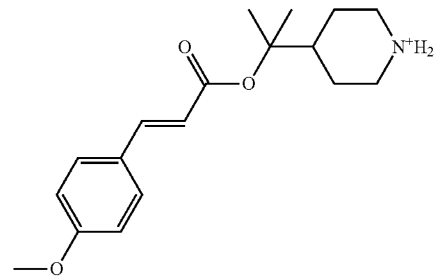
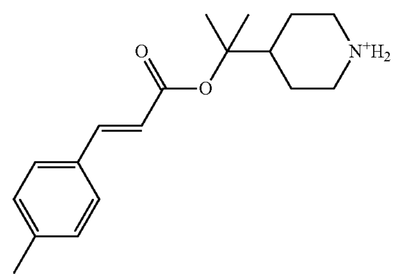
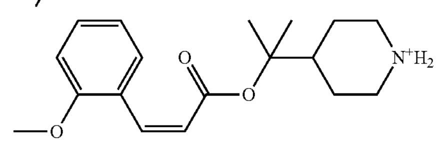
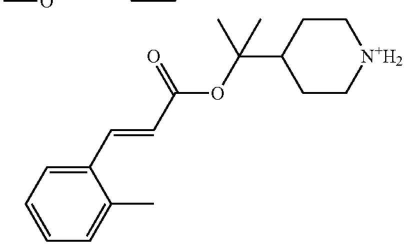
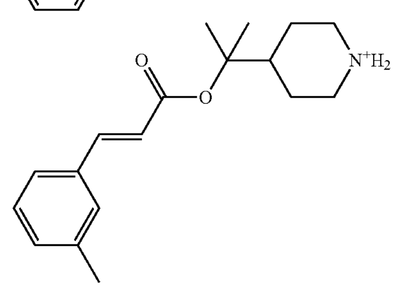
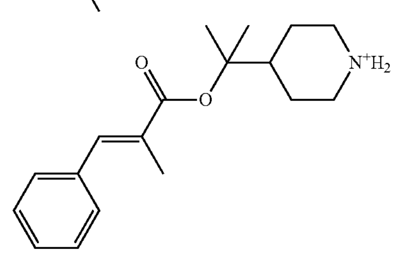

-continued
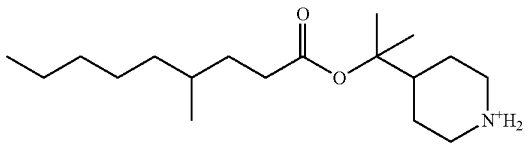
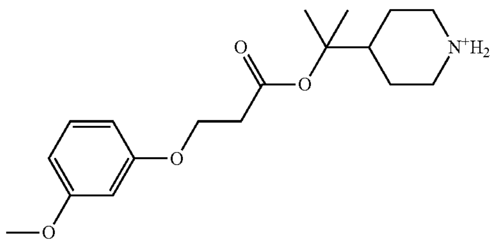
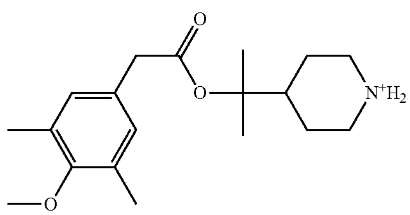
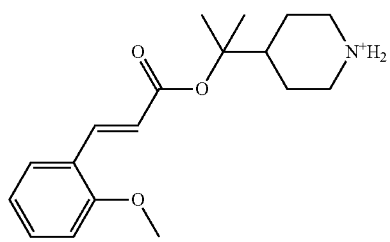
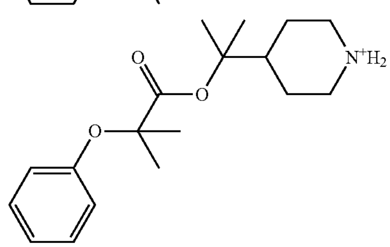
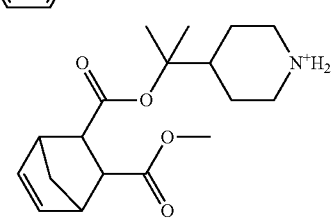
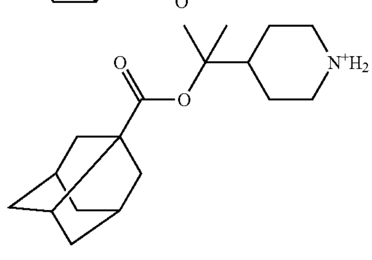
-continued
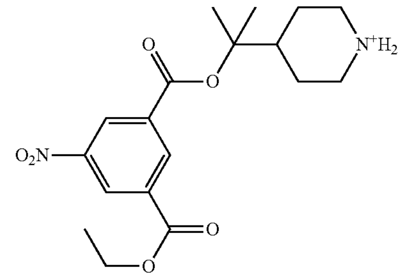
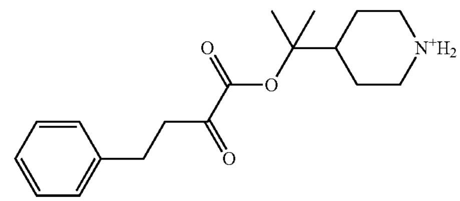
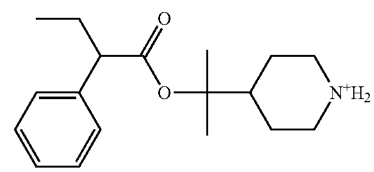
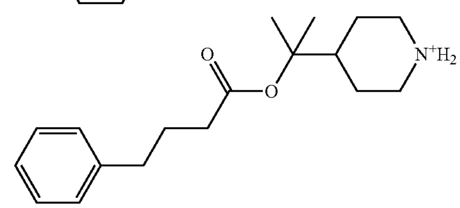
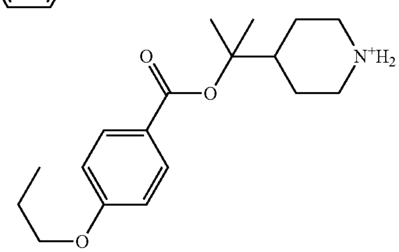
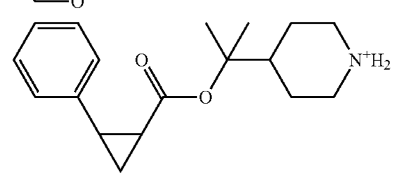
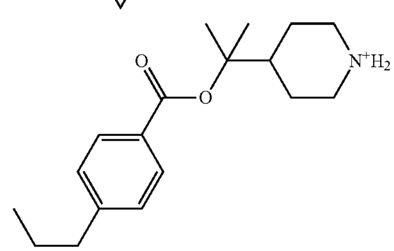
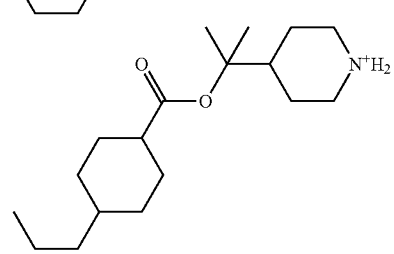

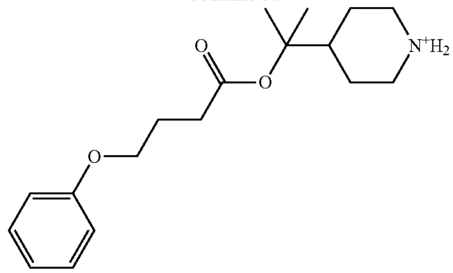
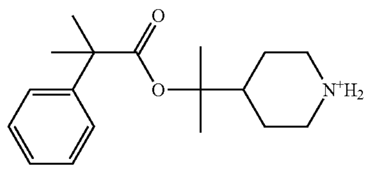
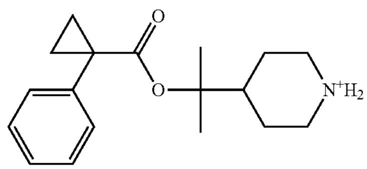
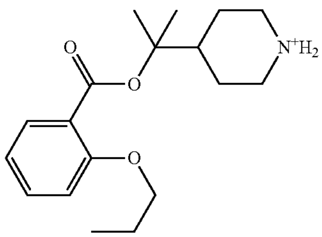
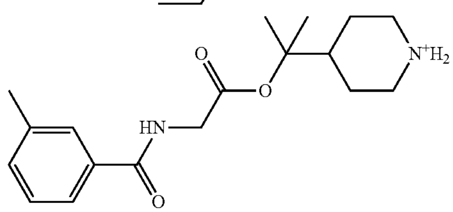
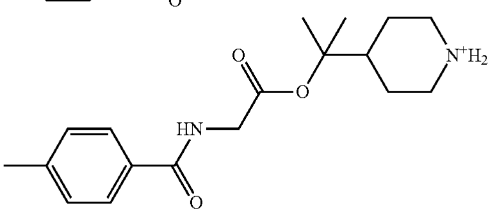
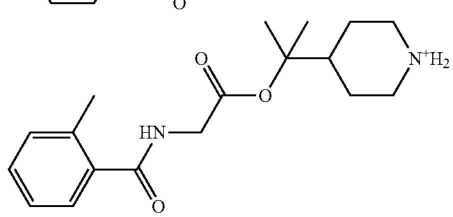
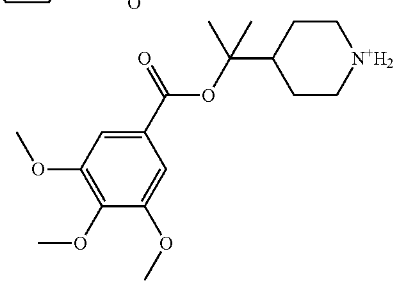
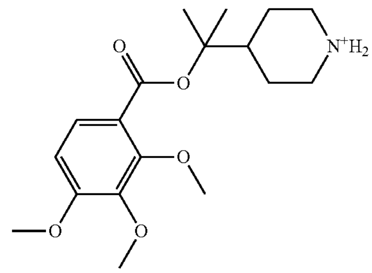
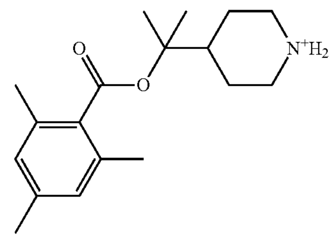
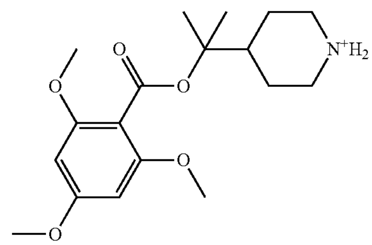
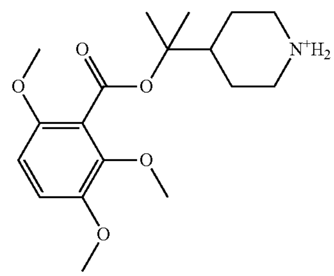
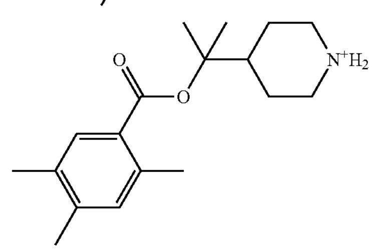
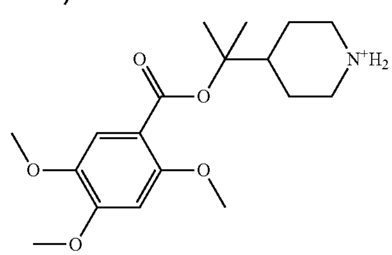

-continued
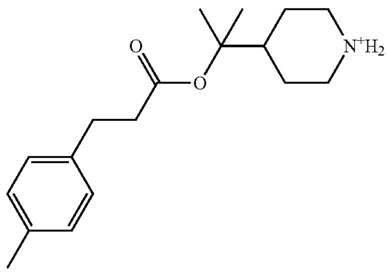
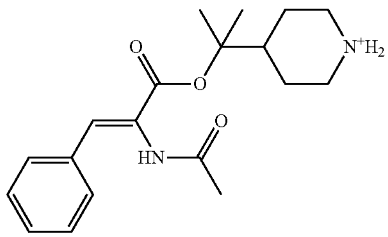
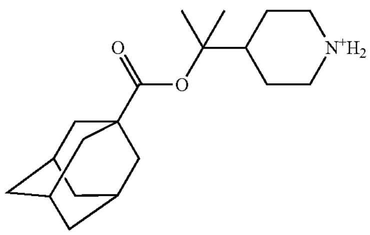
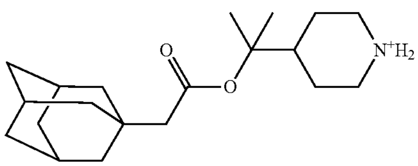
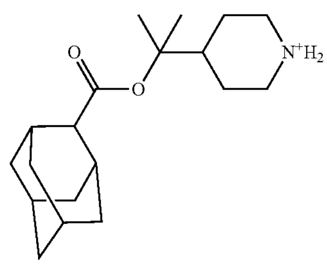
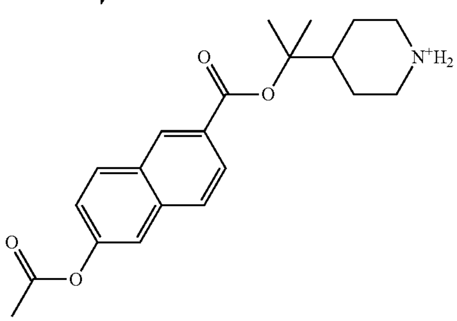
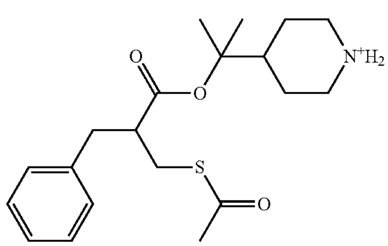
-continued
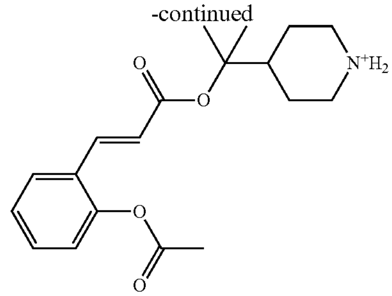
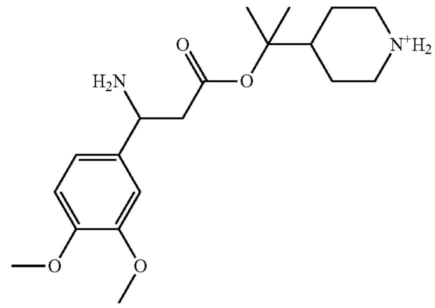
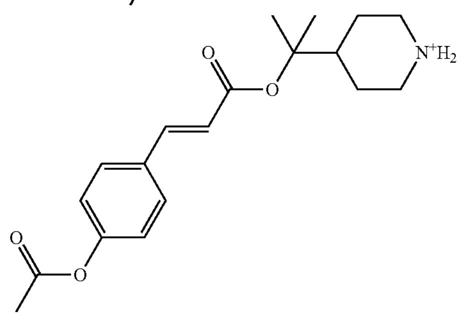
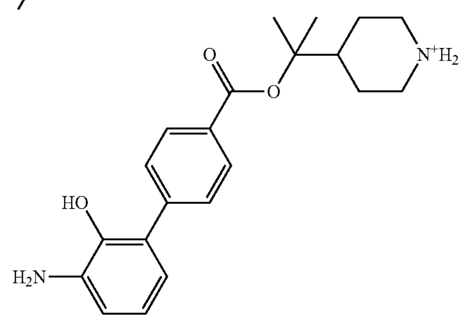
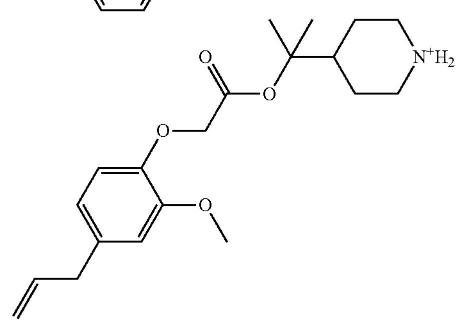
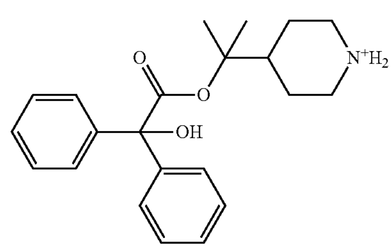

-continued
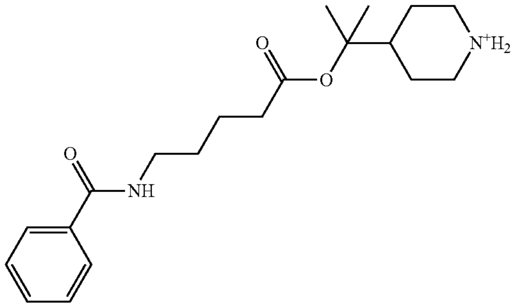
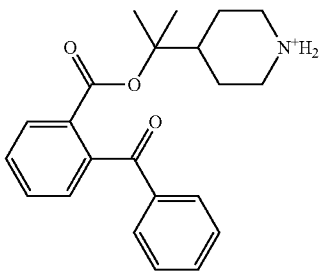
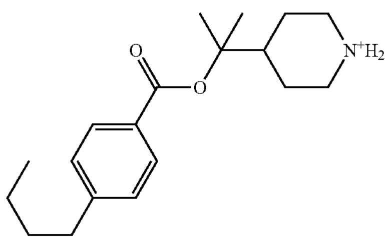
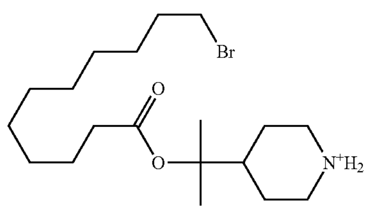
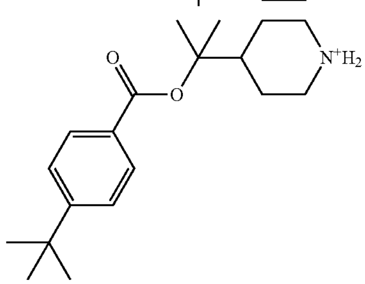
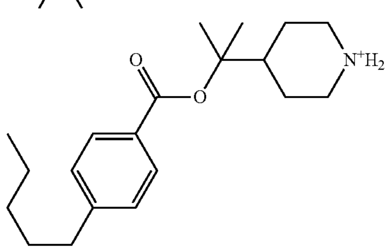
-continued
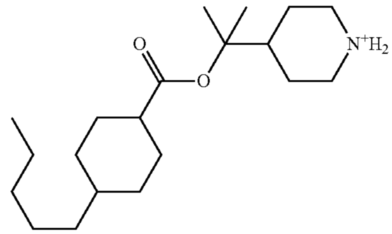
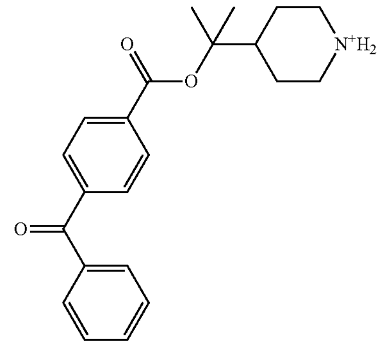
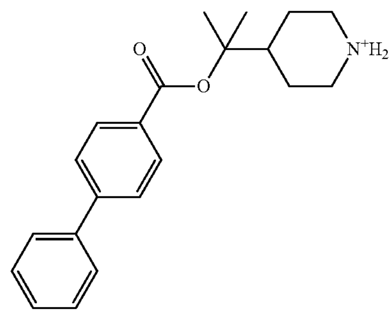
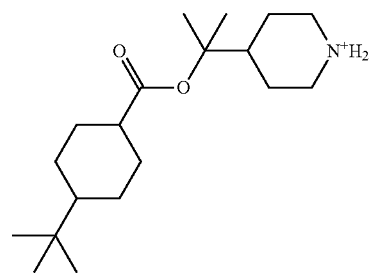
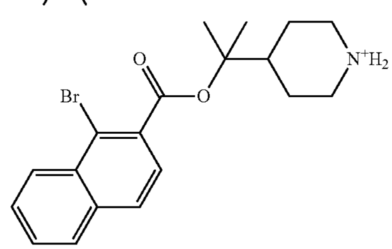
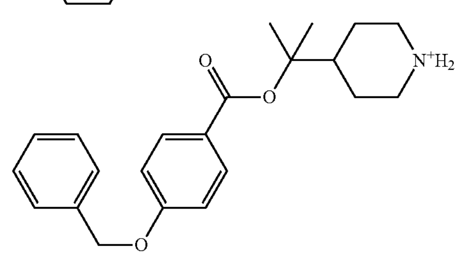

-continued
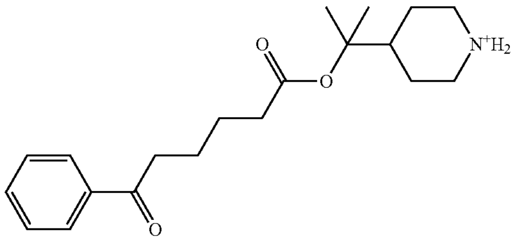
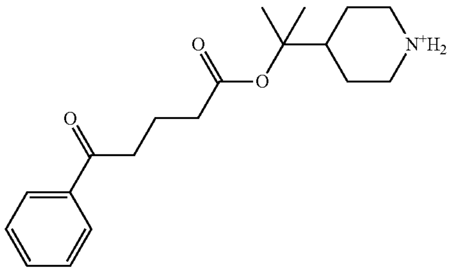
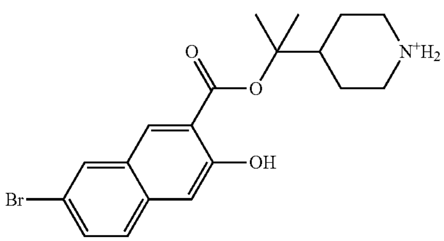
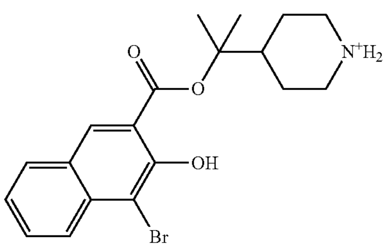
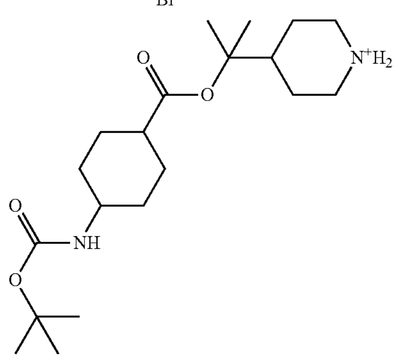
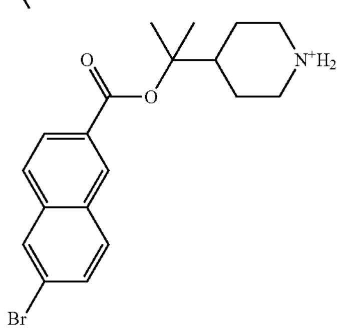
-continued
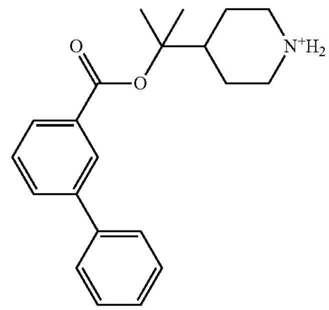
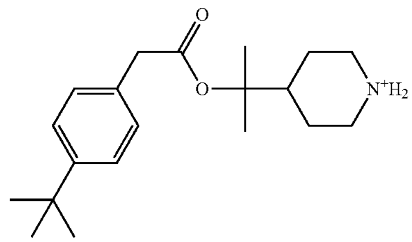
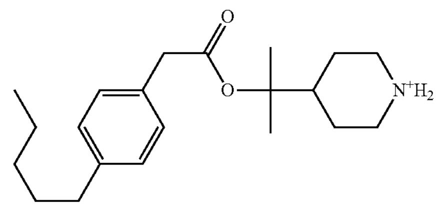
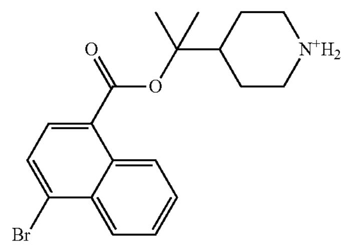
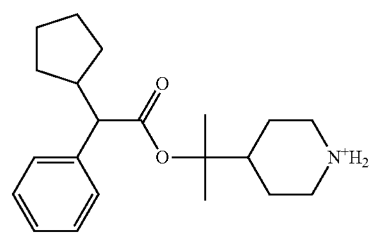
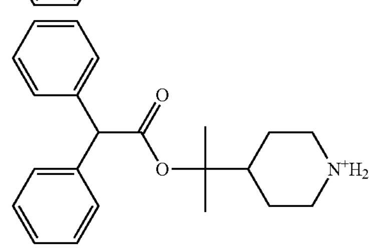
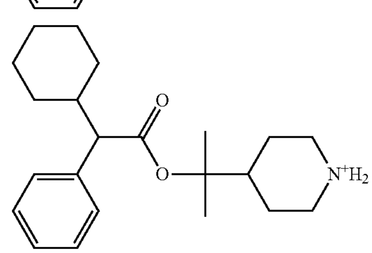

-continued
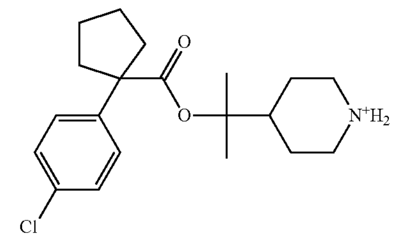
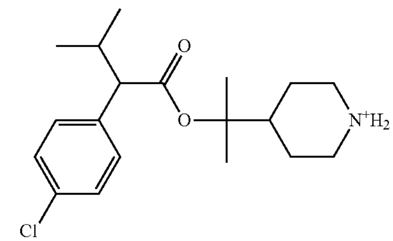
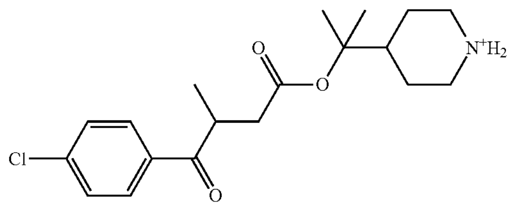
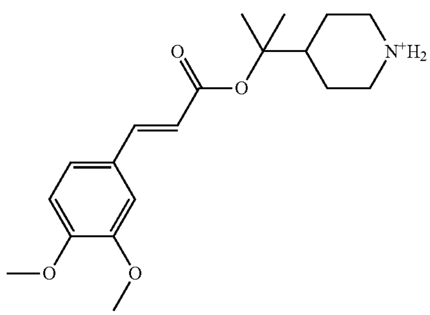
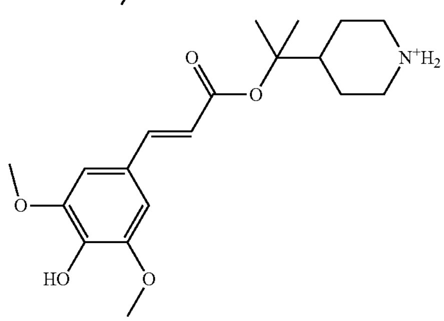
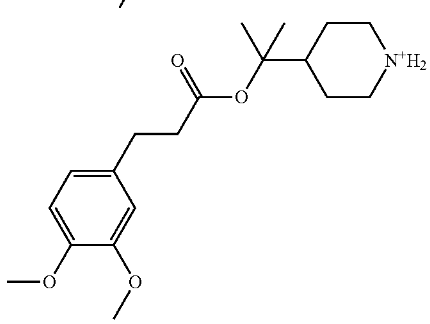
-continued
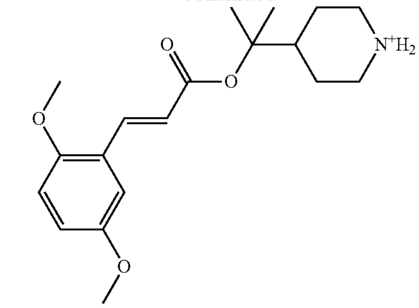
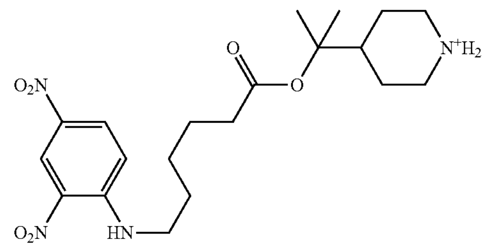
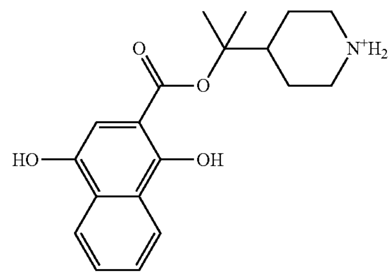
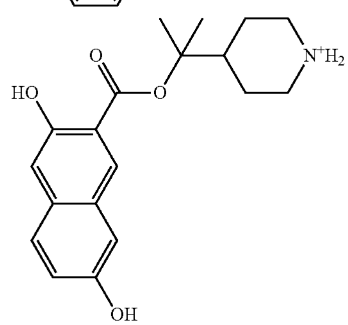
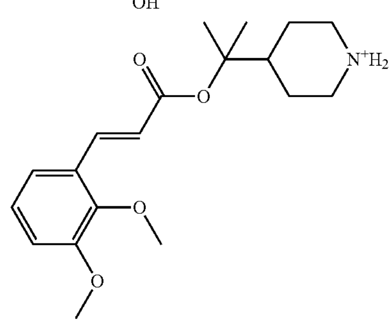
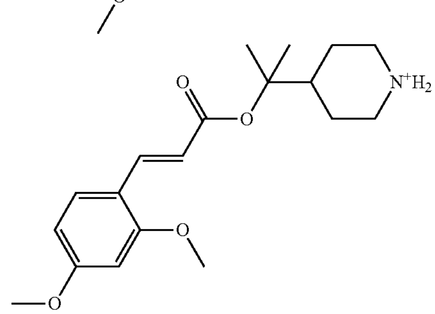

-continued
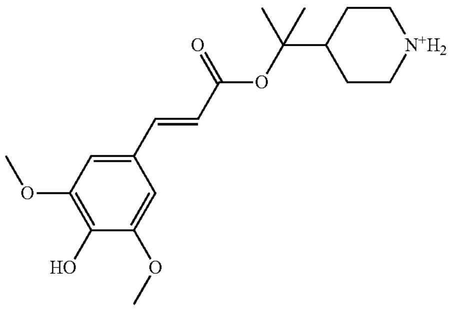
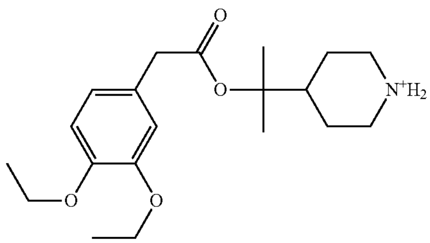
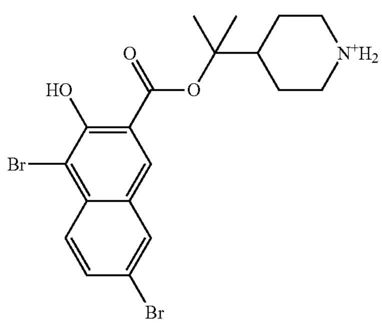
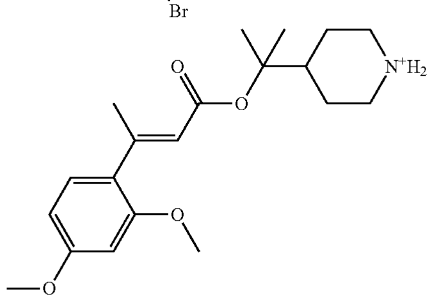
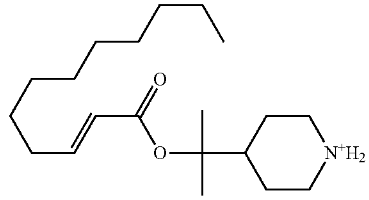
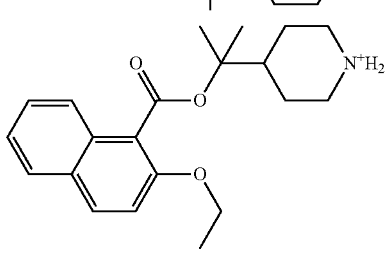
-continued
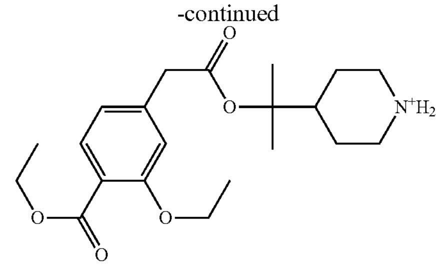
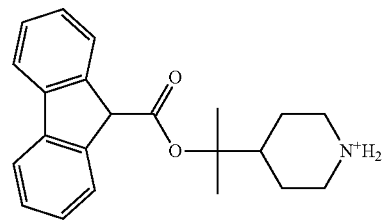
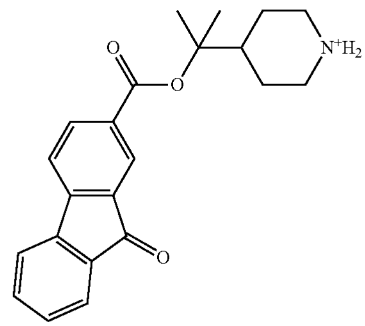
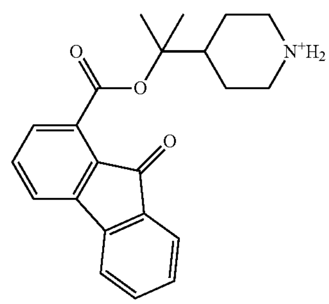
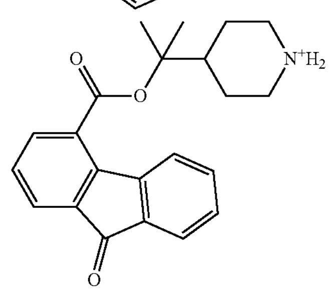
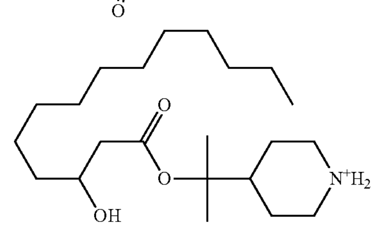

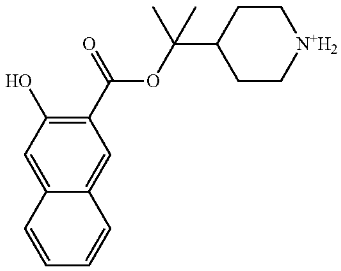
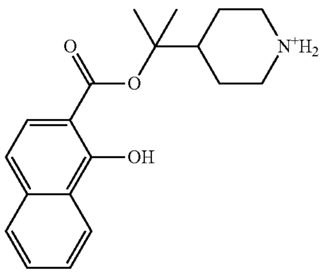
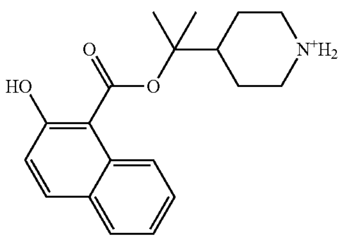
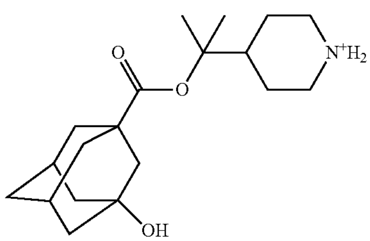
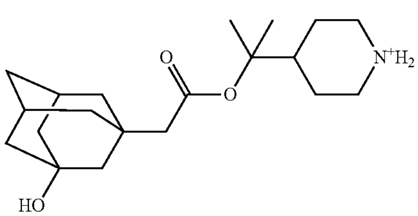
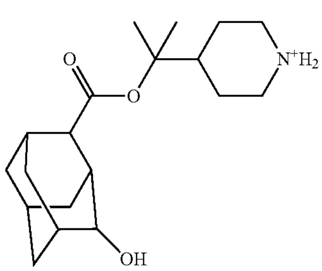
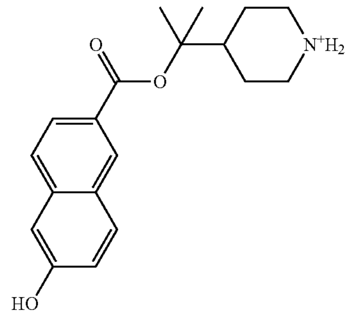
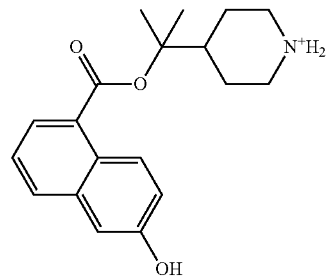
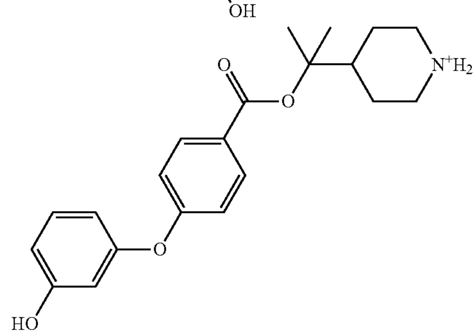
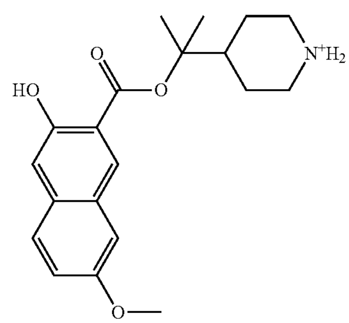
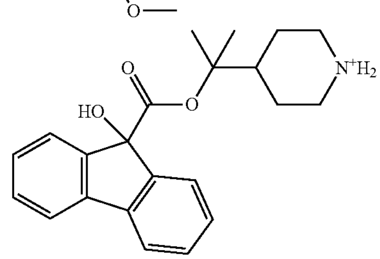
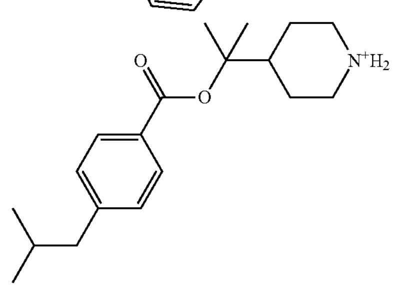

-continued
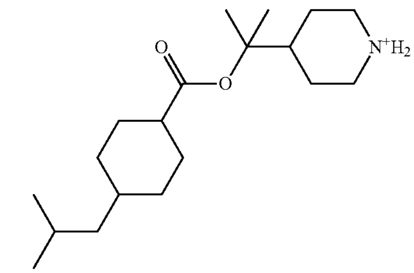
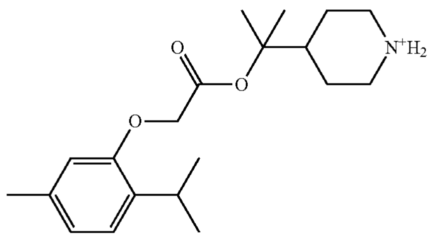
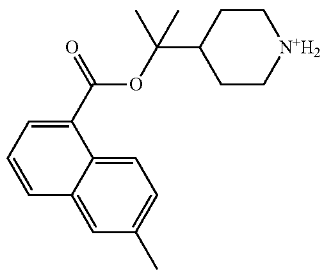
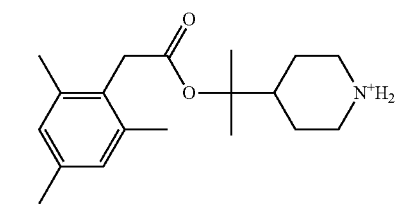
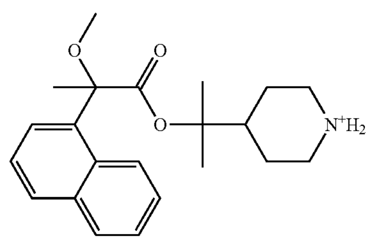
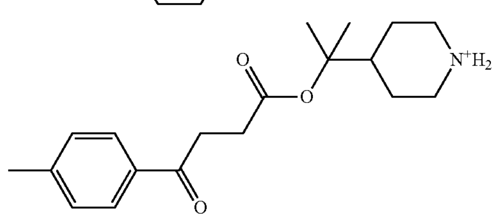
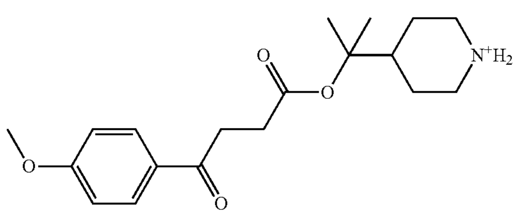
-continued
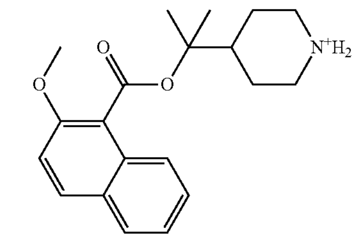
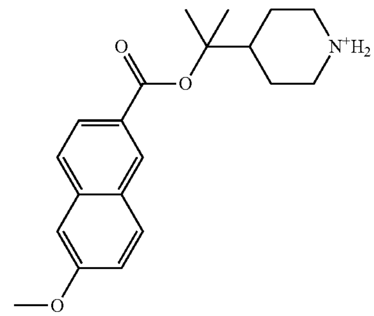
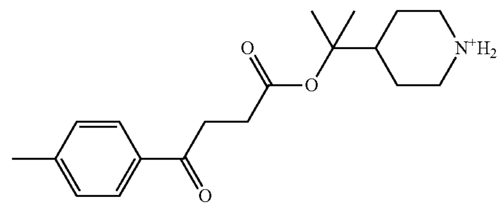
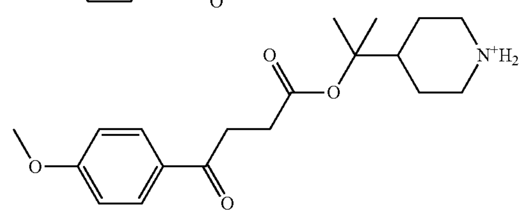
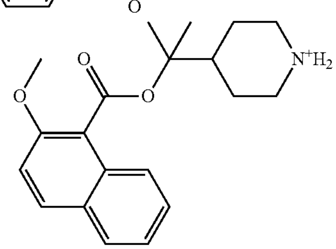
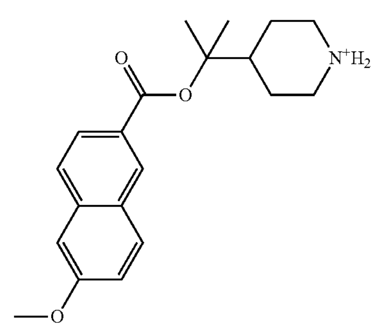

-continued
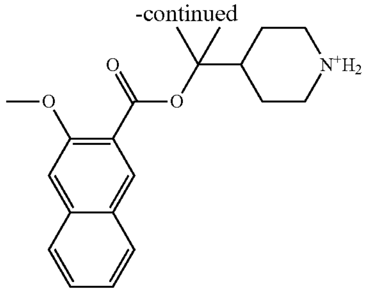
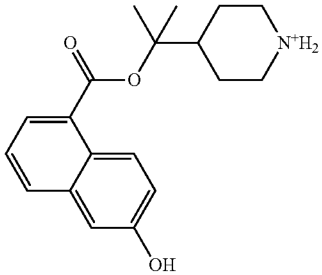
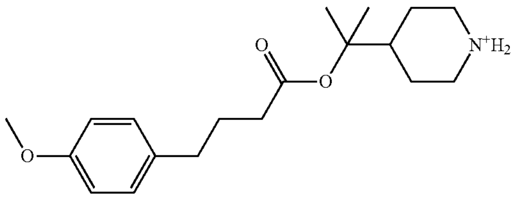
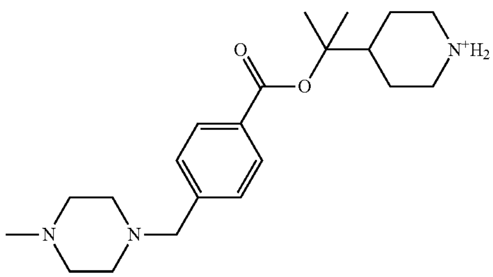
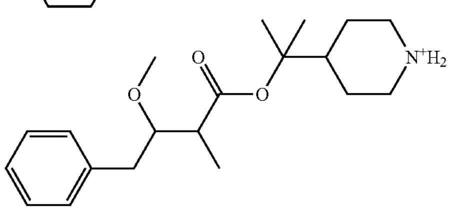
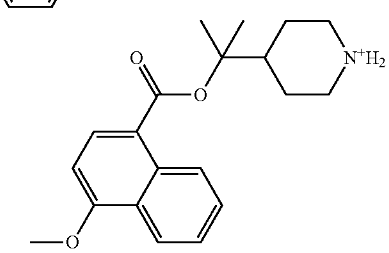
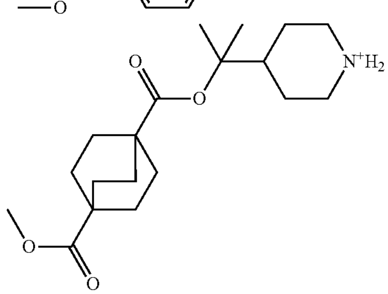
-continued
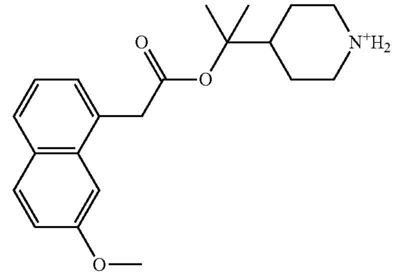
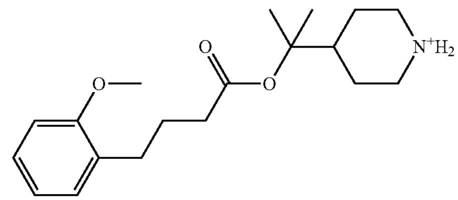
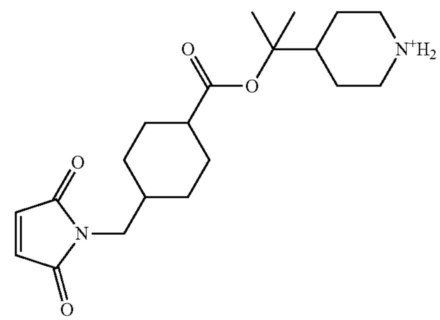
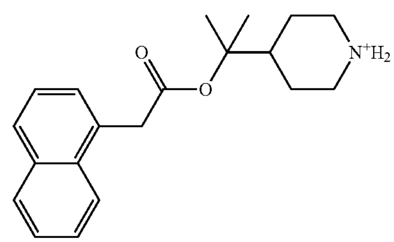
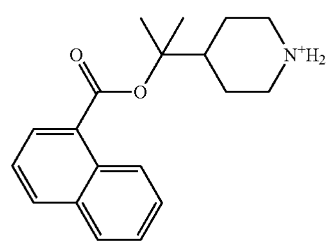
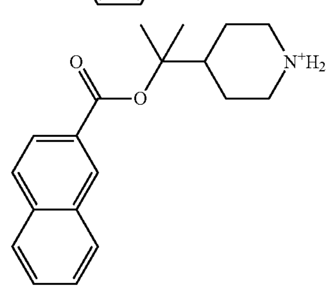

-continued
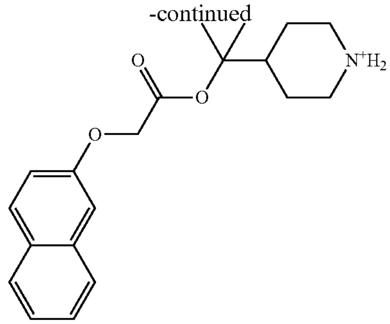
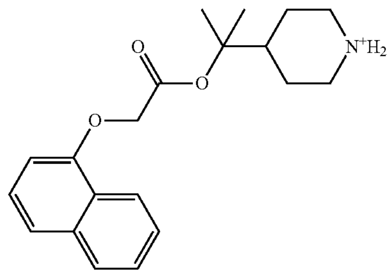
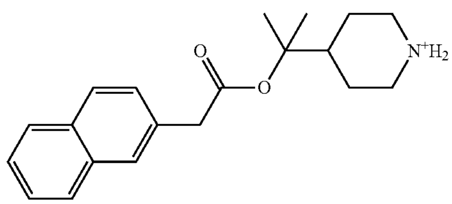
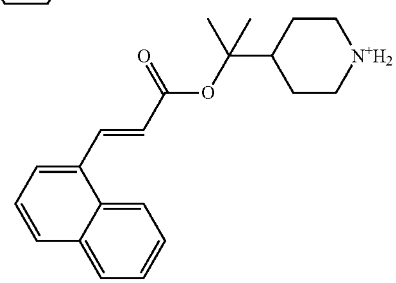
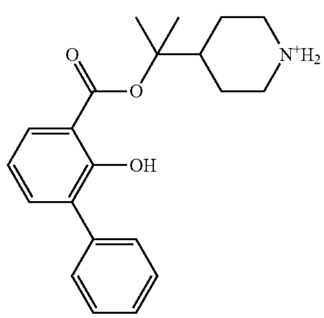
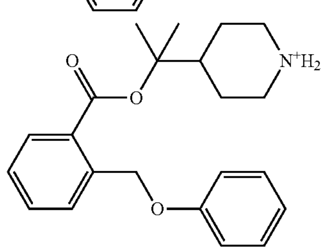
-continued
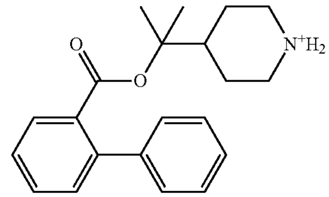
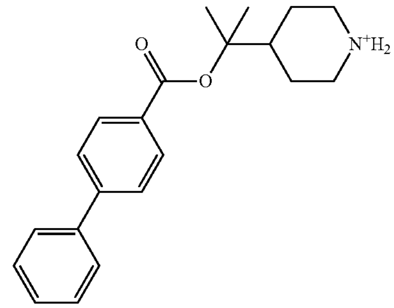
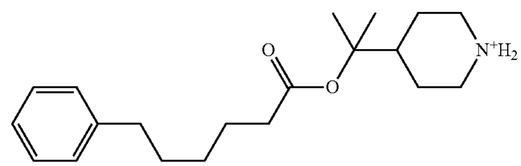
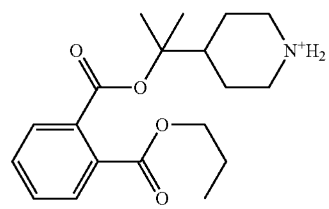
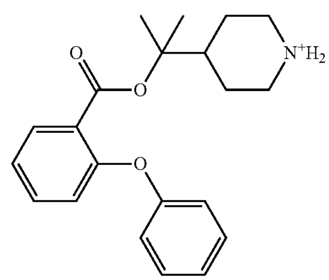
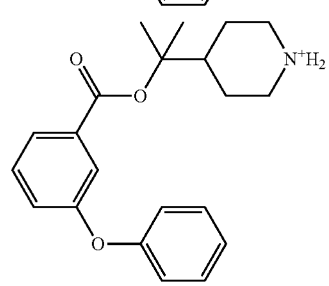
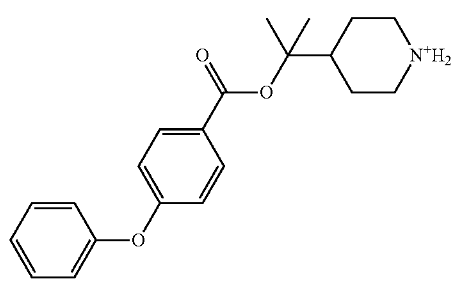

-continued
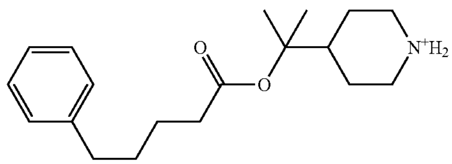
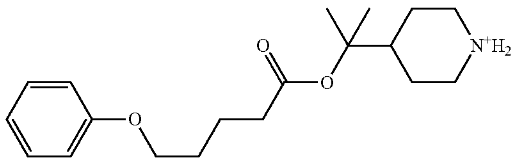
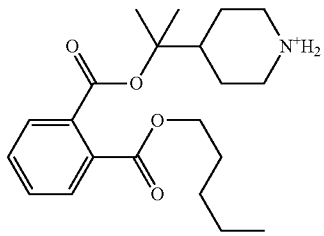
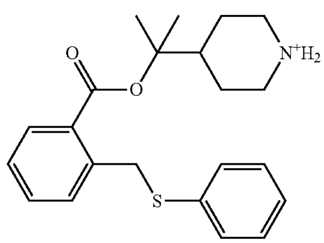
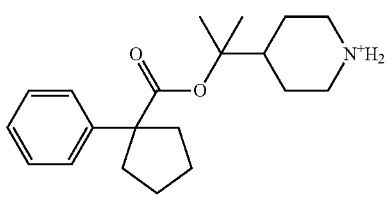
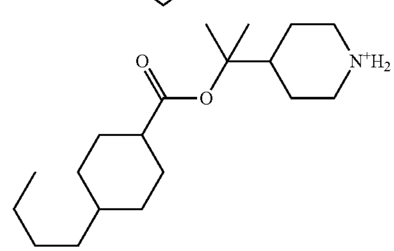
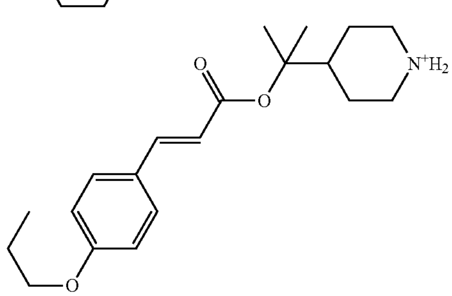
-continued
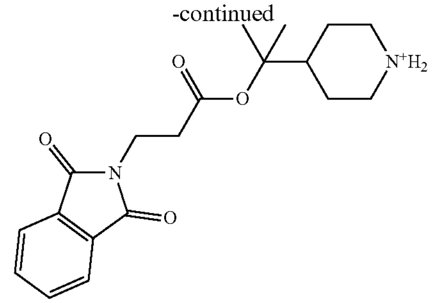
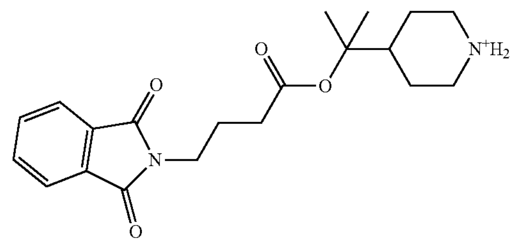
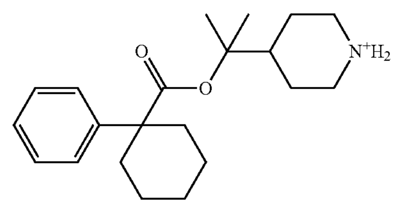
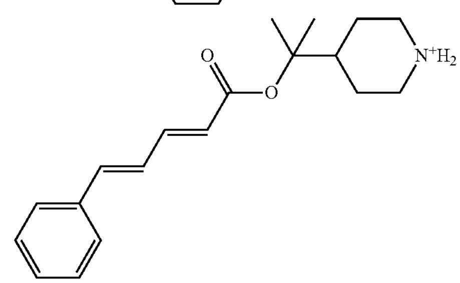
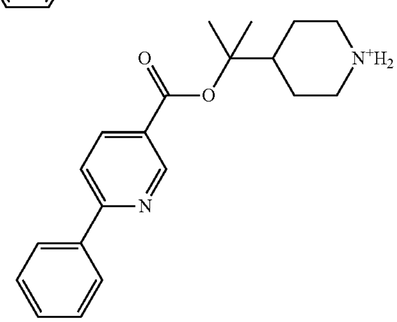
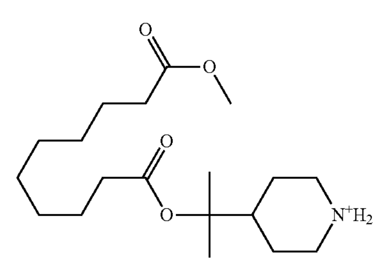

-continued
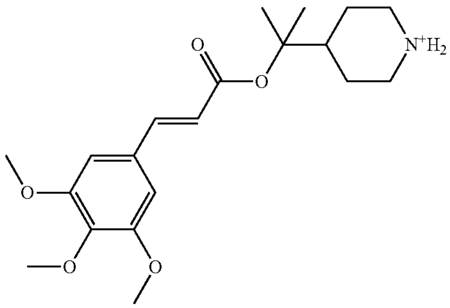
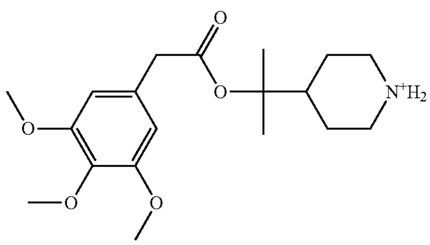
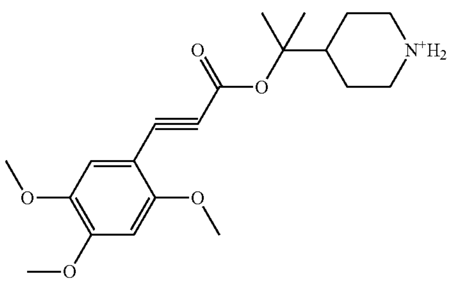
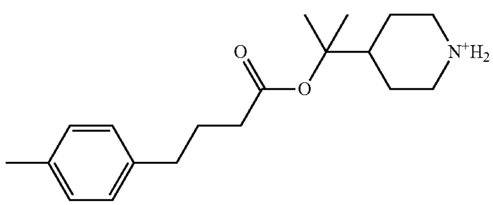
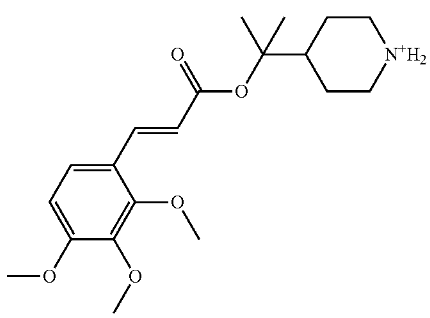
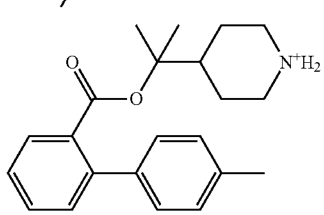
-continued
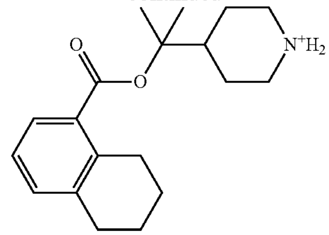
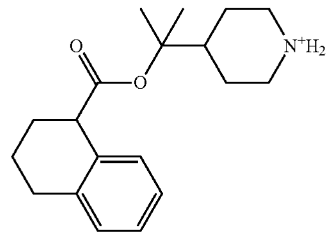
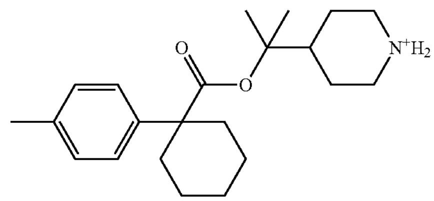
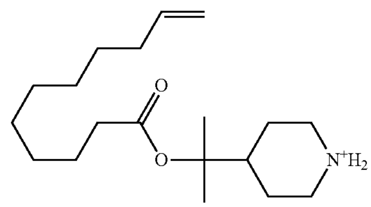
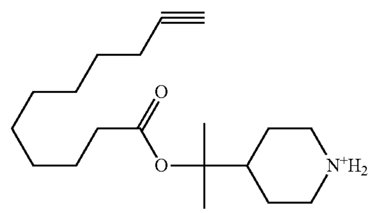
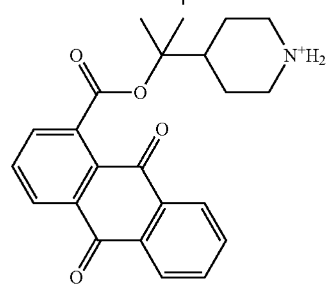
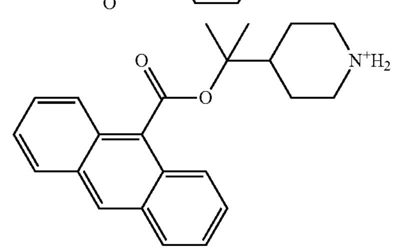

-continued
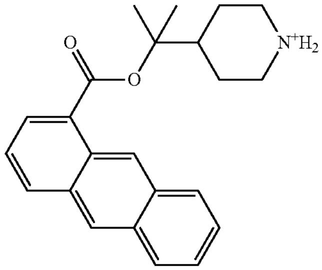
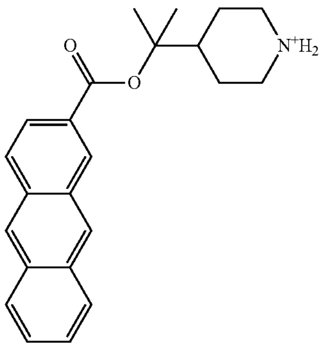
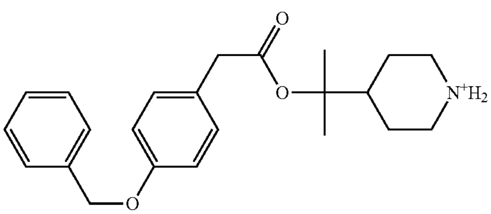
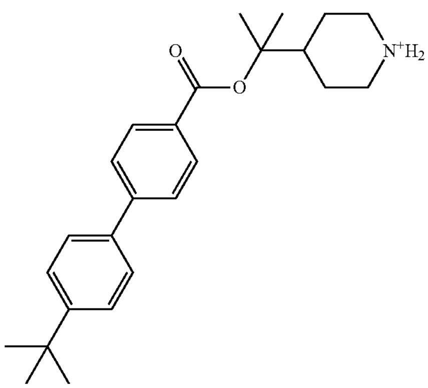
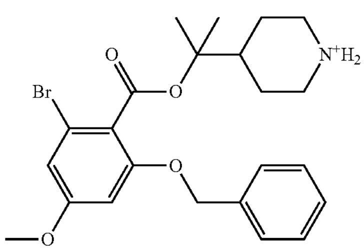
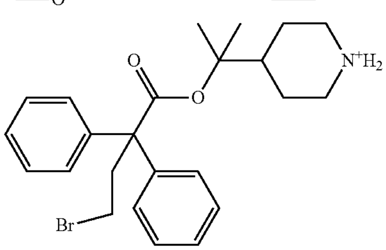
-continued
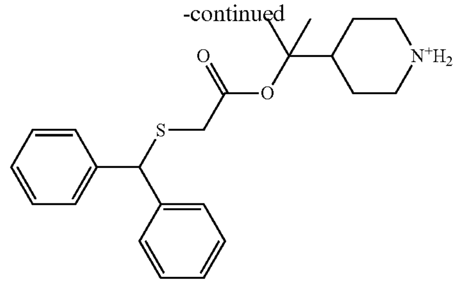
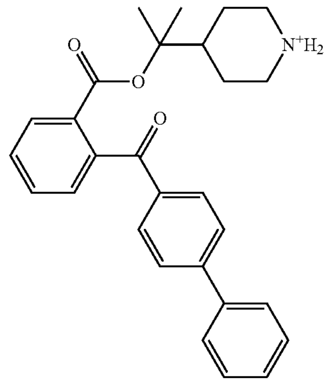
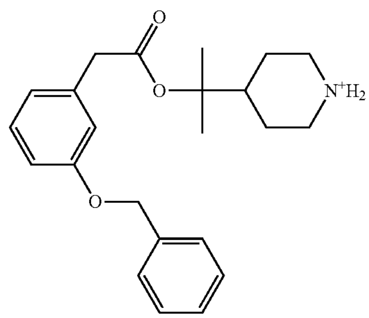
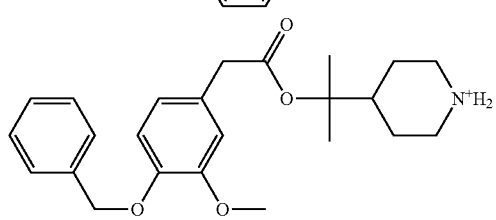
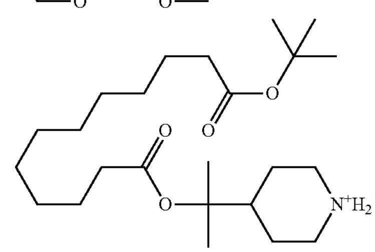
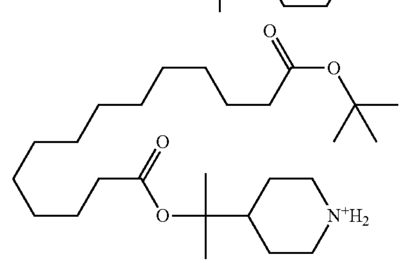

-continued
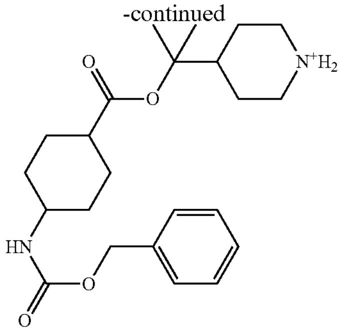
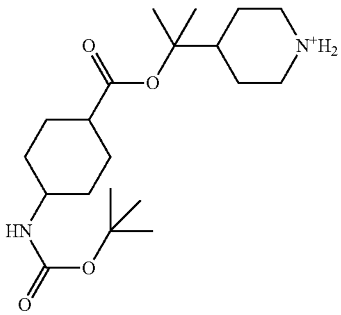
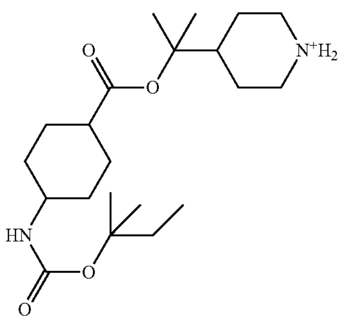
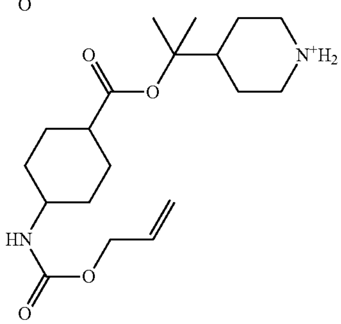
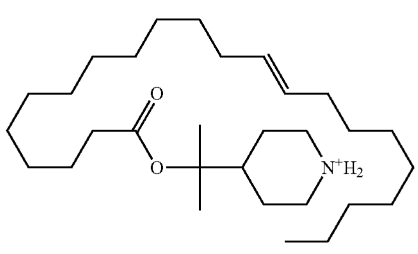
-continued
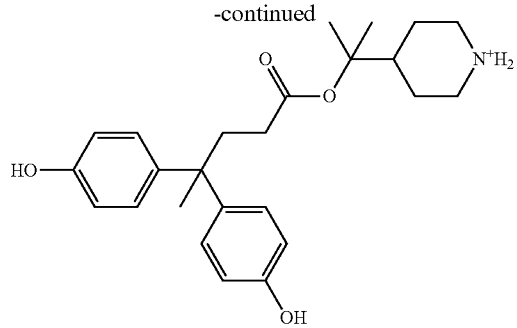
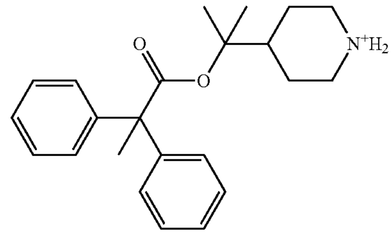
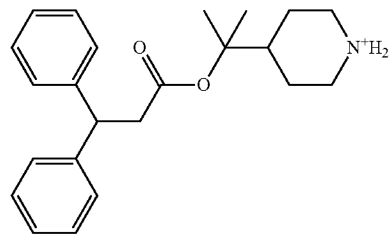
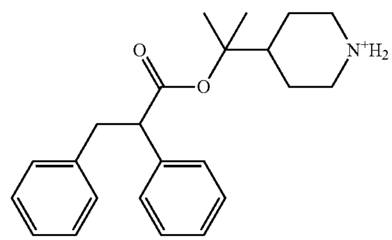
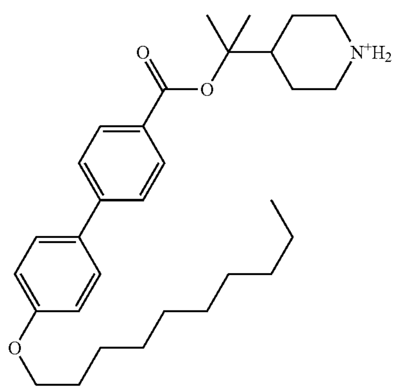
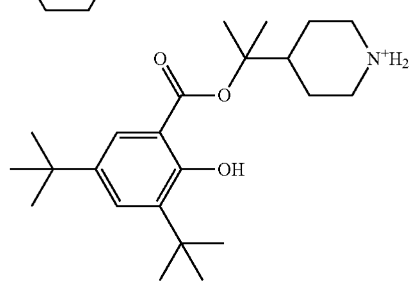

-continued
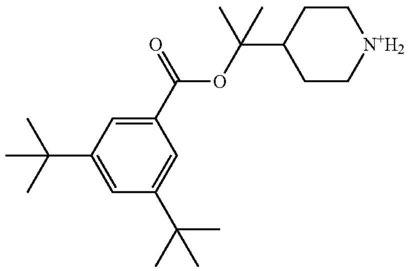
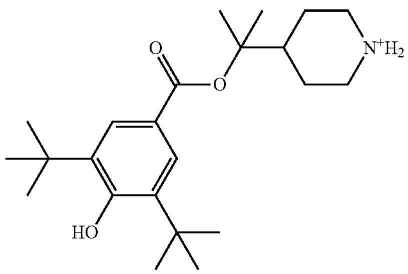
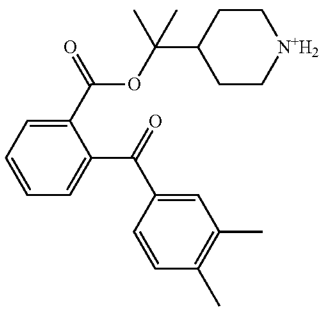
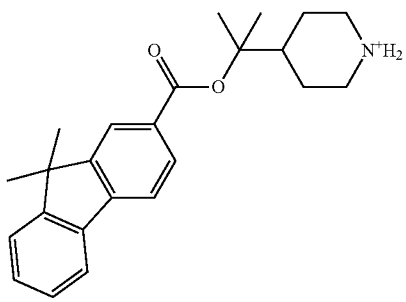
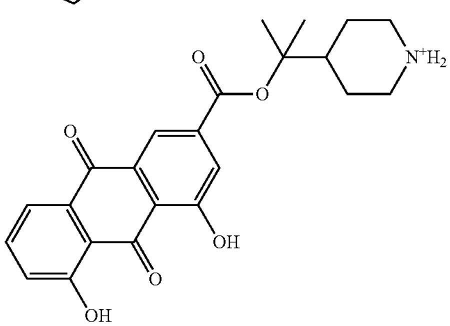
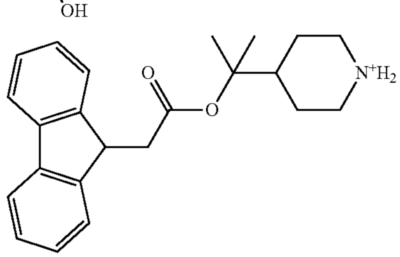
-continued
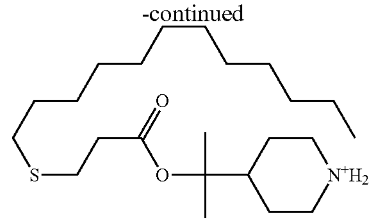
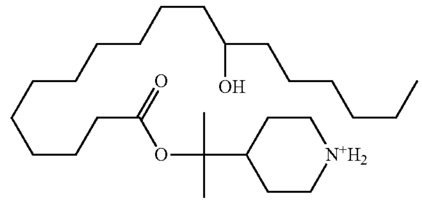
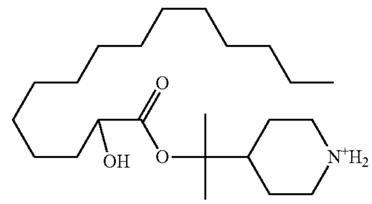
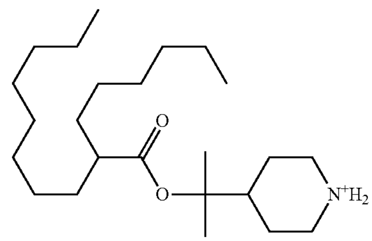
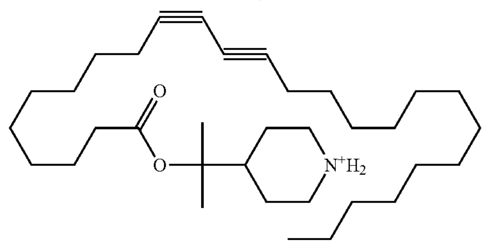
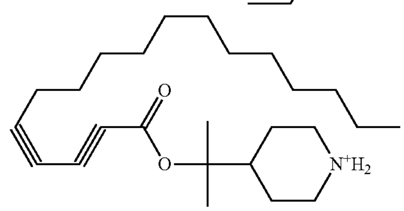
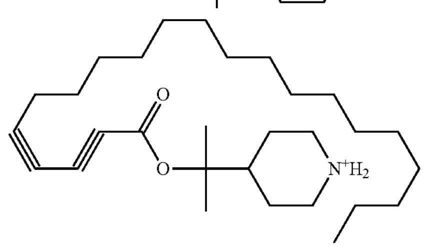
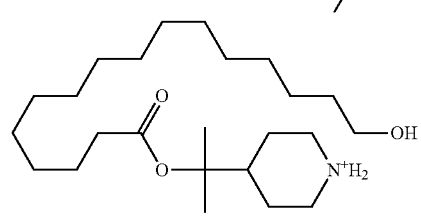

-continued
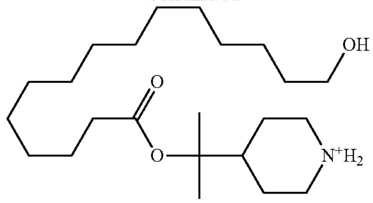
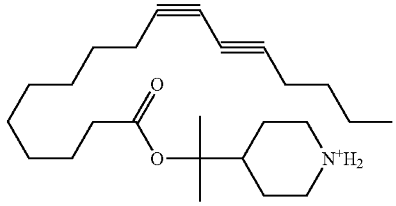
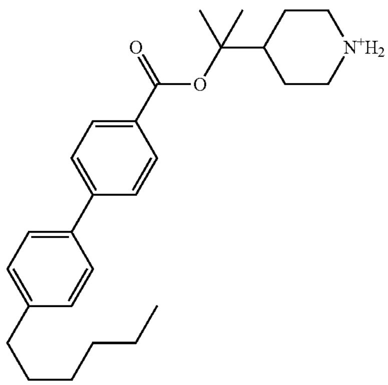
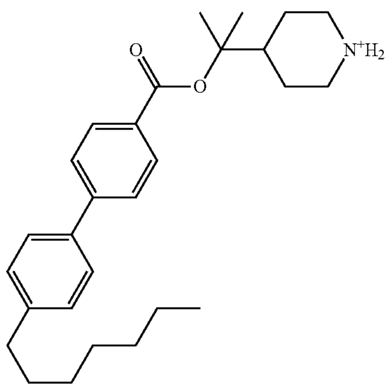
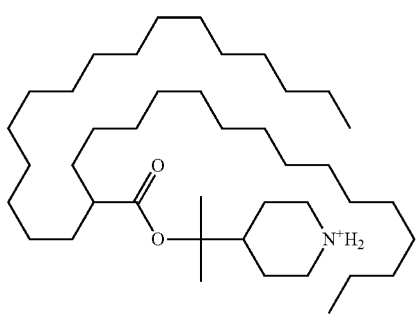
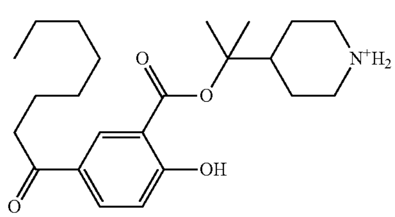
-continued
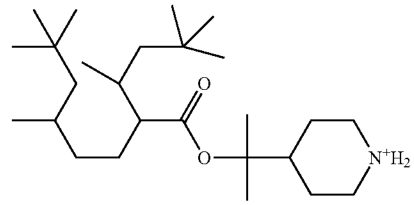
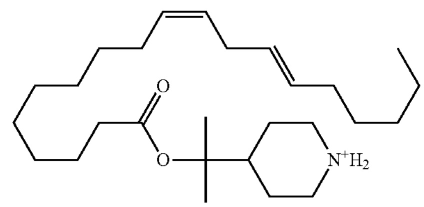
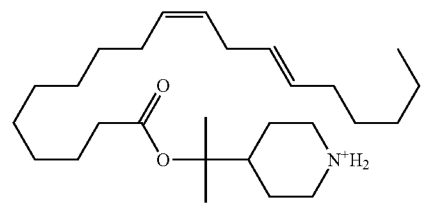
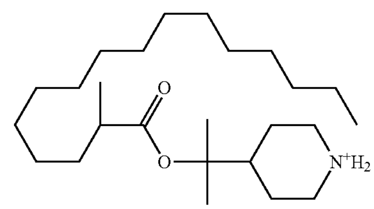
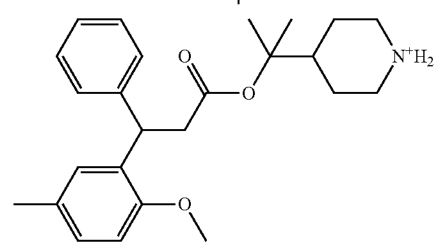
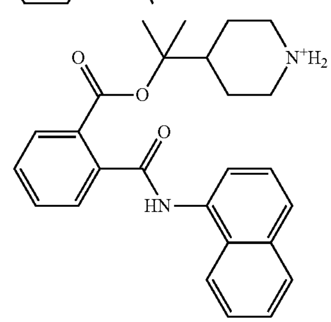
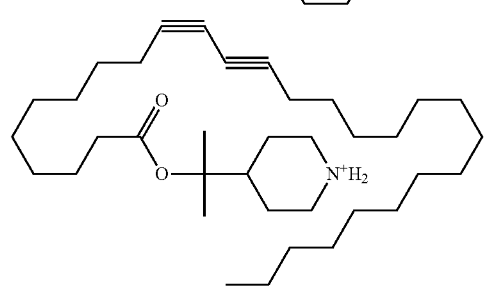

-continued
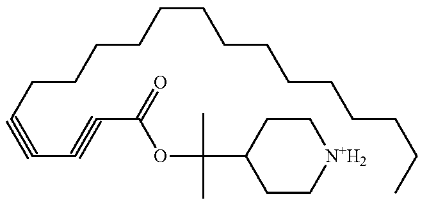
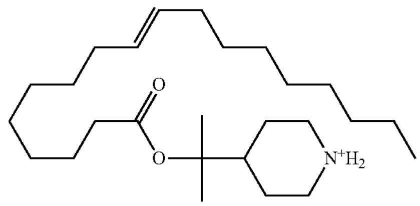
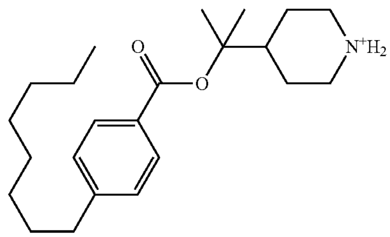
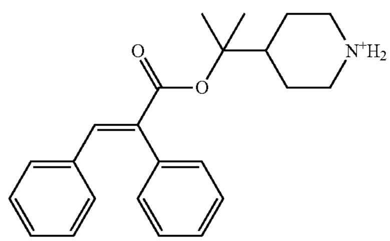
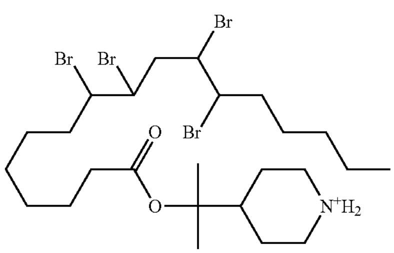
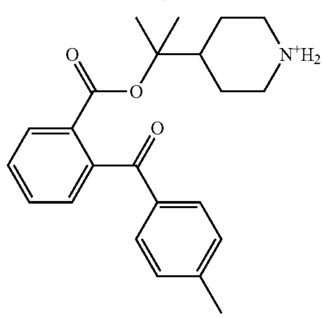
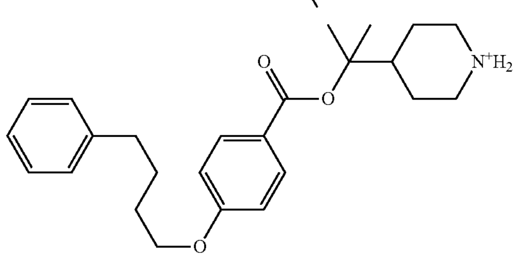
-continued
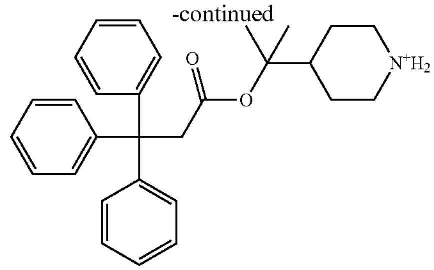
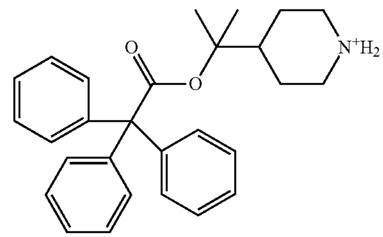
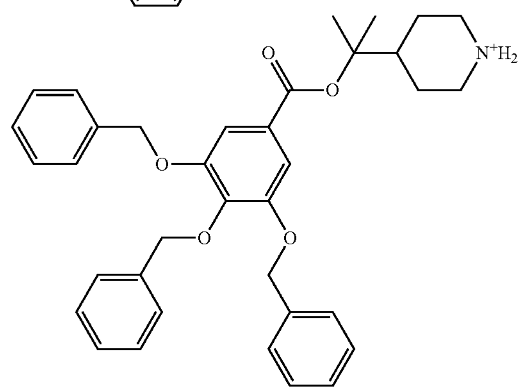
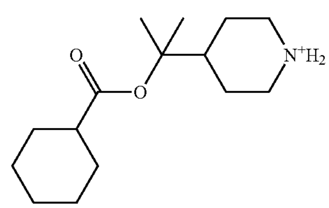
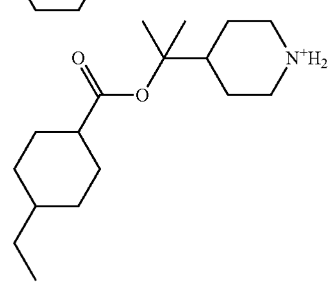
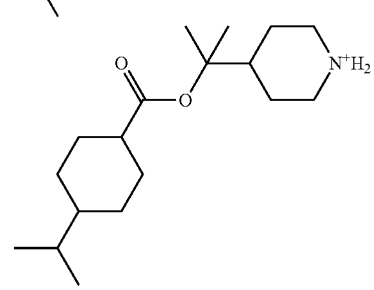

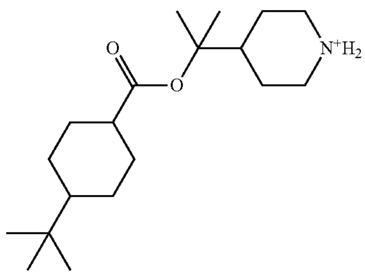
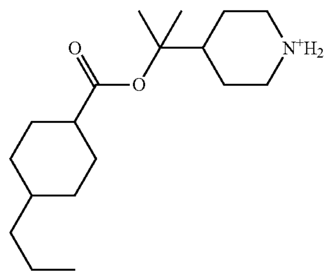
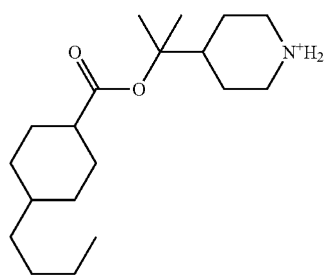
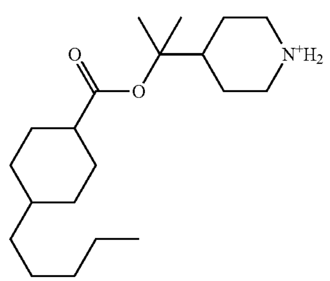
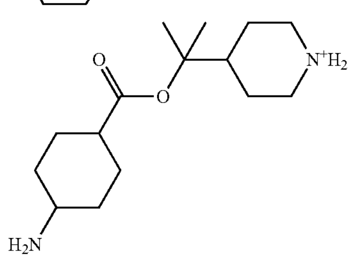
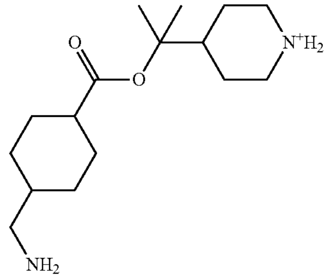
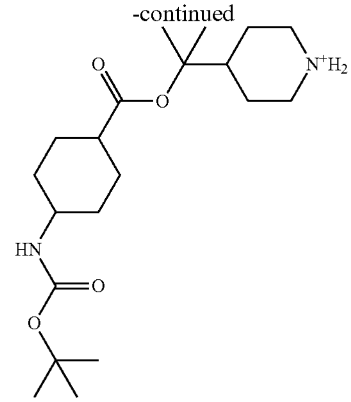
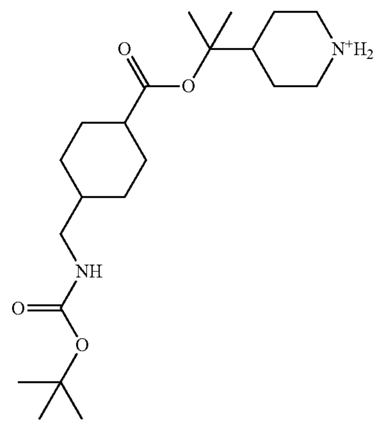
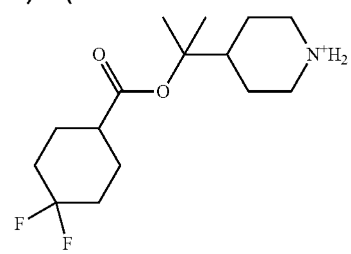
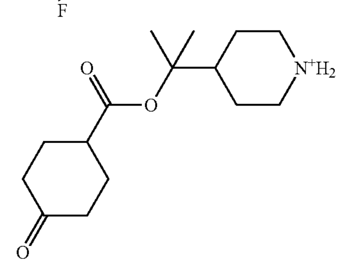
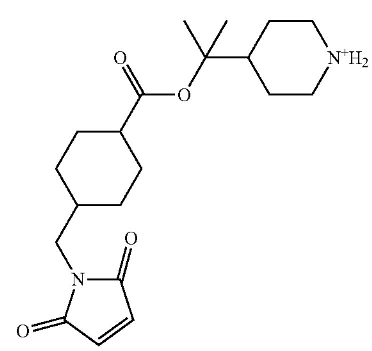

-continued
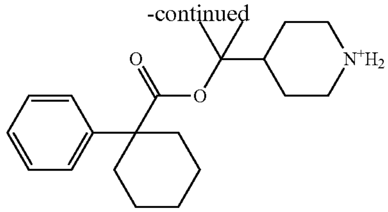
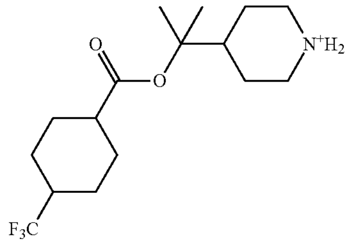
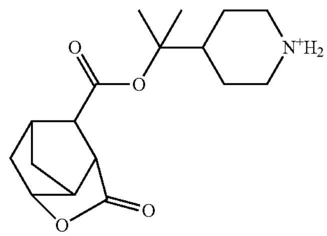
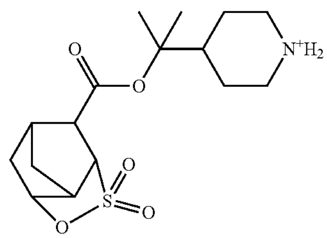
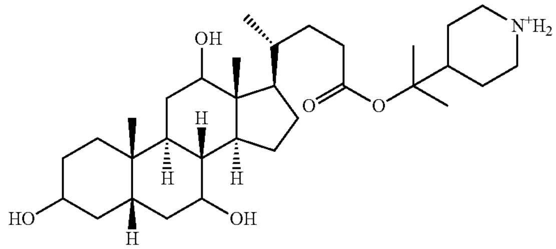
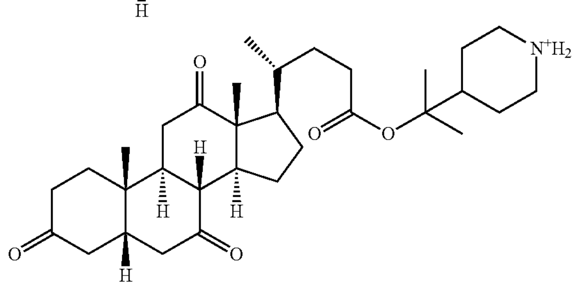
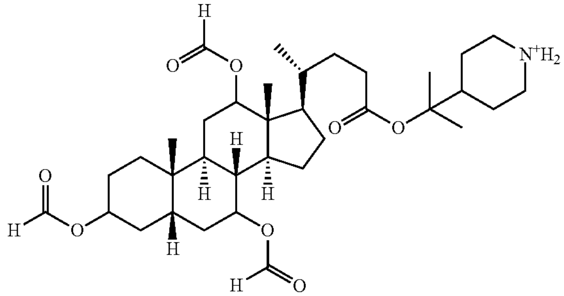
-continued
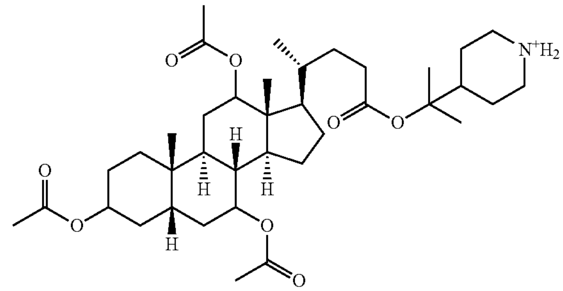
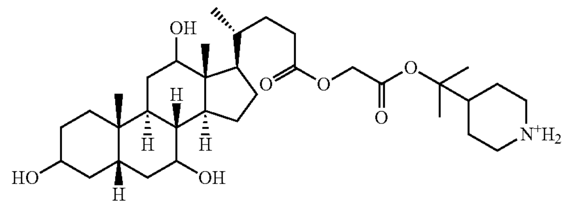
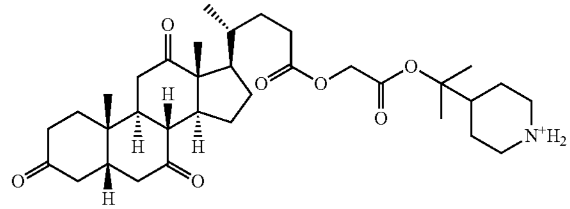
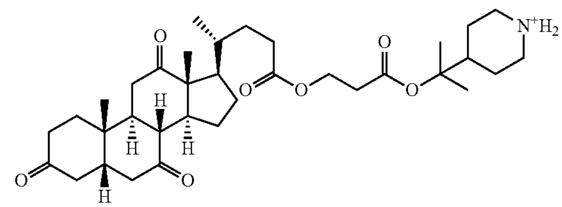
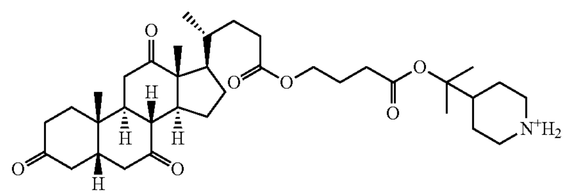
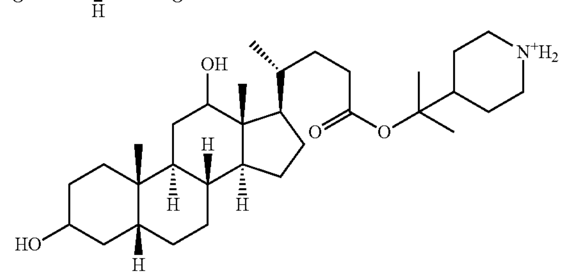
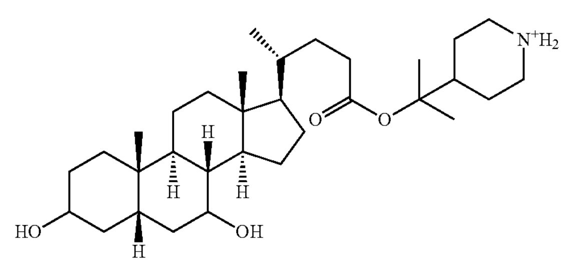

-continued
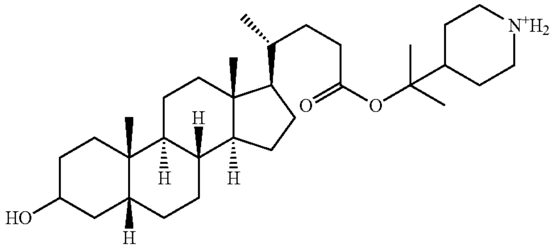
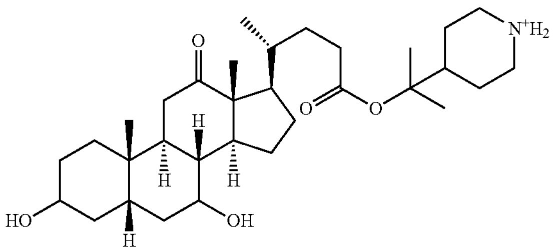
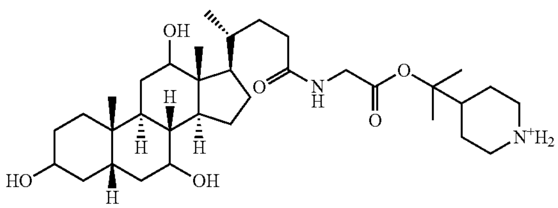
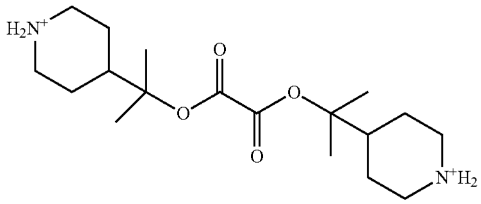
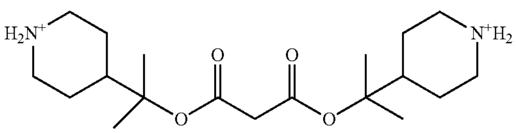
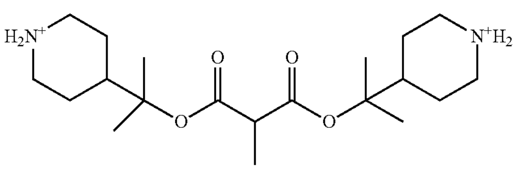
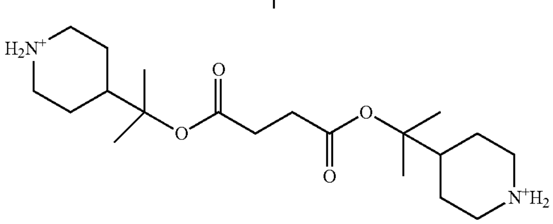
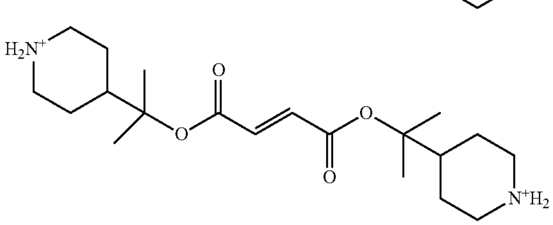
-continued
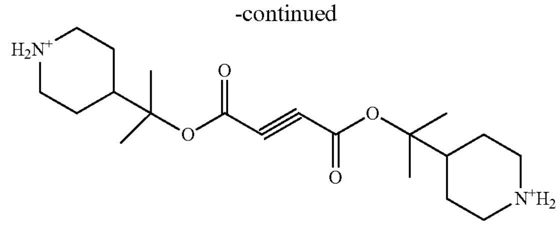
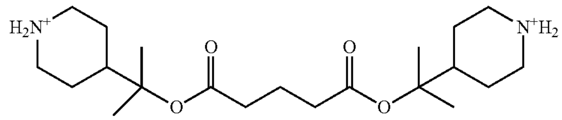
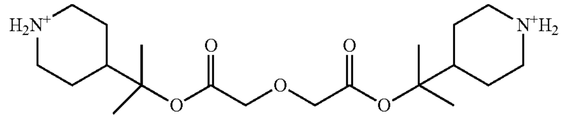
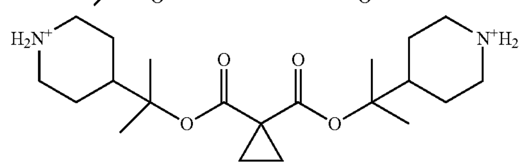
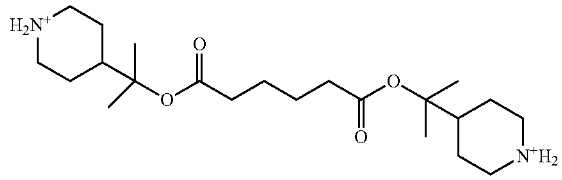
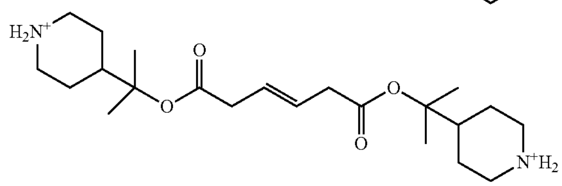
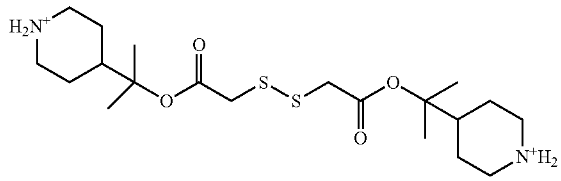
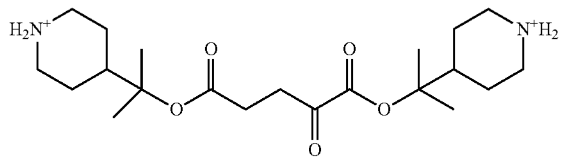
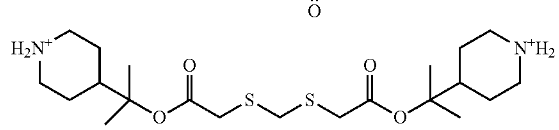
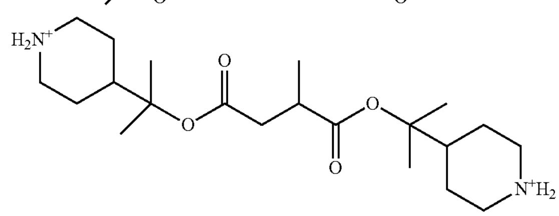
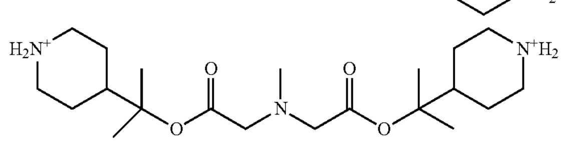

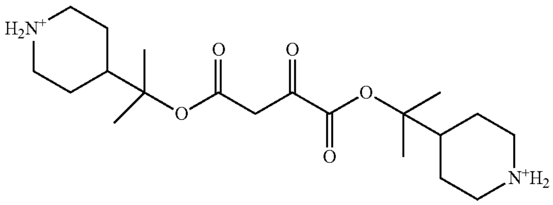
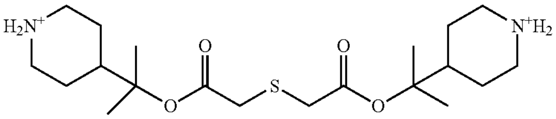
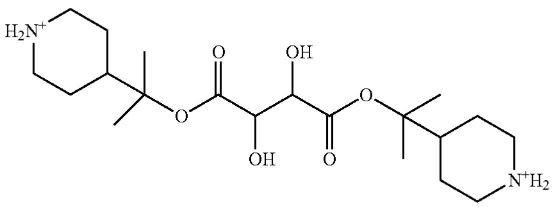
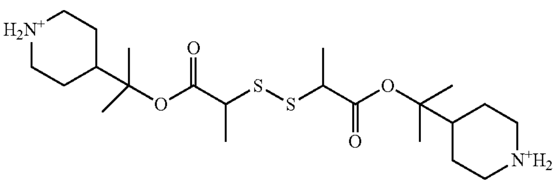
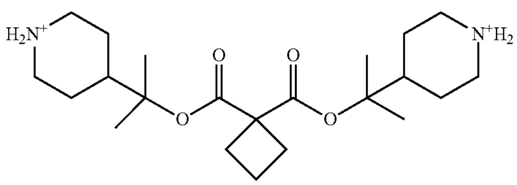
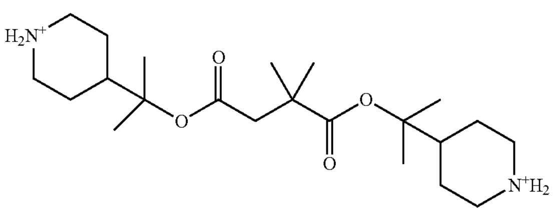
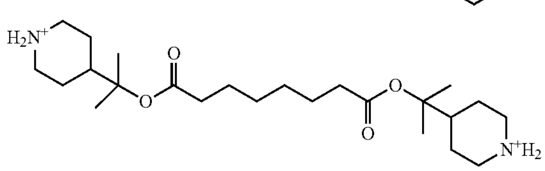
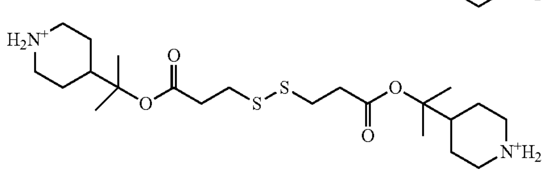
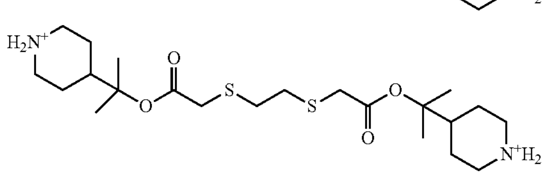
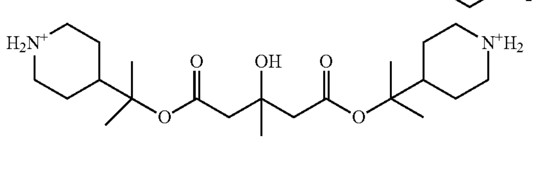
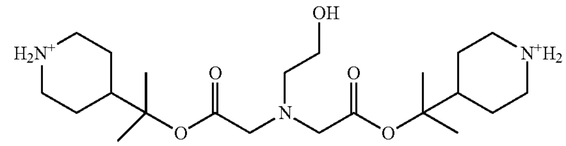
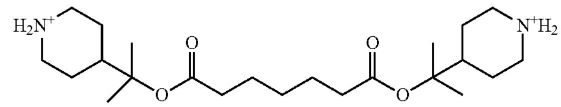
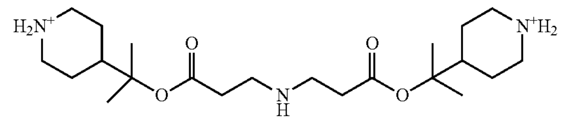
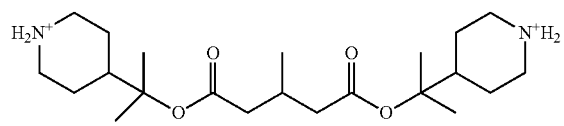
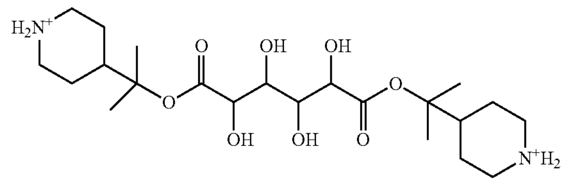
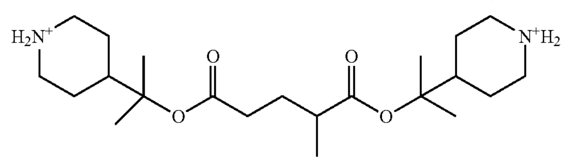
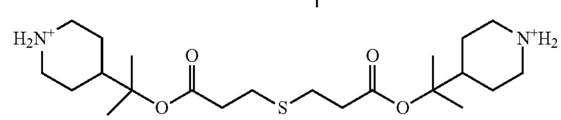
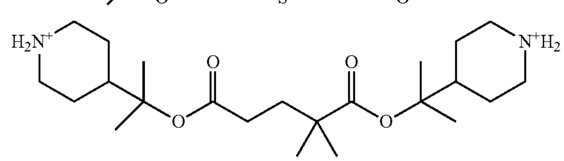
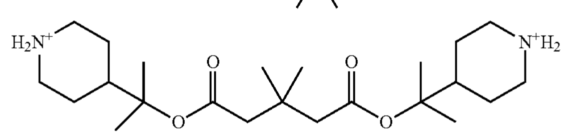
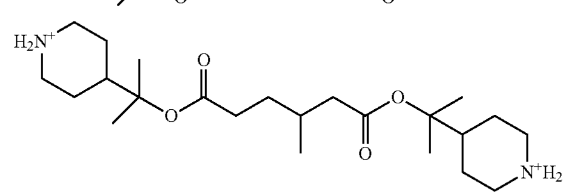

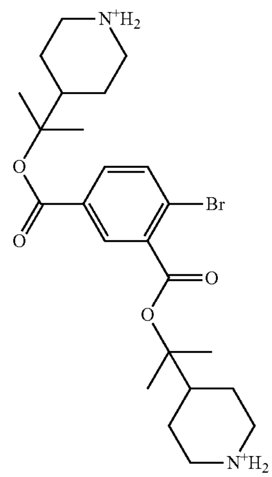
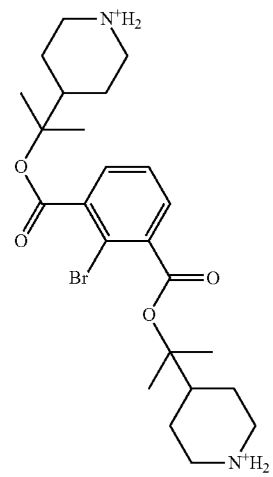
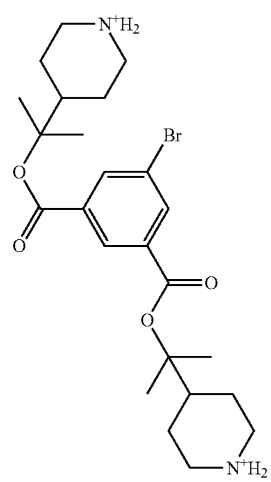
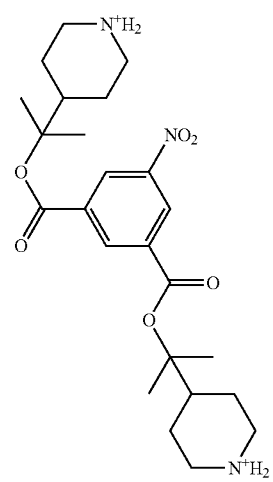
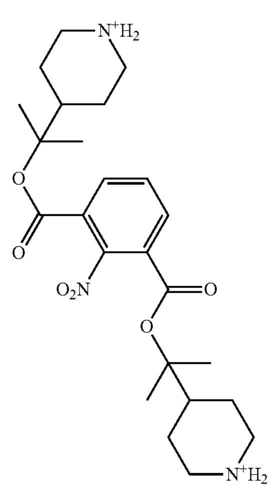
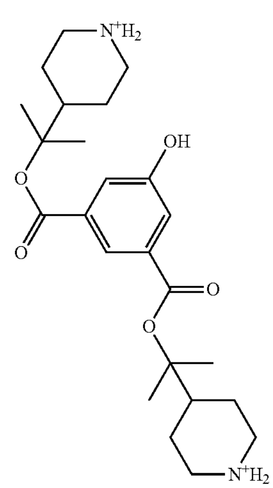
-continued
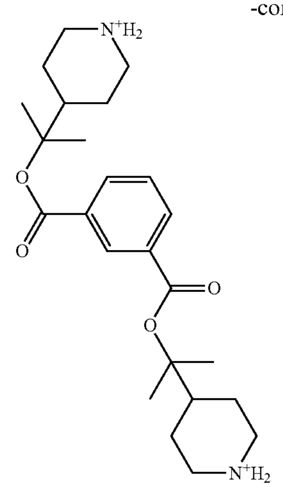
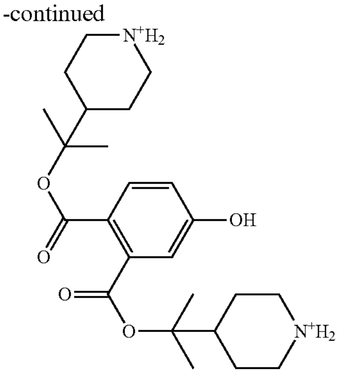
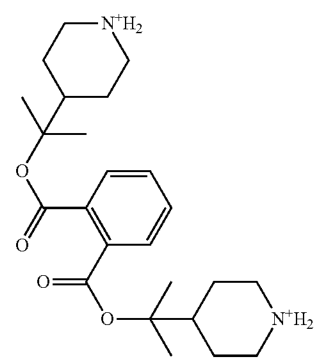
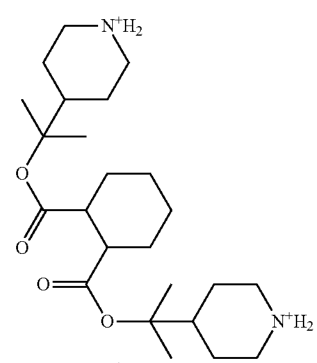
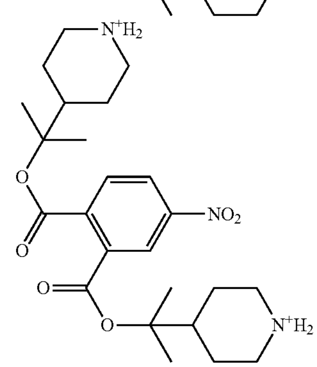

-continued
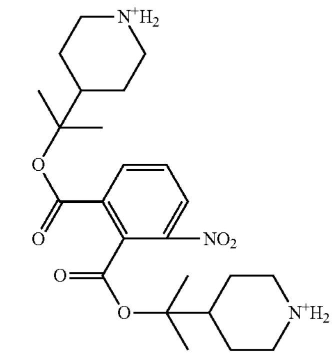
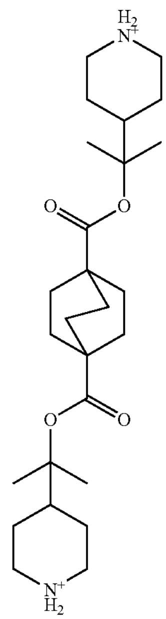
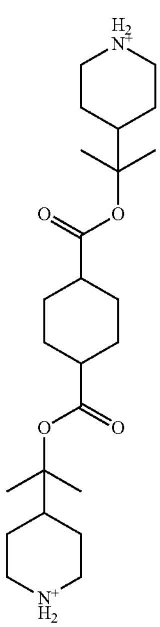
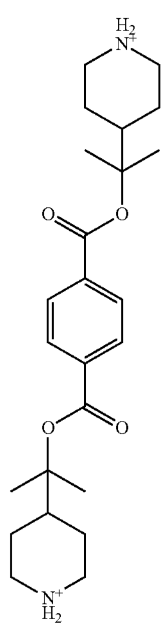
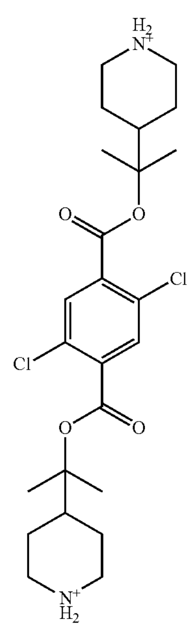
-continued
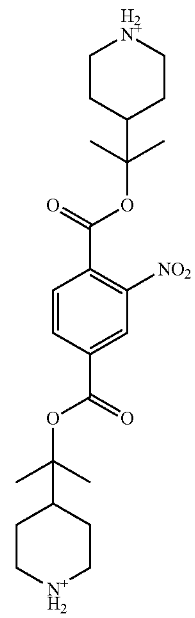
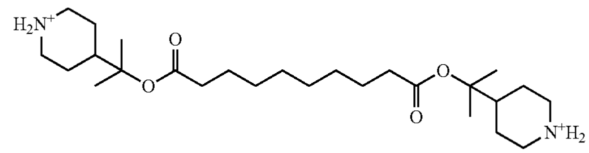
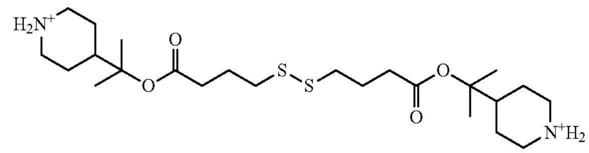
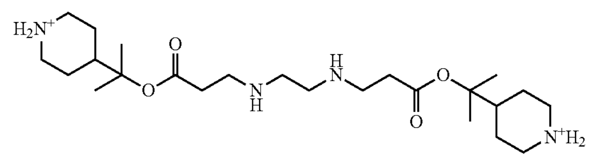
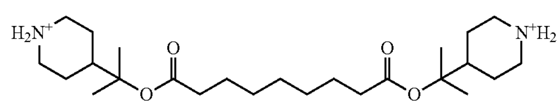
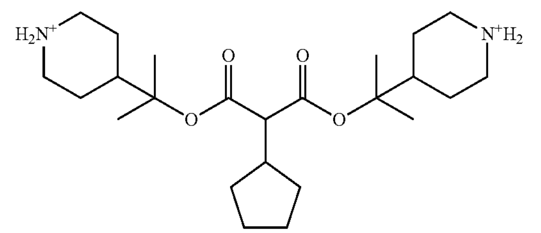
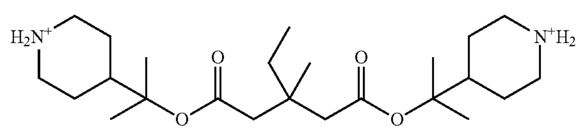
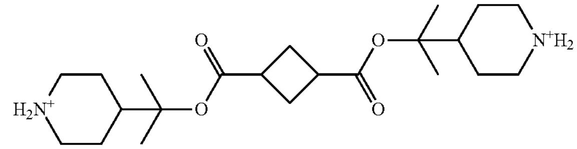

-continued
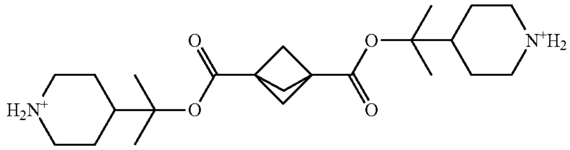
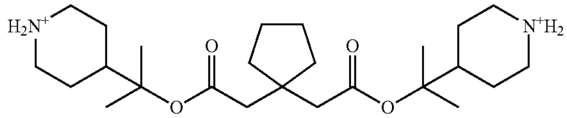
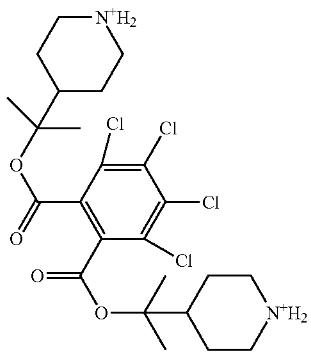
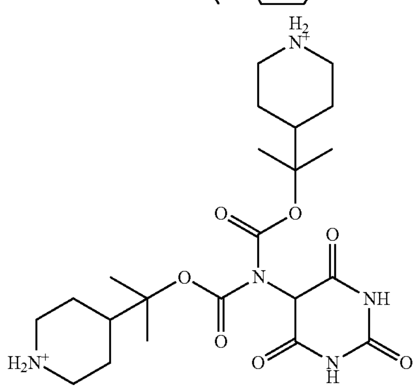
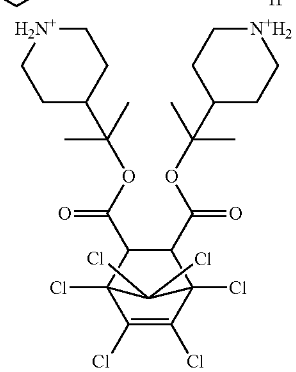
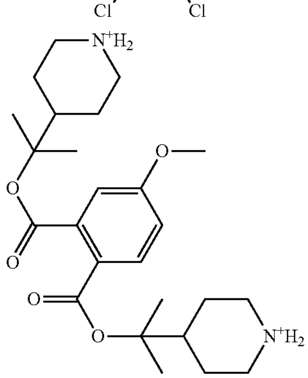
-continued
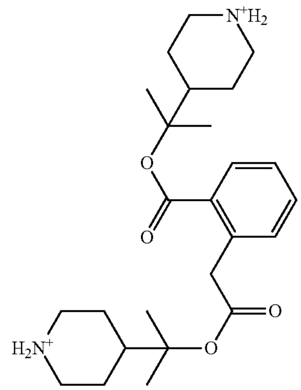
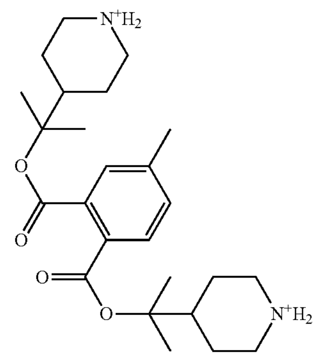
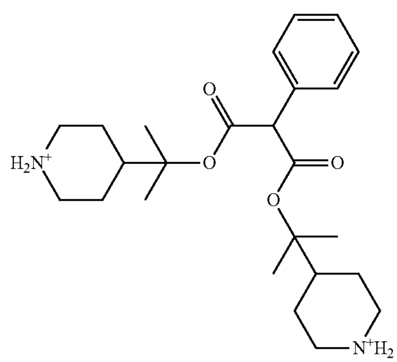
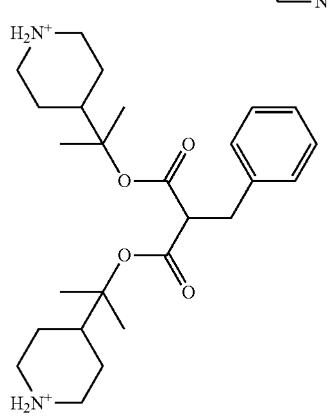

-continued
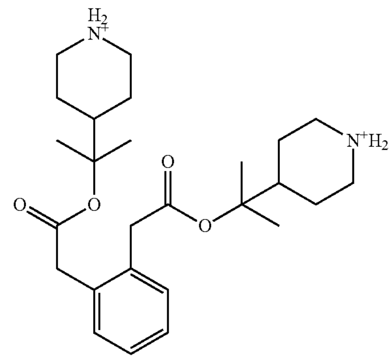
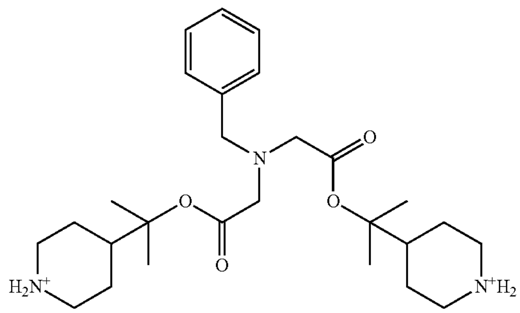
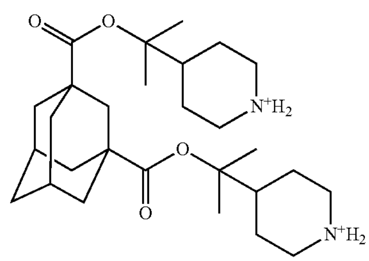
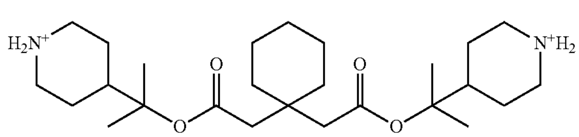
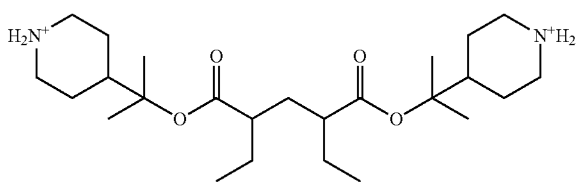
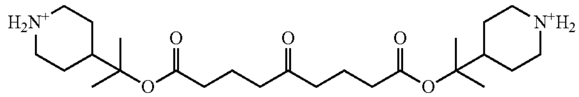
-continued
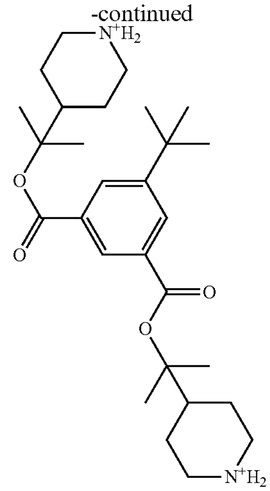
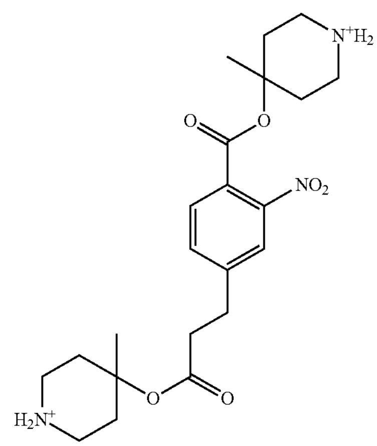
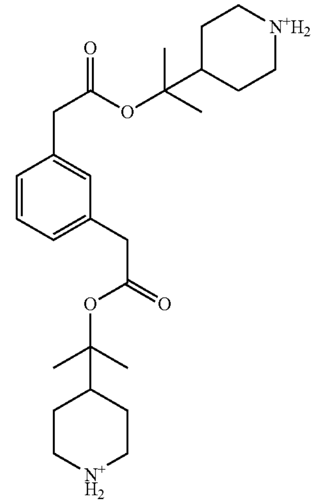

-continued
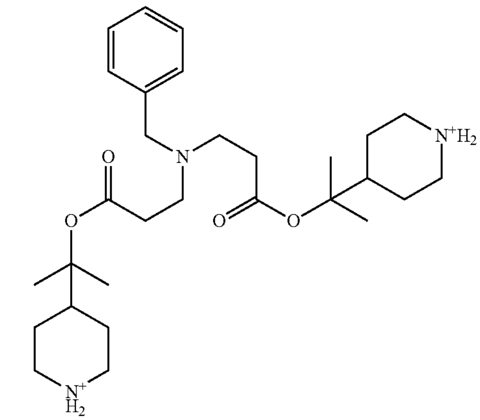
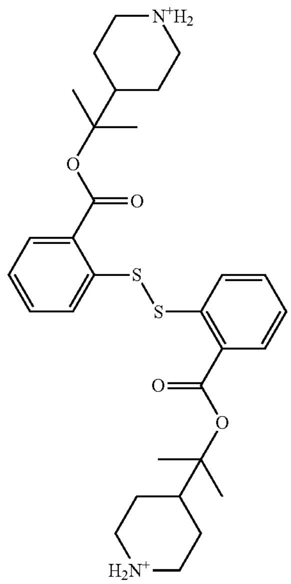
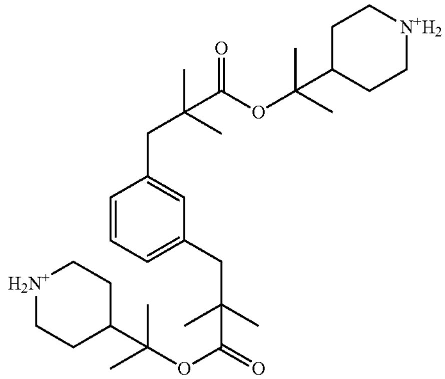
-continued
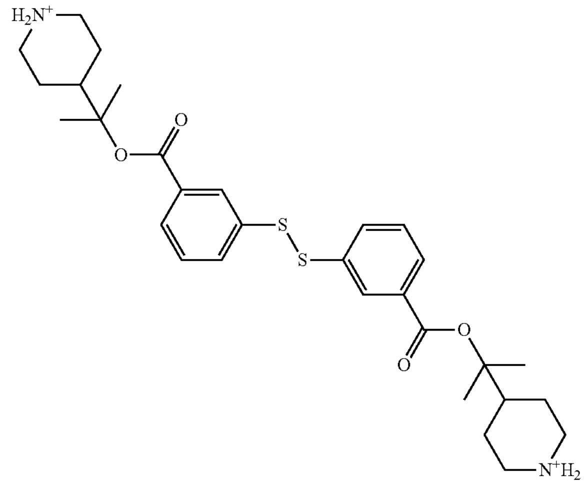
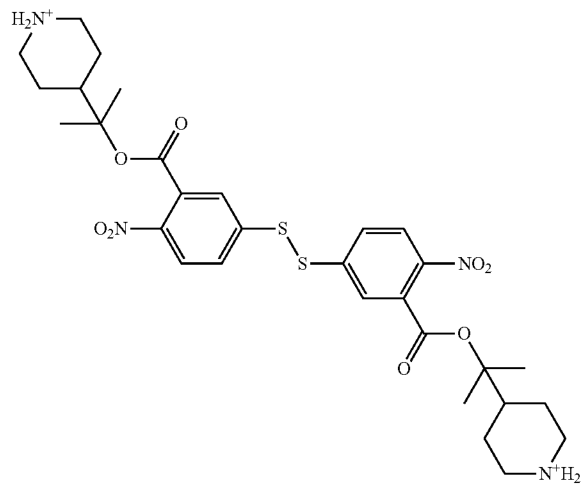
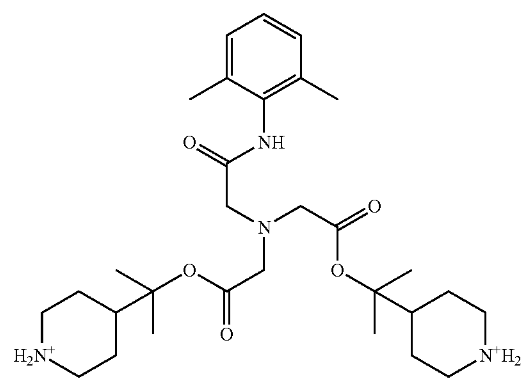
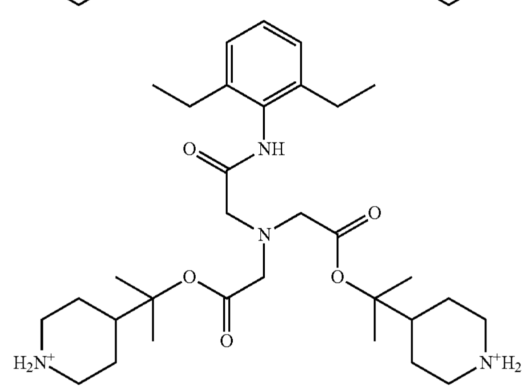

-continued
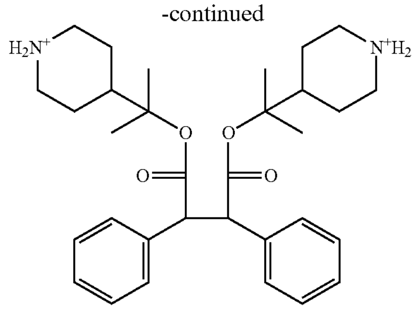
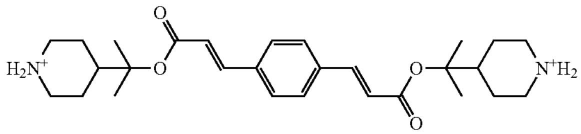
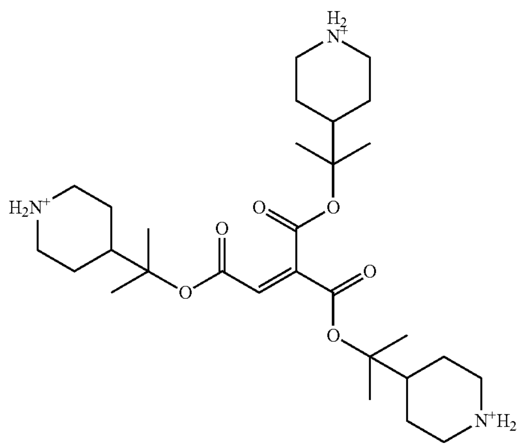
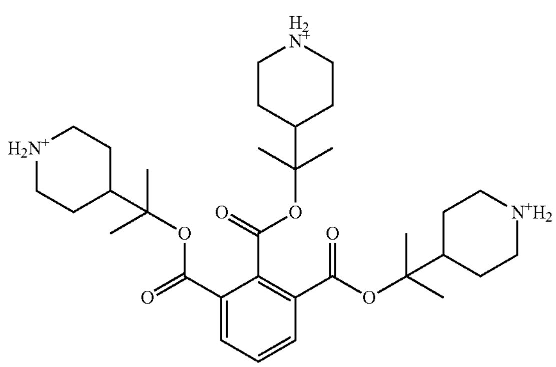
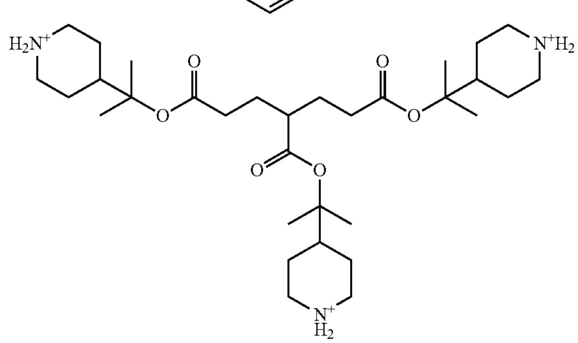
-continued
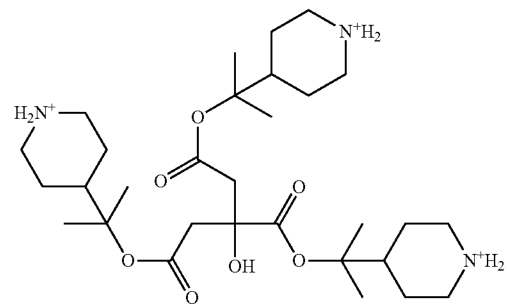
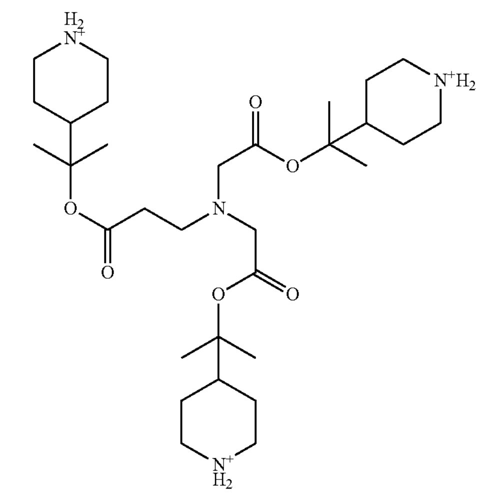
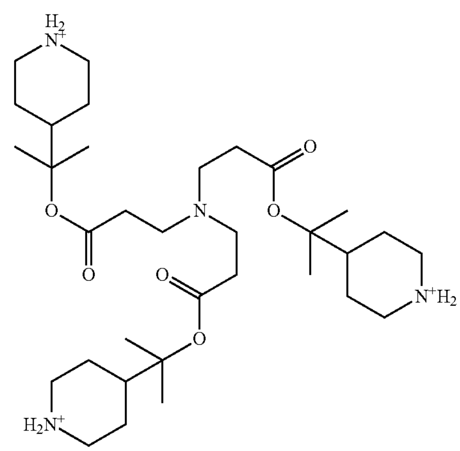
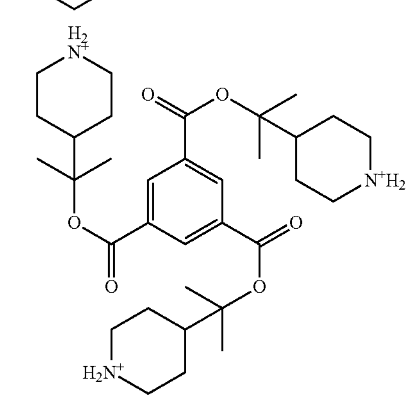

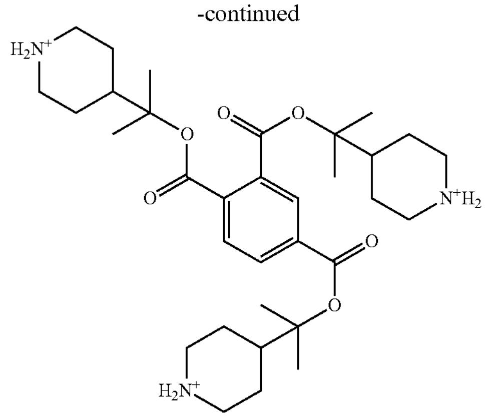
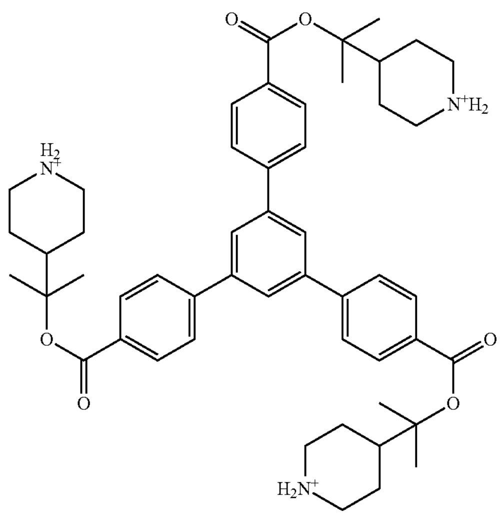
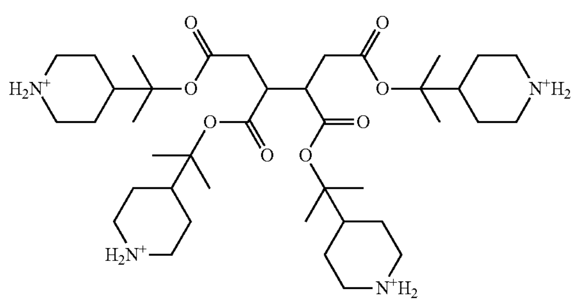
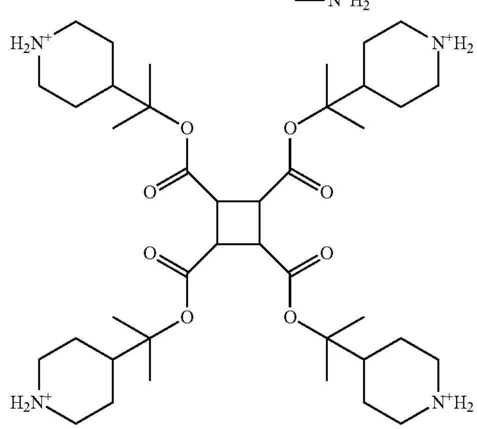
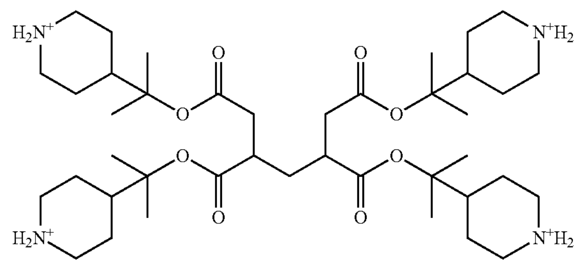
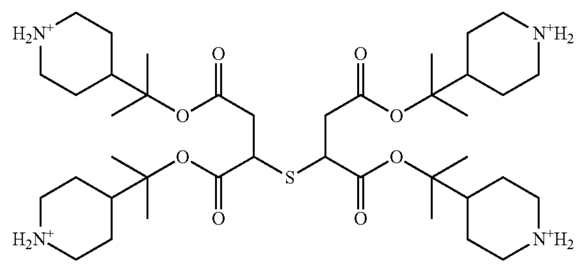
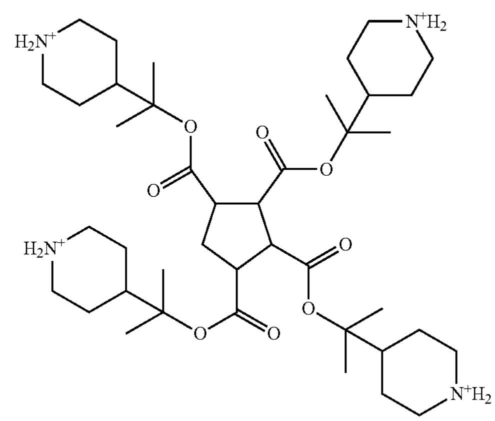
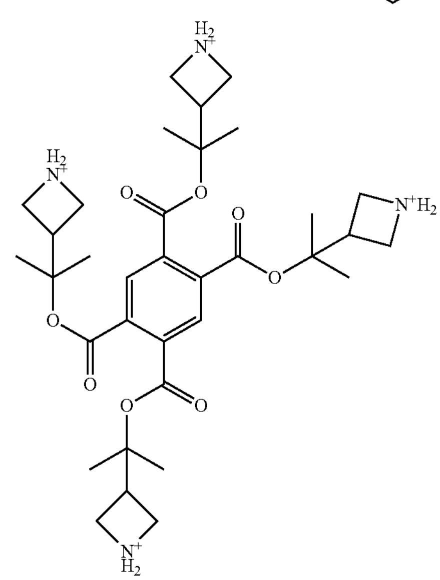

-continued
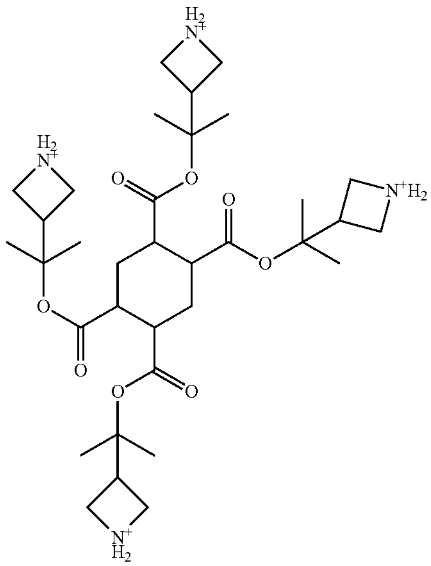
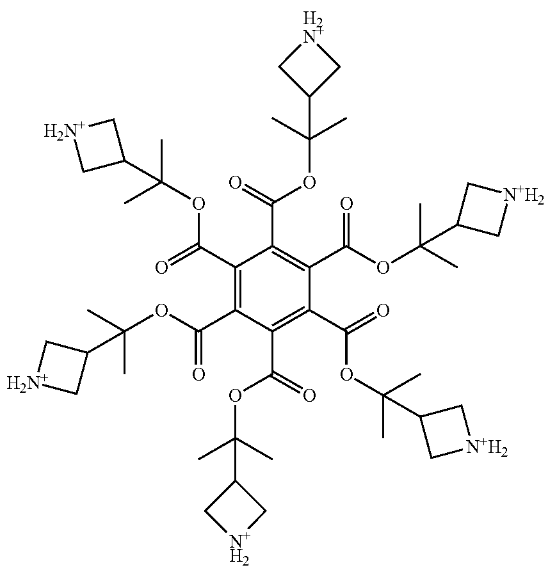
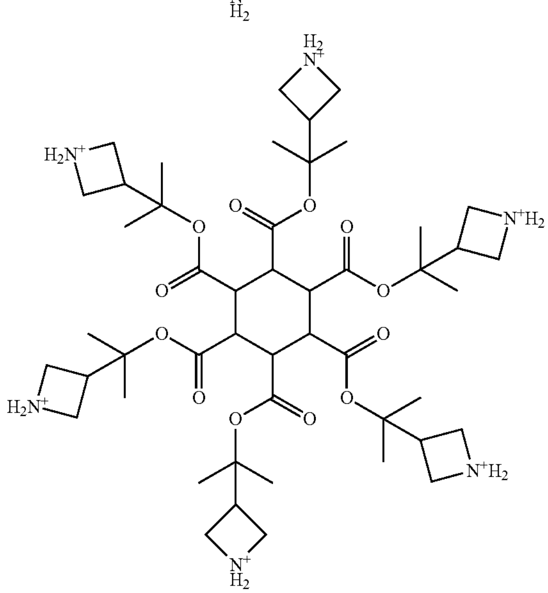
Examples of the cation having formula (A-2) are shown below, but not limited thereto.
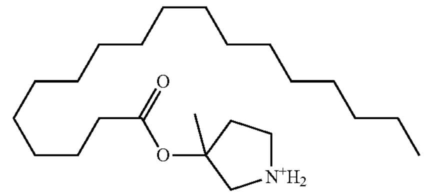
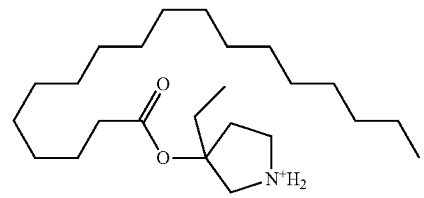
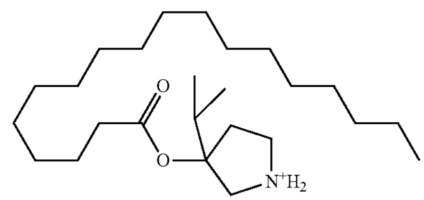
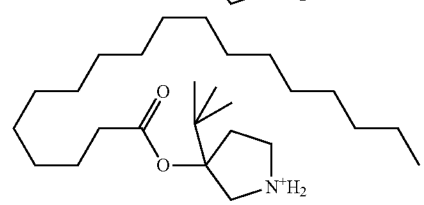
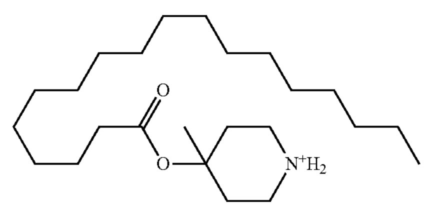
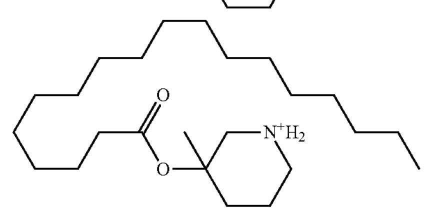
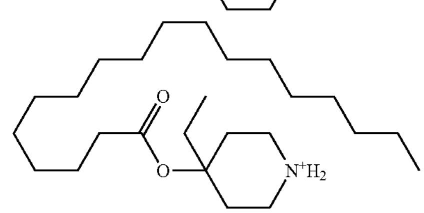
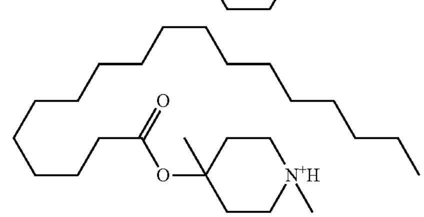

-continued

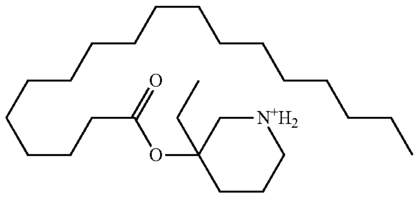

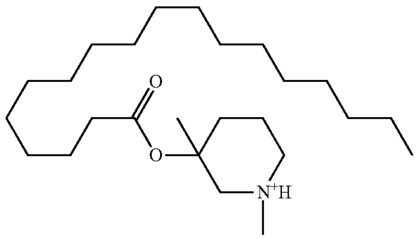

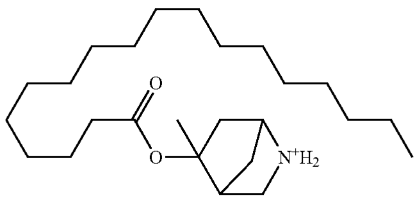

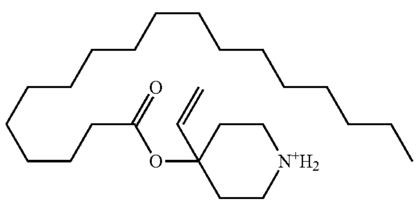

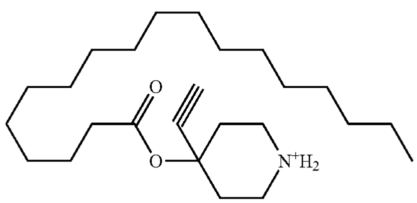

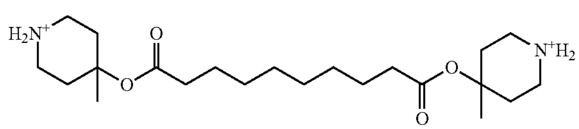

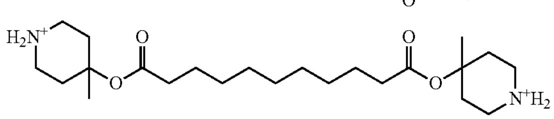

The anion of the cyclic ammonium salt is a carboxylate, sulfonamide, halogenated phenoxide or halide anion.

Preferably, the carboxylate anion has the formula (B-1) or (B-2), the sulfonamide anion has the formula (B-3), and the halogenated phenoxide anion has the formula (B-4), all shown below.

(B-1)

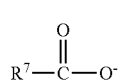

(B-2)

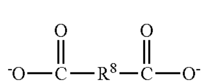

-continued (B-3)

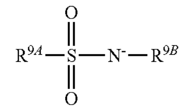

(B-4)

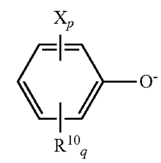

In formula (B-1), $R^7$ is hydrogen or a $C_1$-$C_{30}$ monovalent hydrocarbon group which may contain a heteroatom. The monovalent hydrocarbon group may be straight, branched or cyclic, and examples thereof include $C_1$-$C_{30}$ alkyl groups, $C_2$-$C_{30}$ alkenyl groups, $C_2$-$C_{30}$ alkynyl groups, and $C_6$-$C_{20}$ aryl groups. In these groups, some hydrogen may be substituted by a moiety containing a heteroatom such as oxygen, sulfur, nitrogen or halogen, or some carbon may be replaced by a moiety containing a heteroatom such as oxygen, sulfur or nitrogen, so that the group may contain an ester bond, ether bond, sulfide bond, sulfoxide, carbonate, carbamate, sulfone, amino, amide bond, hydroxyl, thiol, nitro, or halogen.

In formula (B-2), $R^8$ is a $C_1$-$C_{30}$ divalent hydrocarbon group which may contain a heteroatom. The divalent hydrocarbon group may be straight, branched or cyclic, and examples thereof include $C_1$-$C_{30}$ alkanediyl groups. $C_2$-$C_{30}$ alkenediyl groups, $C_2$-$C_{30}$ alkynediyl groups, and $C_6$-$C_{20}$ arylene groups. In these groups, some hydrogen may be substituted by a moiety containing a heteroatom such as oxygen, sulfur, nitrogen or halogen, or some carbon may be replaced by a moiety containing a heteroatom such as oxygen, sulfur or nitrogen, so that the group may contain an ester bond, ether bond, sulfide bond, sulfoxide, carbonate, carbamate, sulfone, amino, amide bond, hydroxyl, thiol, nitro, or halogen.

In formula (B-3), $R^{9A}$ is fluorine, or a $C_1$-$C_{10}$ fluorinated alkyl group or fluorinated phenyl group which may contain a hydroxyl, ether bond or ester bond. $R^{9B}$ is hydrogen or a $C_1$-$C_{10}$ monovalent hydrocarbon group which may contain a hydroxyl, ether bond or ester bond. $R^{9A}$ and $R^{9B}$ may bond together to form a ring with the atoms to which they are attached. The monovalent hydrocarbon group may be straight, branched or cyclic, and examples thereof include $C_1$-$C_{10}$ alkyl groups, $C_2$-$C_{10}$ alkenyl groups, $C_2$-$C_{10}$ alkynyl groups, and $C_6$-$C_{10}$ aryl groups.

In formula (B-4), X is fluorine, trifluoromethyl, 1,1,1,3,3,3-hexafluoro-2-propanol, chlorine, bromine or iodine. $R^{10}$ is hydrogen, hydroxyl, an optionally halogenated $C_1$-$C_6$ alkyl group, optionally halogenated $C_1$-$C_6$ alkoxy group, optionally halogenated $C_2$-$C_8$ acyloxy group, optionally halogenated $C_1$-$C_4$ alkylsulfonyloxy group, fluorine, chlorine, bromine, amino, nitro, cyano, —$NR^{10A}$—C(═O)—$R^{10B}$, or —$NR^{10A}$—C(O)—O—$R^{10B}$, wherein $R^{10A}$ is hydrogen or a $C_1$-$C_6$ alkyl group, $R^{10B}$ is a $C_1$-$C_6$ alkyl group or $C_2$-$C_8$ alkenyl group. The subscript p is an integer of 1 to 5, and q is an integer of 0 to 3, meeting $1 \le p+q \le 5$.

The $C_1$-$C_6$ alkyl groups represented by $R^{10}$, $R^{10A}$ and $R^{10B}$ may be straight, branched or cyclic, and examples thereof include methyl, ethyl, n-propyl, isopropyl, cyclopropyl, n-butyl, isobutyl, sec-butyl, tert-butyl, cyclobutyl, n-pentyl, cyclopentyl, n-hexyl, and cyclohexyl. Examples of the alkyl moiety in the $C_1$-$C_6$ alkoxy group, $C_2$-$C_6$ acyloxy group, and $C_1$-$C_4$ alkylsulfonyloxy group include those of the above-exemplified alkyl groups having 1 to 6 carbon atoms, 1 to 5 carbon atoms, and 1 to 4 carbon atoms, respectively.

The $C_2$-$C_8$ alkenyl group represented by $R^{10B}$ may be straight, branched or cyclic and examples thereof include vinyl, 1-propenyl, 2-propenyl, butenyl, hexenyl and cyclohexenyl.

Among others. $R^{10}$ is preferably selected from fluorine, chlorine, bromine, hydroxyl, amino, $C_1$-$C_3$ alkyl, $C_1$-$C_3$ alkoxy, $C_2$-$C_4$ acyloxy, —$NR^{10A}$—C(═O)—$R^{10B}$, and —$NR^{10A}$—C(═O)—O—$R^{10B}$.

Examples of the carboxylate anion are shown below, but not limited thereto.

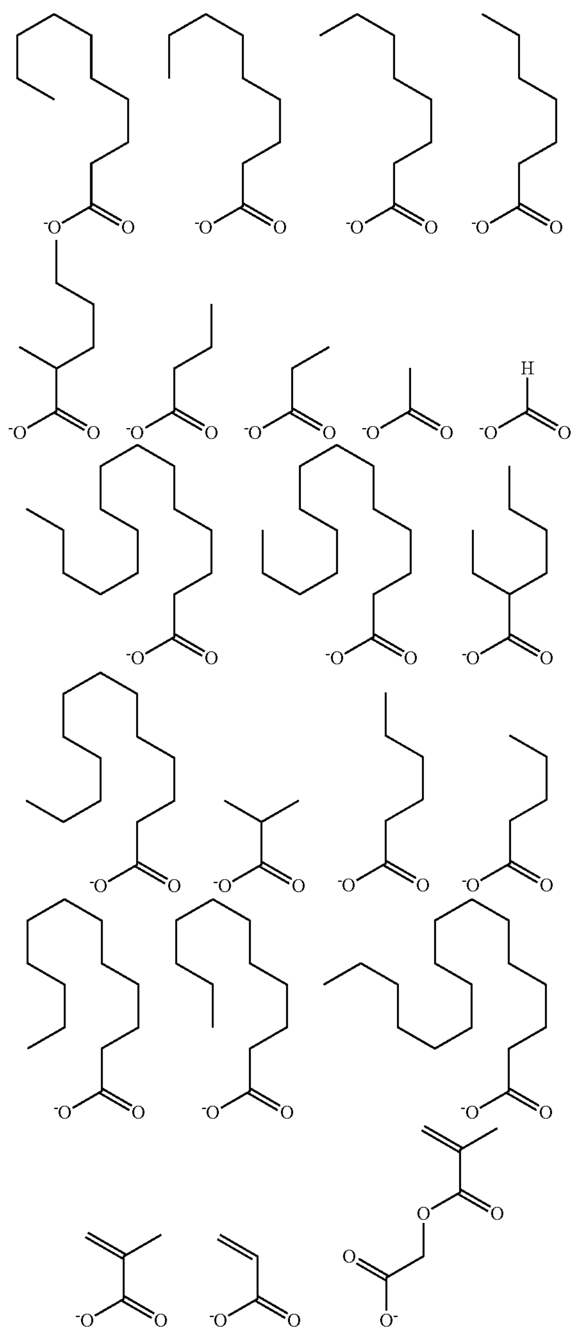

-continued

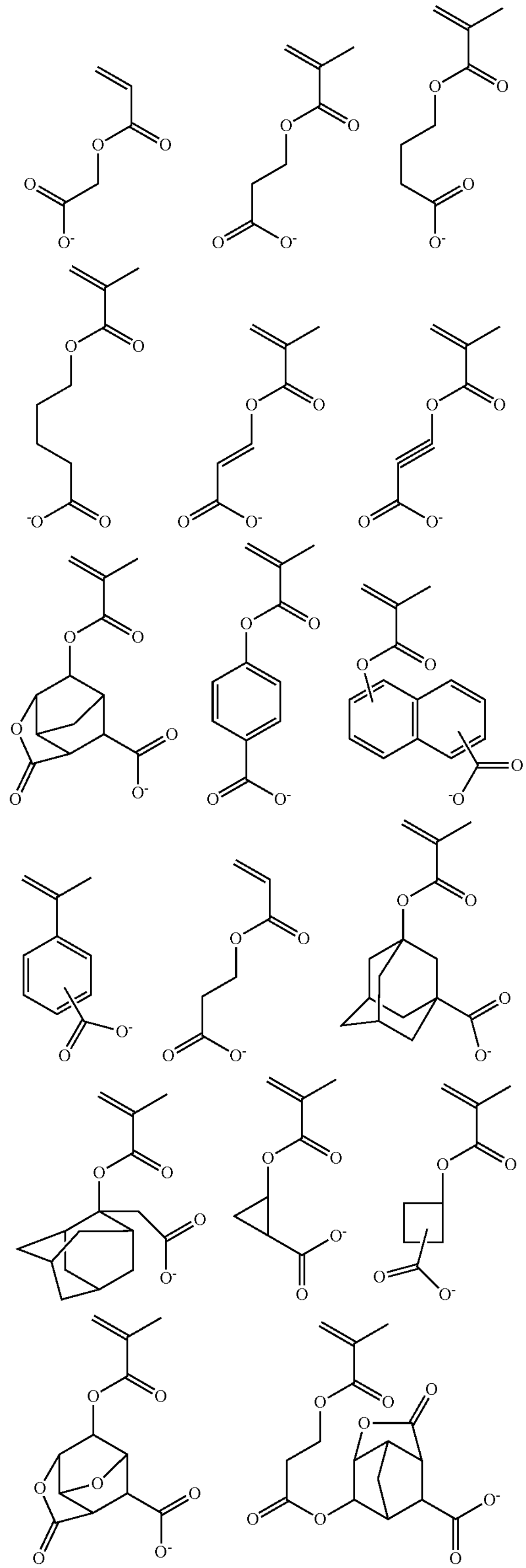

-continued
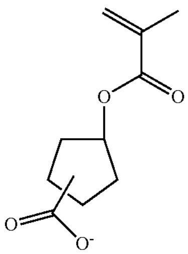
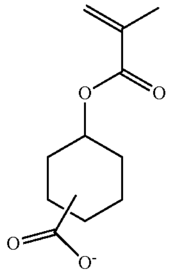
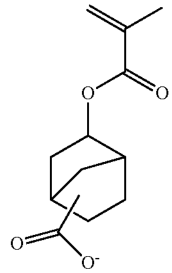
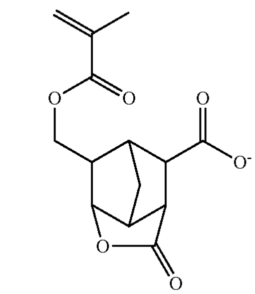
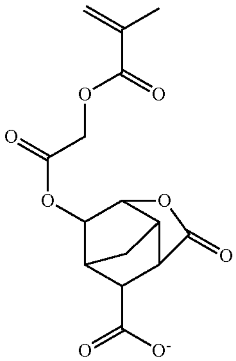
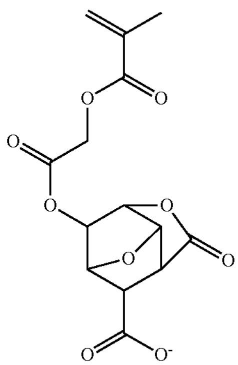
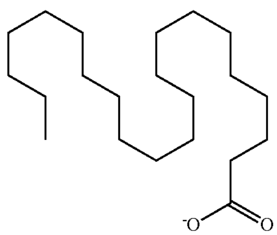
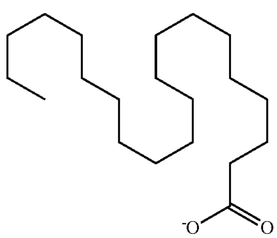
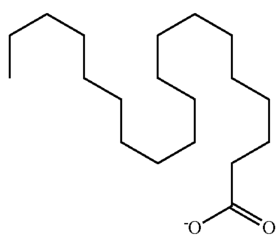
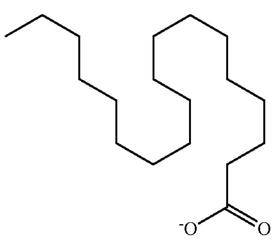
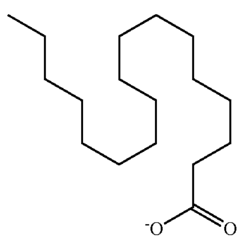
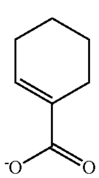
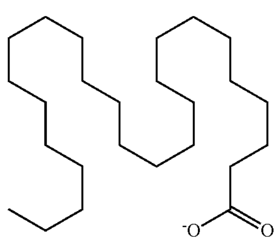
-continued
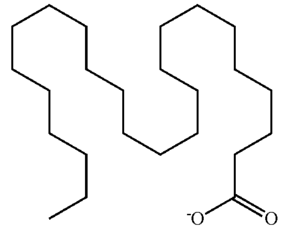
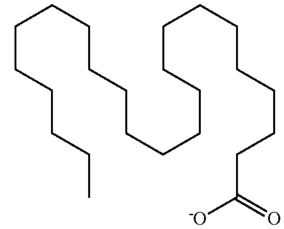
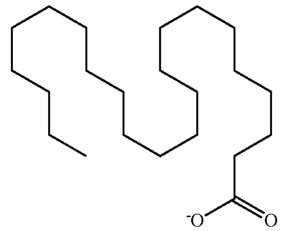
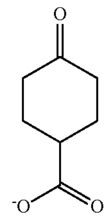
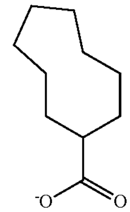
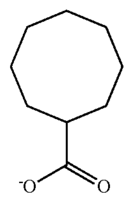
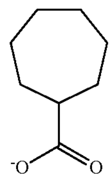
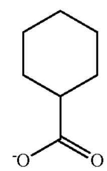
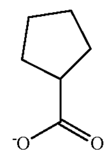
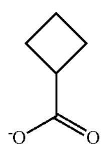
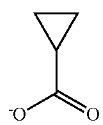
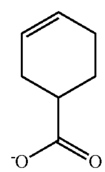
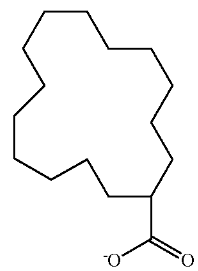
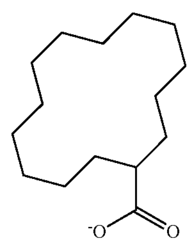
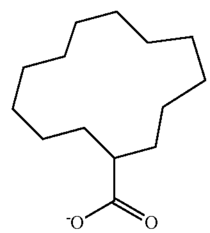
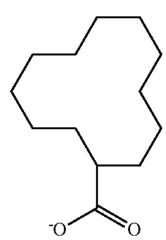
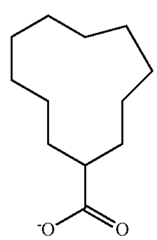
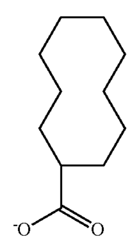
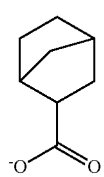
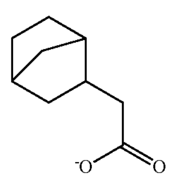
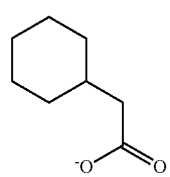

-continued
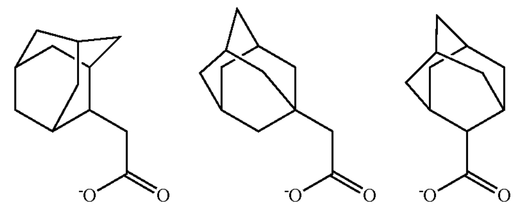
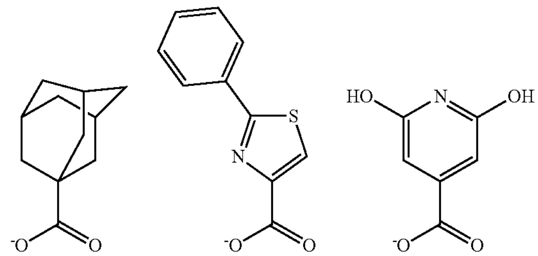
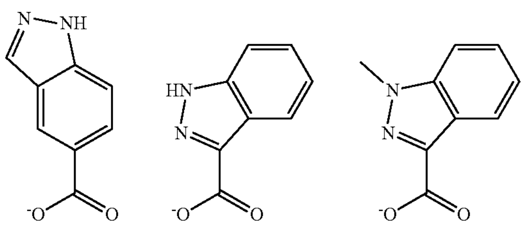
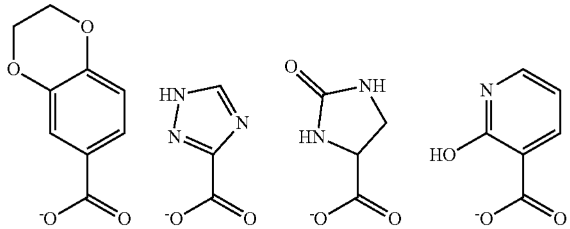
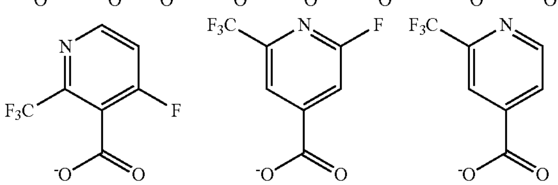
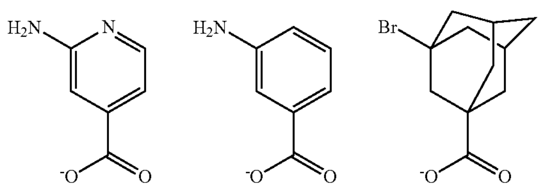
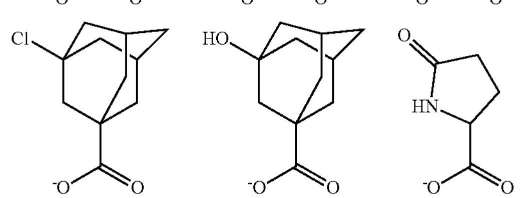
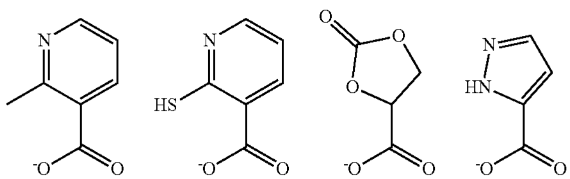
-continued
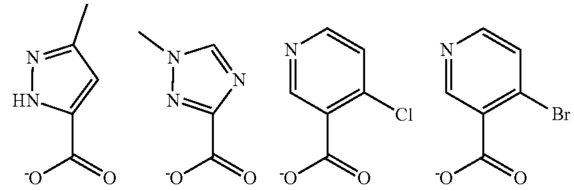
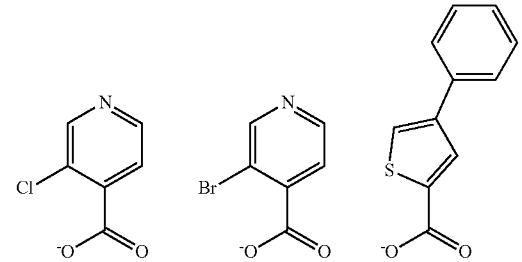
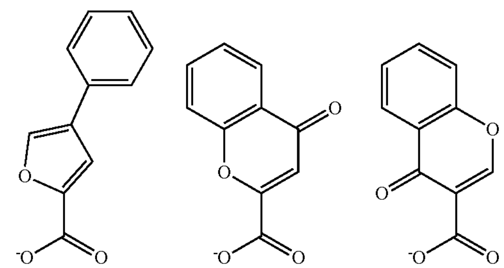
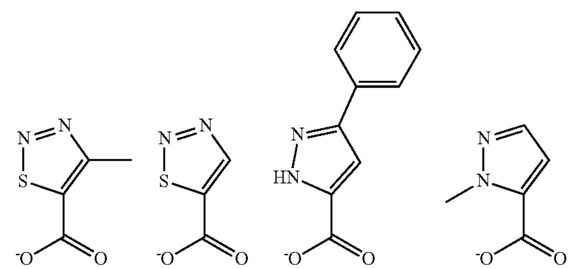
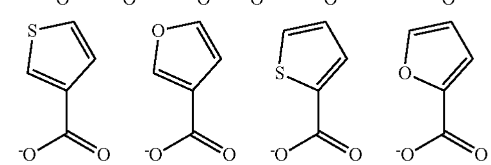
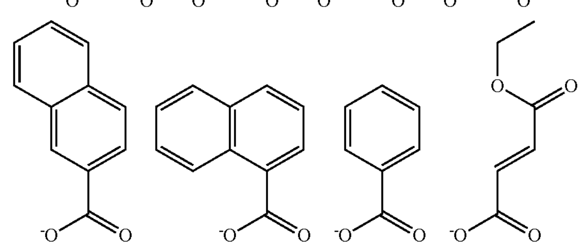
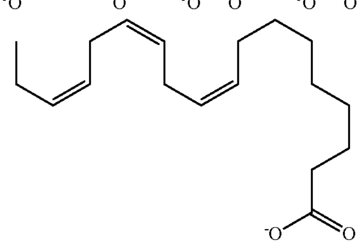

-continued
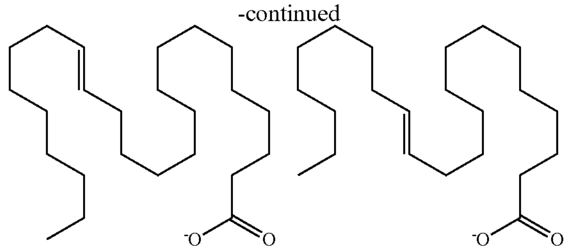
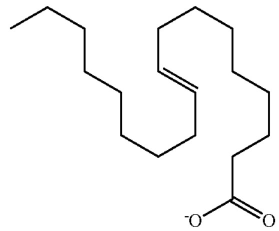
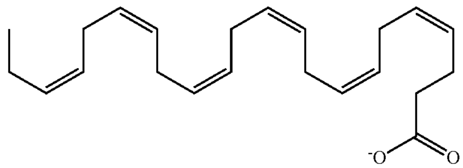
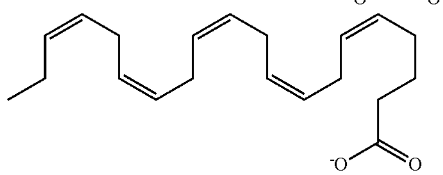
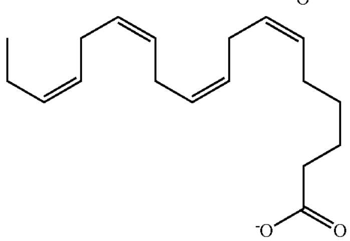
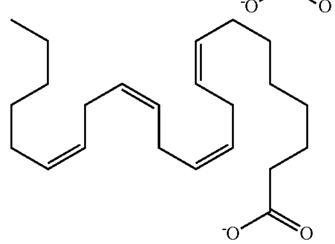
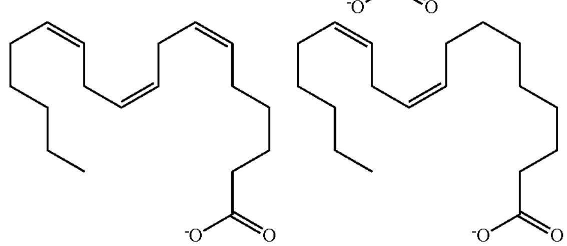
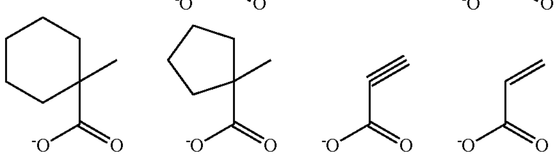
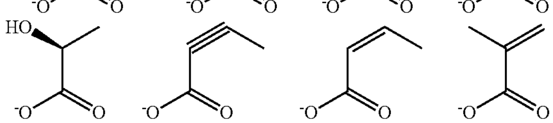
-continued
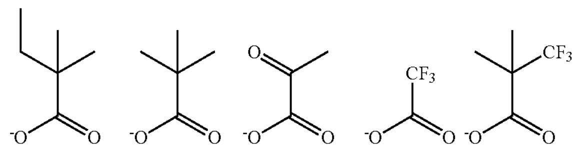
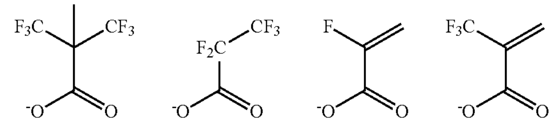
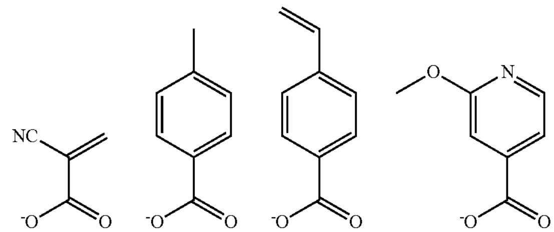
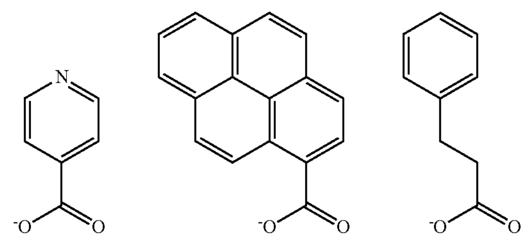
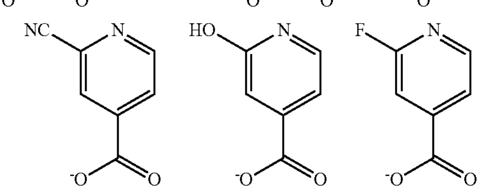
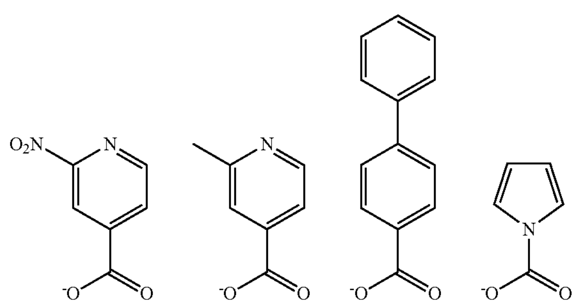
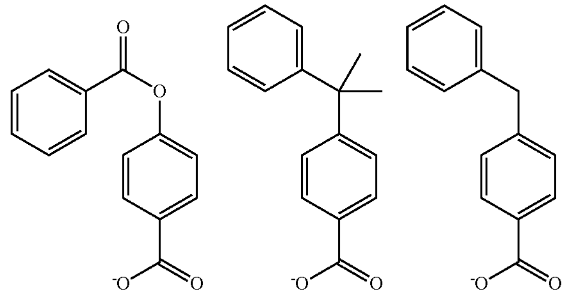

-continued
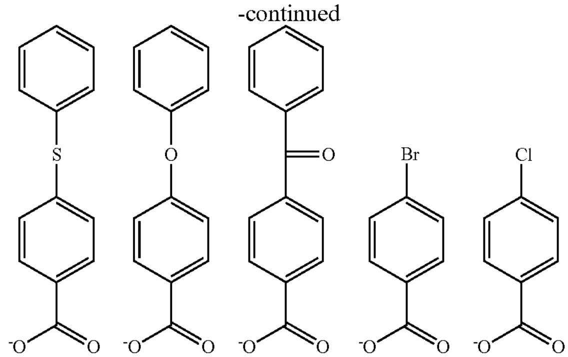
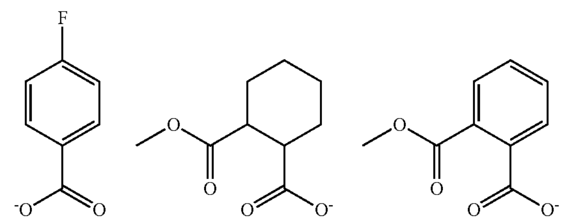
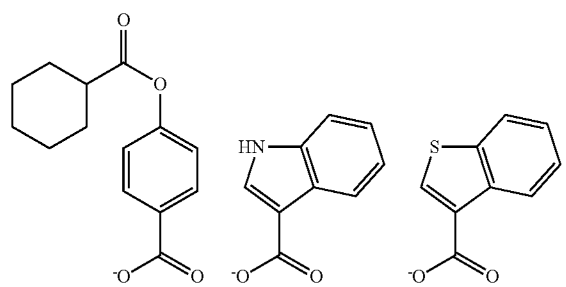
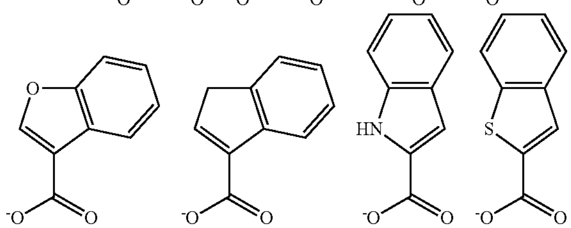
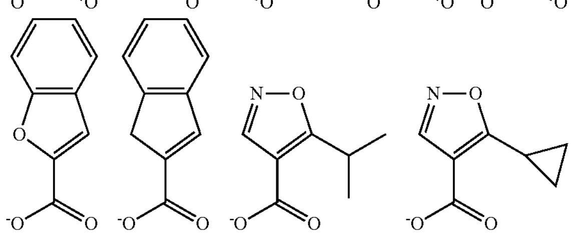
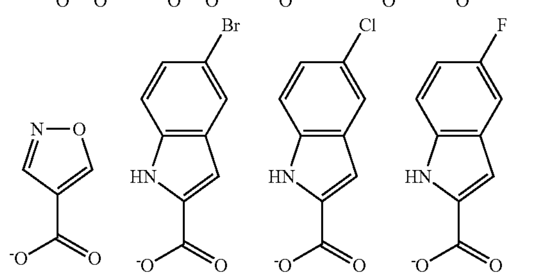
-continued
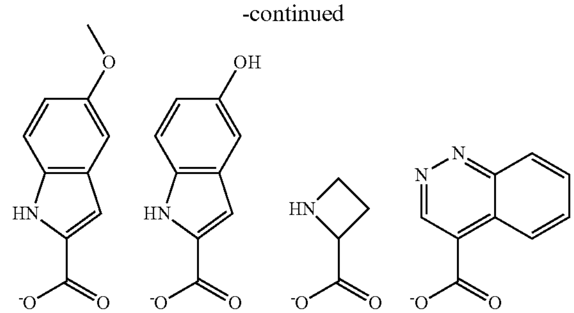
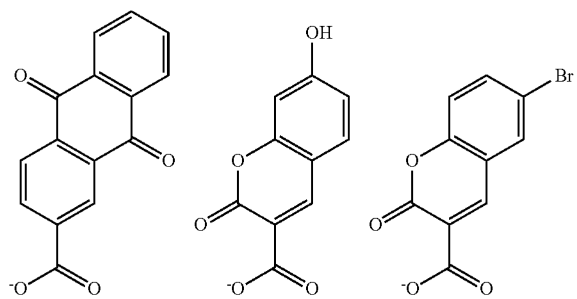
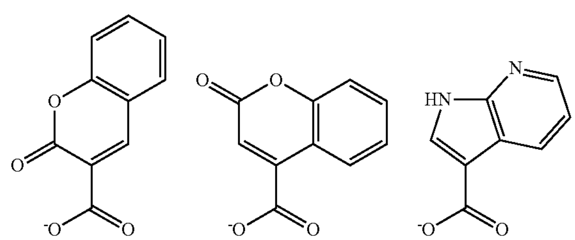
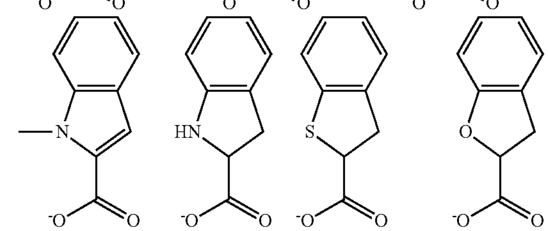
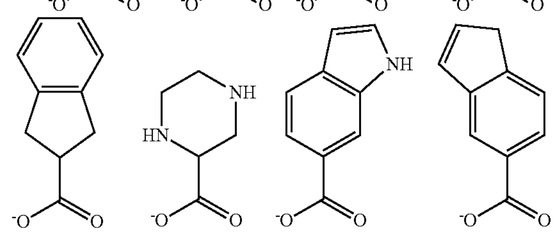
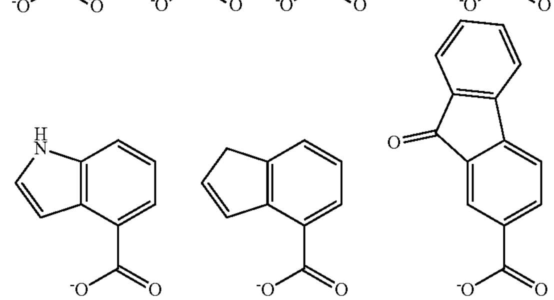

-continued
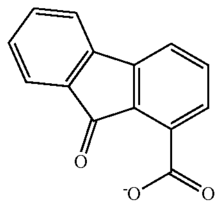
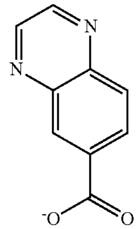
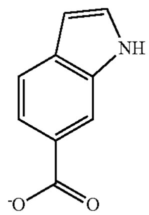
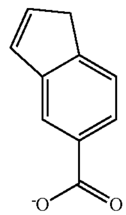
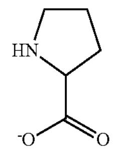
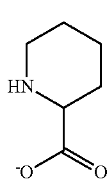
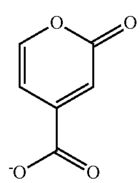
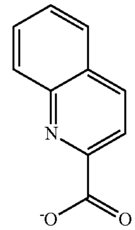
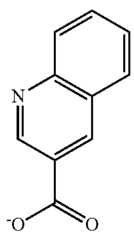
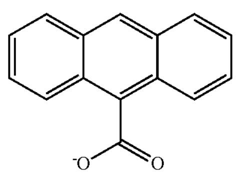
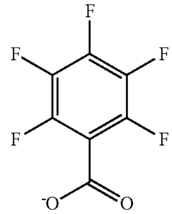
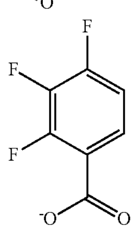
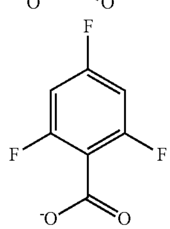
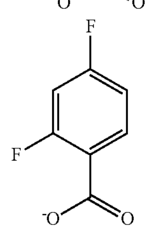
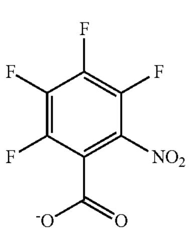
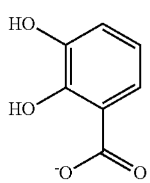
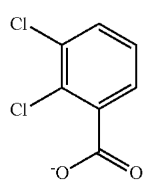
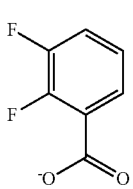
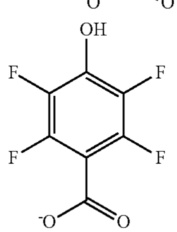
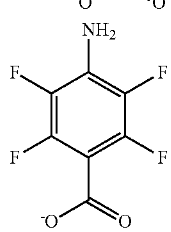
-continued
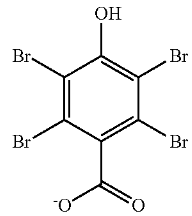
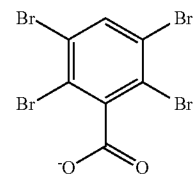
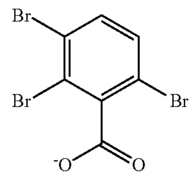
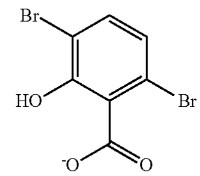
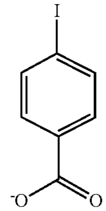
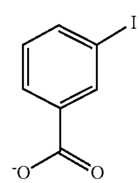
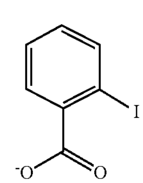
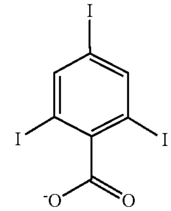
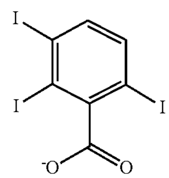
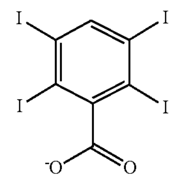
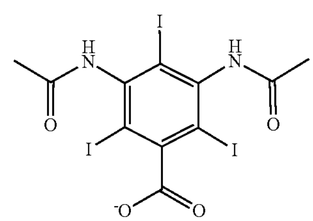
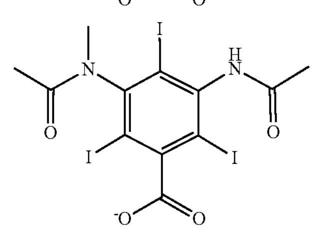
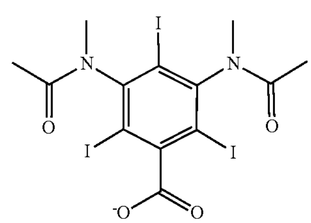
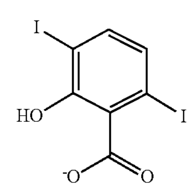
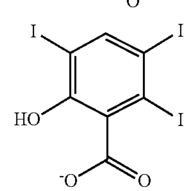
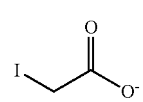
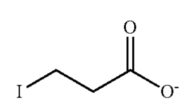

-continued
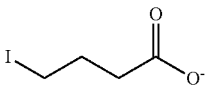
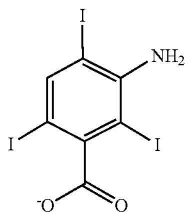
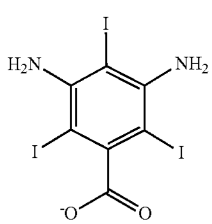
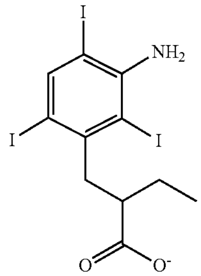
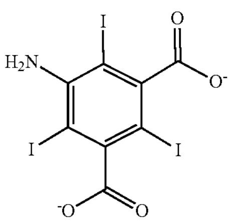
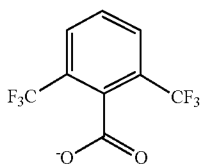
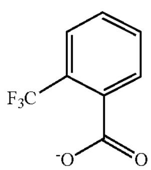
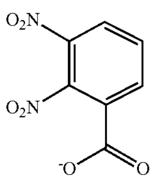
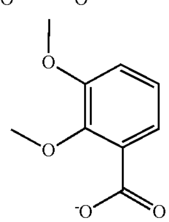
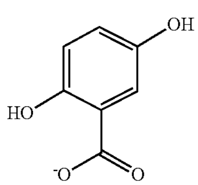
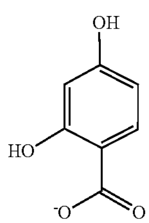
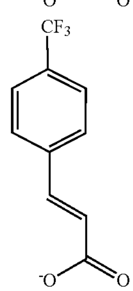
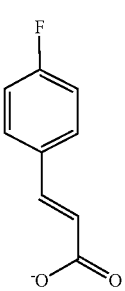
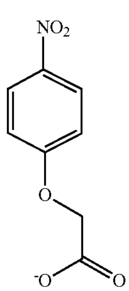
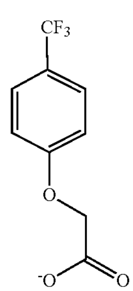
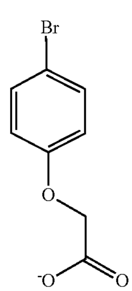
-continued
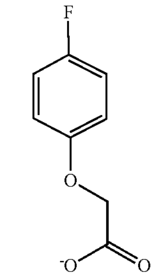
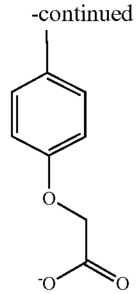
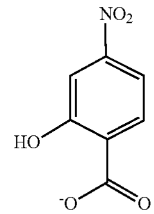
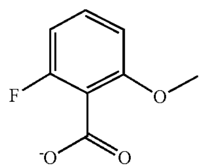
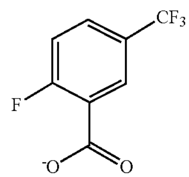
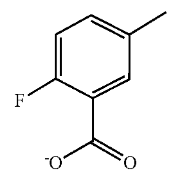
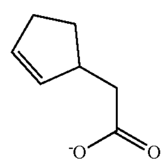
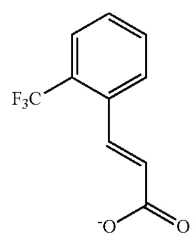
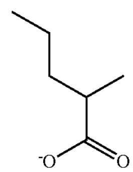
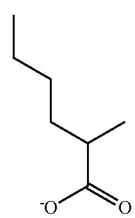
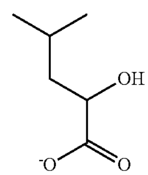
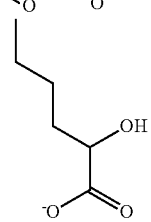
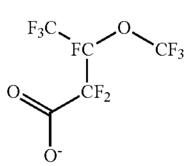
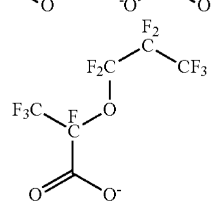
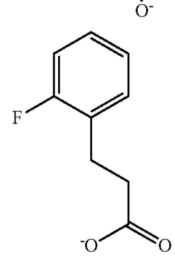
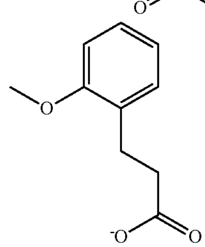
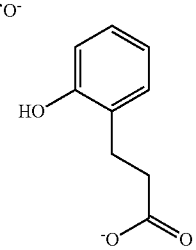
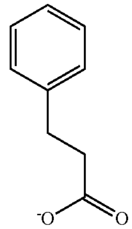
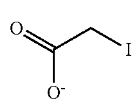
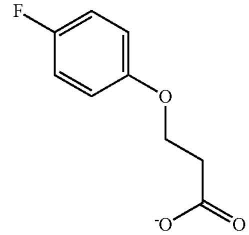

-continued
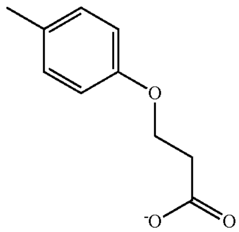
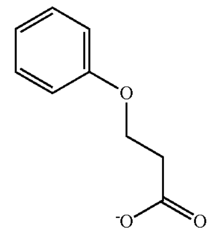
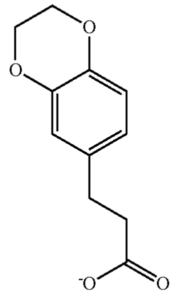
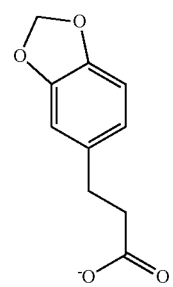
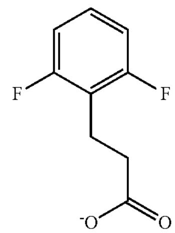
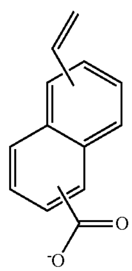
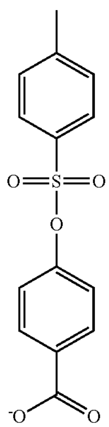
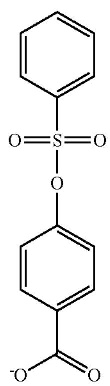
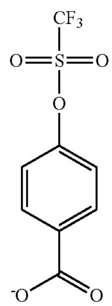
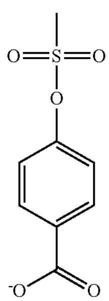
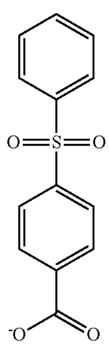
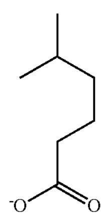
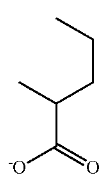
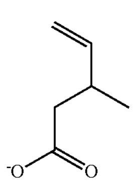
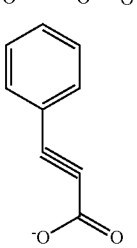
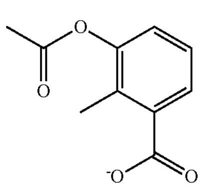
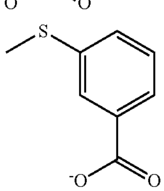
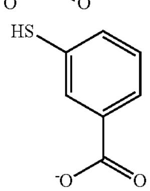
-continued
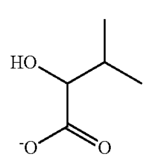
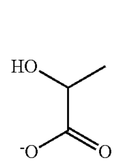
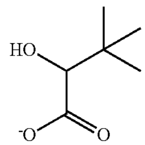
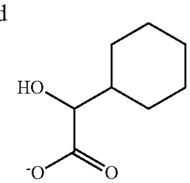
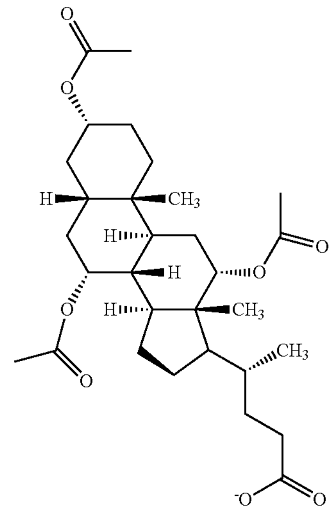
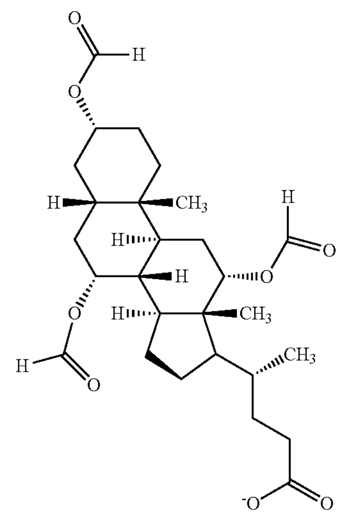
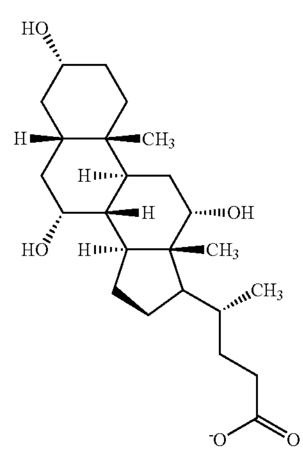
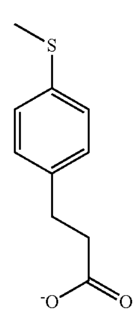

-continued
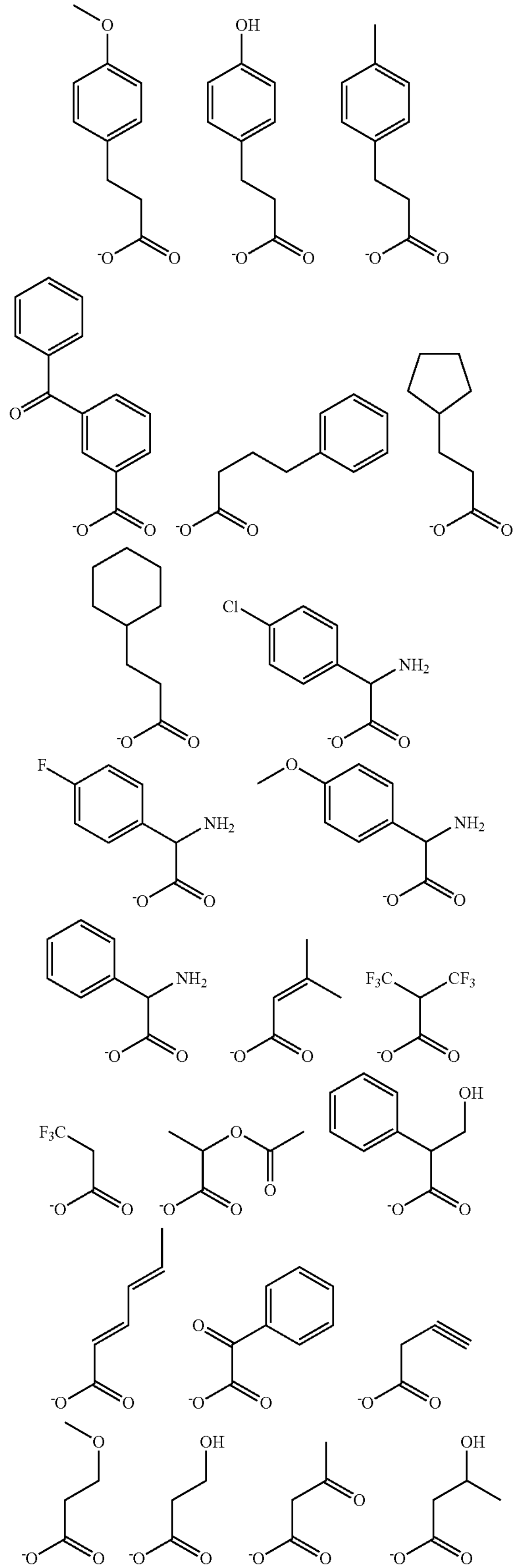
-continued
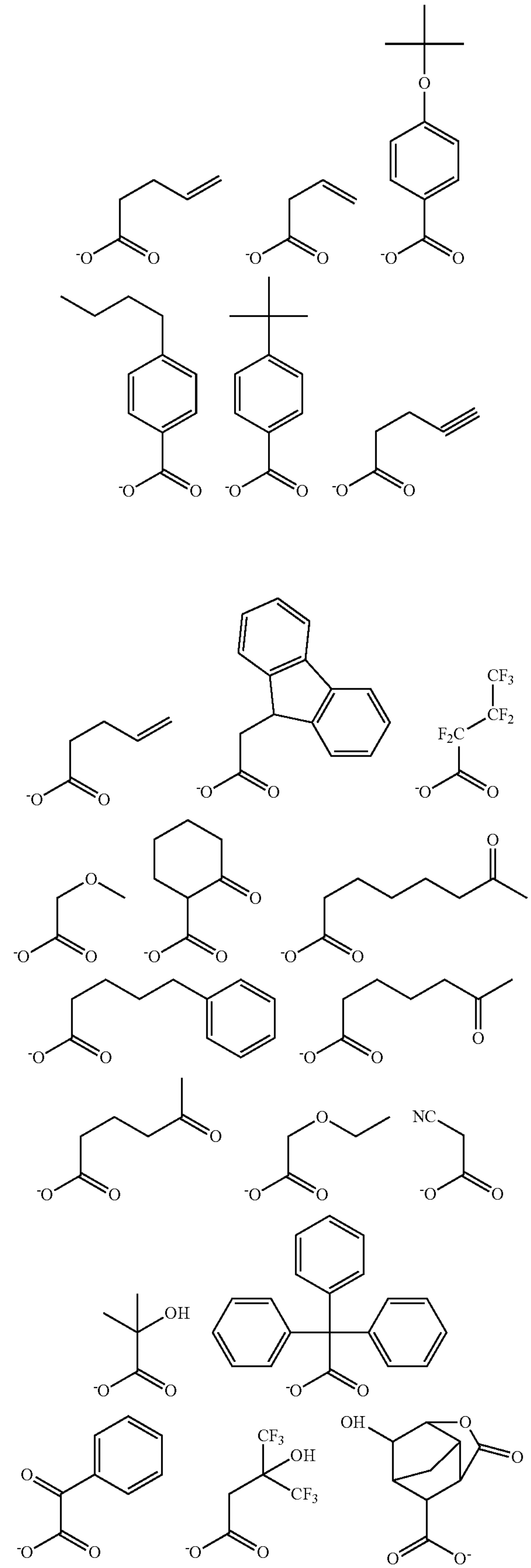

-continued
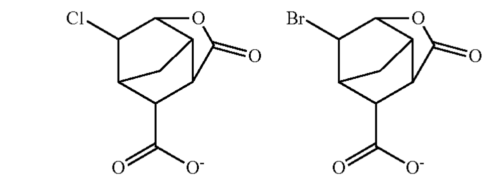
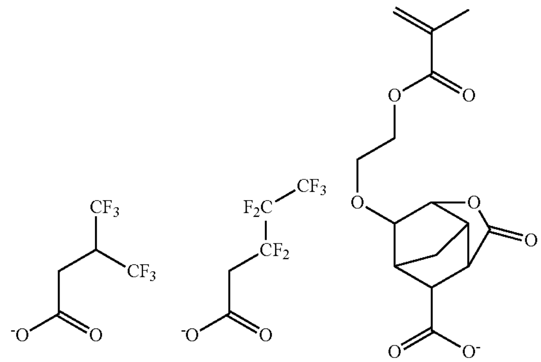
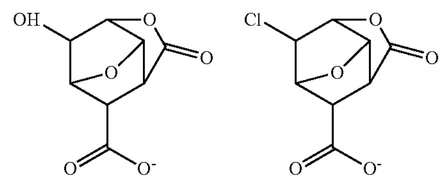
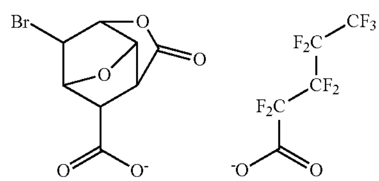
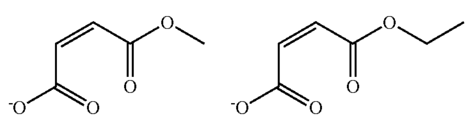
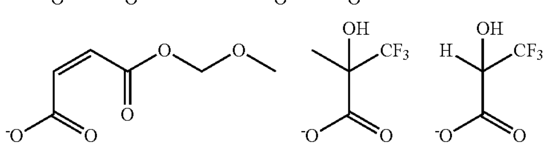
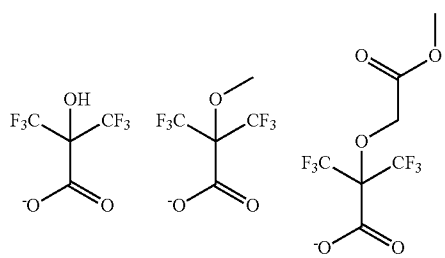
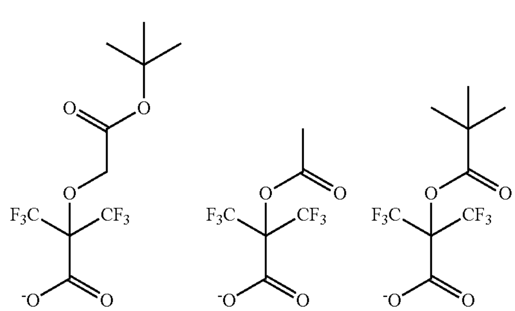
-continued
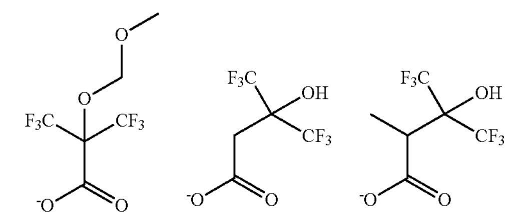
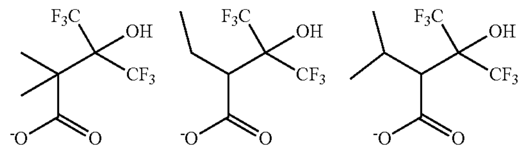
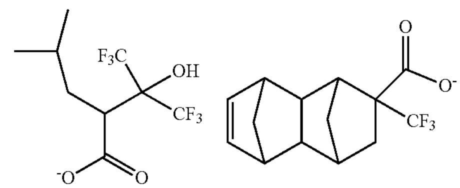
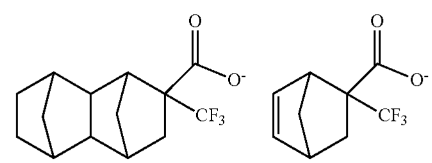
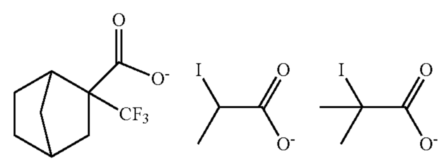
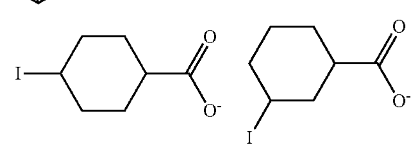
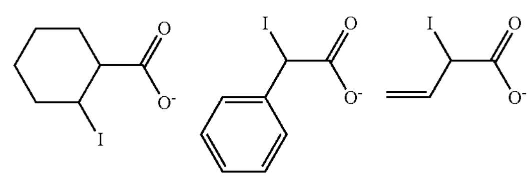
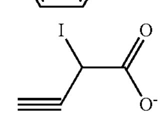
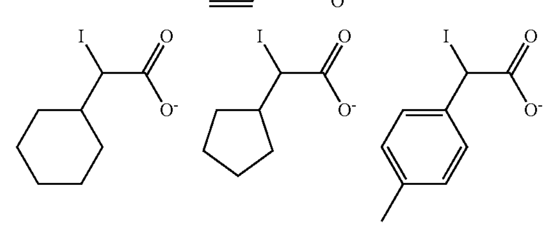
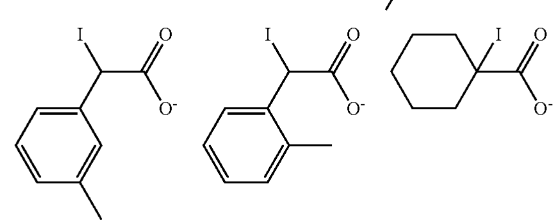

-continued
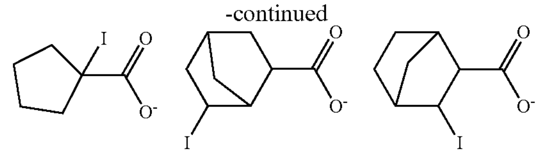
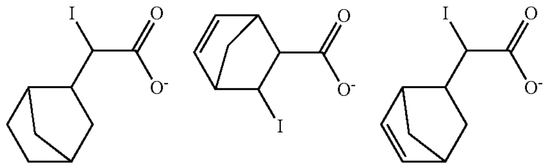
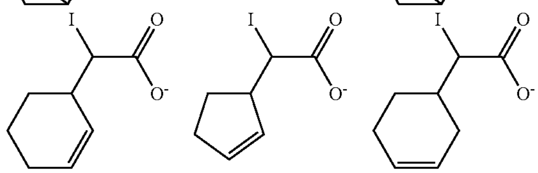
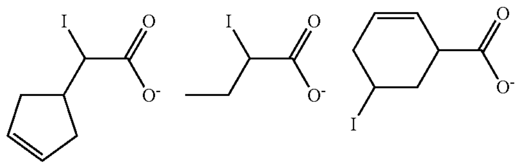
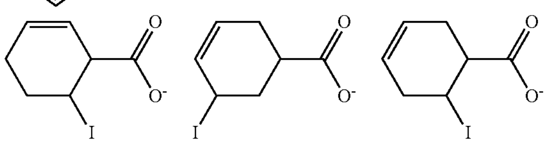
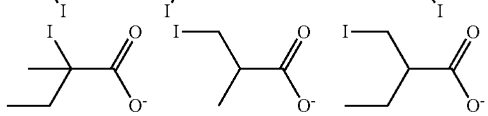
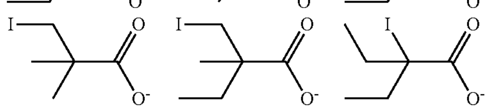
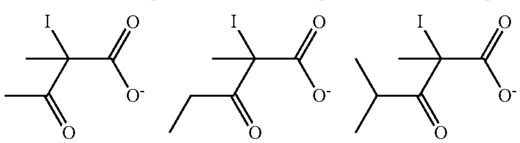
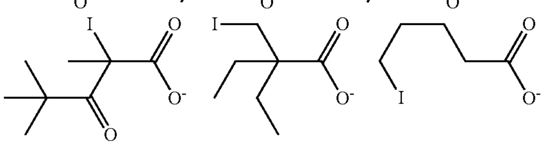
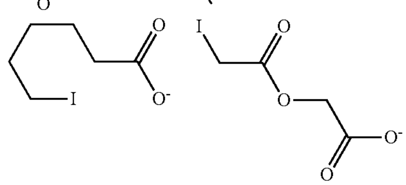
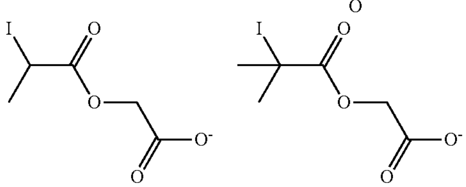
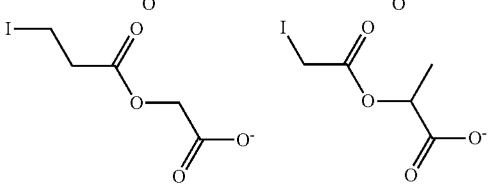
-continued
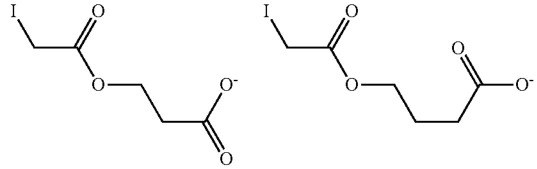
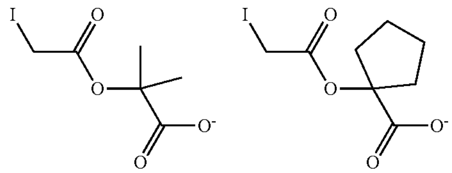
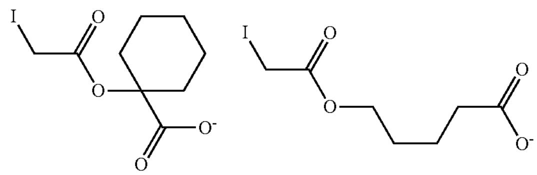
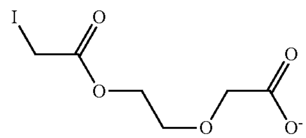
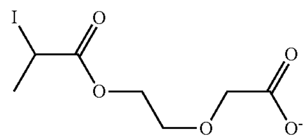
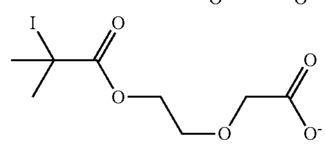
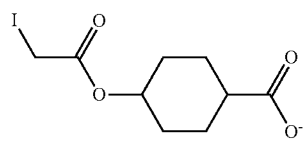
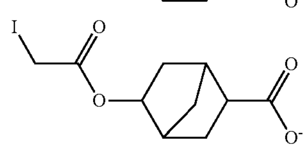
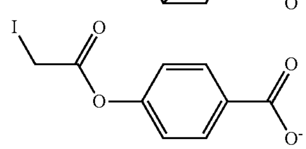
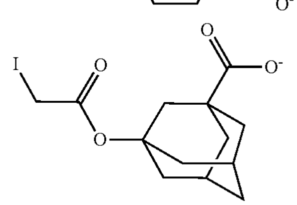
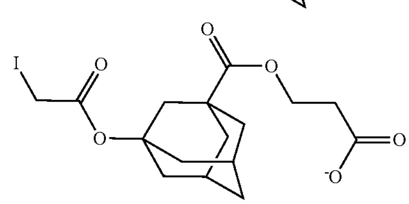

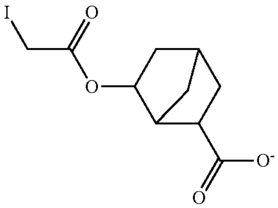
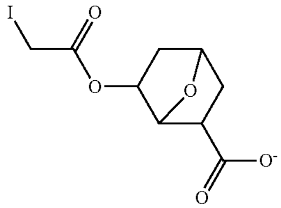
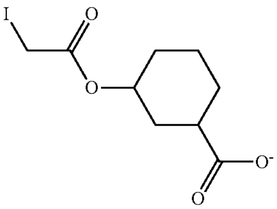
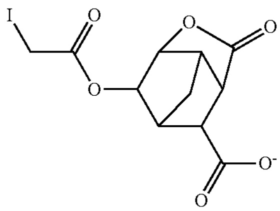
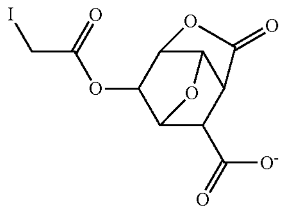
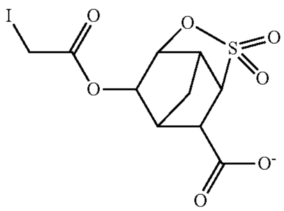
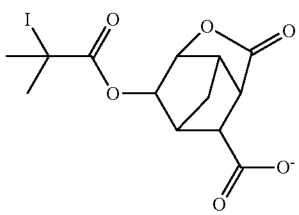
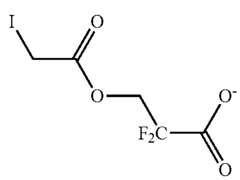
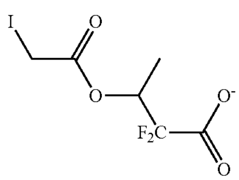
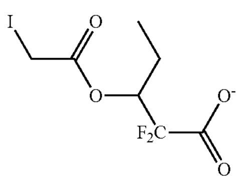
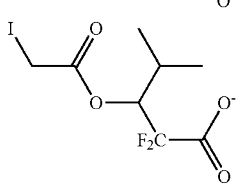
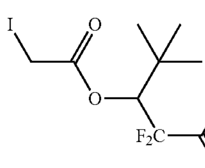
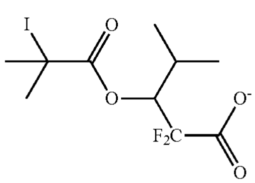
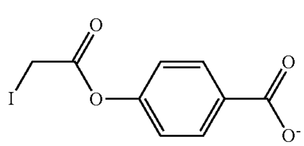
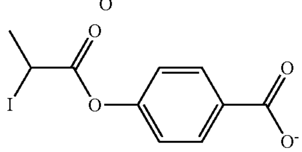
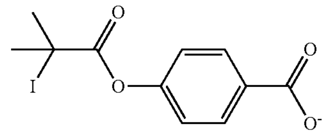
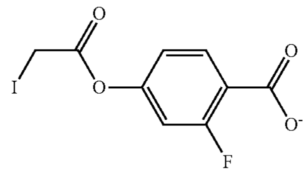
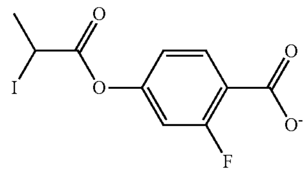
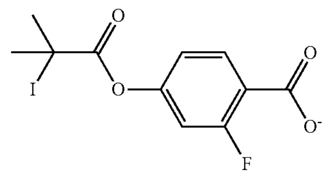
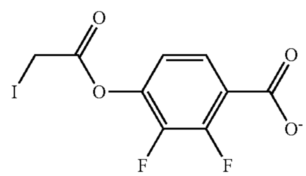
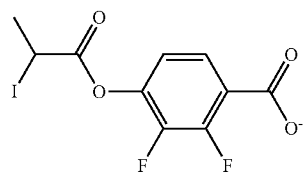
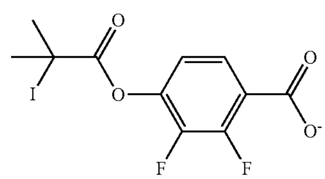
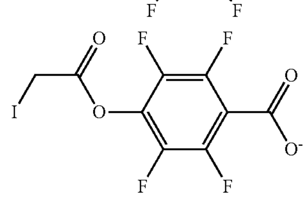
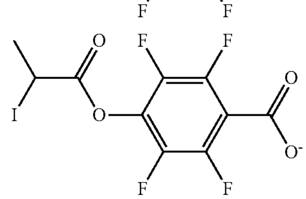
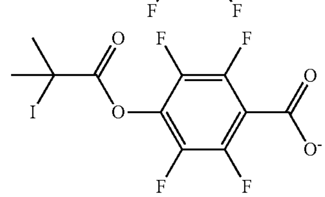

-continued
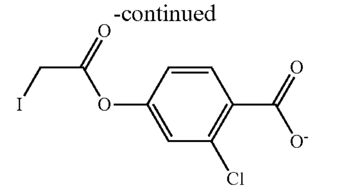
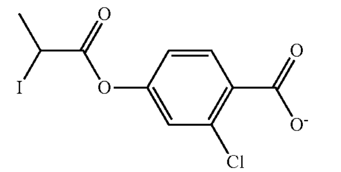
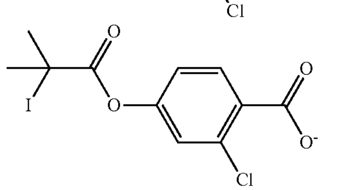
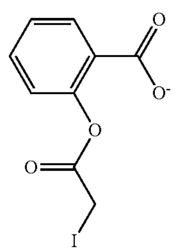
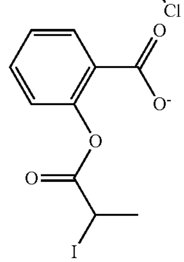
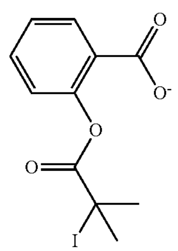
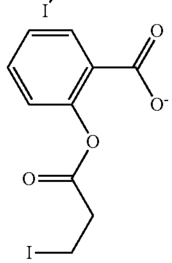
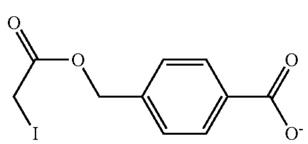
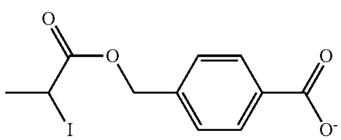
-continued
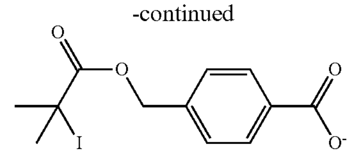
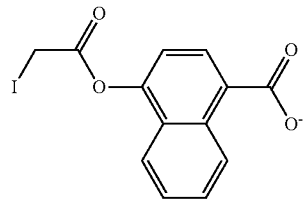
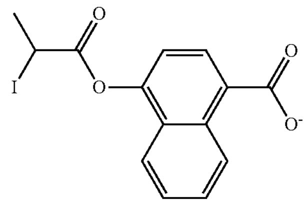
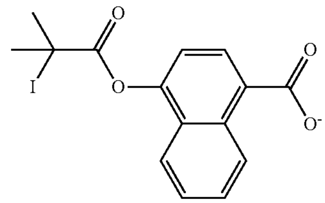
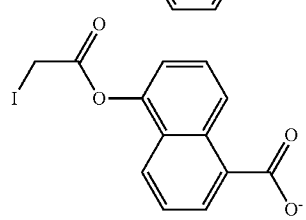
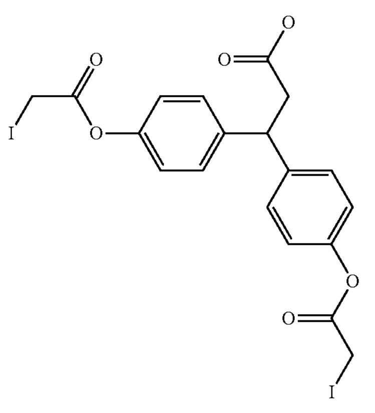
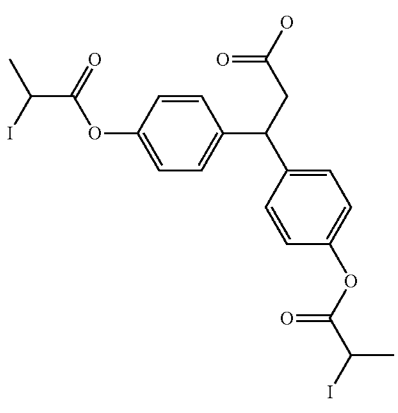
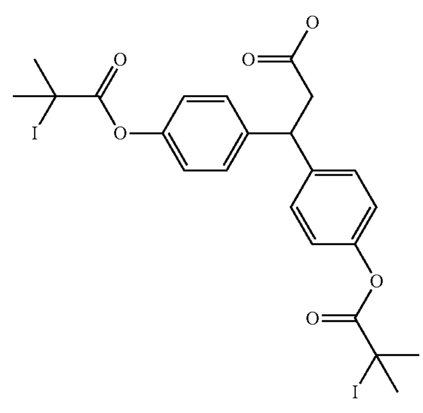

-continued
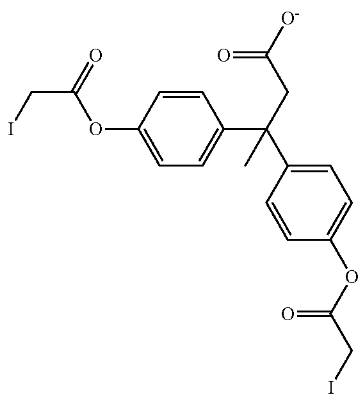
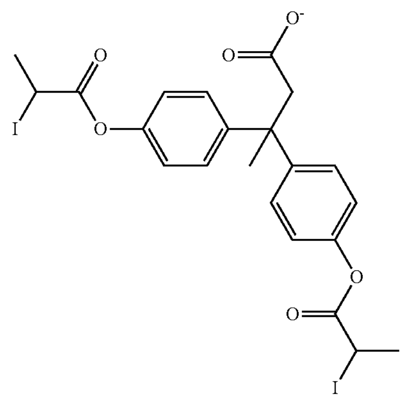
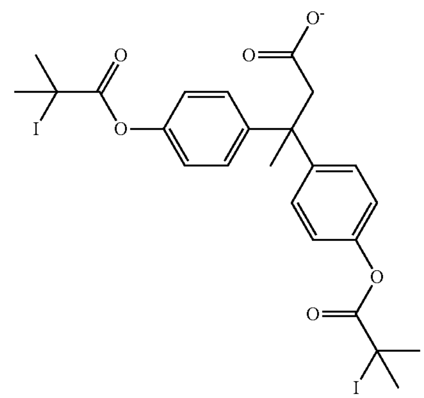
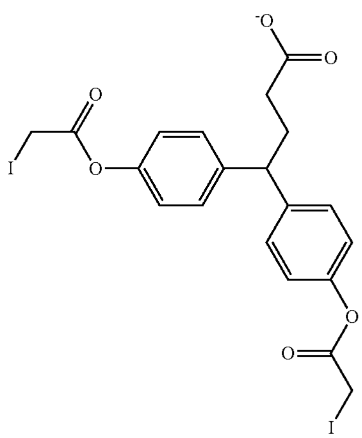
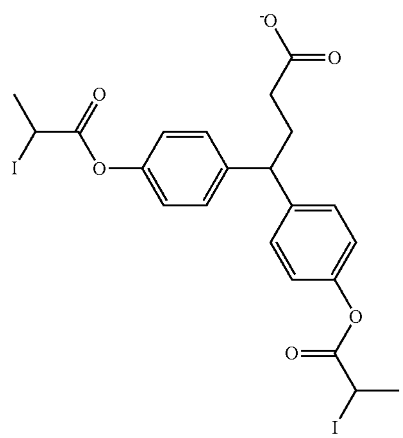
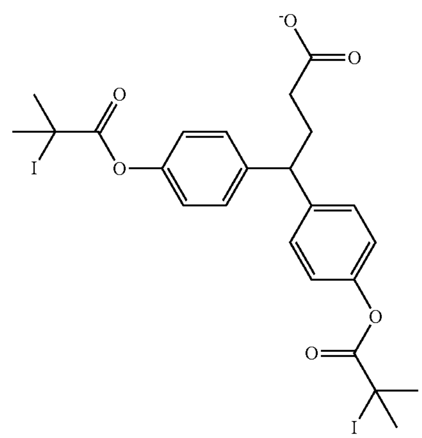
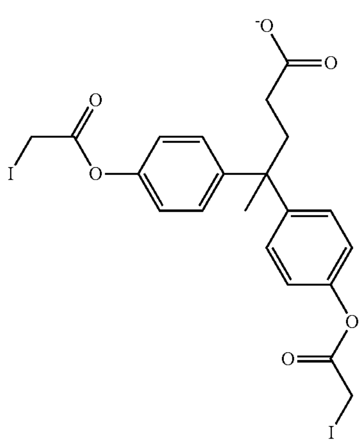
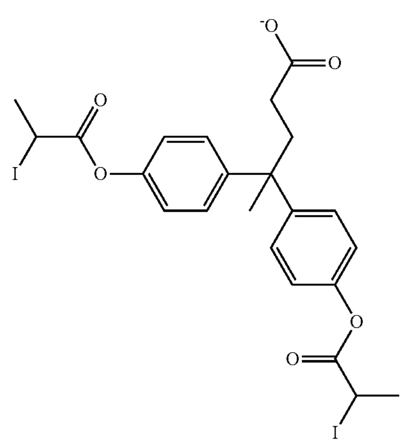
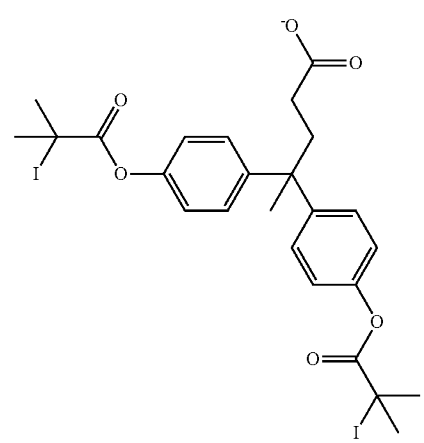
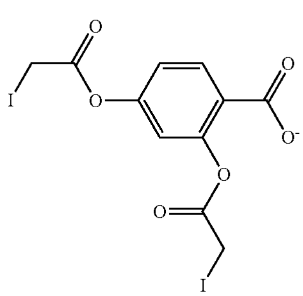
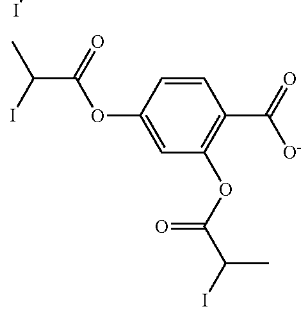
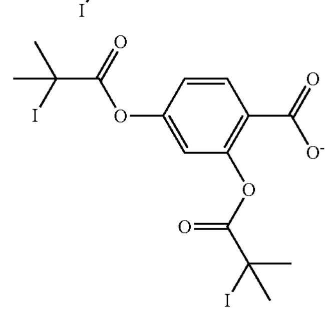

-continued
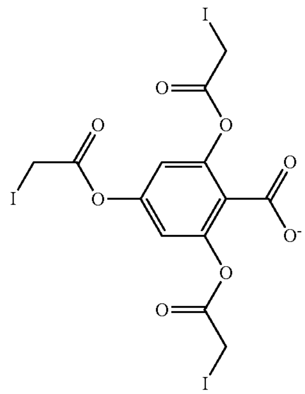
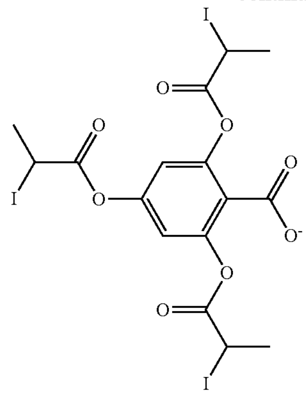
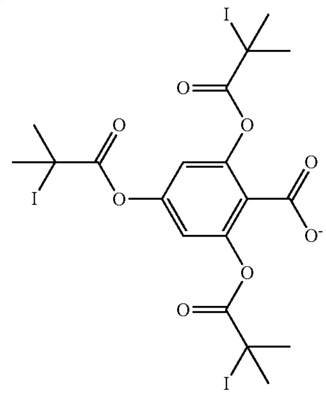
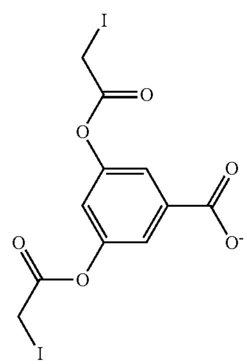
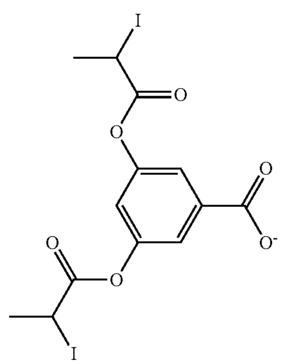
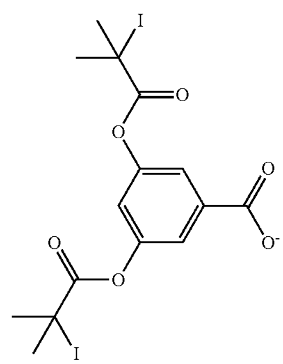
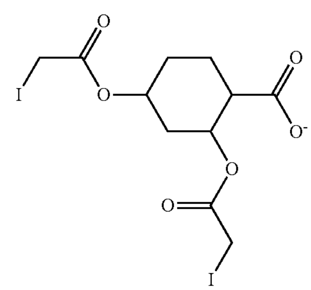
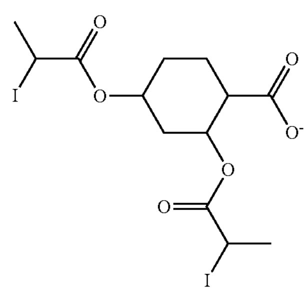
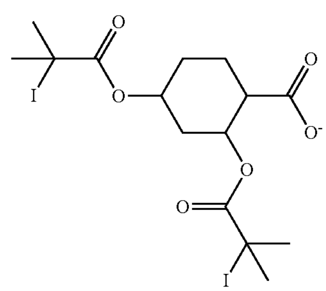
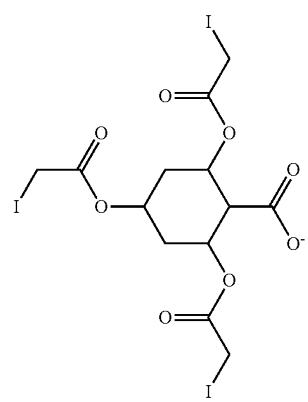
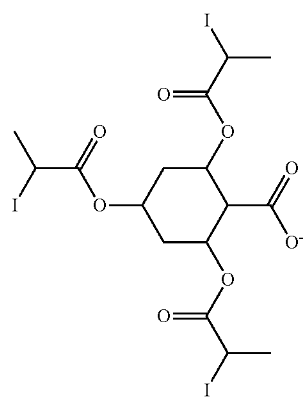
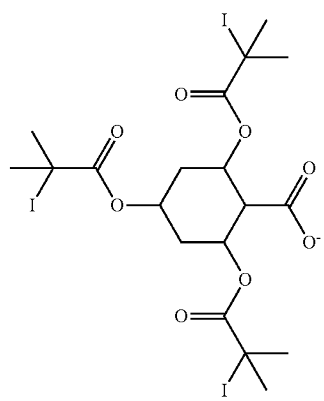
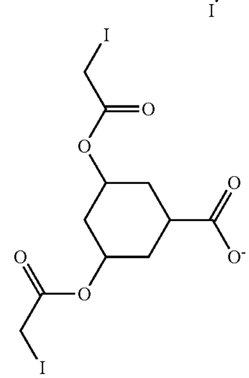
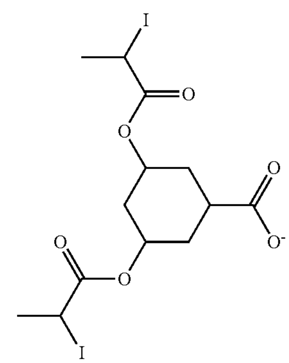

-continued
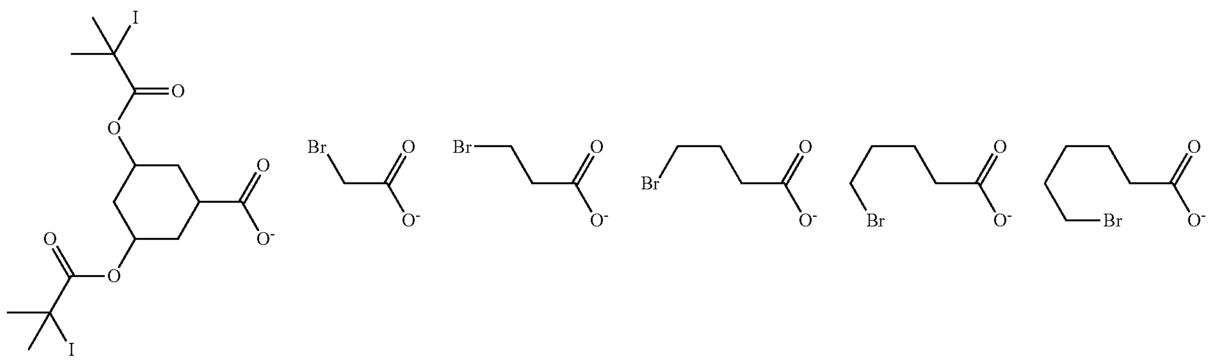
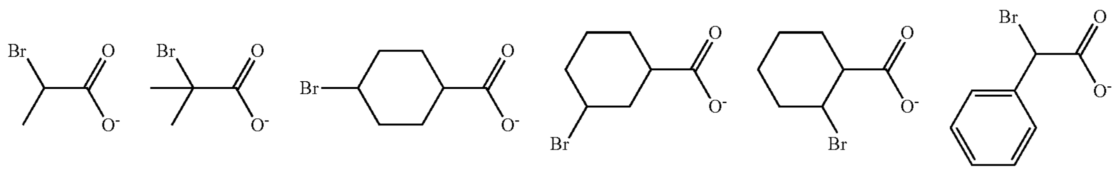
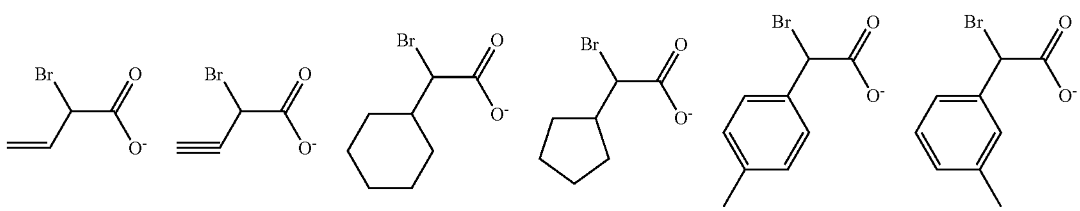
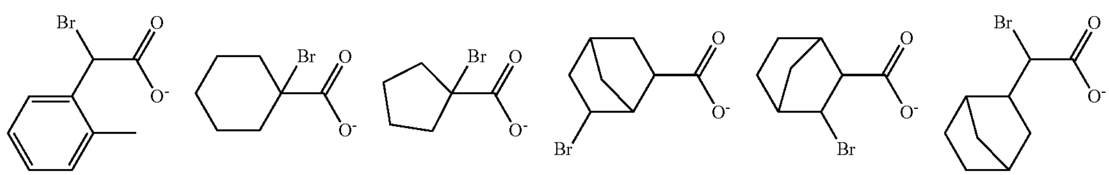
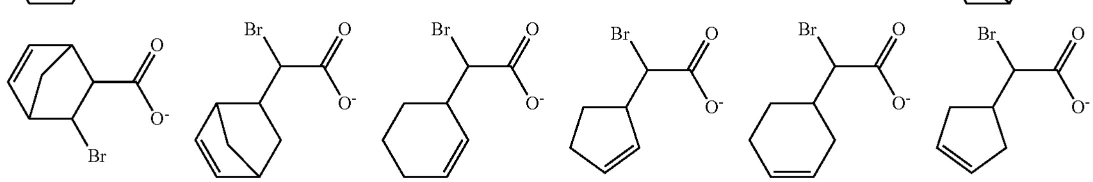
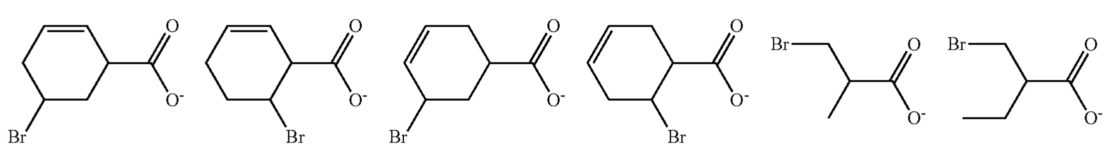
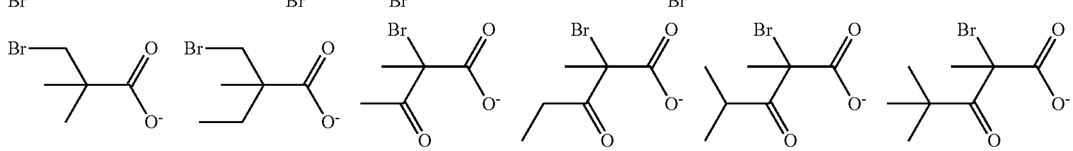
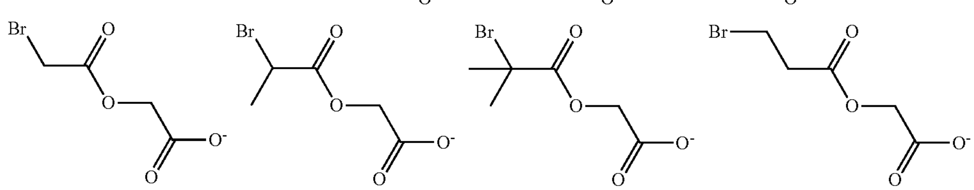
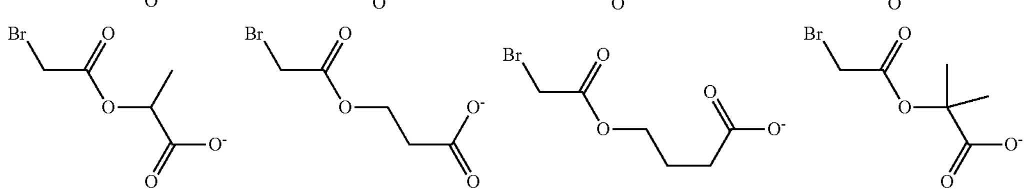

-continued
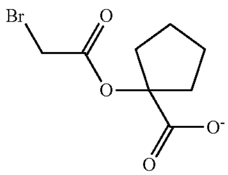 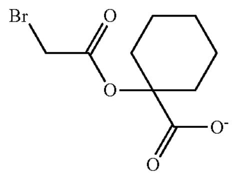 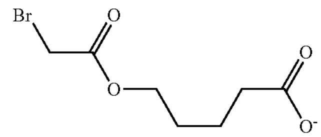 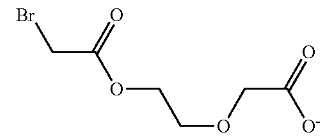
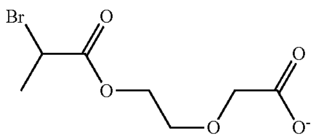 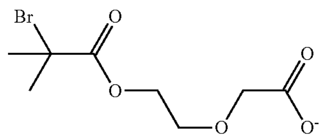 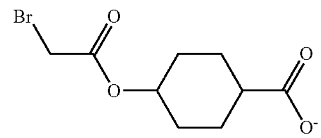
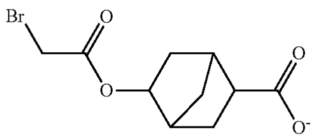 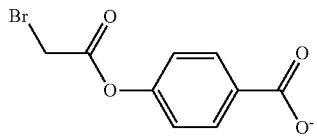 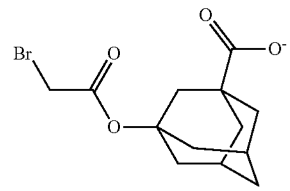
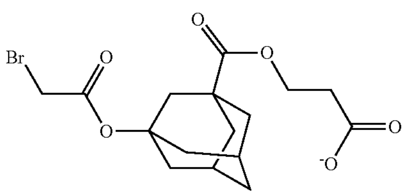 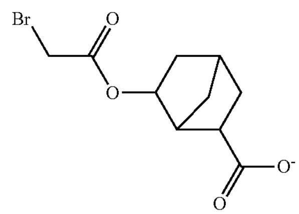 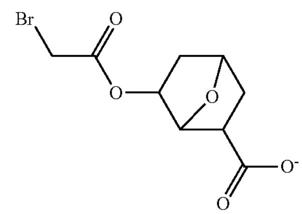
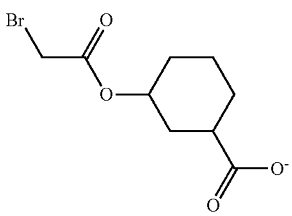 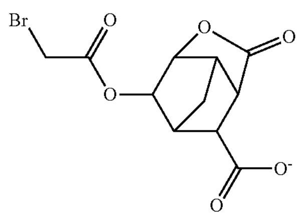 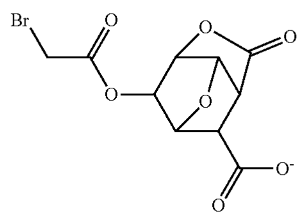
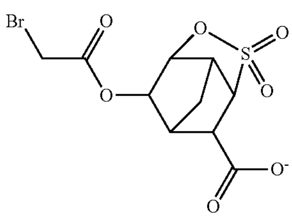 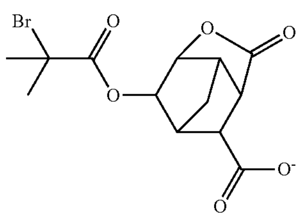 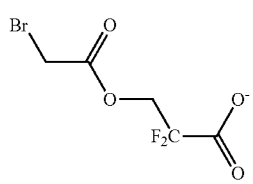 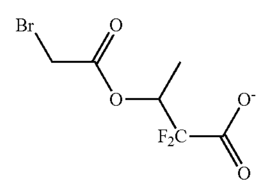
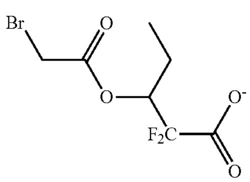 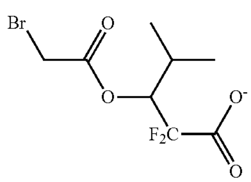 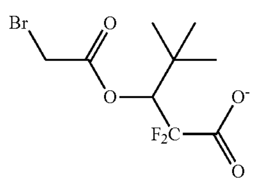 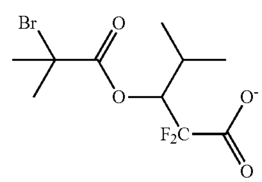
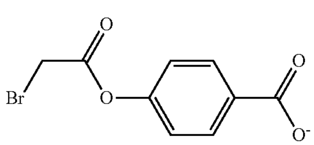 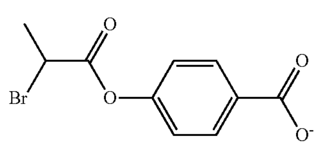 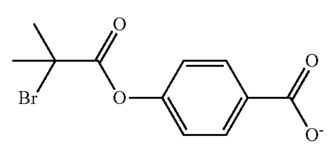
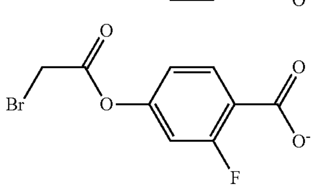 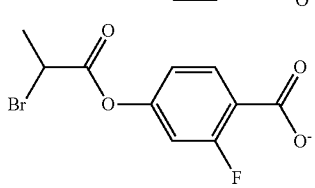 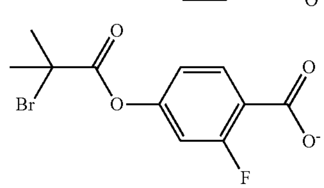

-continued
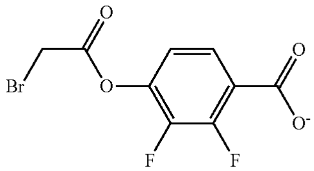
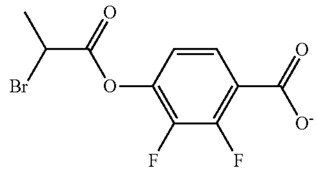
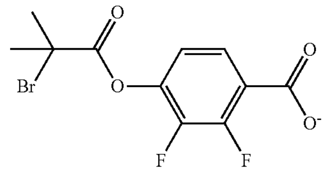
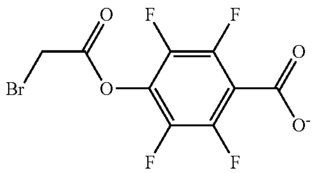
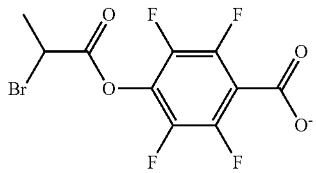
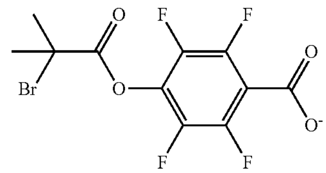
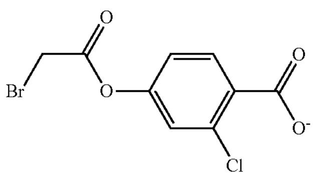
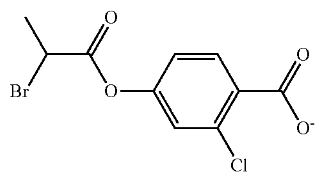
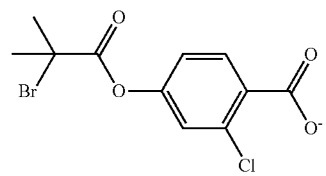
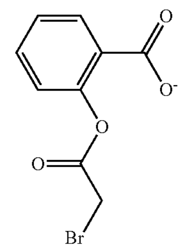
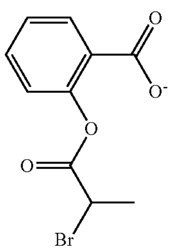
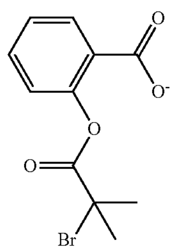
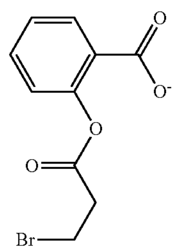
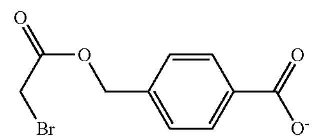
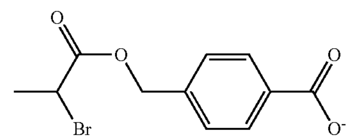
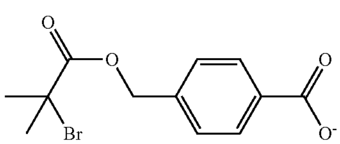
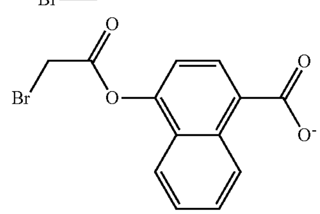
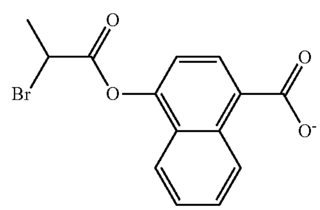
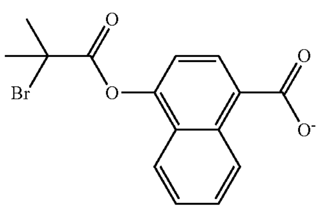
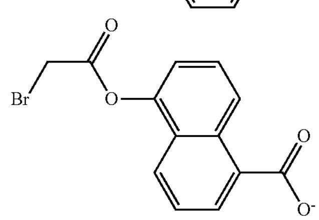
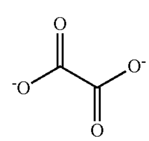
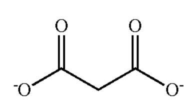
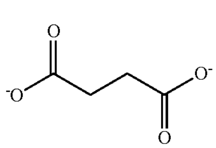
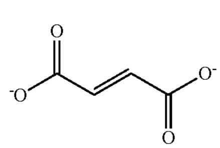
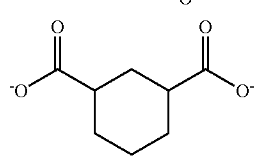
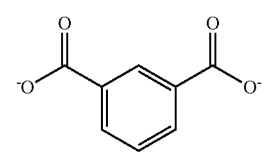
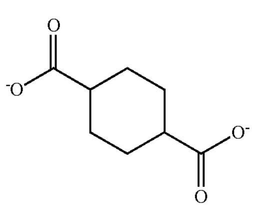
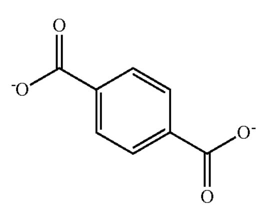
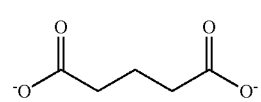
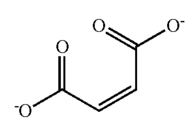
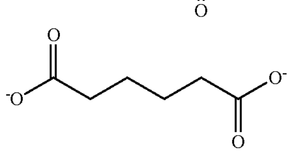
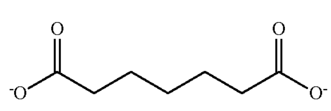
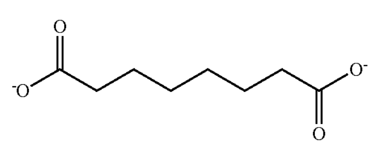

-continued
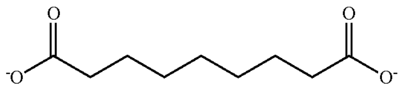
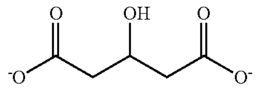
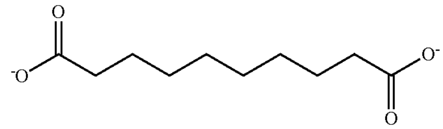
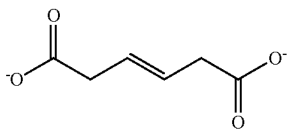
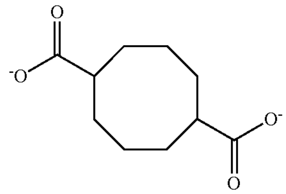
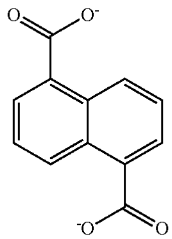
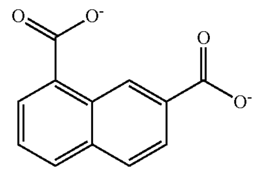
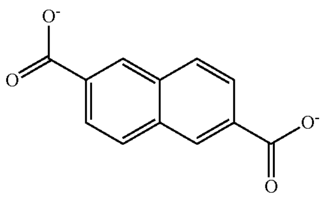
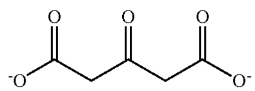
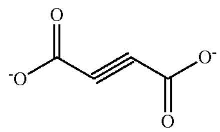
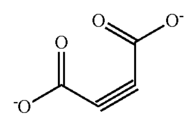
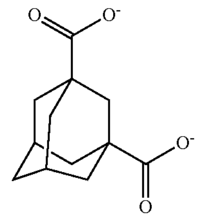
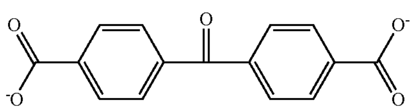
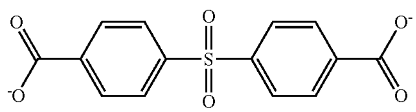
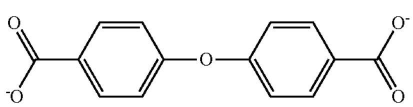
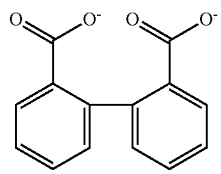
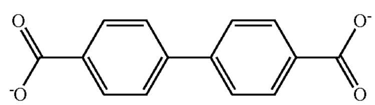
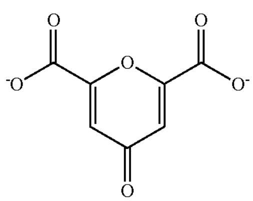
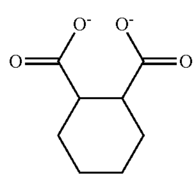
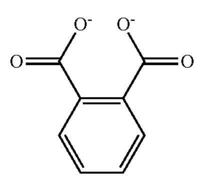
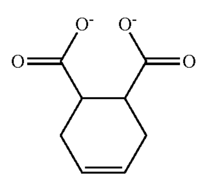
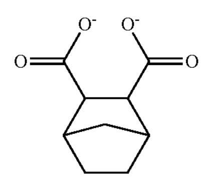
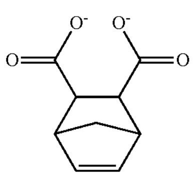
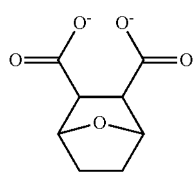
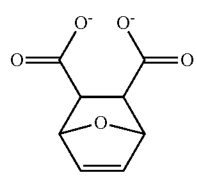
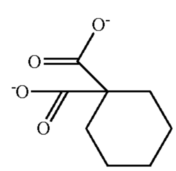
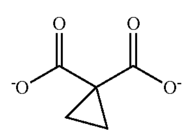
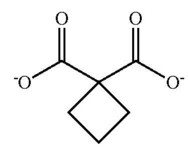
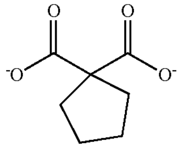
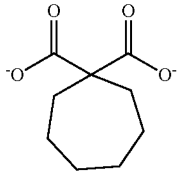
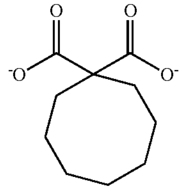
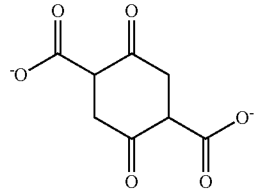
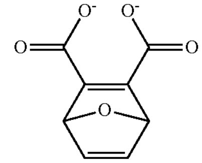
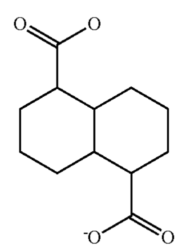
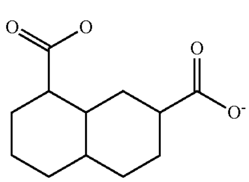
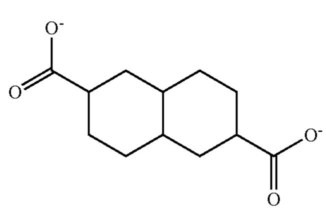
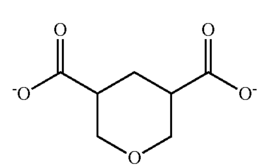
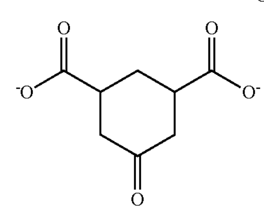

-continued
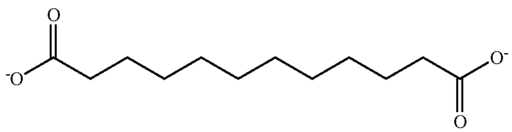
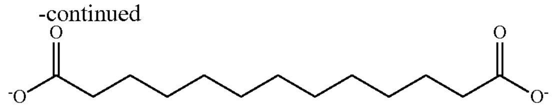
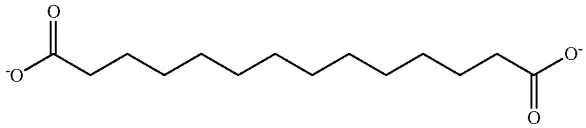
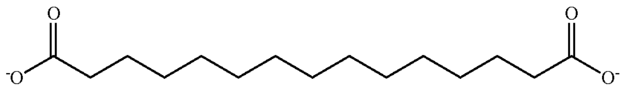
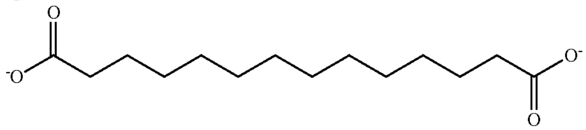
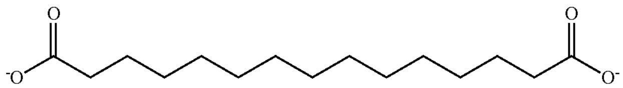
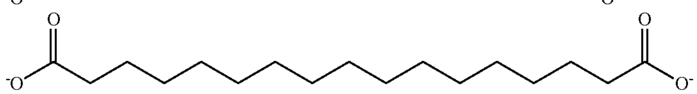
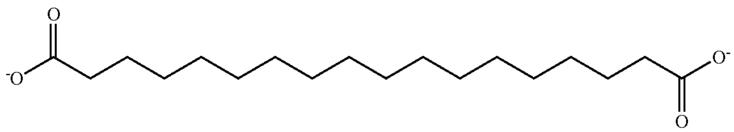
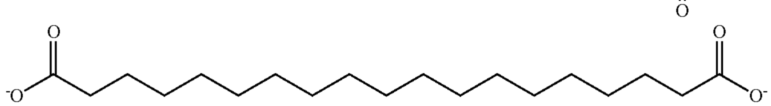
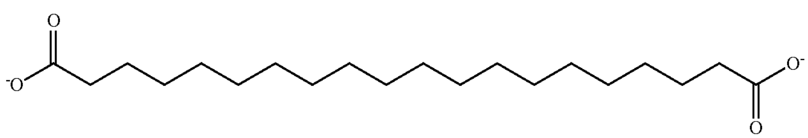
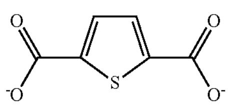
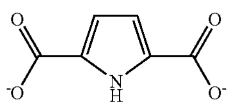
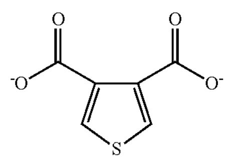
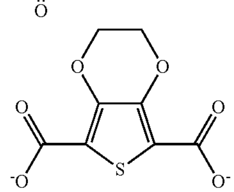
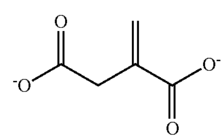
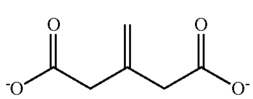
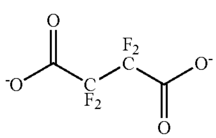
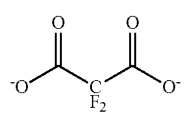
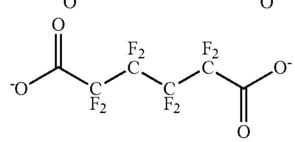
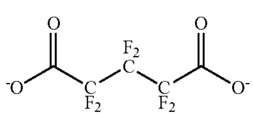
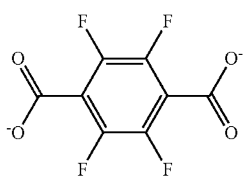
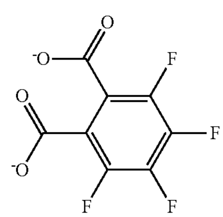
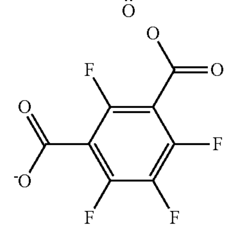
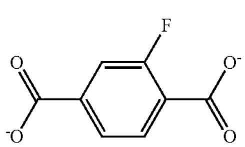
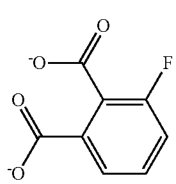
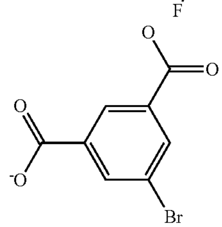
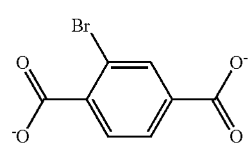
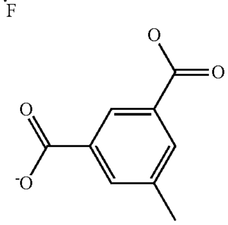

-continued
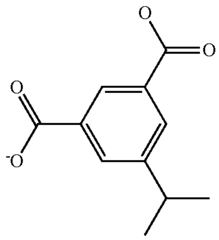
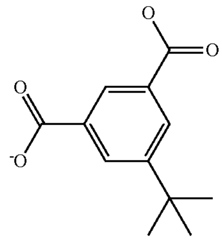
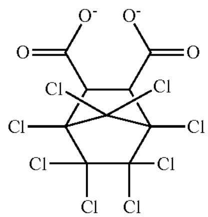
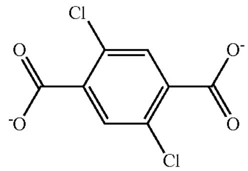
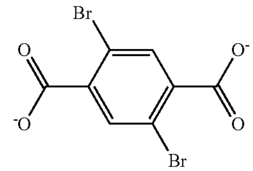
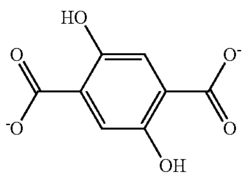
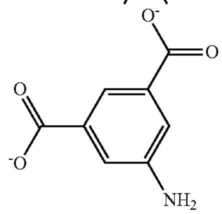
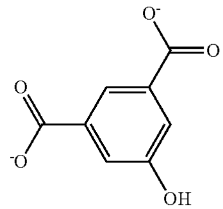
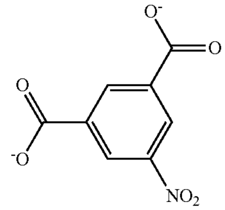
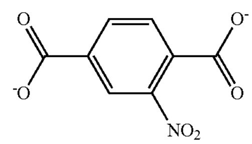
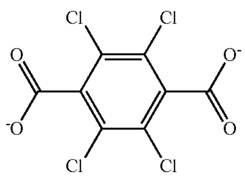
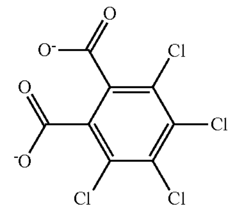
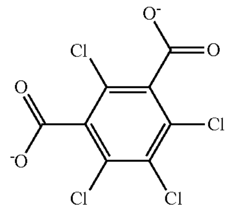
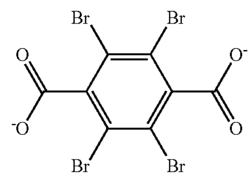
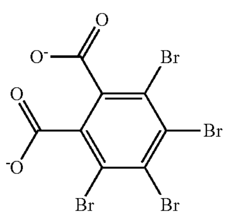
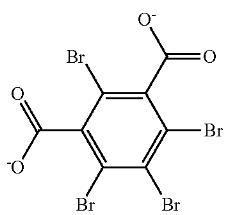
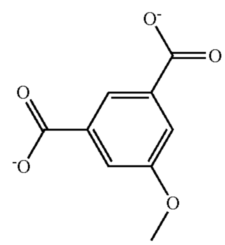
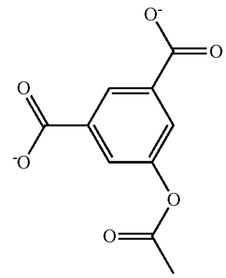
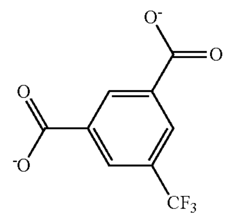
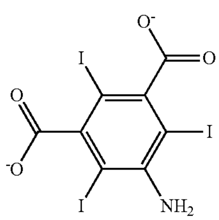
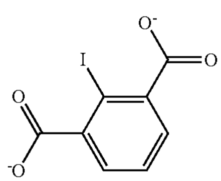
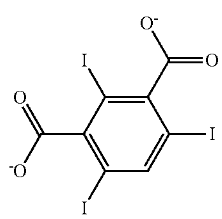
Examples of the sulfonamide anion are shown below, but not limited thereto.
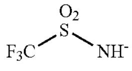
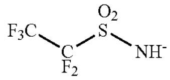
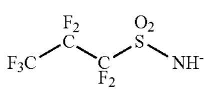
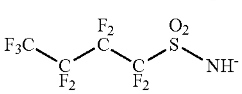
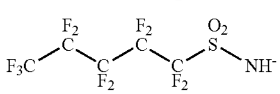
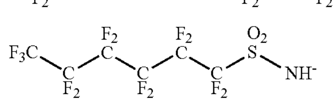
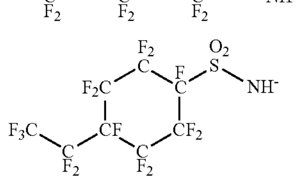
-continued
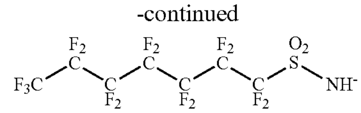
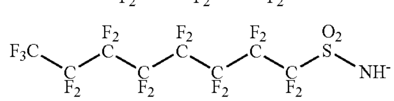
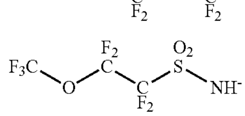
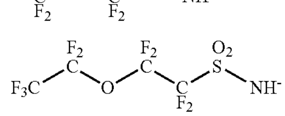
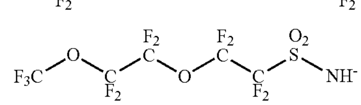
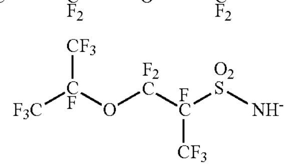

-continued
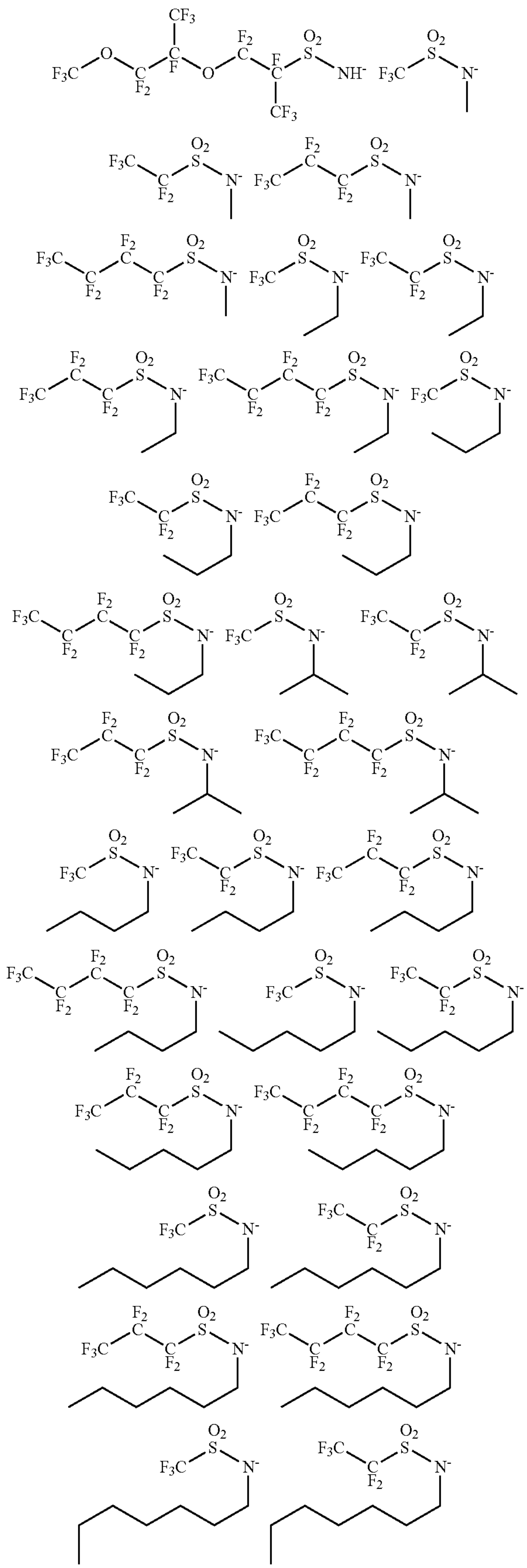
-continued
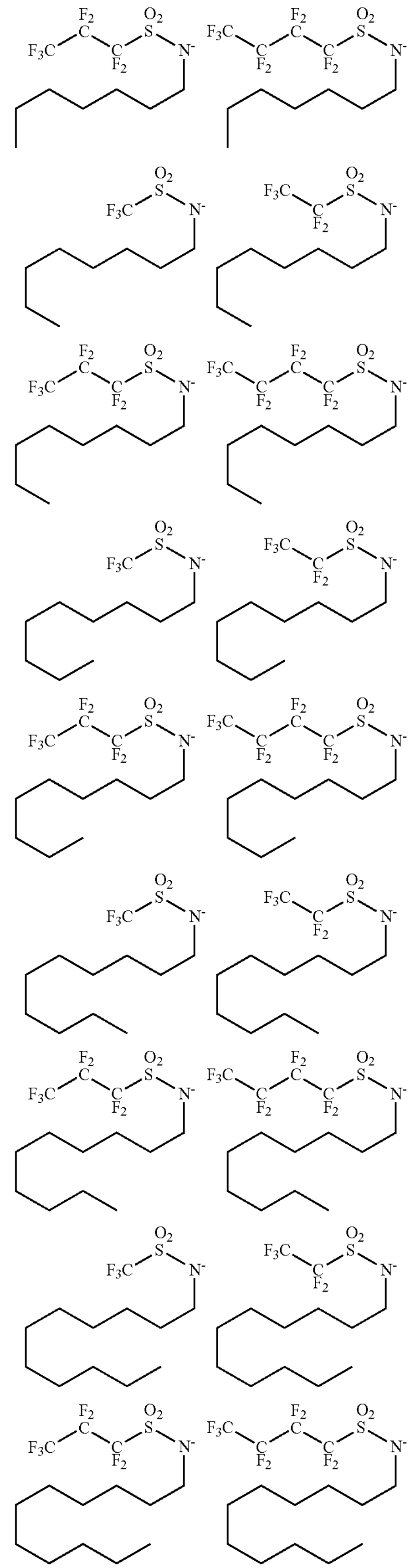

-continued
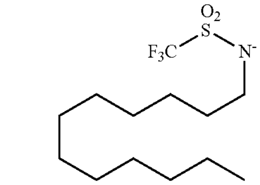 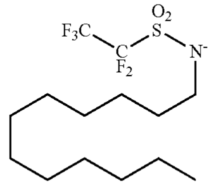
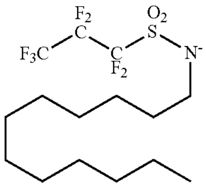 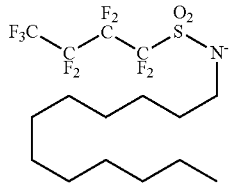
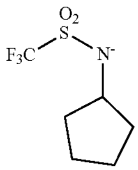 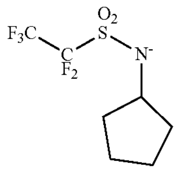 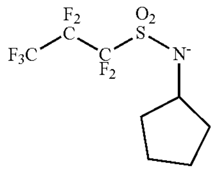
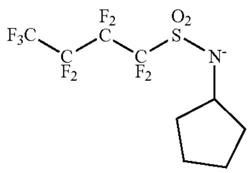 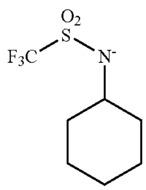
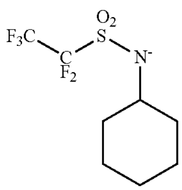 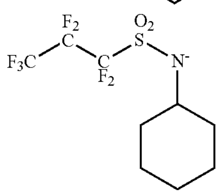
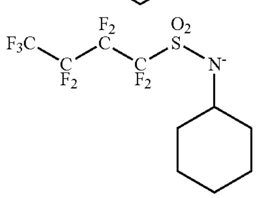 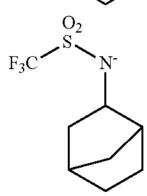
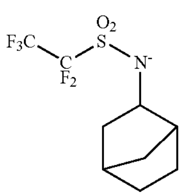 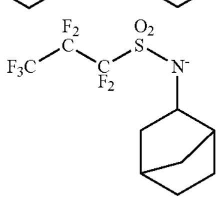
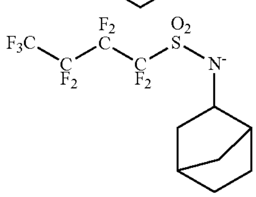 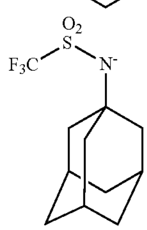
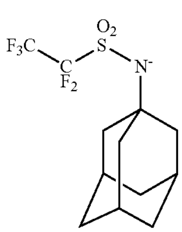 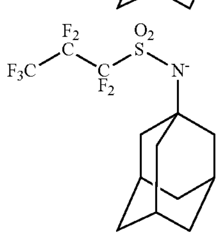
-continued
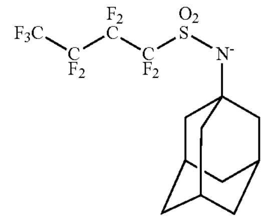 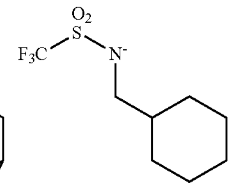
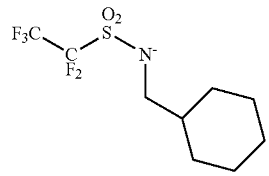 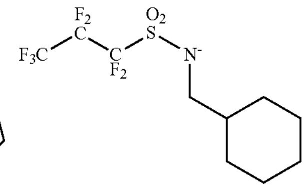
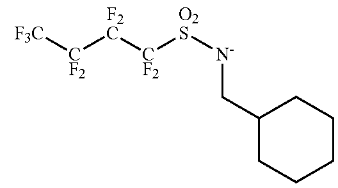 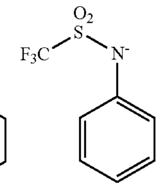
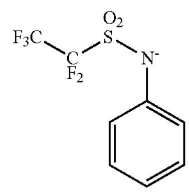 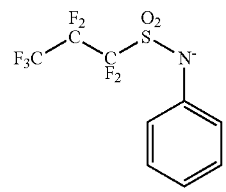
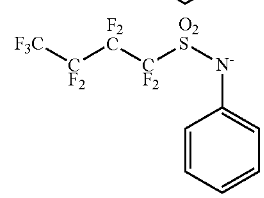 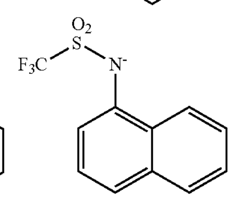
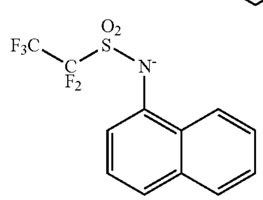 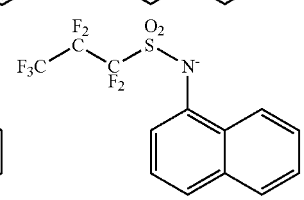
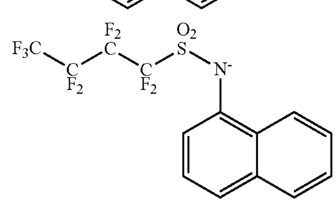 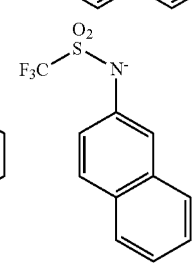
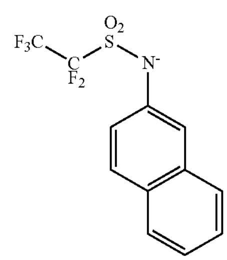 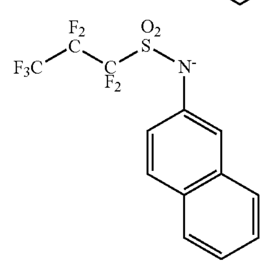

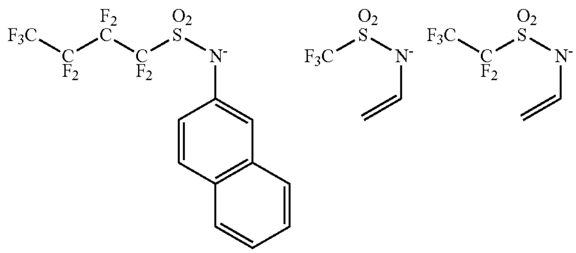
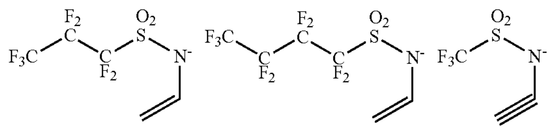
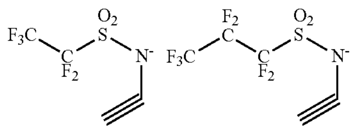
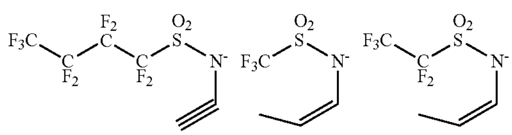
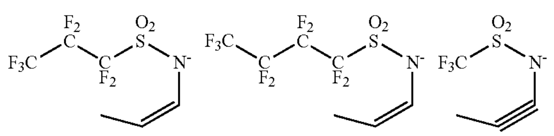
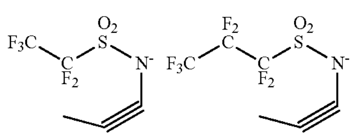
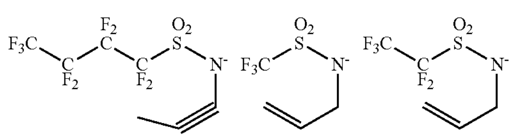
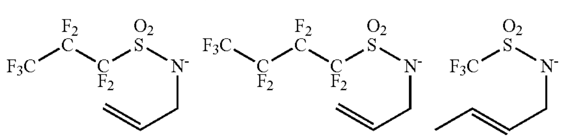
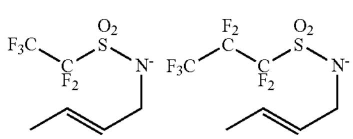
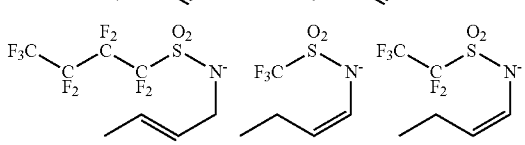
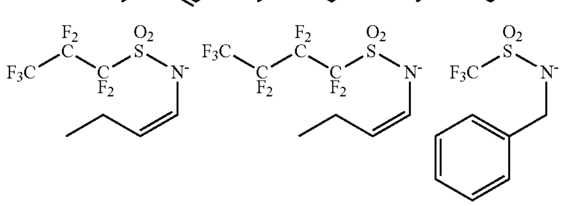
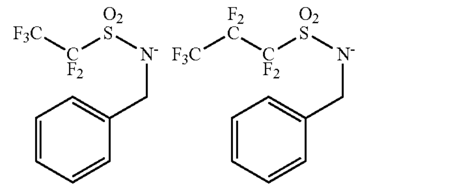
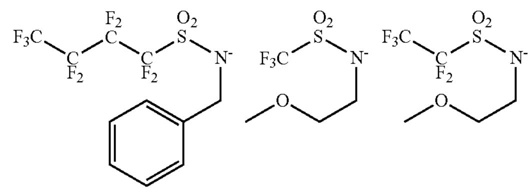
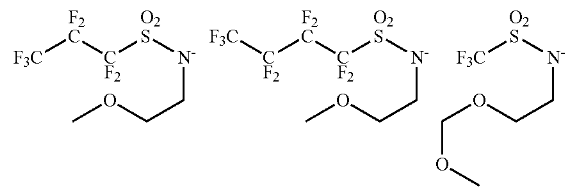
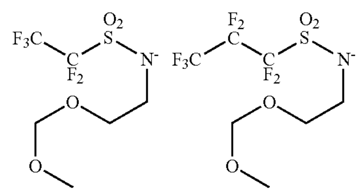
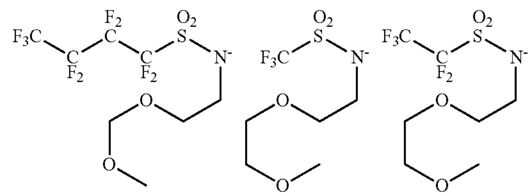
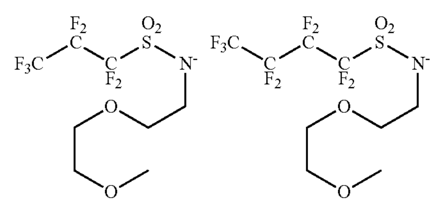
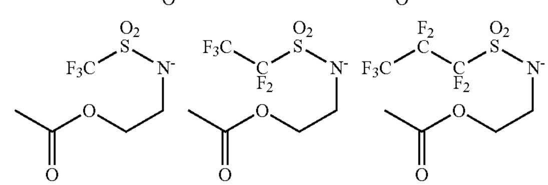
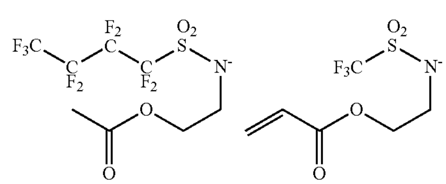
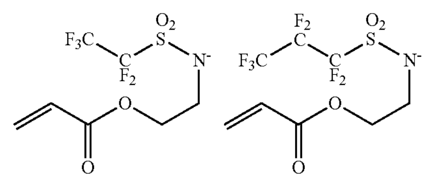

-continued
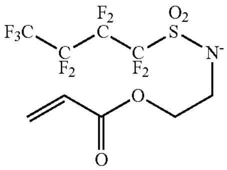
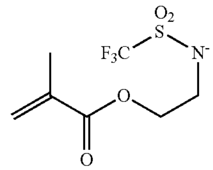
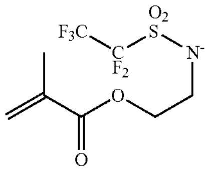
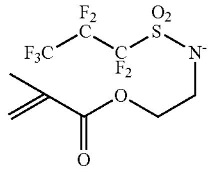
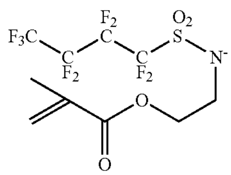
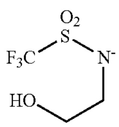
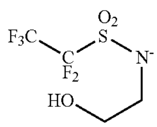
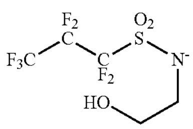
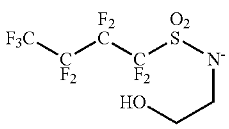
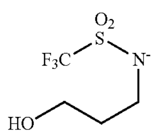
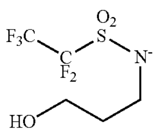
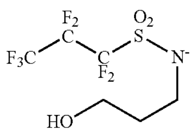
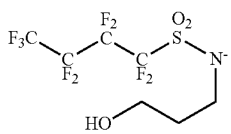
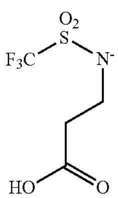
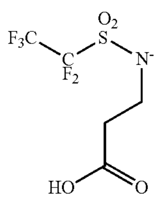
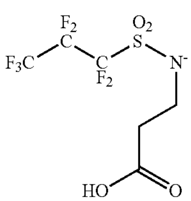
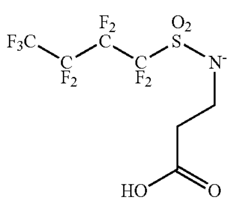
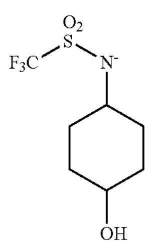
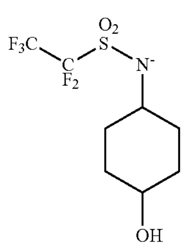
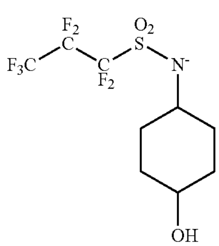
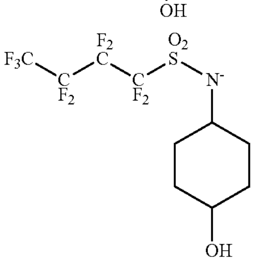
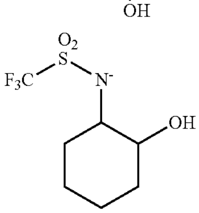
-continued
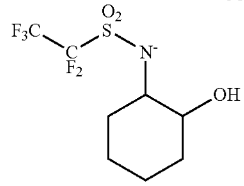
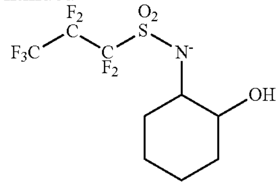
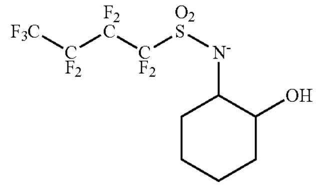
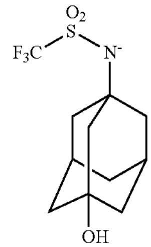
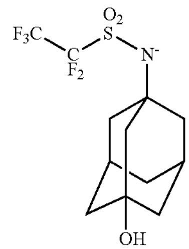
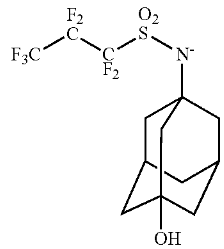
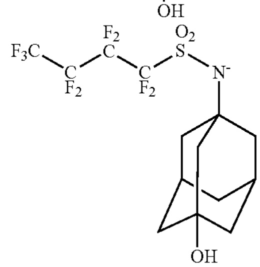
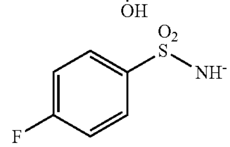
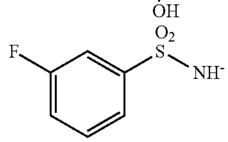
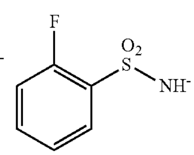
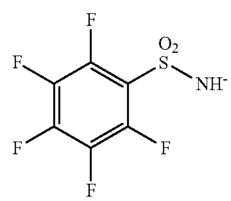
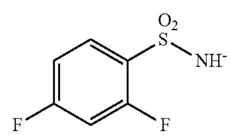
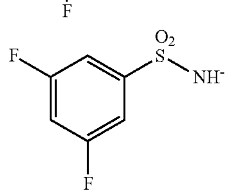
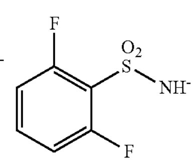
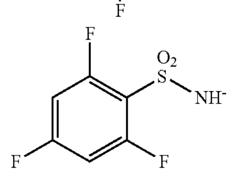
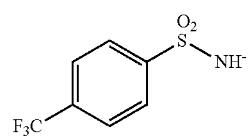
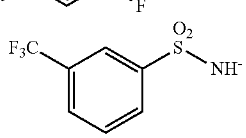
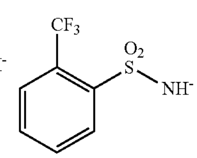

-continued
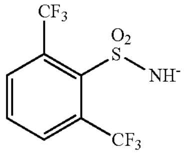
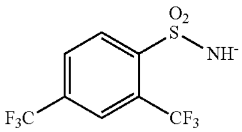
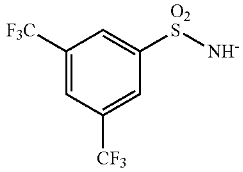
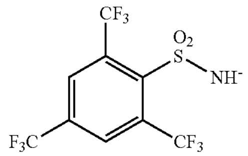
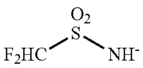
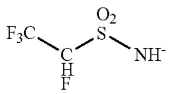
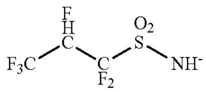
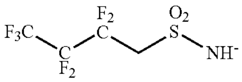
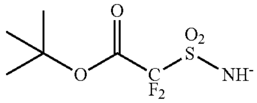
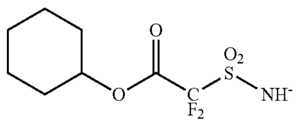
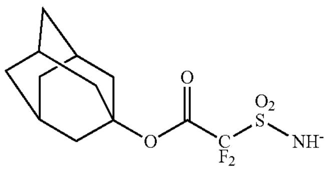
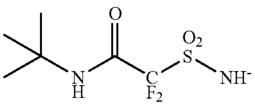
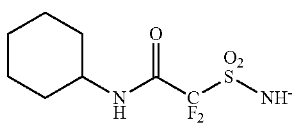
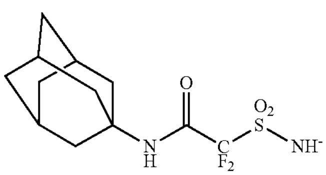
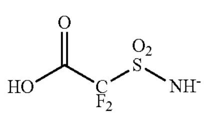
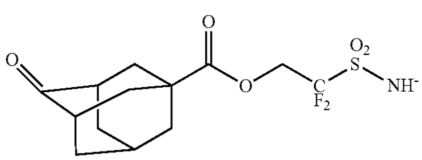
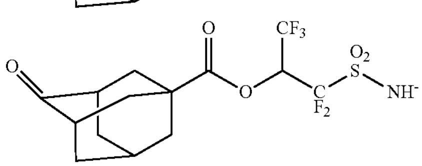
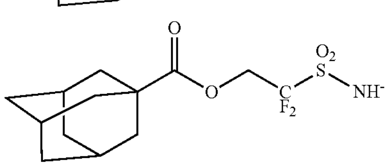
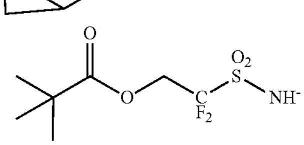
-continued
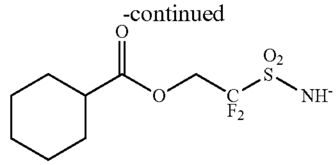
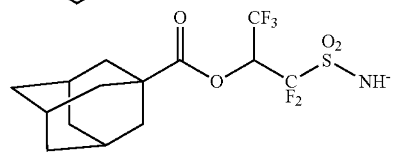
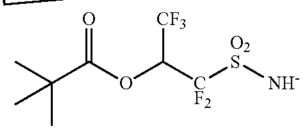
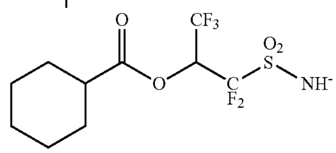
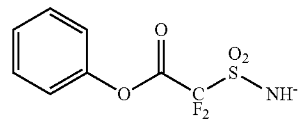
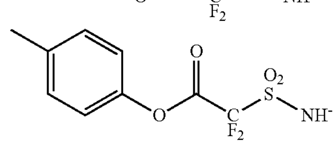
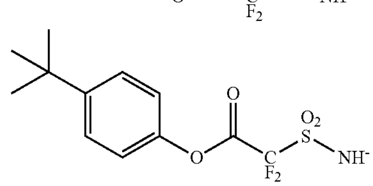
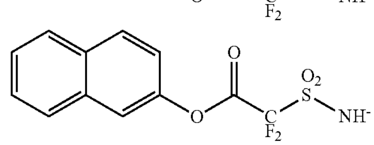
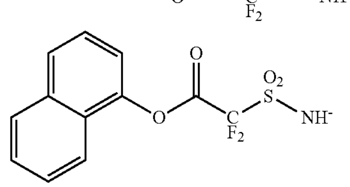
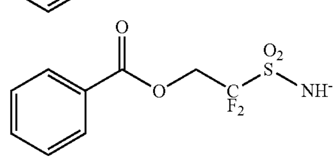
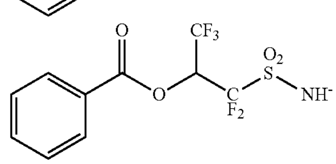
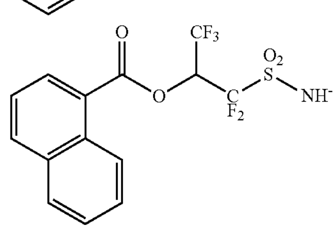

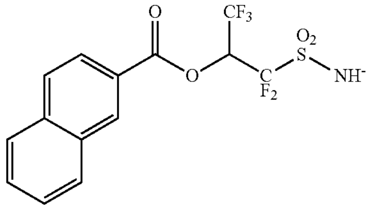
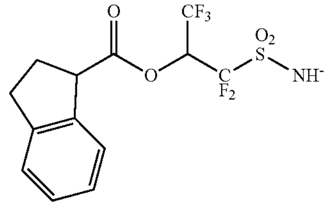
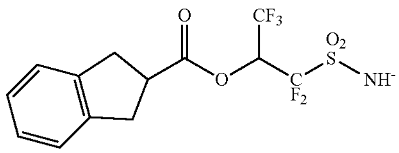
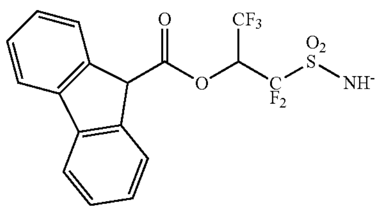
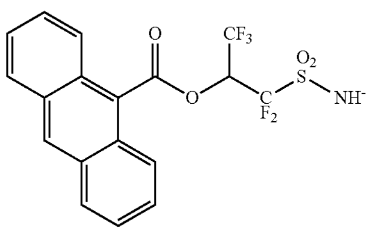
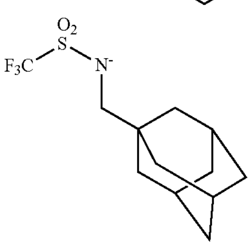
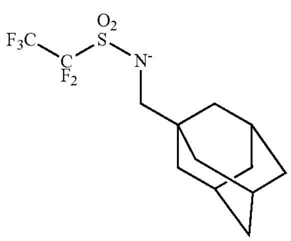
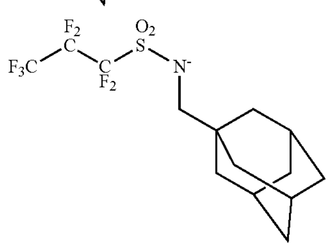
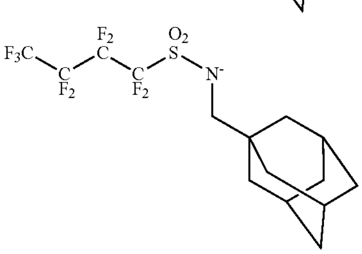
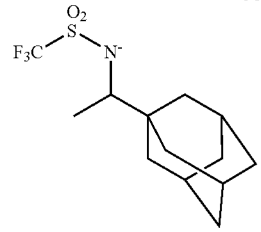
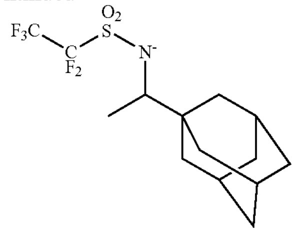
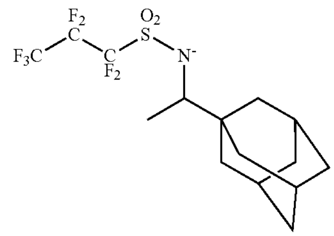
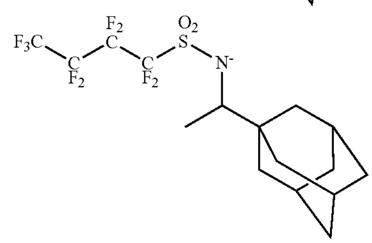
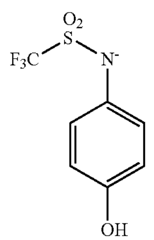
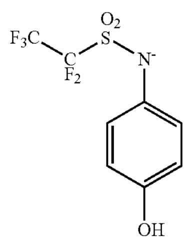
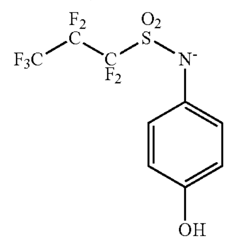
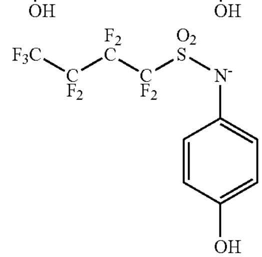
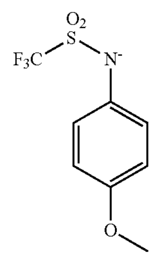
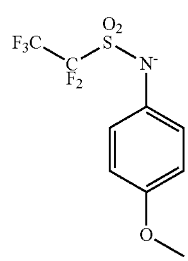
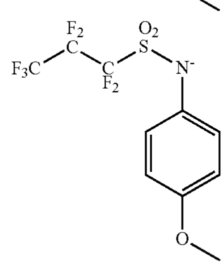
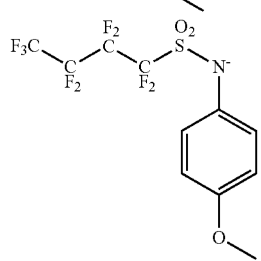
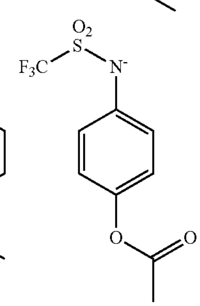

-continued
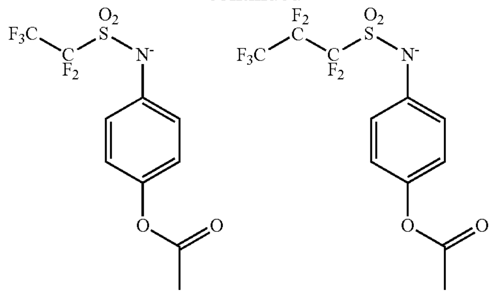
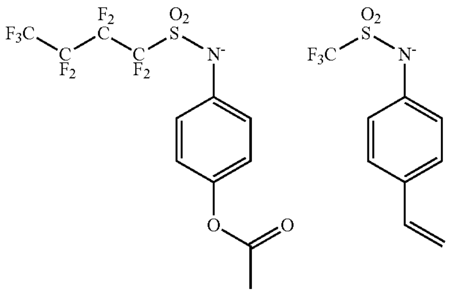
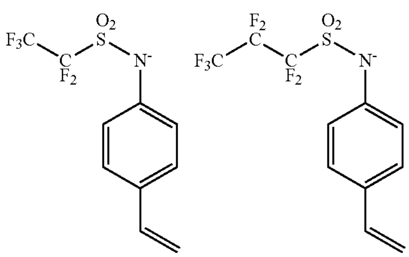
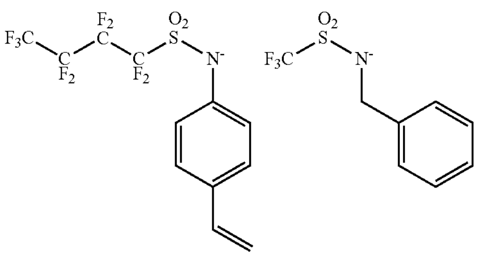
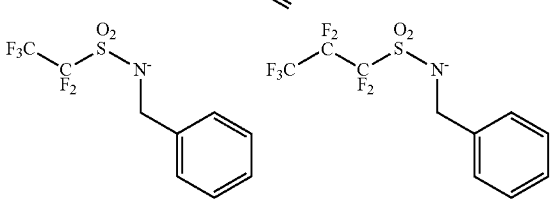
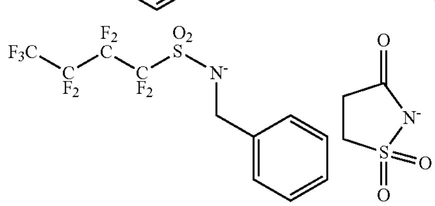
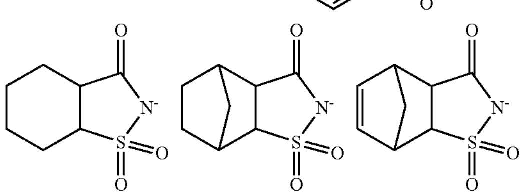
-continued
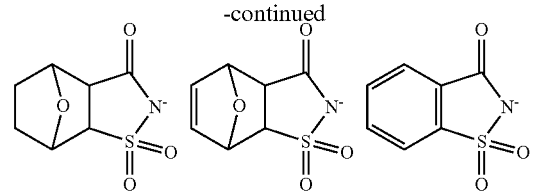
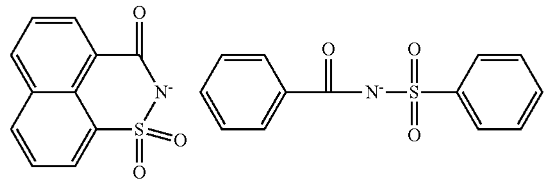
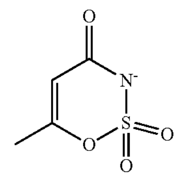
Examples of the halogenated phenoxide anion are shown below, but not limited thereto.
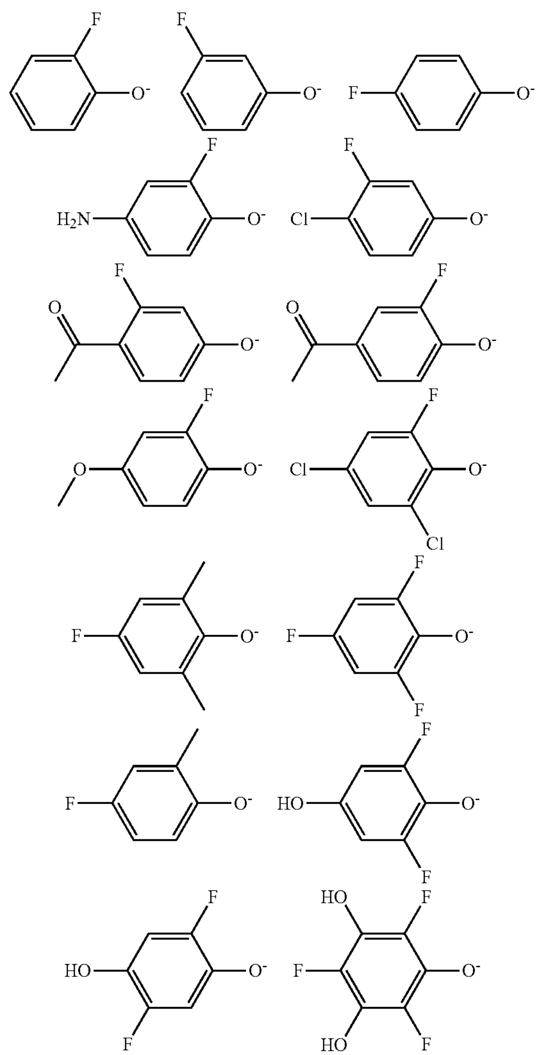

-continued
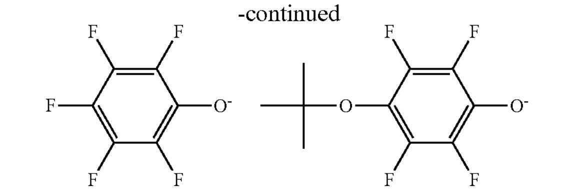
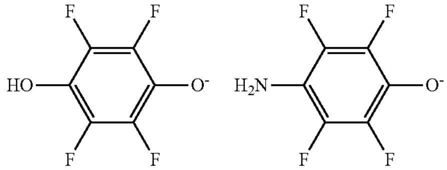
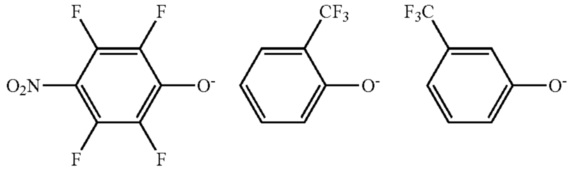
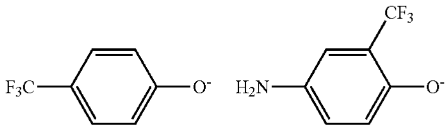
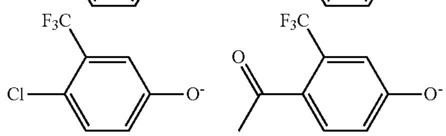
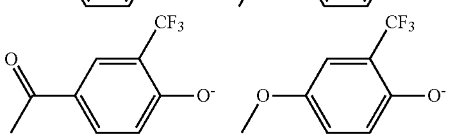
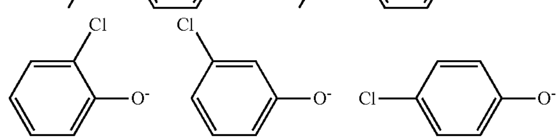
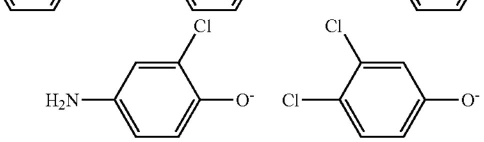
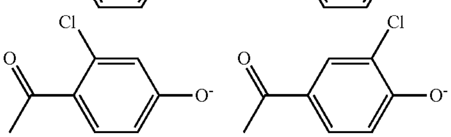
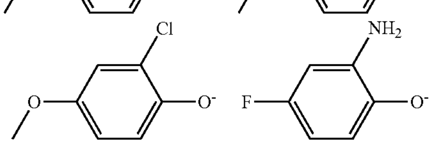
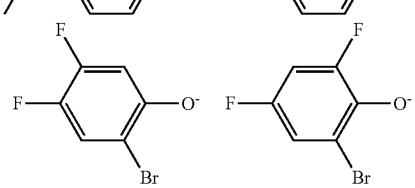
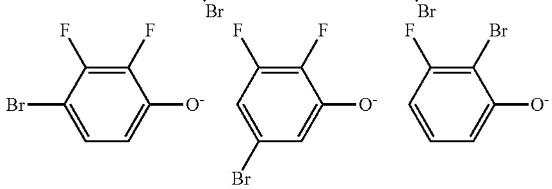
-continued
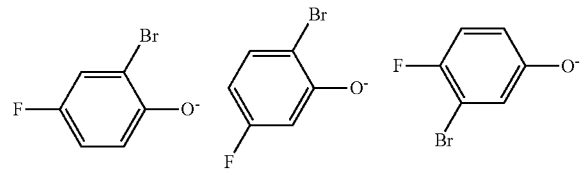
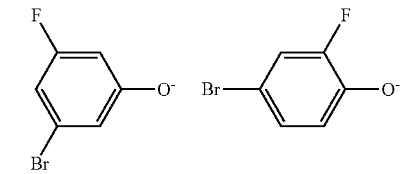
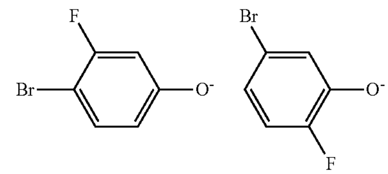
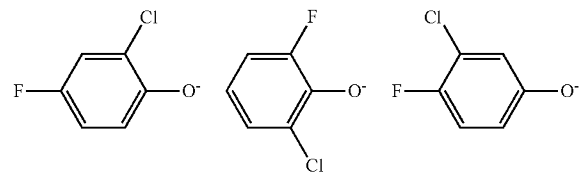
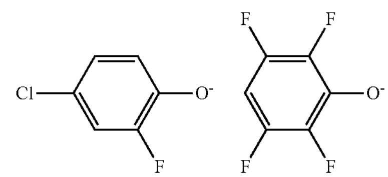
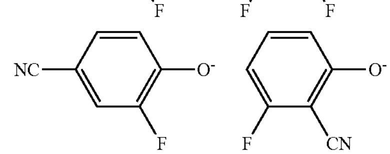
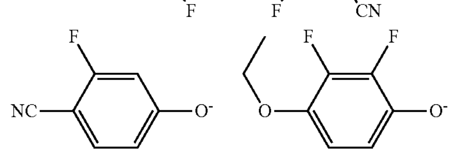
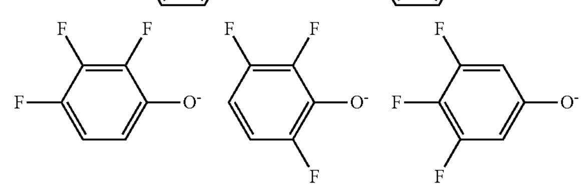
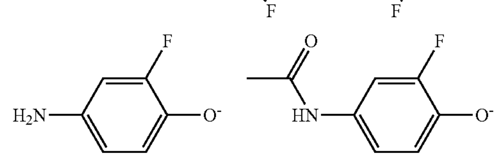
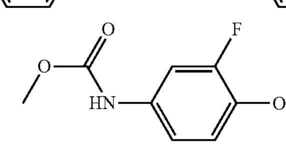
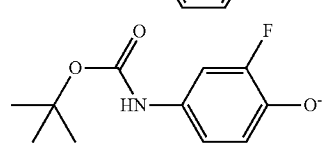

-continued
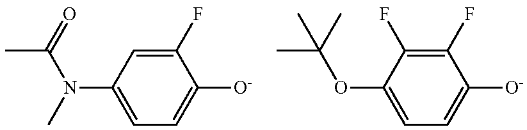
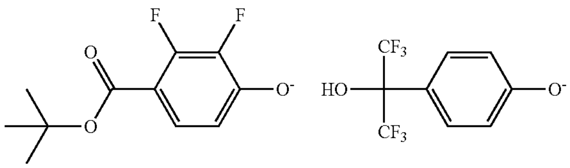
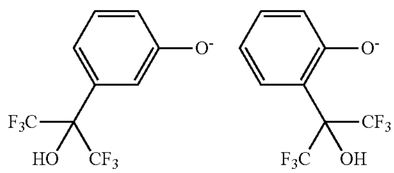
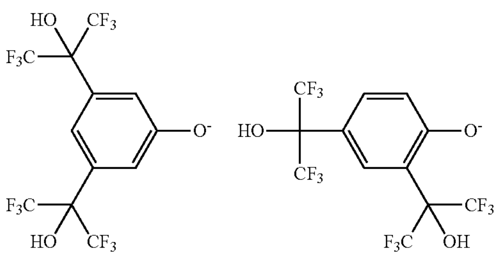
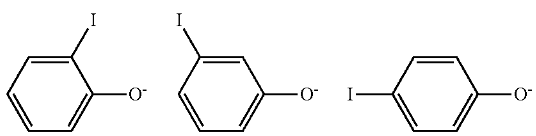
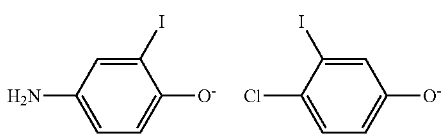
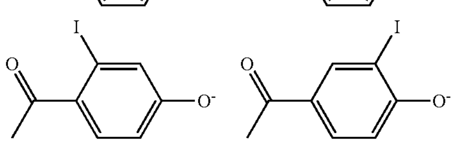
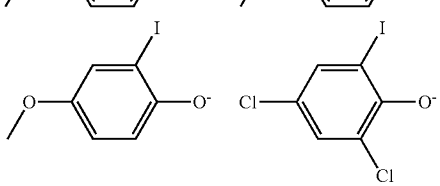
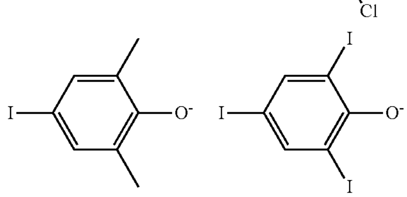
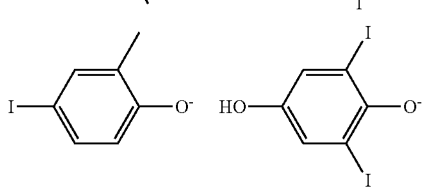
-continued
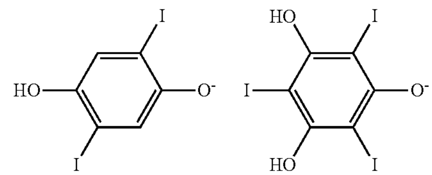
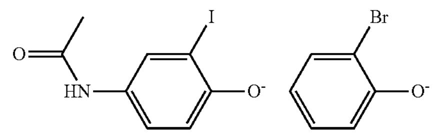
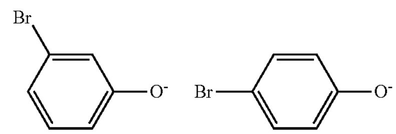
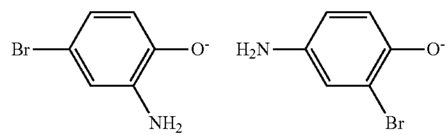
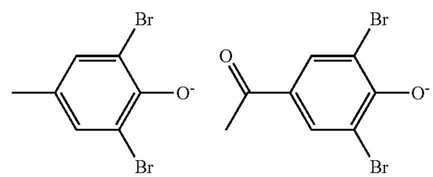
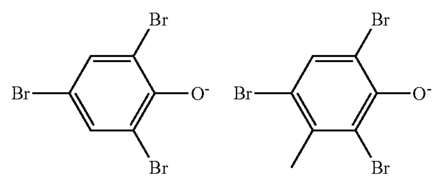
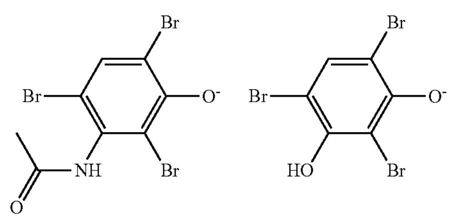
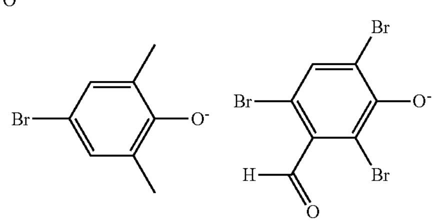
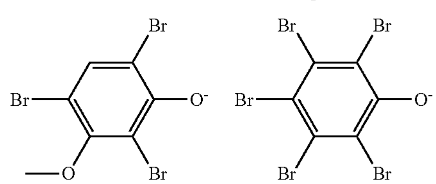
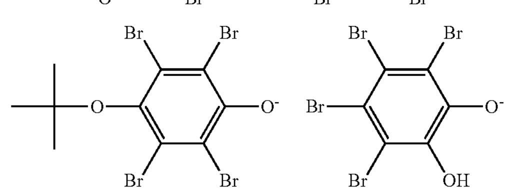

-continued

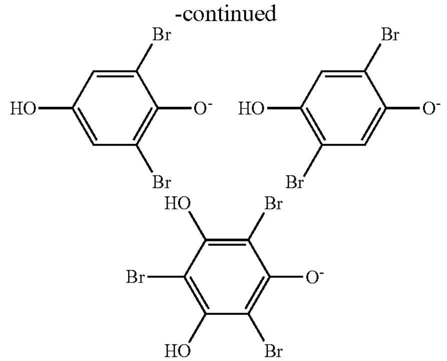

Exemplary of the halide anion are fluoride, chloride, bromide and iodide ions.

The cyclic ammonium salt may be synthesized, for example, by effecting esterification reaction of a carboxylic chloride with an amine compound having a tertiary hydroxyl group and effecting neutralization reaction of the resulting compound with a carboxylic acid or sulfonamide compound.

The cyclic ammonium salt functions as a quencher for controlling acid diffusion in a resist composition. Since it has an acid-decomposable tertiary ester group, it is decomposed with an acid to a lower molecular weight. As the amino-containing compound reduces its molecular weight, the acid diffusion ability decreases and the acid reactivity increases. It occurs in the exposed region that the cyclic ammonium salt reduces its molecular weight under the action of acid. An acid diffusion controlling ability is retained high in the unexposed region whereas acid diffusion is promoted in the exposed region.

Thus the difference in reactivity between unexposed and exposed regions is exaggerated, leading to an improvement in reaction contrast. It is thus possible to improve a contrast while suppressing acid diffusion.

In the resist composition, the cyclic ammonium salt is preferably present in an amount of 0.001 to 50 parts by weight, more preferably 0.01 to 40 parts by weight per 100 parts by weight of the base polymer, as viewed from sensitivity and acid diffusion suppressing effect. The cyclic ammonium salt may be used alone or in admixture.

In the unexposed region or prior to acid decomposition, the cyclic ammonium salt is highly lipophilic and least dissolvable in alkaline developer. After acid decomposition, it releases a cyclic ammonium salt having a low molecular weight and a carboxylic acid. Thus alkaline solubility is increased, which is particularly effective in the case of alkaline development. That is, any pattern film thickness loss is restrained in the unexposed region whereas scum formation at the pattern bottom is prevented in the exposed region. Particularly when the resist film has a thickness of at least 100 nm, the heterocyclic amine compound is effective for preventing scum formation at the pattern bottom in the exposed region.

Base Polymer

Where the resist composition is of positive tone, the base polymer comprises recurring units containing an acid labile group, preferably recurring units having the formula (a1) or recurring units having the formula (a2). These units are simply referred to as recurring units (a1) and (a2).

(a1)

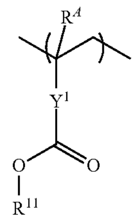

(a2)

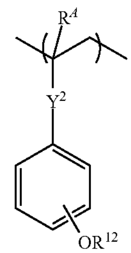

In formulae (a1) and (a2), $R^A$ is each independently hydrogen or methyl. $R^{11}$ and $R^{12}$ each are an acid labile group. $Y^1$ is a single bond, phenylene or naphthylene group, or $C_5$-$C_{12}$ linking group containing at least one moiety selected from ester bond and lactone ring. $Y^2$ is a single bond or ester bond. When the base polymer contains both recurring units (a1) and (a2). $R^{11}$ and $R^{12}$ may be the same or different.

Examples of the monomer from which the recurring units (a1) are derived are shown below, but not limited thereto. $R^A$ and $R^{11}$ are as defined above.

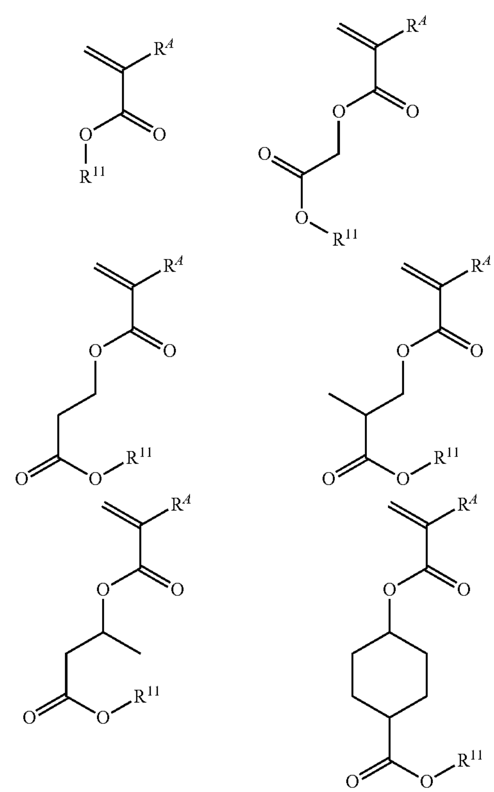

-continued
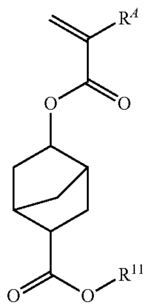
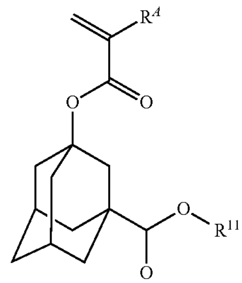
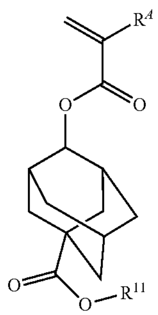
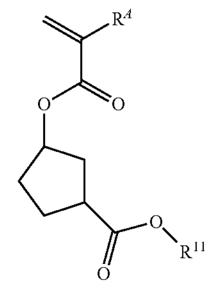
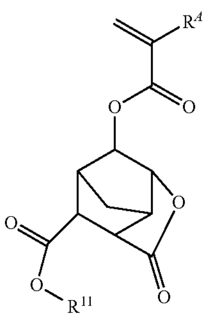
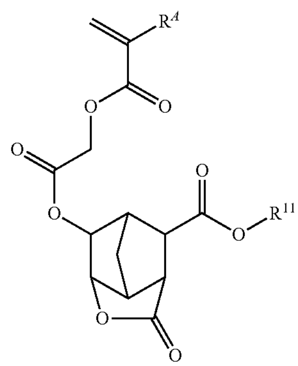
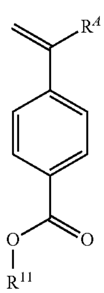
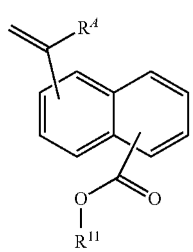
Examples of the monomer from which the recurring units (a2) are derived are shown below, but not limited thereto. $R^A$ and $R^{12}$ are as defined above.
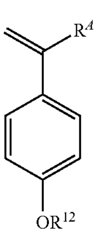
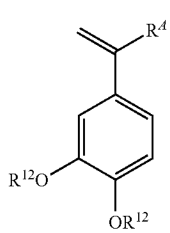
-continued
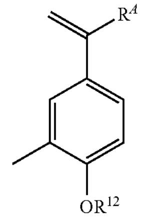
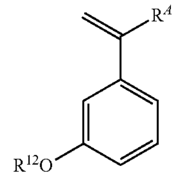
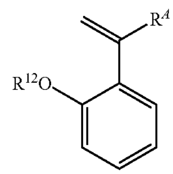
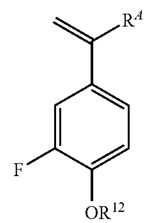
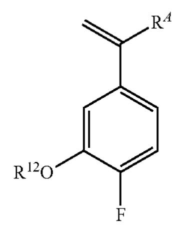
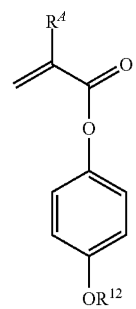
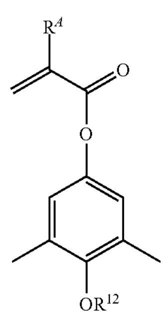
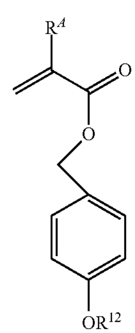
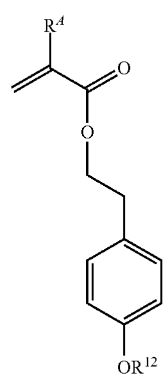
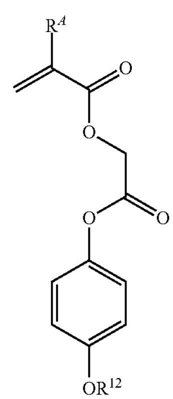

-continued

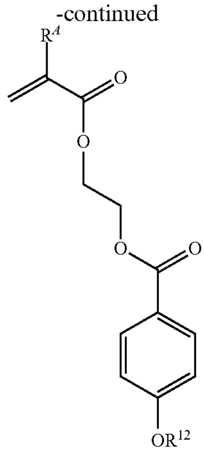

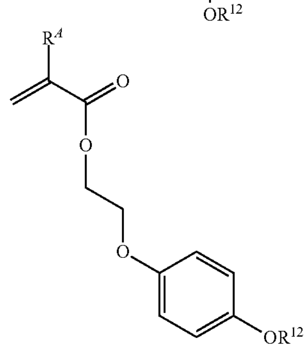

The acid labile groups represented by $R^{11}$ and $R^{12}$ in formulae (a1) and (a2) may be selected from a variety of such groups, for example, those groups described in JP-A 2013-080033 (U.S. Pat. No. 8,574,817) and JP-A 2013-083821 (U.S. Pat. No. 8,846,303).

Typical of the acid labile group are groups of the following formulae (AL-1) to (AL-3).

(AL-1)

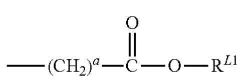

(AL-2)

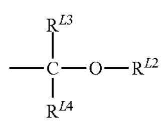

(AL-3)

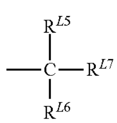

In formulae (AL-1) and (AL-2), $R^{L1}$ and $R^{L2}$ are each independently a $C_1$-$C_{40}$ monovalent hydrocarbon group which may contain a heteroatom such as oxygen, sulfur, nitrogen or fluorine. The monovalent hydrocarbon groups may be straight, branched or cyclic while $C_1$-$C_{40}$ alkyl groups are preferred, and $C_1$-$C_{20}$ alkyl groups are more preferred. In formula (AL-1), "a" is an integer of 0 to 10, preferably 1 to 5.

In formula (AL-2), $R^{L3}$ and $R^{L4}$ are each independently hydrogen or a $C_1$-$C_{20}$ monovalent hydrocarbon group which may contain a heteroatom such as oxygen, sulfur, nitrogen or fluorine. The monovalent hydrocarbon groups may be straight, branched or cyclic while $C_1$-$C_{20}$ alkyl groups are preferred. Any two of $R^{L2}$, $R^{L3}$ and $R^{L4}$ may bond together to form a ring, typically alicyclic, with the carbon atom or carbon and oxygen atoms to which they are attached, the ring containing 3 to 20 carbon atoms, preferably 4 to 16 carbon atoms.

In formula (AL-3), $R^{L5}$, $R^{L6}$ and $R^{L7}$ are each independently a $C_1$-$C_{20}$ monovalent hydrocarbon group which may contain a heteroatom such as oxygen, sulfur, nitrogen or fluorine. The monovalent hydrocarbon groups may be straight, branched or cyclic while $C_1$-$C_{20}$ alkyl groups are preferred. Any two of $R^{L5}$, $R^{L6}$ and $R^{L7}$ may bond together to form a ring, typically alicyclic, with the carbon atom to which they are attached, the ring containing 3 to 20 carbon atoms, preferably 4 to 16 carbon atoms.

The base polymer may further comprise recurring units (b) having a phenolic hydroxyl group as an adhesive group. Examples of suitable monomers from which recuring units (b) are derived are given below, but not limited thereto. Herein $R^A$ is as defined above.

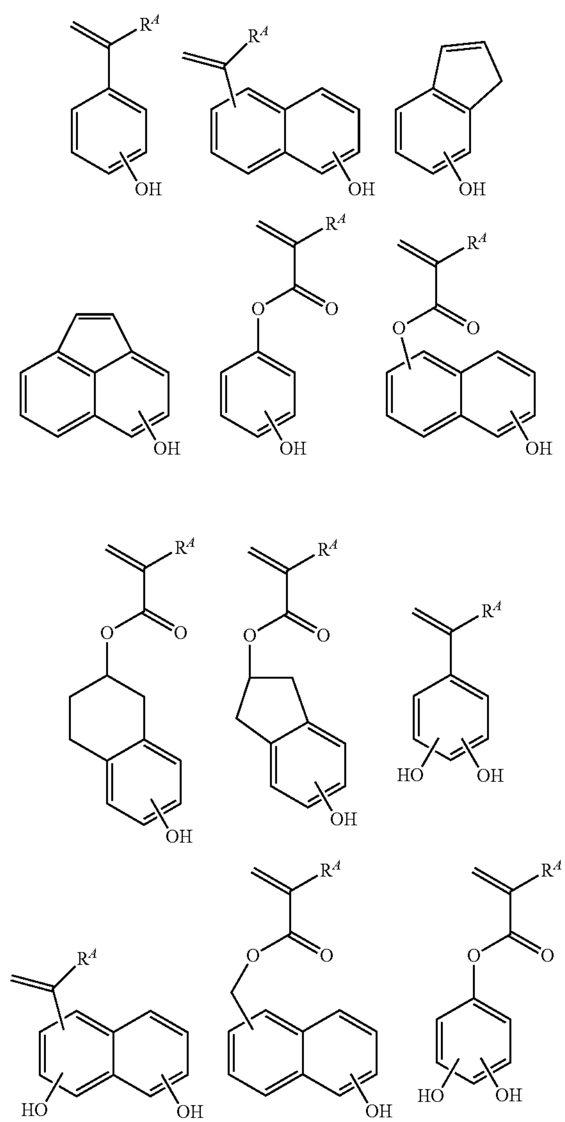

-continued

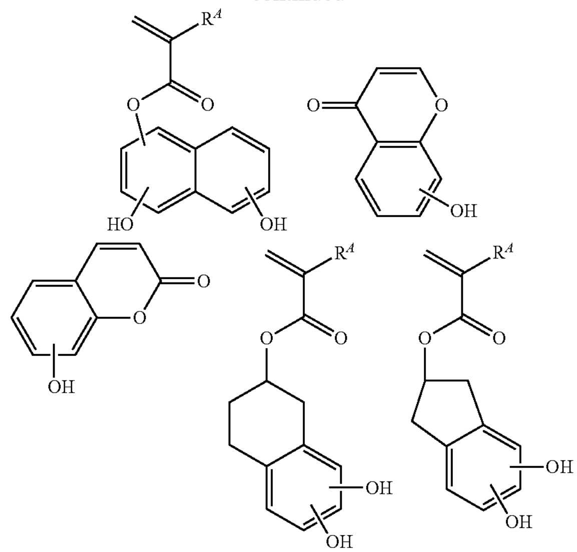

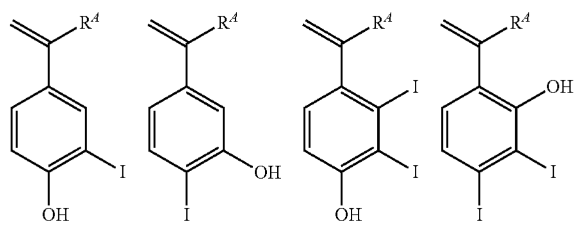

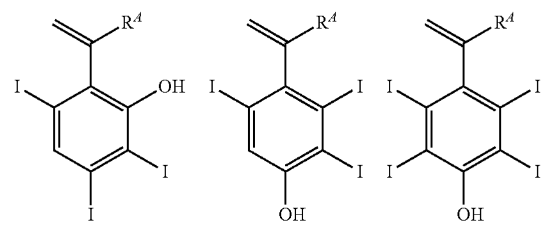

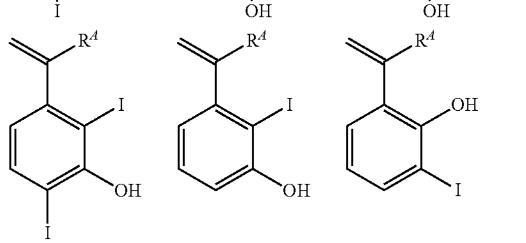

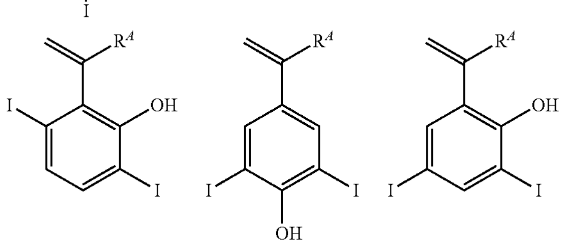

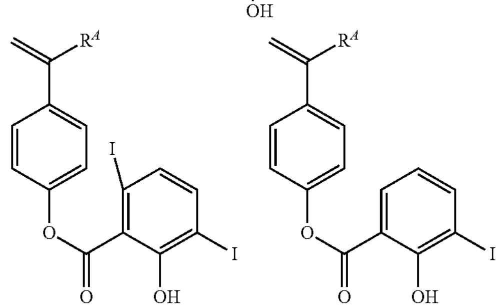

-continued

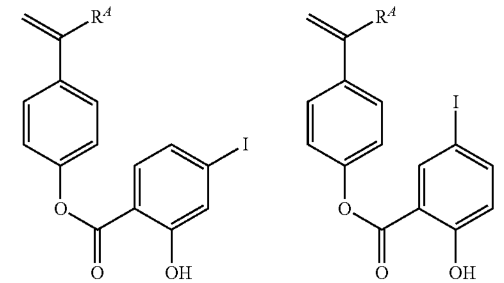

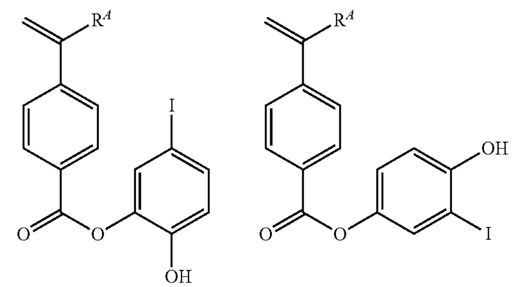

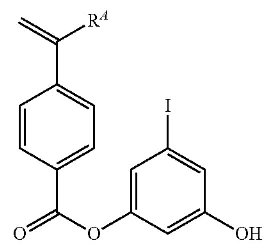

Further, recurring units (c) having another adhesive group selected from hydroxyl (other than the foregoing phenolic hydroxyl), lactone ring, ether bond, ester bond, carbonyl, cyano, and carboxyl groups may also be incorporated in the base polymer. Examples of suitable monomer from which recurring units (c) are derived are given below, but not limited thereto. Herein $R^A$ is as defined above.

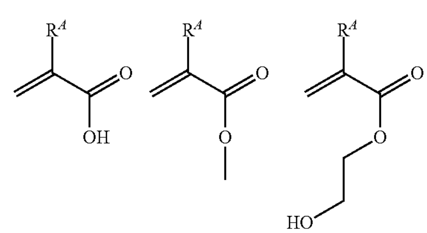

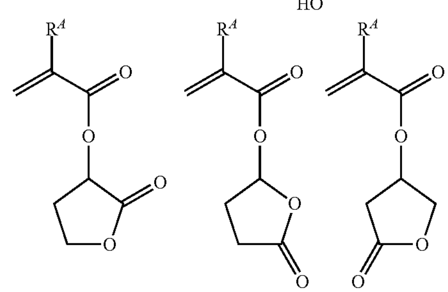

-continued
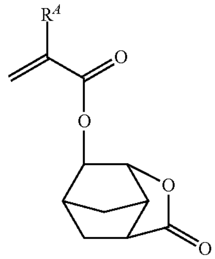
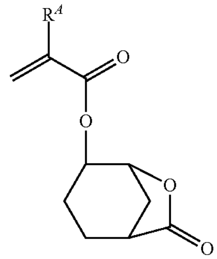
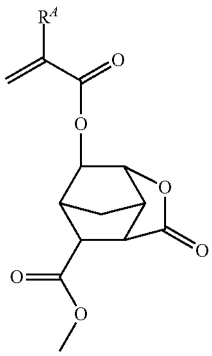
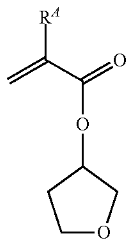
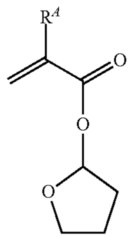
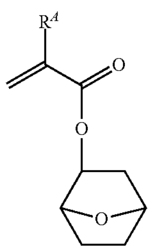
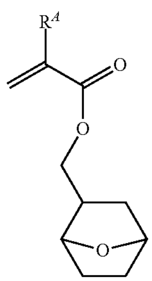
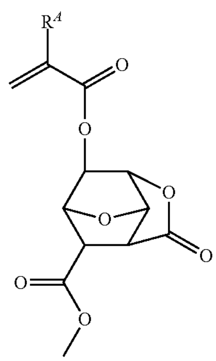
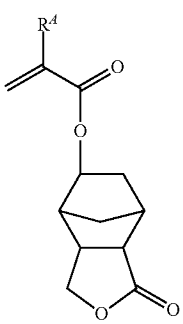
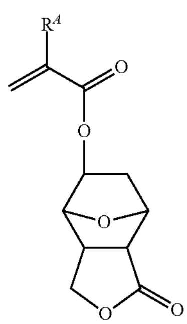
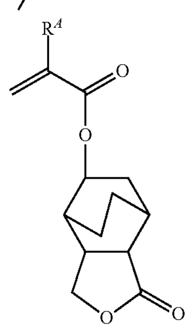
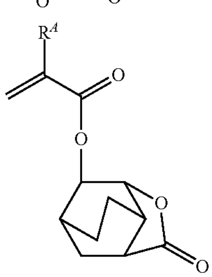
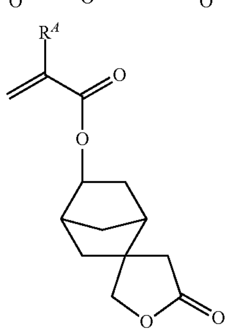
-continued
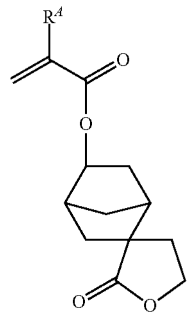
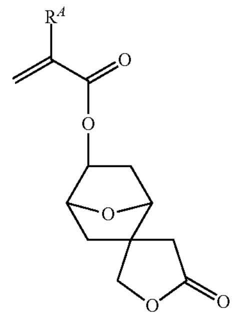
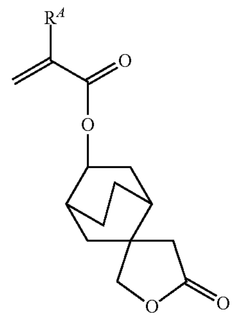
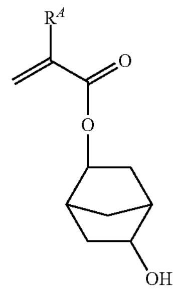
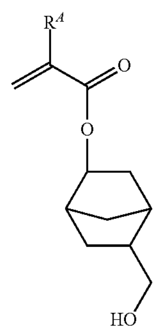
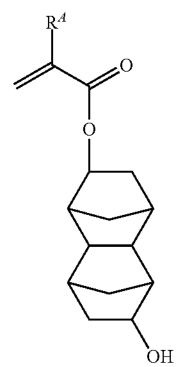
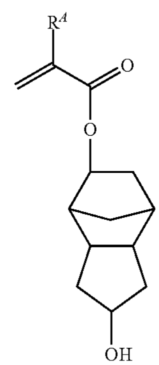
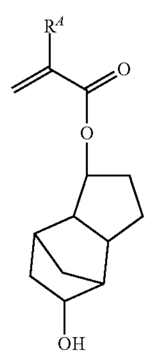
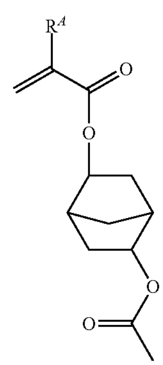
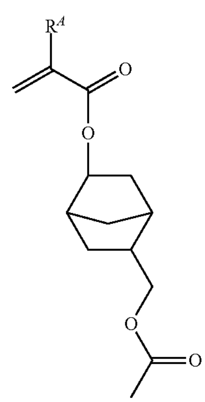

-continued
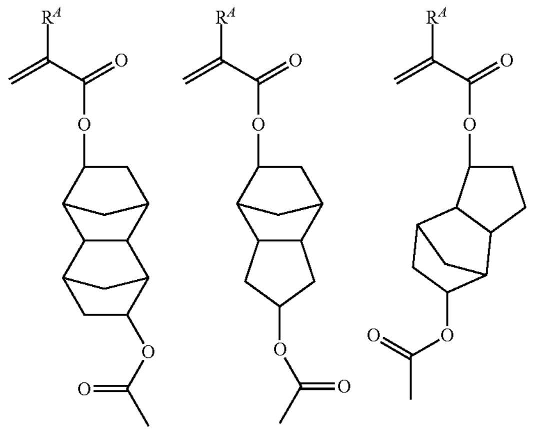
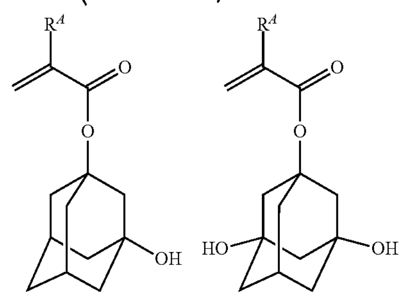
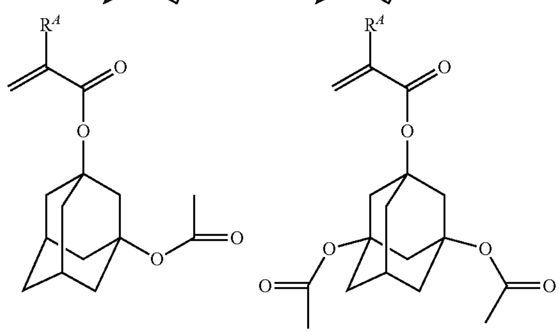
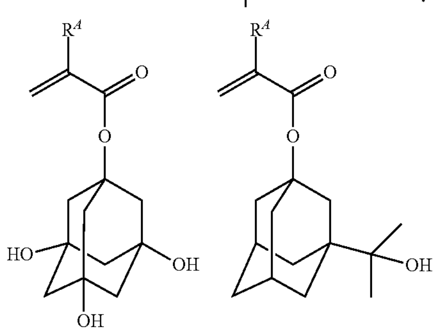
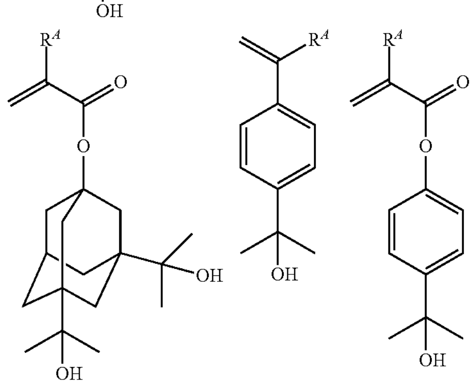
-continued
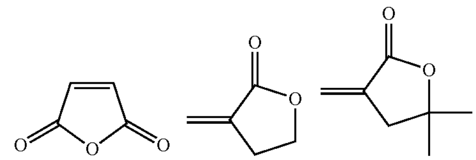
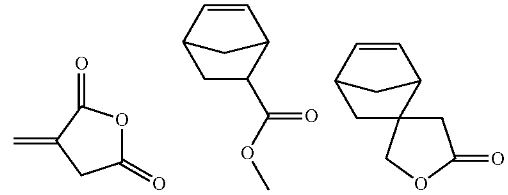
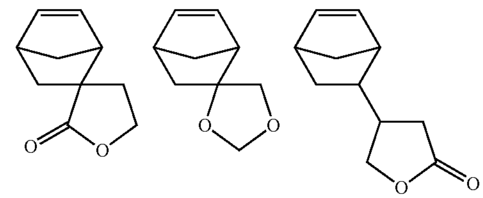
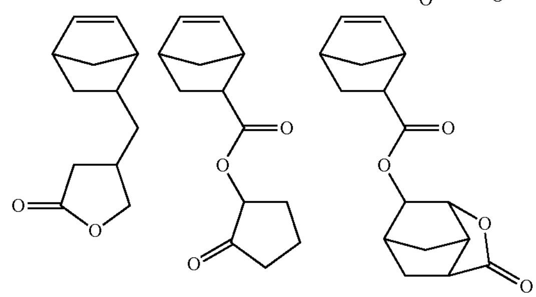
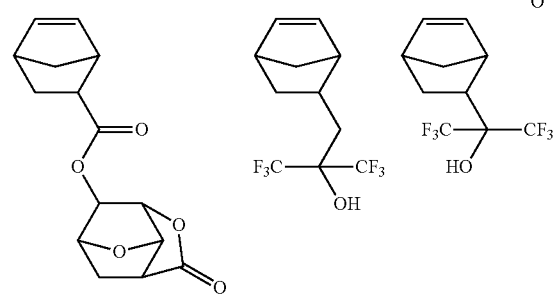
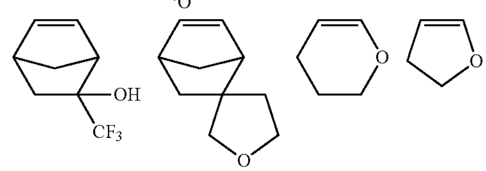
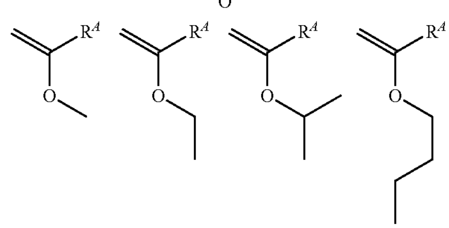
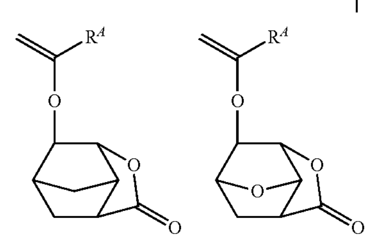

-continued
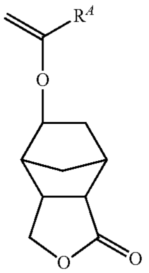
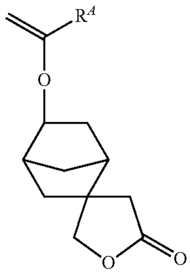
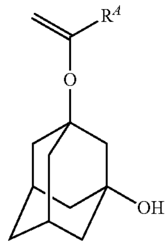
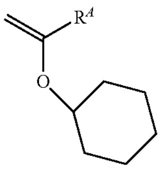
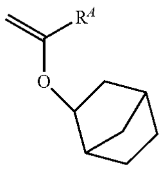
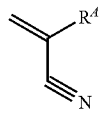
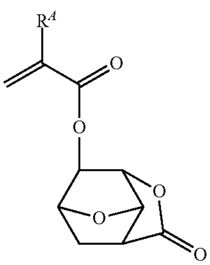
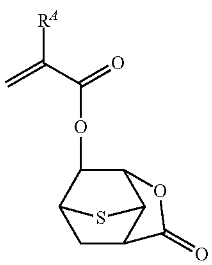
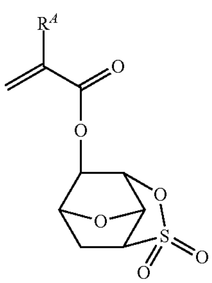
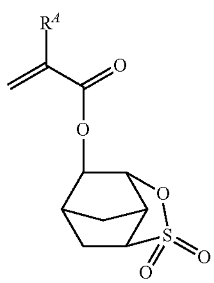
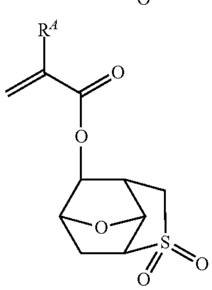
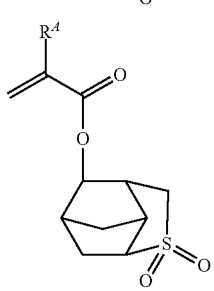
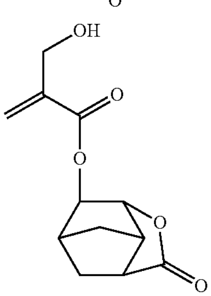
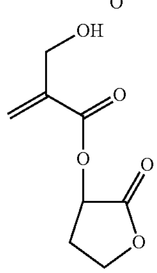
-continued
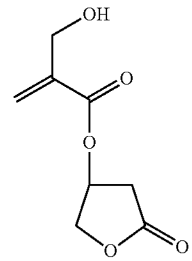
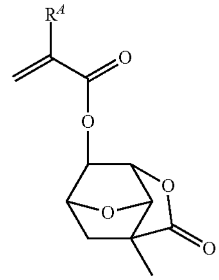
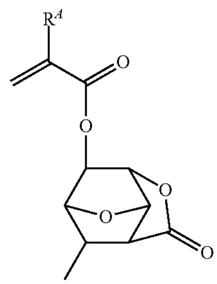
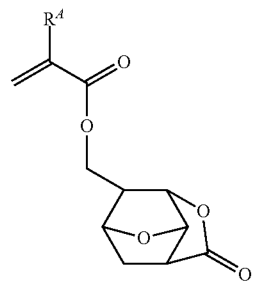
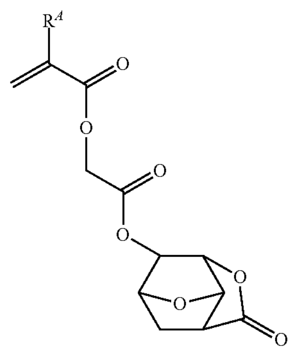
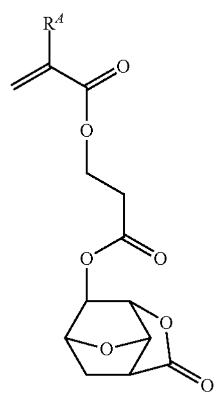
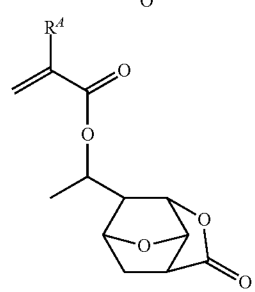
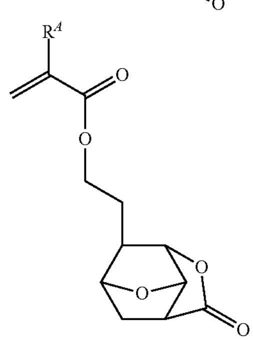
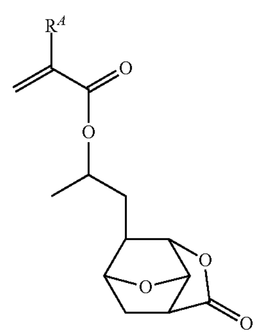

-continued
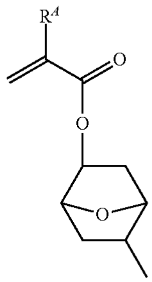
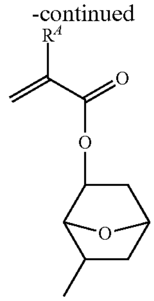
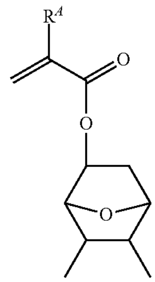
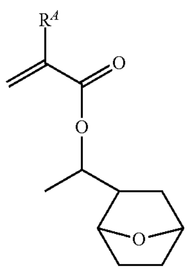
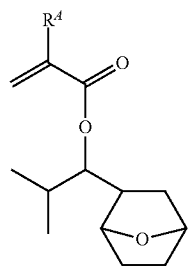
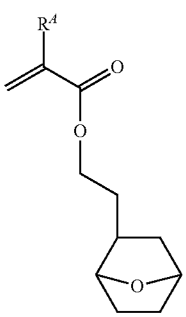
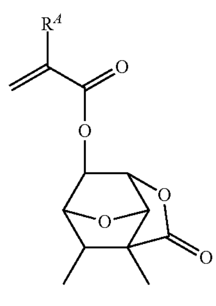
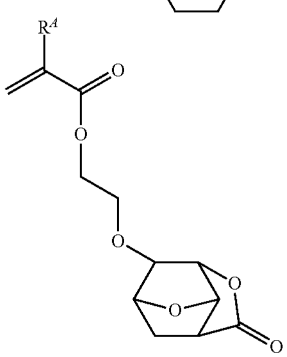
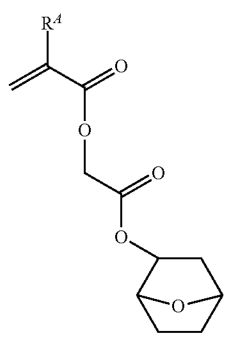
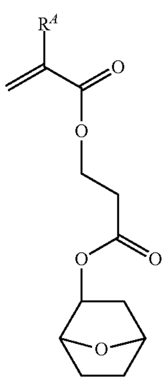
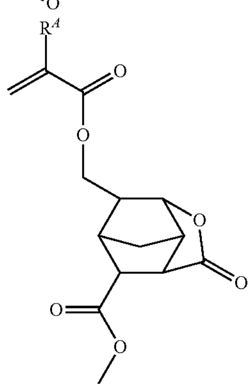
-continued
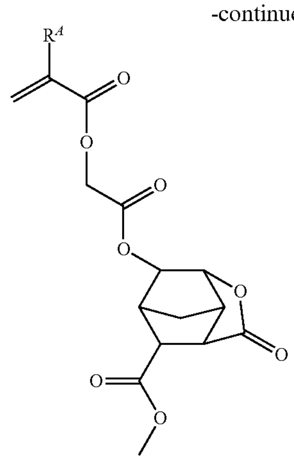
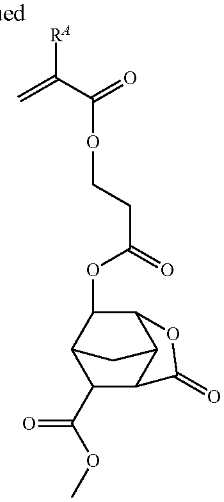
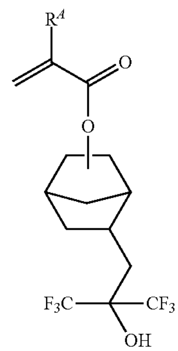
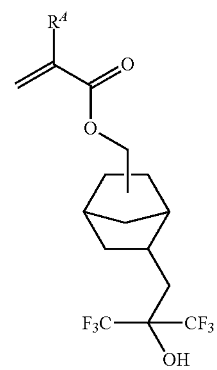
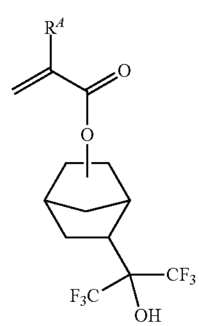
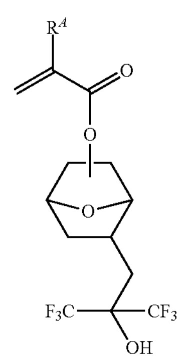
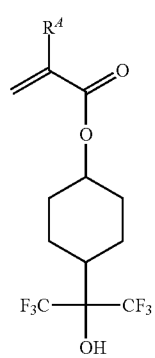
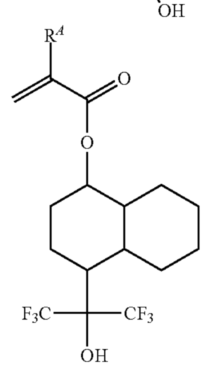

-continued
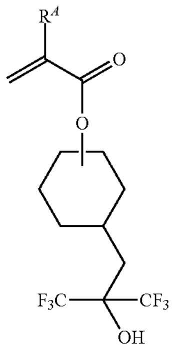
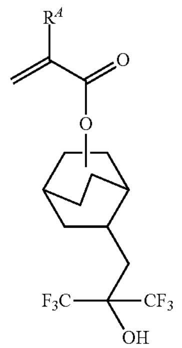
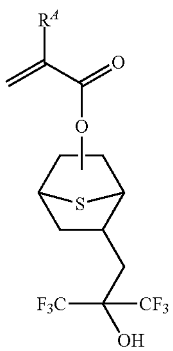
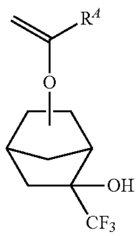
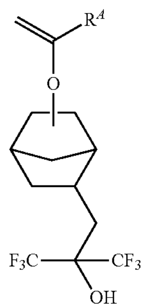
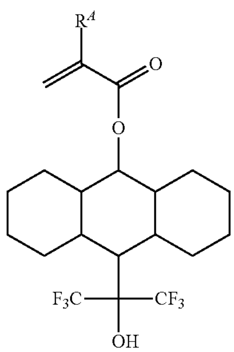
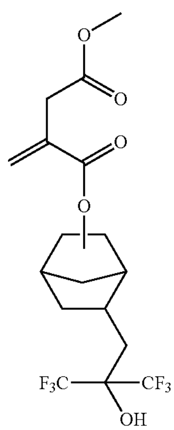
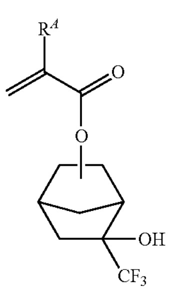
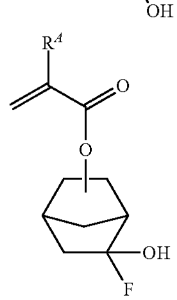
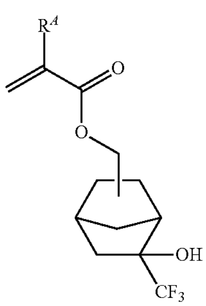
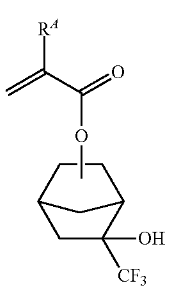
-continued
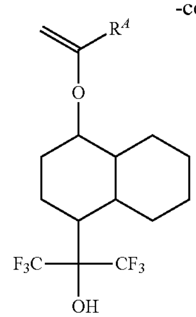
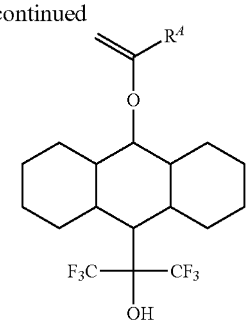
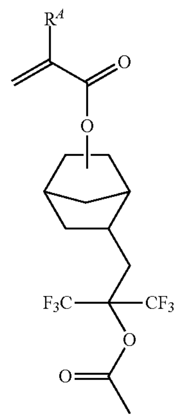
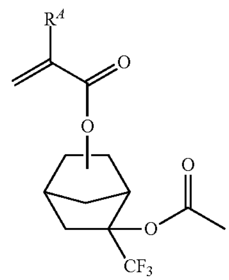
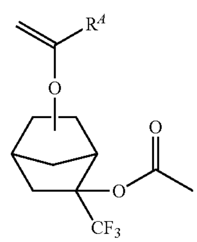
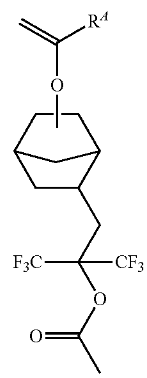
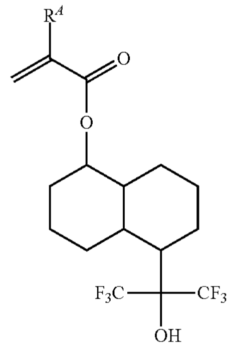
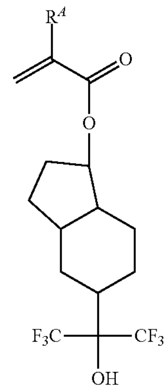

-continued
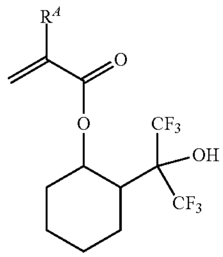
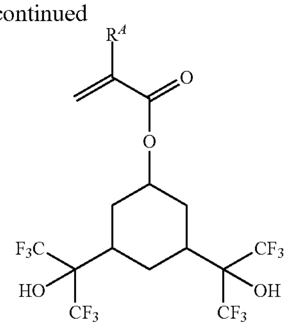
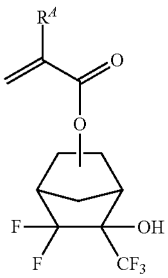
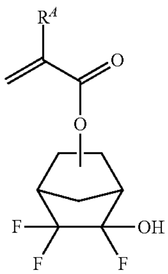
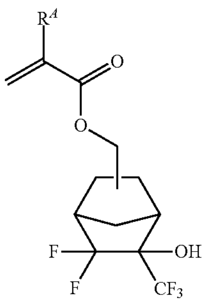
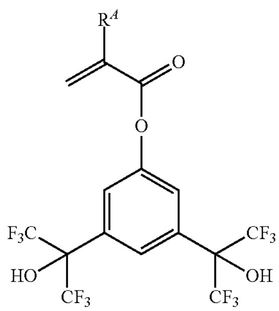
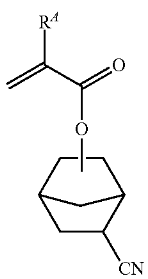
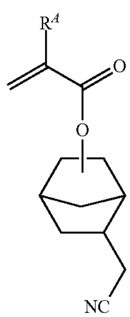
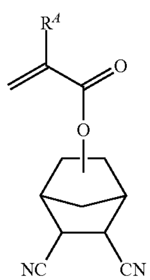
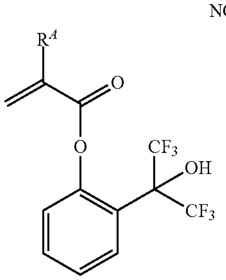
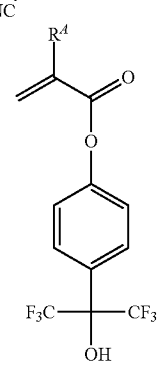
-continued
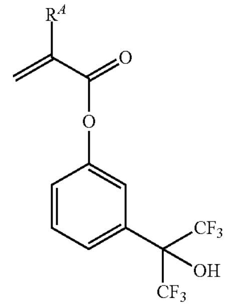
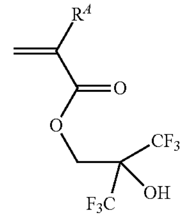
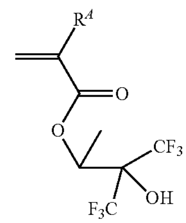
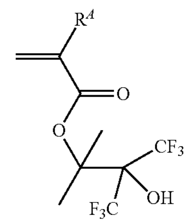
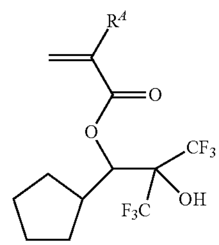
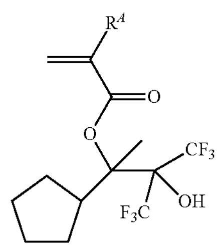
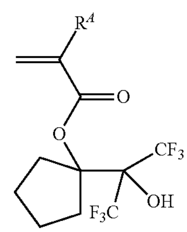
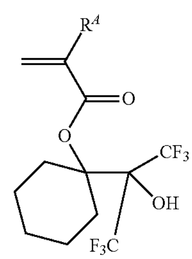
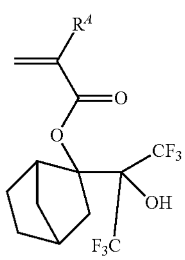
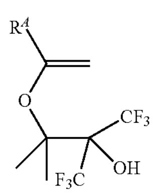
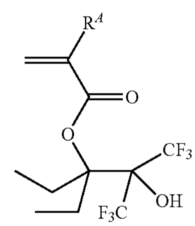
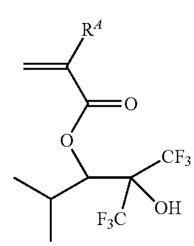
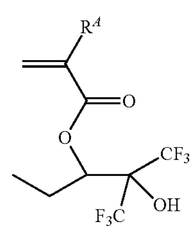

-continued
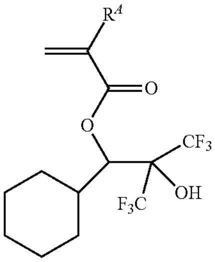
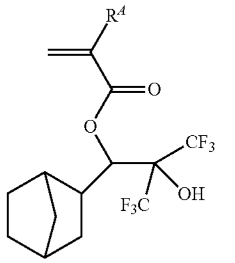
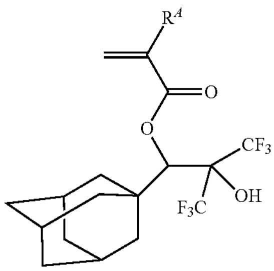
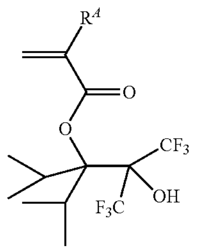
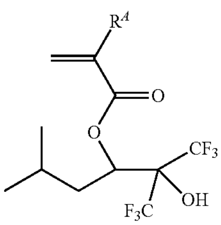
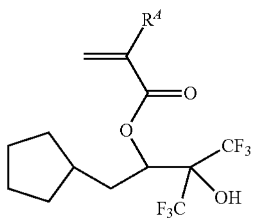
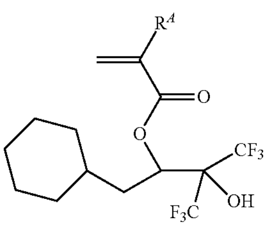
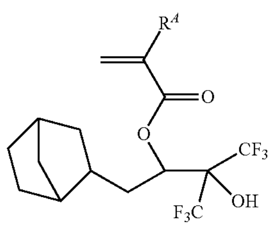
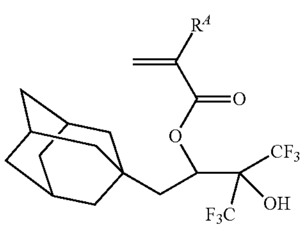
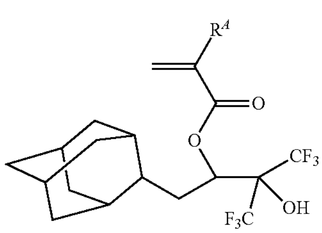
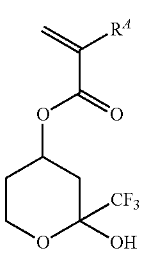
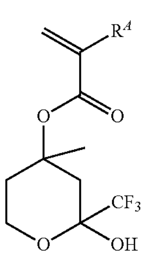
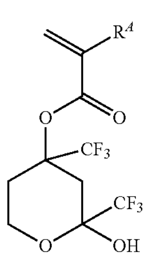
-continued
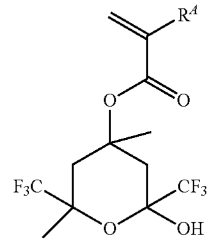
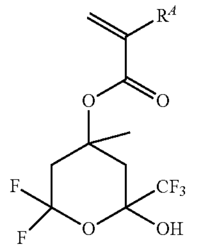
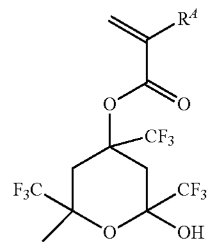
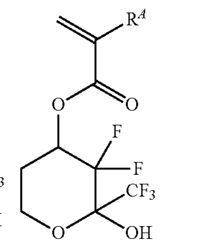
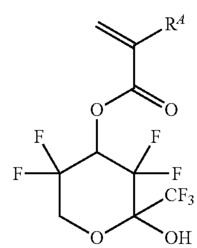
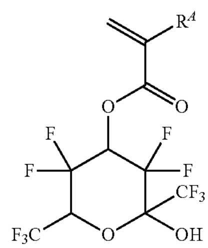
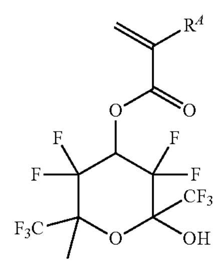
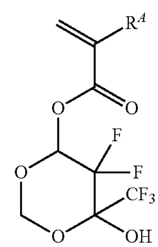
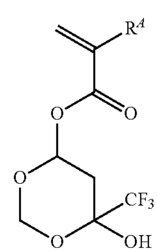
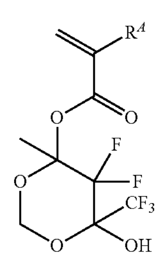
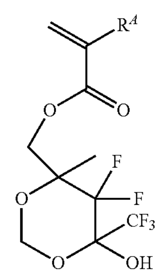
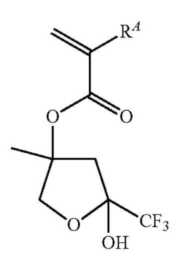
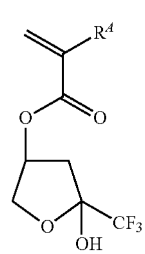
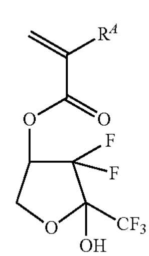

-continued
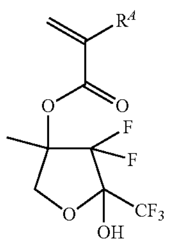
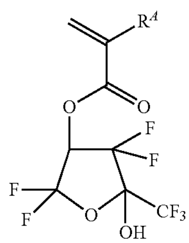
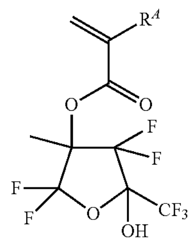
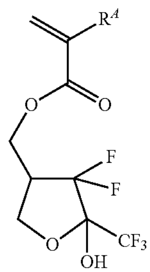
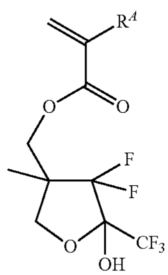
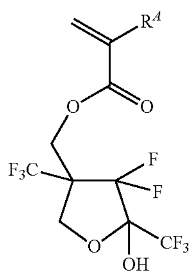
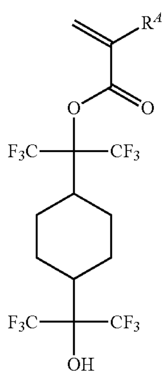
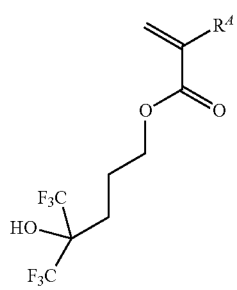
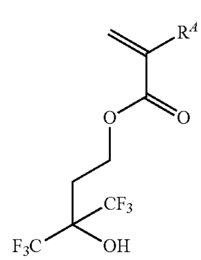
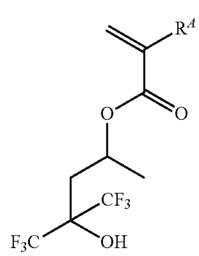
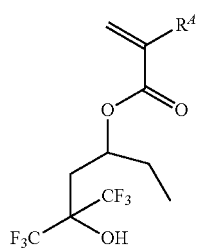
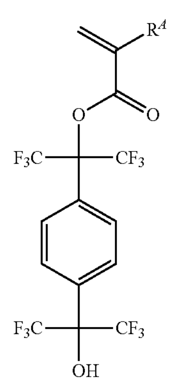
-continued
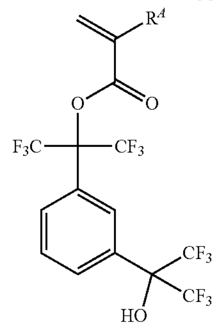
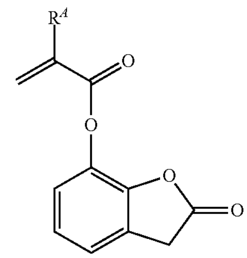
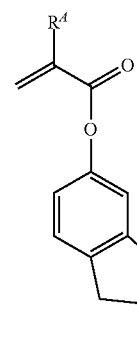
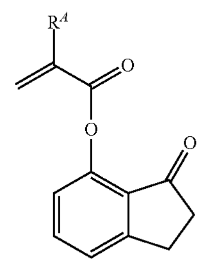
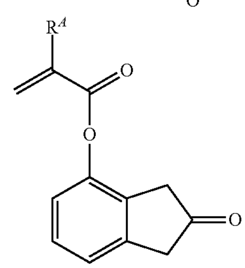
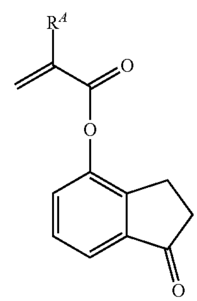
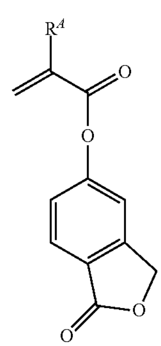
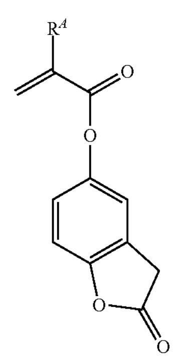
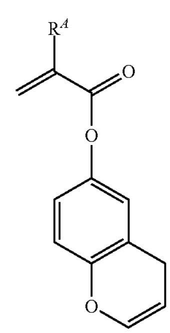
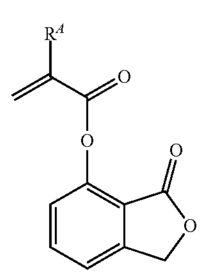
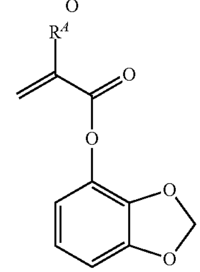

-continued
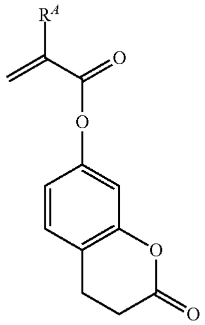
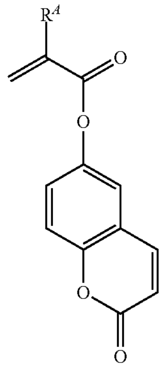
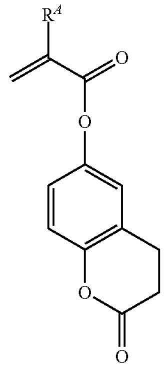
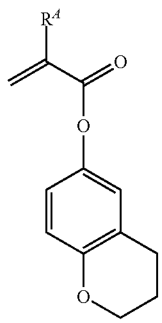
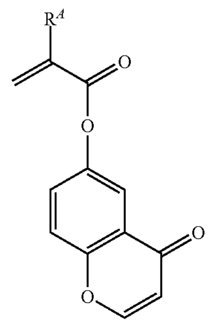
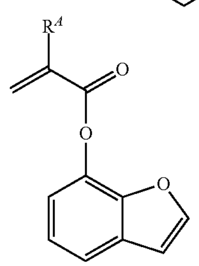
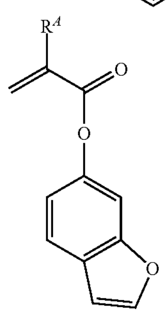
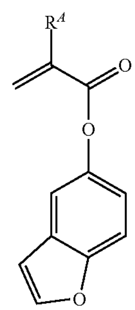
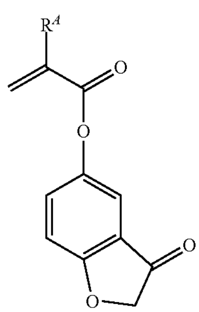
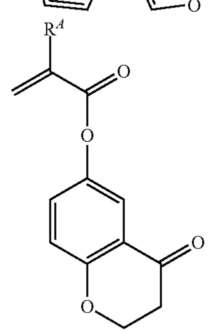
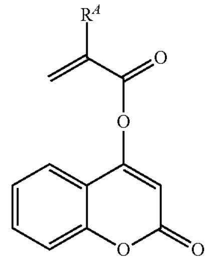
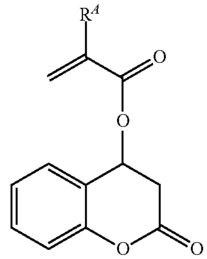
-continued
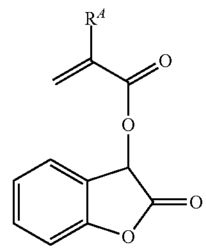
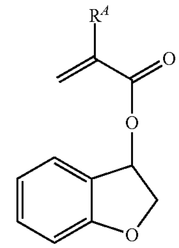
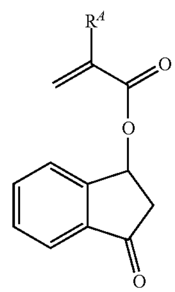
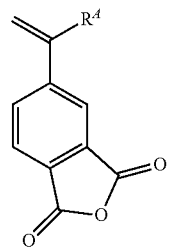
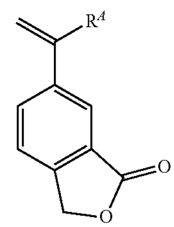
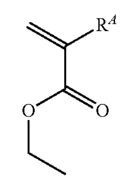
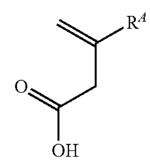
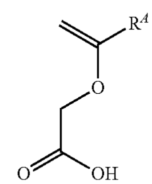
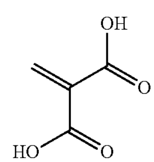
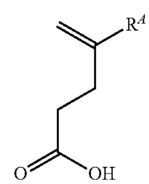
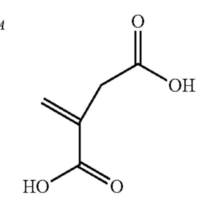
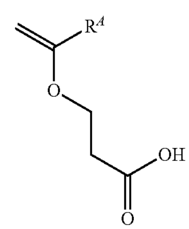
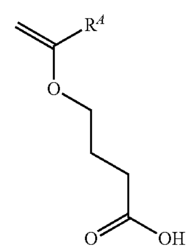
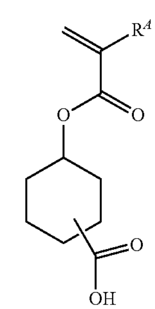
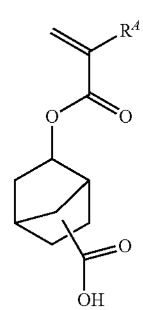
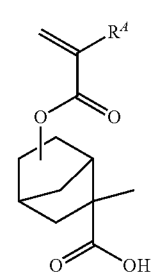

-continued
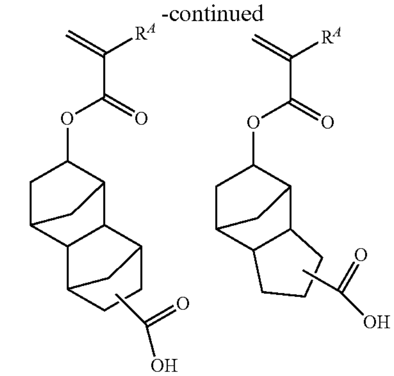
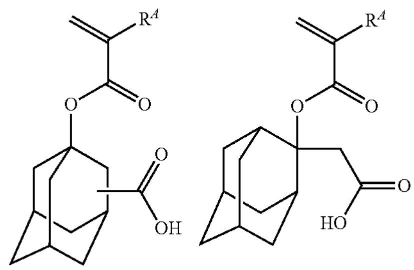
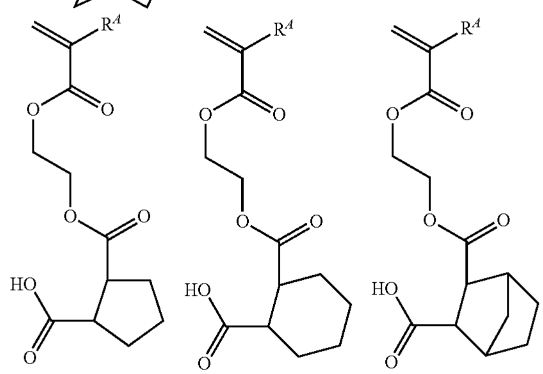
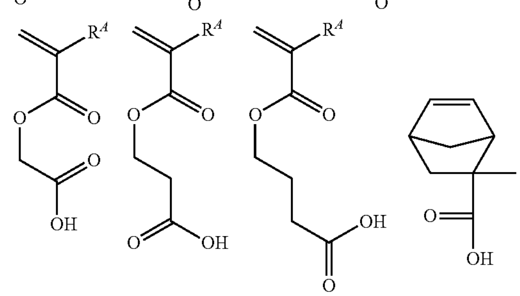
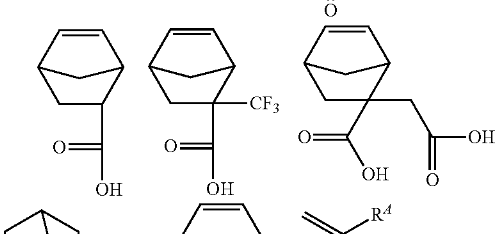
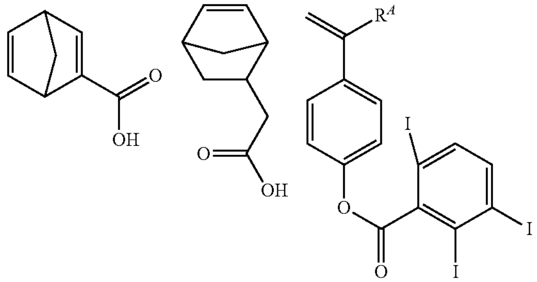
-continued
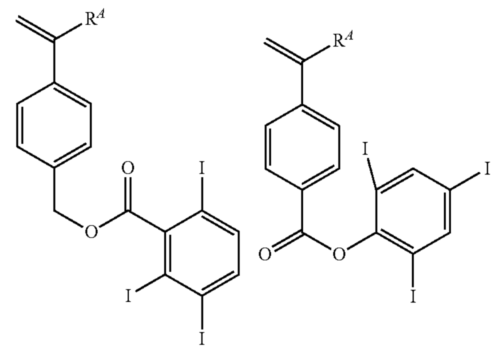
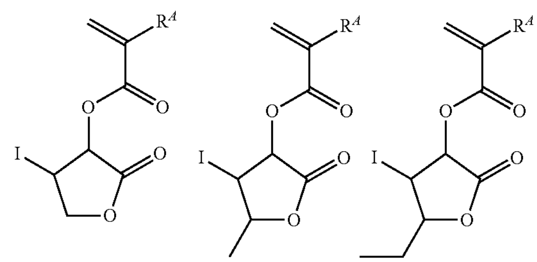
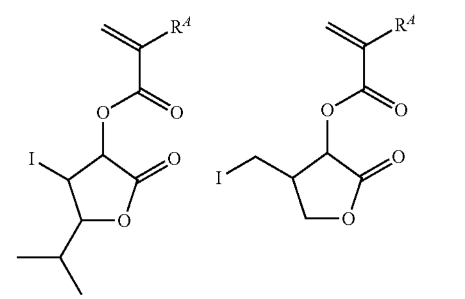
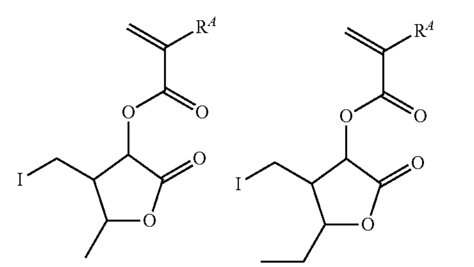
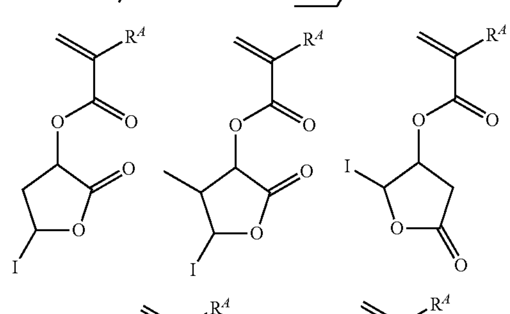
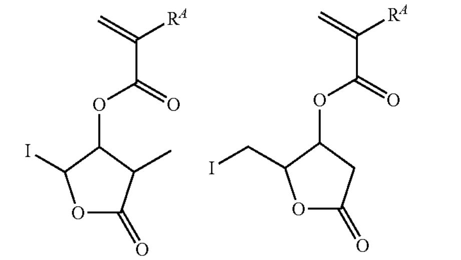

-continued

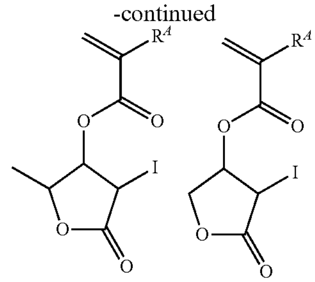

In another preferred embodiment, the base polymer may further comprise recurring units (d) derived from indene, benzofuran, benzothiophene, acenaphthylene, chromone, coumarin, and norbornadiene, or derivatives thereof. Suitable monomers are exemplified below.

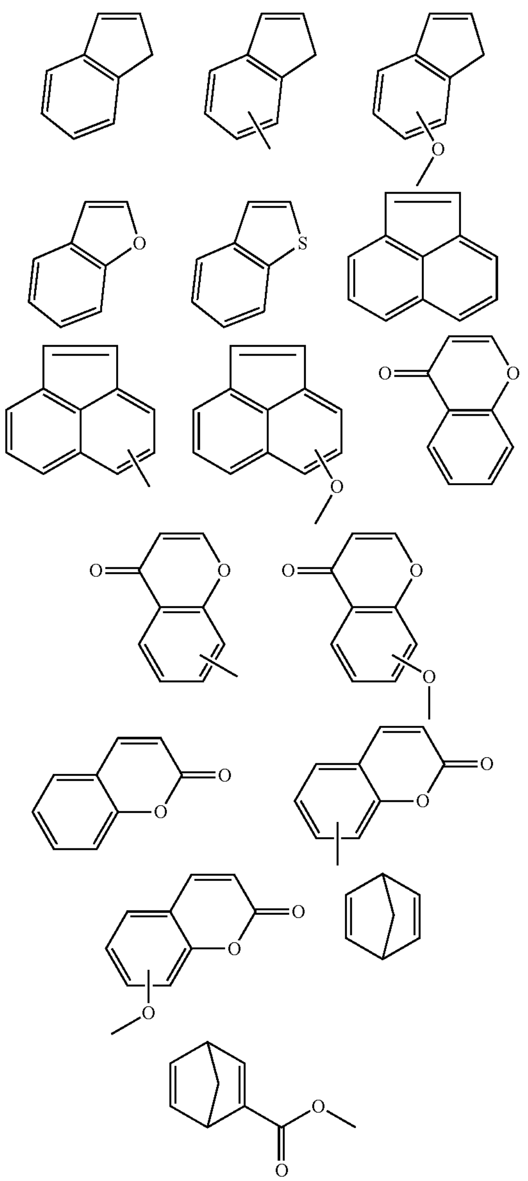

Furthermore, recurring units (e) may be incorporated in the base polymer, which are derived from styrene, vinylnaphthalene, vinylanthracene, vinylpyrene, methyleneindene, vinylpyridine, or vinylcarbazole.

In a further embodiment, recurring units (f) derived from an onium salt having a polymerizable unsaturated bond may be incorporated in the base polymer. Specifically, the base polymer may comprise recurring units of at least one type selected from formulae (f1), (f2) and (f3). These units are simply referred to as recurring units (f1), (f2) and (f3), which may be used alone or in combination of two or more types.

(f1)

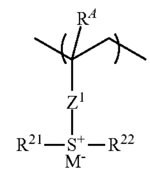

(f2)

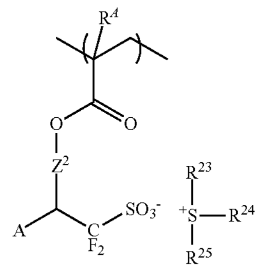

(f3)

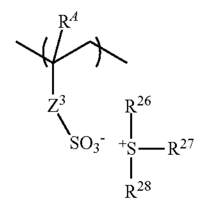

In formulae (f1) to (f3). $R^A$ is independently hydrogen or methyl. $Z^1$ is a single bond, phenylene group, —O—$Z^{11}$—, —C(═O)—O—$Z^{11}$—, or —C(═O)—NH—$Z^{11}$—, wherein $Z^{11}$ is a $C_1$-$C_6$ alkanediyl group, $C_2$-$C_6$ alkenediyl group, or phenylene group, which may contain a carbonyl, ester bond, ether bond or hydroxyl moiety. $Z^2$ is a single bond, —$Z^{21}$—C(═O)—O—, —$Z^{21}$—O— or —$Z^{21}$—O—C(═O)—, wherein $Z^{21}$ is a $C_1$-$C_{12}$ alkanediyl group which may contain a carbonyl moiety, ester bond or ether bond. "A" is hydrogen or trifluoromethyl. $Z^3$ is a single bond, methylene, ethylene, pheuylene, fluorinated phenylene, —O—$Z^{31}$—, —C(═O)—O—$Z^{31}$—, or —C(═O)—NH—$Z^{31}$—, wherein $Z^{31}$ is a $C_1$-$C_6$ alkanediyl group, $C_2$-$C_6$ alkenediyl group, phenylene group, fluorinated phenylene group, or trifluoromethyl-substituted phenylene group, which may contain a carbonyl moiety, ester bond, ether bond or hydroxyl moiety. The alkanediyl and alkenediyl groups may be straight, branched or cyclic.

In formulae (f1) to (f3), $R^{21}$ to $R^{28}$ are each independently a $C_1$-$C_{20}$ monovalent hydrocarbon group which may contain a heteroatom. The monovalent hydrocarbon groups may be straight, branched or cyclic, and examples thereof include $C_1$-$C_{12}$ alkyl groups, $C_6$-$C_{12}$ aryl groups, and $C_7$-$C_{20}$ aralkyl groups. In these groups, some or all of the hydrogen atoms may be substituted by $C_1$-$C_{10}$ alkyl groups, halogen, trifluoromethyl, cyano, nitro, hydroxyl, mercapto, $C_1$-$C_{10}$ alkoxy groups, $C_2$-$C_{10}$ alkoxycarbonyl groups, or $C_2$-$C_{10}$ acyloxy groups, and some carbon atom may be replaced by a carbonyl moiety, ether bond or ester bond. Any two of $R^{23}$, $R^{24}$ and $R^{25}$ or any two of $R^{26}$, $R^{27}$ and $R^{28}$ may bond together to form a ring with the sulfur atom to which they are attached.

In formula (f1), $M^-$ is a non-nucleophilic counter ion. Examples of the non-nucleophilic counter ion include halide ions such as chloride and bromide ions; fluoroalkylsulfonate ions such as triflate, 1,1,1-trifluoroethanesulfonate, and to nonafluorobutanesulfonate: arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imide ions such as bis(trifluoromethylsulfonyl)imide, bis(perfluoroethylsulfonyl)imide and bis(perfluorobutylsulfonyl)imide; methide ions such as tris(trifluoromethylsulfonyl)methide and tris(perfluoroethylsulfonyl)methide.

Also included are sulfonate ions having fluorine substituted at α-position as represented by the formula (f1-1) and sulfonate ions having fluorine substituted at α- and β-positions as represented by the formula (f1-2).

$$R^{31}—CF_2—SO_3^- \quad \text{(f1-1)}$$

(f1-2)

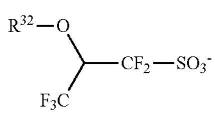

In formula (f1-1), $R^{31}$ is hydrogen, or a $C_1$-$C_{20}$ alkyl group. $C_2$-$C_{20}$ alkenyl group, or $C_6$-$C_{20}$ aryl group, which may contain an ether bond, ester bond, carbonyl moiety, lactone ring, or fluorine atom. The alkyl and alkenyl groups may be straight, branched or cyclic.

In formula (f1-2), $R^{32}$ is hydrogen, or a $C_1$-$C_{30}$ alkyl group, $C_2$-$C_{20}$ acyl group, $C_2$-$C_{20}$ alkenyl group, $C_4$-$C_{20}$ aryl group or $C_6$-$C_{20}$ aryloxy group, which may contain an ether bond, ester bond, carbonyl moiety or lactone ring. The alkyl, acyl and alkenyl groups may be straight, branched or cyclic.

Examples of the monomer from which recurring unit (f1) is derived are shown below, but not limited thereto. $R^A$ and $M^-$ are as defined above.

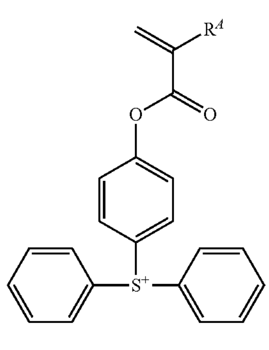

-continued

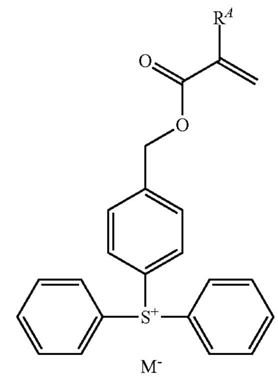

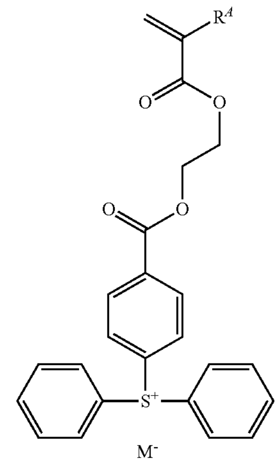

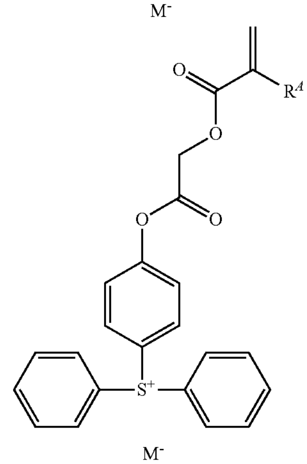

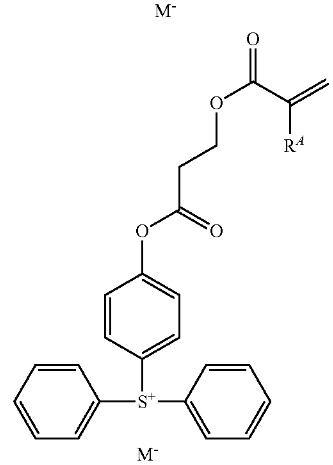

-continued
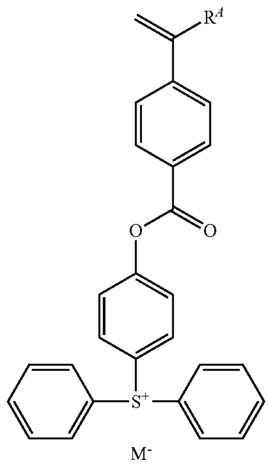
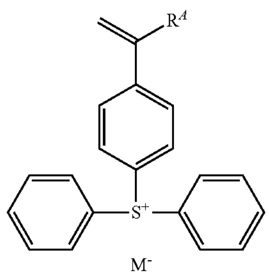
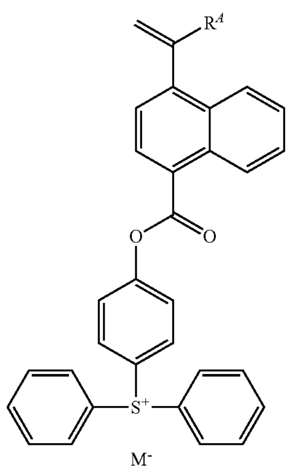
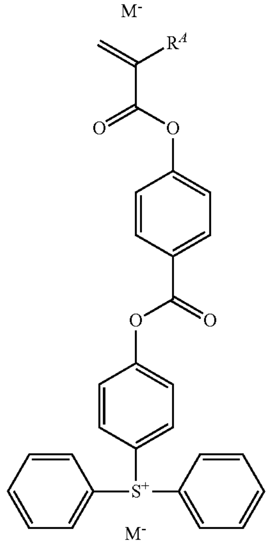
-continued
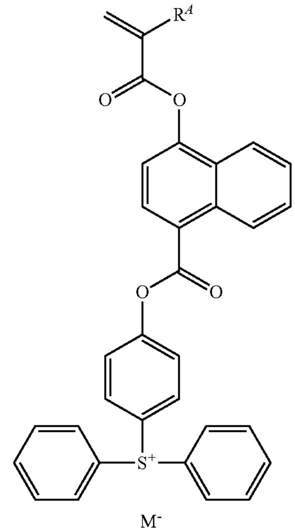
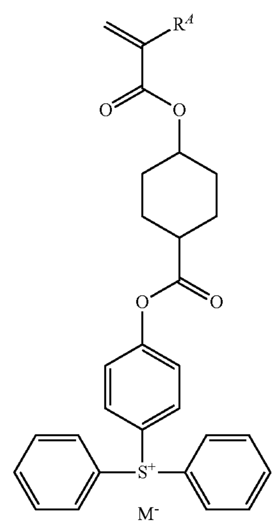
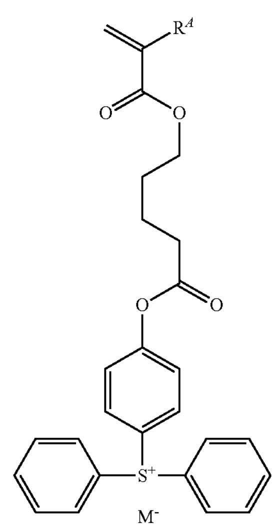

-continued
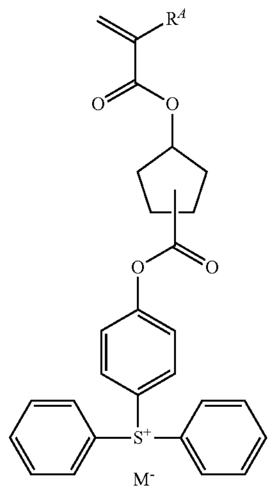
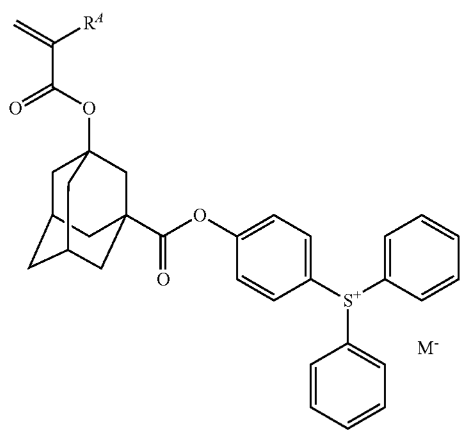
Examples of the monomer from which recurring unit (f2) is derived are shown below, but not limited thereto. $R^A$ is as defined above.
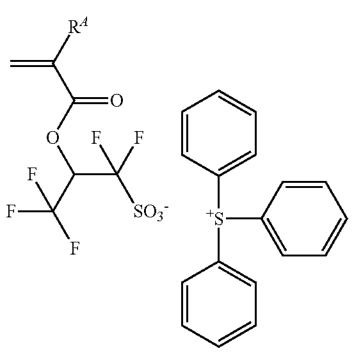
-continued
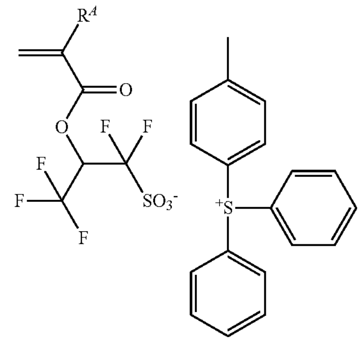
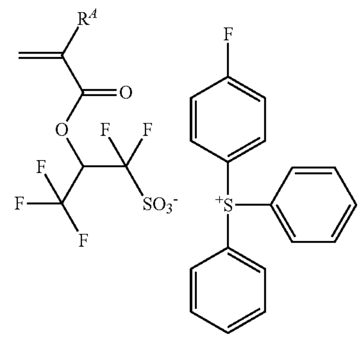
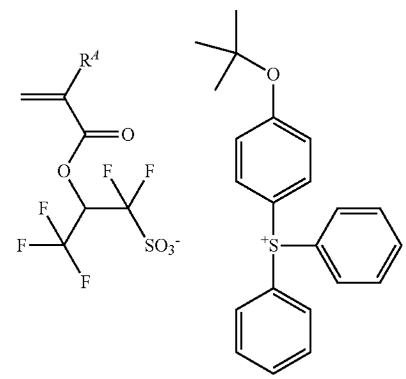
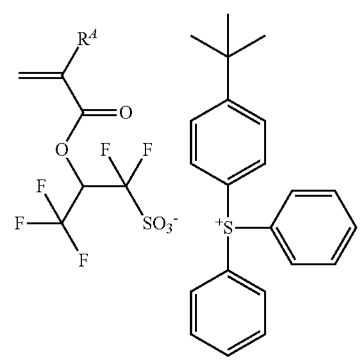
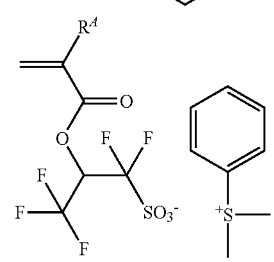

-continued
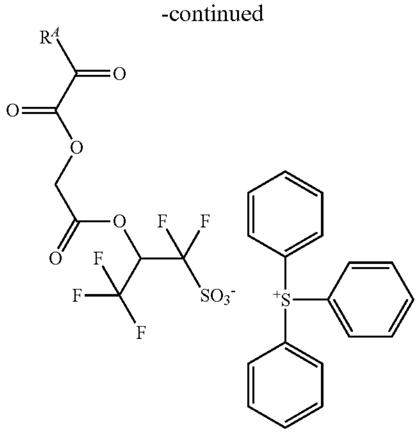
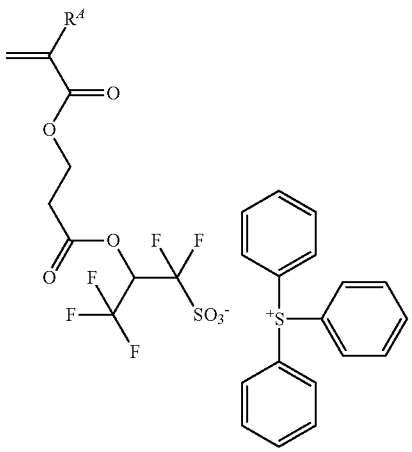
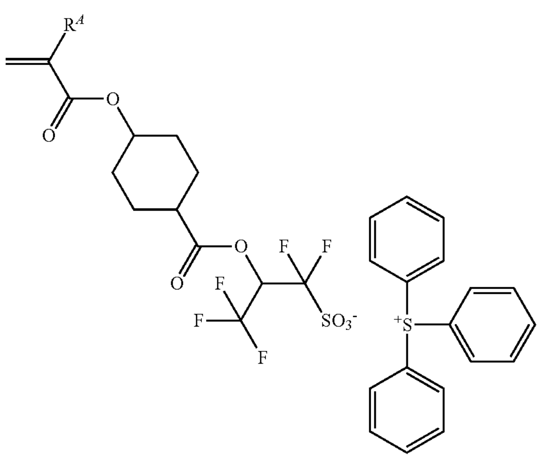
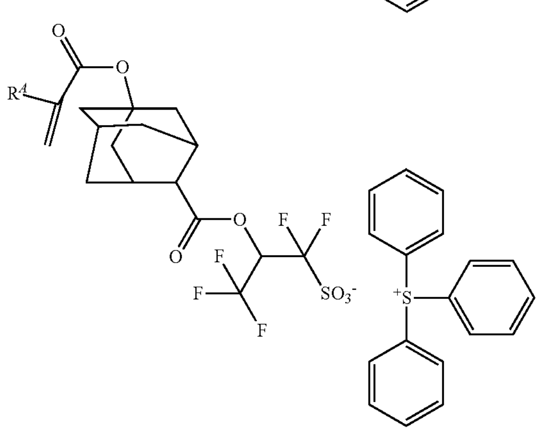
-continued
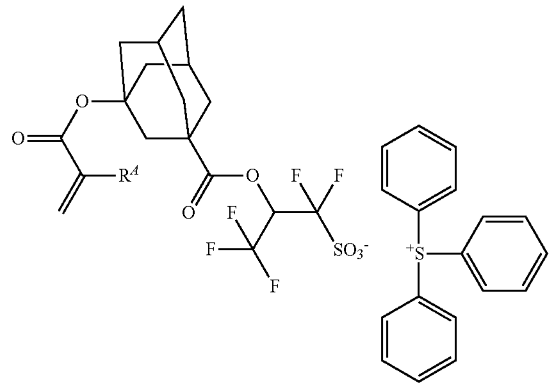
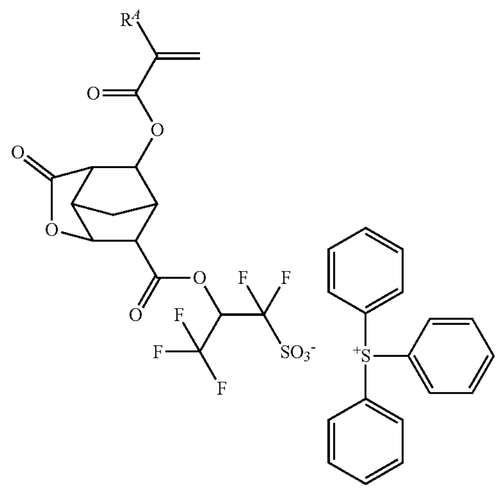
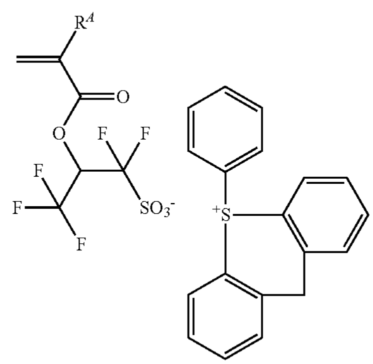
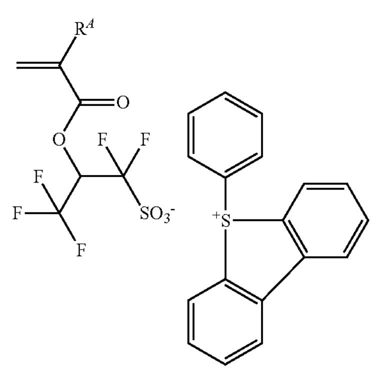

-continued
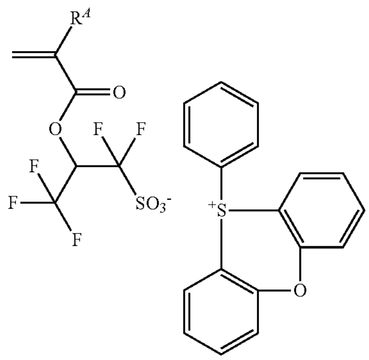
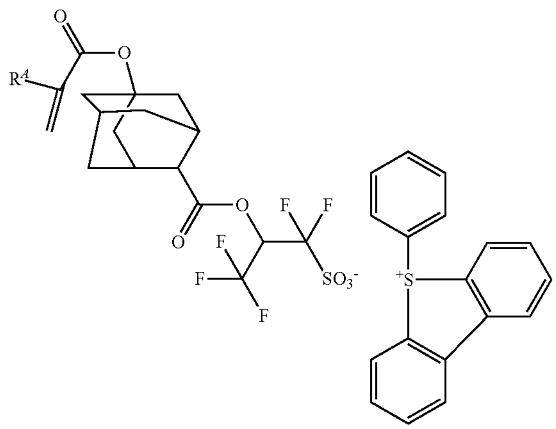
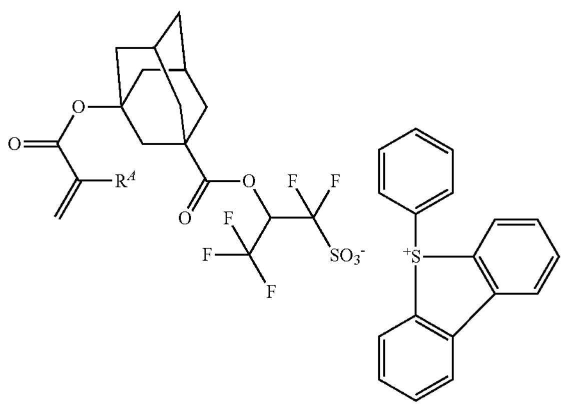
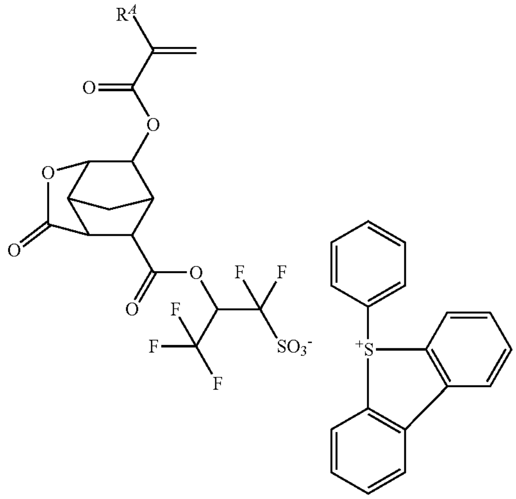
-continued
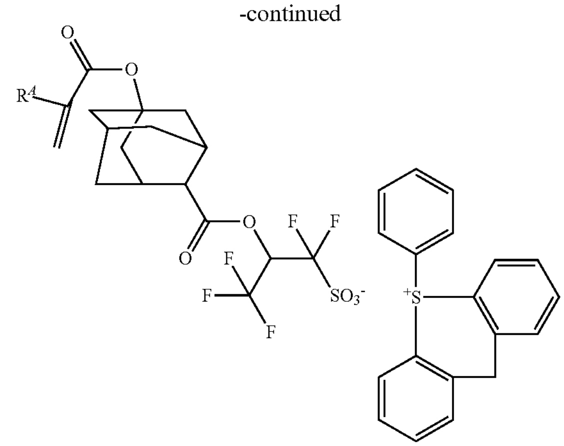
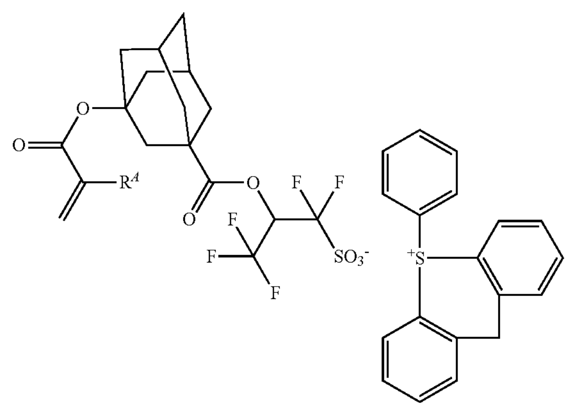
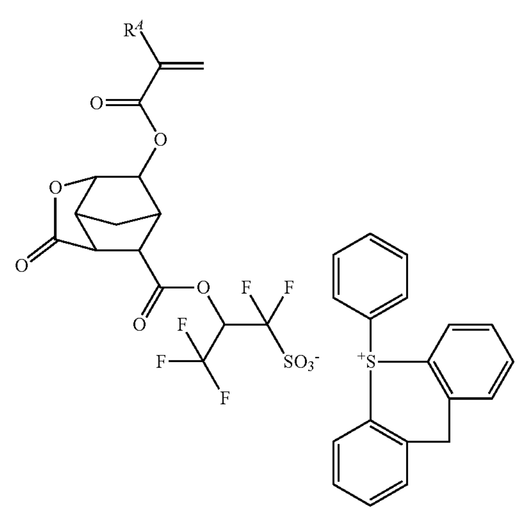

-continued
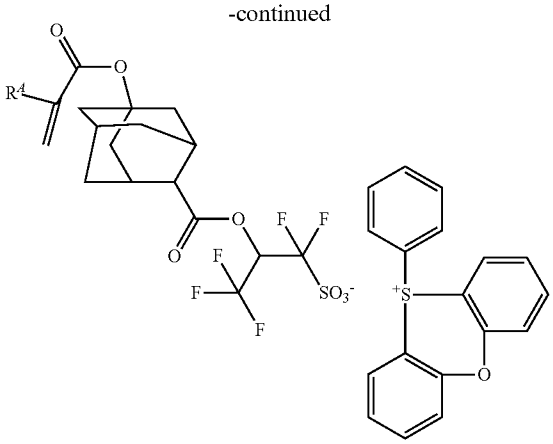
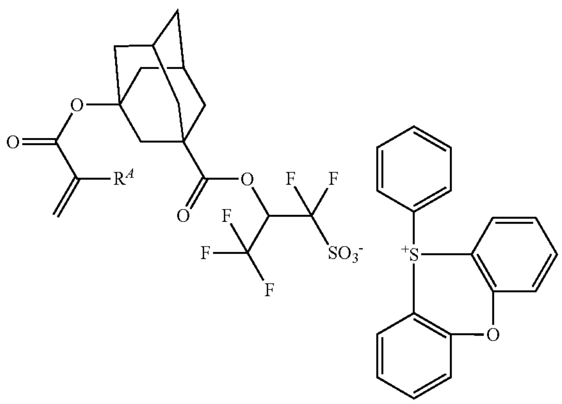
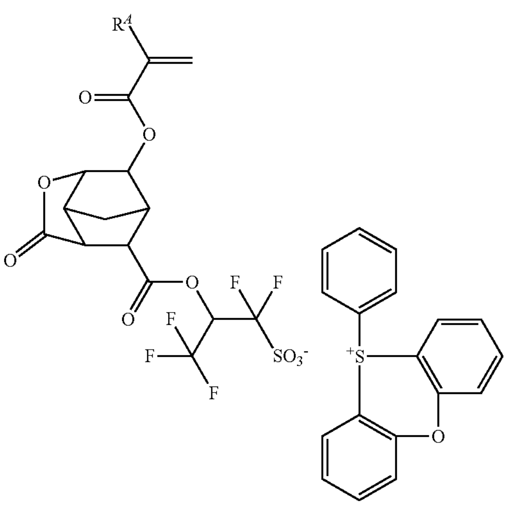
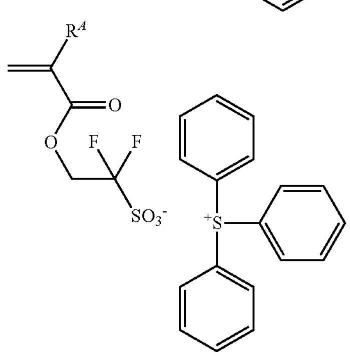
-continued
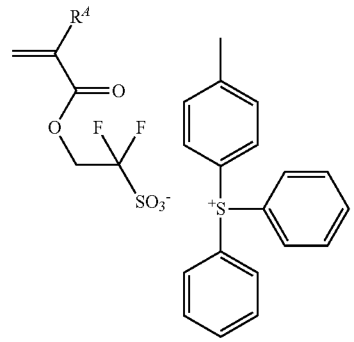
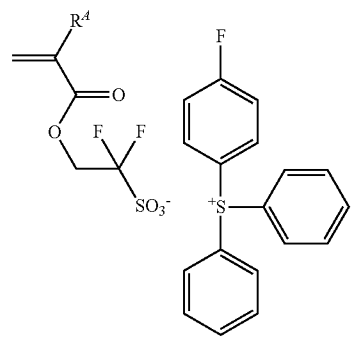
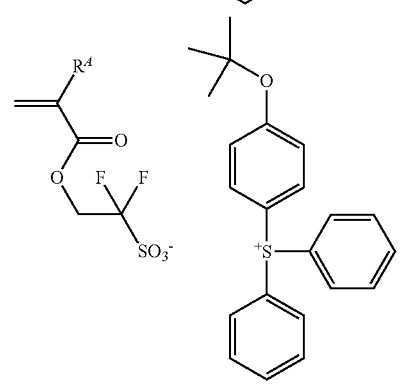
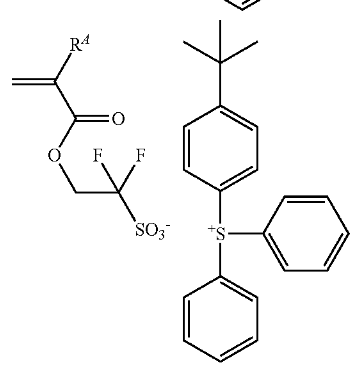
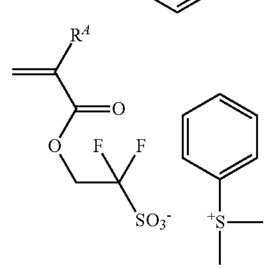

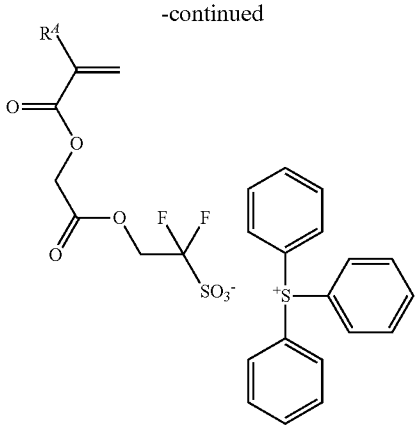
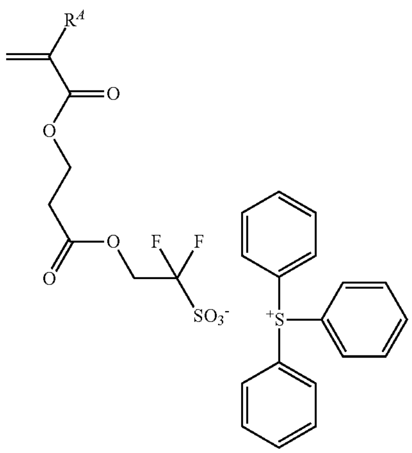
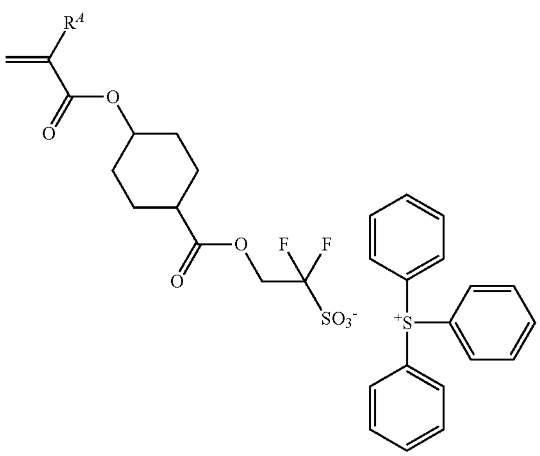
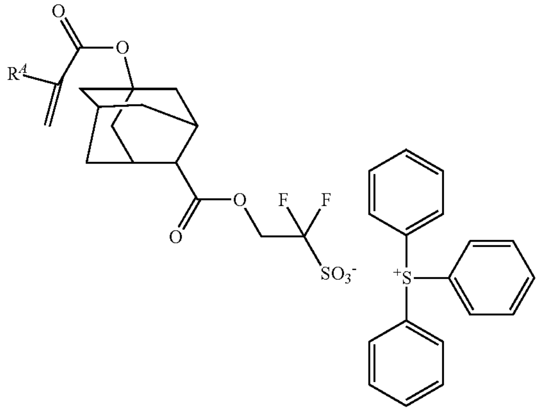
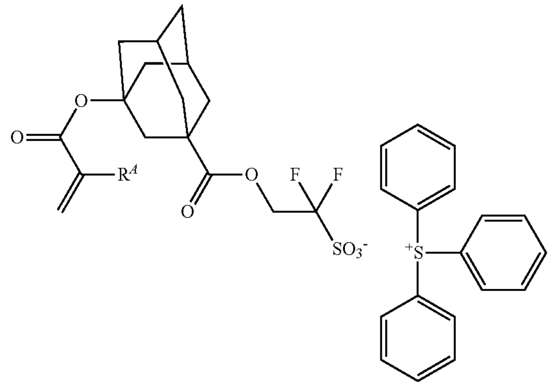
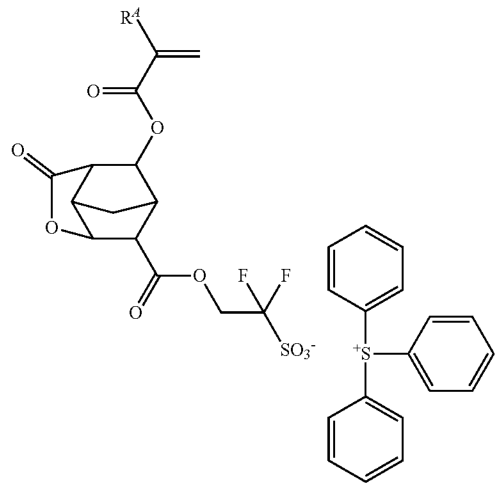
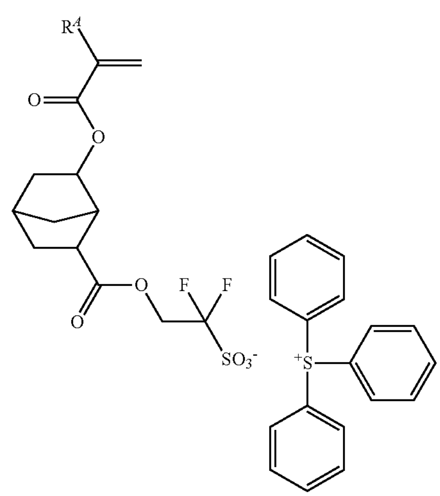
Examples of the monomer from which recurring unit (f3) is derived are shown below, but not limited thereto. $R^A$ is as defined above.

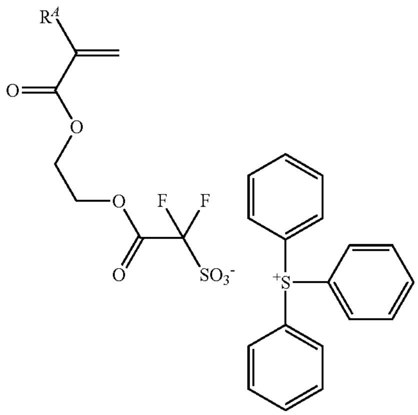
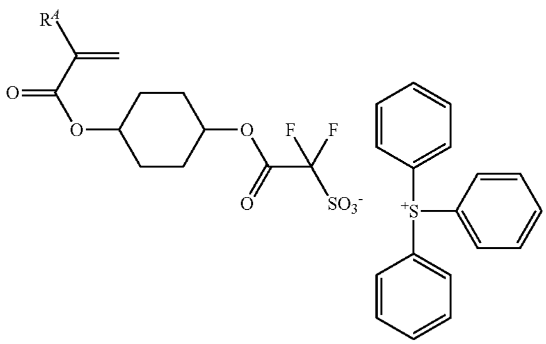
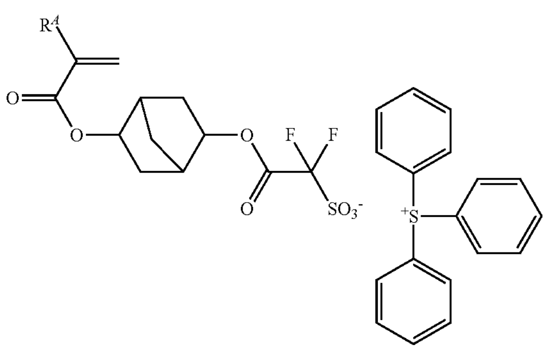
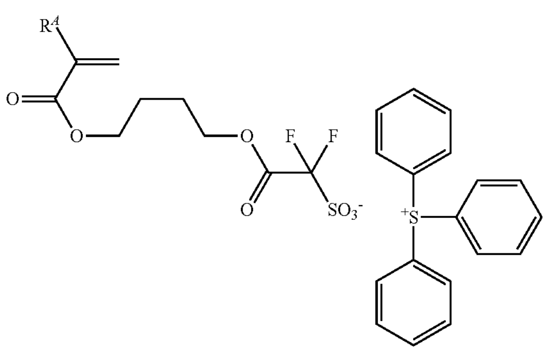
-continued
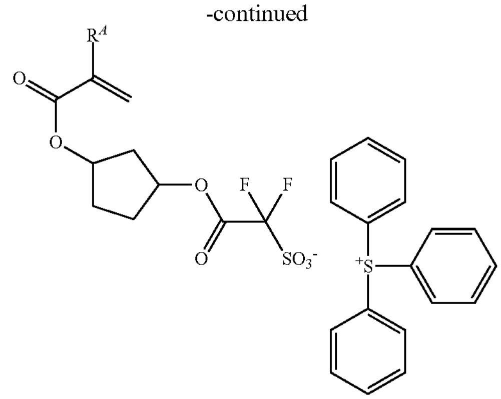
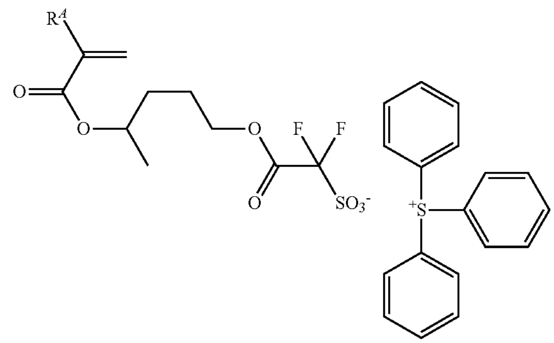
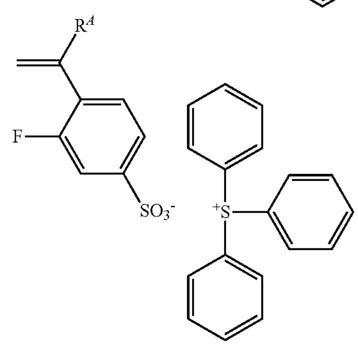
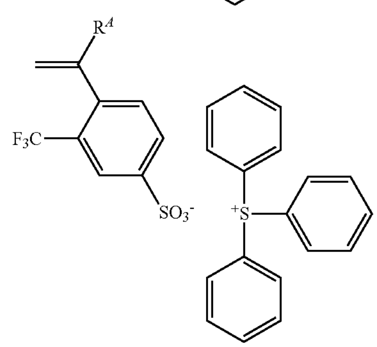
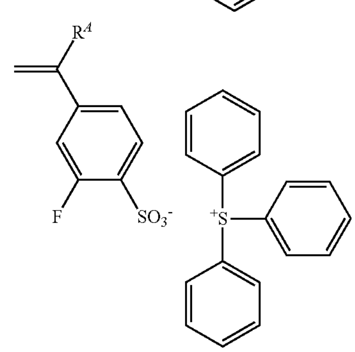

-continued
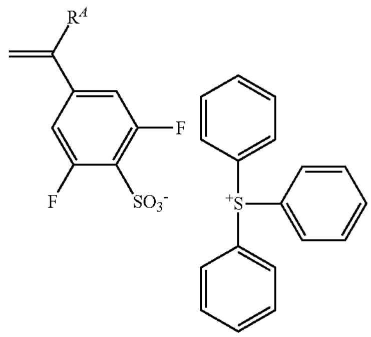
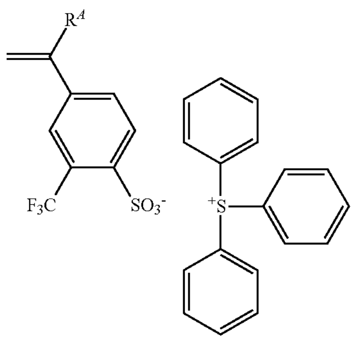
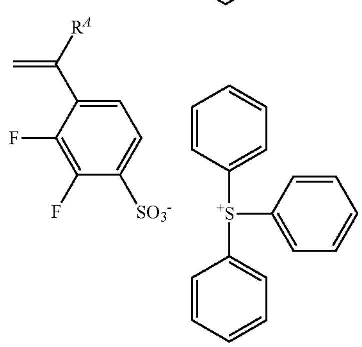
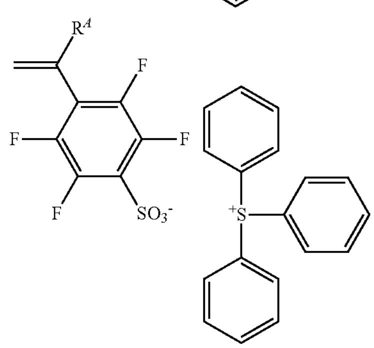
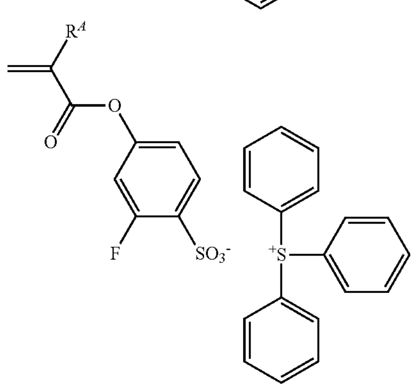
-continued
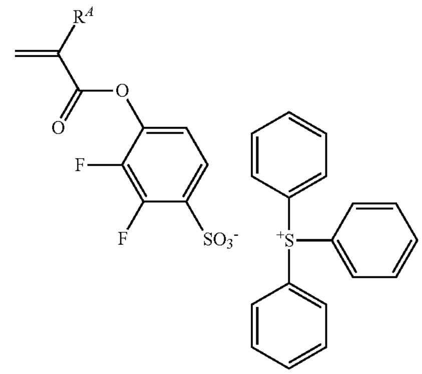
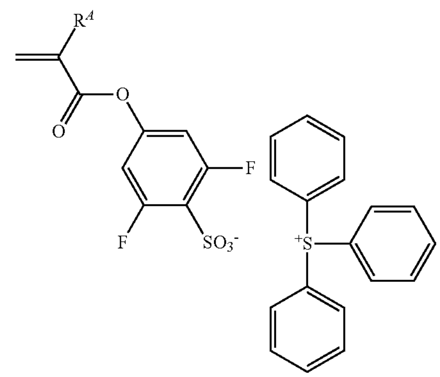
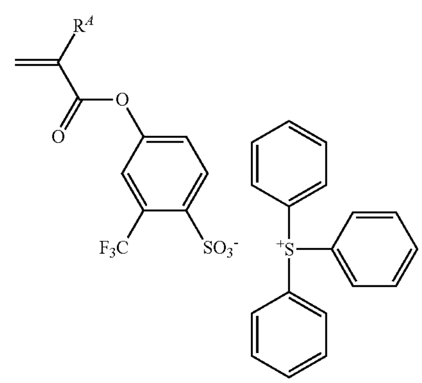
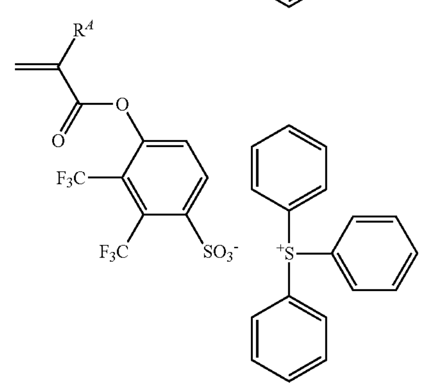

-continued

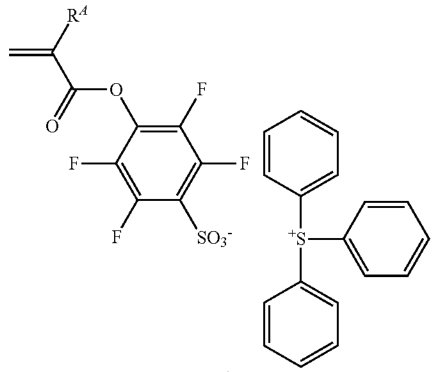

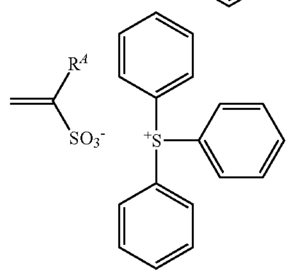

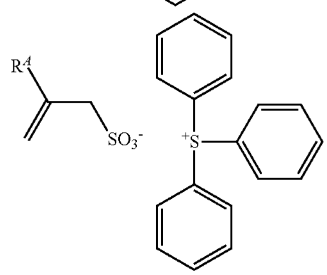

The attachment of an acid generator to the polymer main chain is effective in restraining acid diffusion, thereby preventing a reduction of resolution due to blur by acid diffusion. Also LWR is improved since the acid generator is uniformly distributed.

Where a base polymer containing recurring units (f) is used, the blending of an acid generator of addition type may be omitted.

The base polymer for formulating the positive resist composition comprises recurring units (a1) or (a2) having an acid labile group as essential component and additional recurring units (b), (c), (d), (e), and (f) as optional components. A fraction of units (a1), (a2), (b), (c), (d), (e), and (f) is: preferably $0\leq a1<1.0$, $0\leq a2<1.0$, $0<a1+a2<1.0$, $0\leq b\leq 0.9$, $0\leq c\leq 0.9$, $0\leq d\leq 0.8$, $0\leq e\leq 0.8$, and $0\leq f\leq 0.5$; more preferably $0\leq a1\leq 0.9$, $0\leq a2\leq 0.9$, $0.1\leq a1+a2\leq 0.9$, $0\leq b\leq 0.8$, $0\leq c\leq 0.8$, $0\leq d\leq 0.7$, $0\leq e\leq 0.7$, and $0\leq f\leq 0.4$; and even more preferably $0<a1\times 0.8$, $0\leq a2\leq 0.8$, $0.1\leq a1+a2\leq 0.8$, $0\leq b\leq 0.75$, $0\leq c\leq 0.75$, $0\leq d\leq 0.6$, $0\leq e\leq 0.6$, and $0\leq f\leq 0.3$. Notably, $f=f1+f+f3$, meaning that unit (f) is at least one of units (f1) to (f3), and $a1+a2+b+c+d+e+f=1.0$.

For the base polymer for formulating the negative resist composition, an acid labile group is not necessarily essential. The base polymer comprises recurring units (b), and optionally recurring units (c), (d), (e), and/or (f). A fraction of these units is: preferably $0<b\leq 1.0$, $0\leq c\leq 0.9$, $0\leq d\leq 0.8$, $0\leq e\leq<0.8$, and $0\leq f\leq 0.5$; more preferably $0.2\leq b\leq 1.0$, $0\leq c\leq 0.8$, $0\leq d\leq 0.7$, $0\leq e\leq 0.7$, and $0\leq f\leq 0.4$; and even more preferably $0.3\leq b\leq 1.0$, $0\leq c\leq 0.75$, $0\leq d\leq 0.6$, $0\leq e\leq 0.6$, and $0\leq f\leq 0.3$. Notably, $f=f1+f2+f3$, meaning that unit (f) is at least one of units (f1) to (f3), and $b+c+d+e+f=1.0$.

The base polymer may be synthesized by any desired methods, for example, by dissolving one or more monomers selected from the monomers corresponding to the foregoing recurring units in an organic solvent, adding a radical polymerization initiator thereto, and heating for polymerization. Examples of the organic solvent which can be used for polymerization include toluene, benzene, tetrahydrofuran, diethyl ether, and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably, the reaction temperature is 50 to 80° C. and the reaction time is 2 to 100 hours, more preferably 5 to 20 hours.

Where a monomer having a hydroxyl group is copolymerized, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis, for thereby converting the polymer product to hydroxystyrene or hydroxyvinylnaphthalene. For alkaline hydrolysis, a base such as aqueous ammonia or triethylamine may be used. Preferably the reaction temperature is −20° C. to 100° C., more preferably 0° C. to 60° C., and the reaction time is 0.2 to 100 hours, more preferably 0.5 to 20 hours.

The base polymer should preferably have a weight average molecular weight (Mw) in the range of 1,000 to 500,000, and more preferably 2,000 to 30,000, as measured by GPC versus polystyrene standards using tetrahydrofuran (THF) solvent. With too low a Mw, the resist composition may become less heat resistant. A polymer with too high a Mw may lose alkaline solubility and give rise to a footing phenomenon after pattern formation.

If a base polymer has a wide molecular weight distribution or dispersity (Mw/Mn), which indicates the presence of lower and higher molecular weight polymer fractions, there is a possibility that foreign matter is left on the pattern or the pattern profile is degraded. The influences of Mw and Mw/Mn become stronger as the pattern rule becomes finer. Therefore, the base polymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, Mw or Mw/Mn is acceptable.

Acid Generator

The resist composition may comprise an acid generator capable of generating a strong acid (referred to as acid generator of addition type, hereinafter). As used herein, the term "strong acid" refers to a compound having a sufficient acidity to induce deprotection reaction of an acid labile group on the base polymer in the case of a chemically amplified positive resist composition, or a compound having a sufficient acidity to induce acid-catalyzed polarity switch reaction or crosslinking reaction in the case of a chemically amplified negative resist composition. The inclusion of such an acid generator ensures that the cyclic ammonium salt functions as a quencher and the inventive resist composition functions as a chemically amplified positive or negative resist composition.

The acid generator is typically a compound (PAG) capable of generating an acid upon exposure to actinic ray or radiation. Although the PAG used herein may be any compound capable of generating an acid upon exposure to high-energy radiation, those compounds capable of generating sulfonic acid, imide acid (imidic acid) or methide acid are preferred. Suitable PAGs include sulfouitan salts, iodonium salts, sulfonyldiazomethane, N-sulfonyloxyimide, and oxime-O-sulfonate acid generators. Exemplary PAGs are described in JP-A 2008-111103, paragraphs [0122]-[0142] (U.S. Pat. No. 7,537,880).

As the PAG used herein, sulfonium salts having the formula (1-1) and iodonium salts having the formula (1-2) are also preferred.

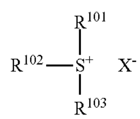

(1-1)

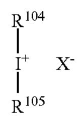

(1-2)

In formulae (1-1) and (1-2), $R^{101}$, $R^{102}$, $R^{103}$, $R^{104}$ and $R^{105}$ are each independently a $C_1$-$C_{20}$ monovalent hydrocarbon group which may contain a heteroatom. Any two of $R^{101}$, $R^{102}$ and $R^{103}$ may bond together to form a ring with the sulfur atom to which they are attached. The monovalent hydrocarbon group may be straight, branched or cyclic, and examples thereof include those exemplified above for $R^{21}$ to $R^{28}$ in formulae (f1) to (f3).

Examples of the cation in the sulfonium salt having formula (1-1) are shown below, but not limited thereto.

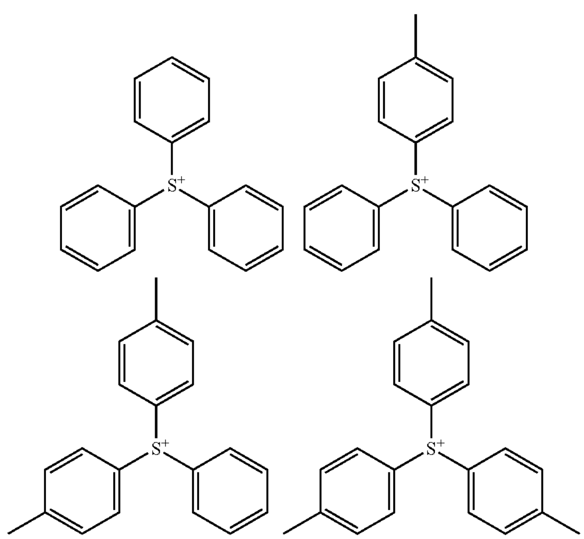

-continued

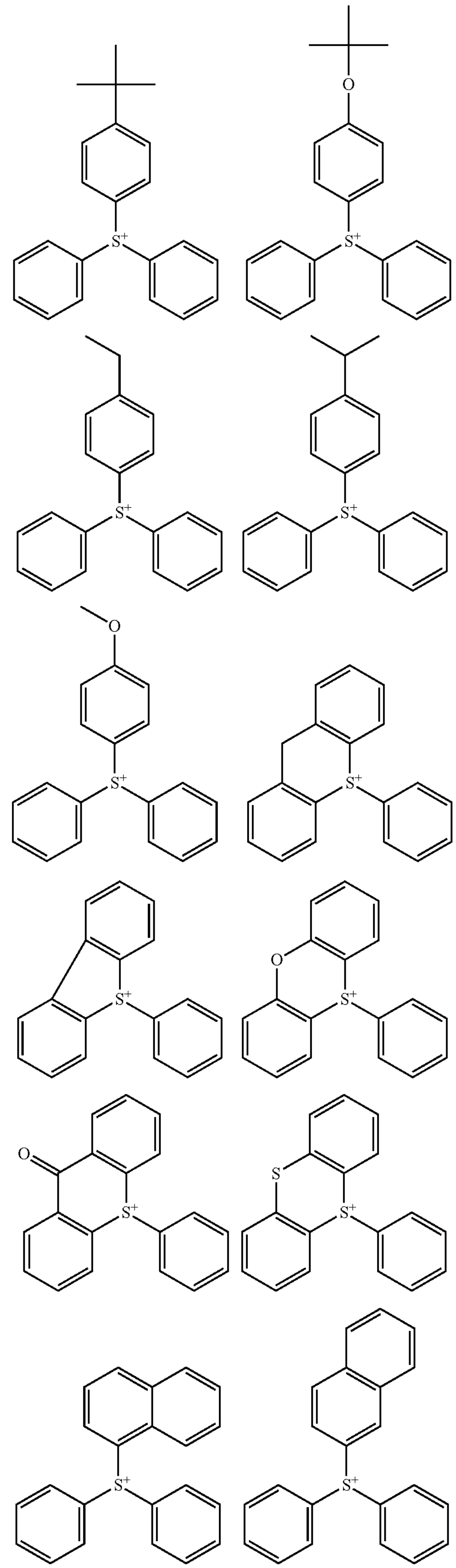

-continued
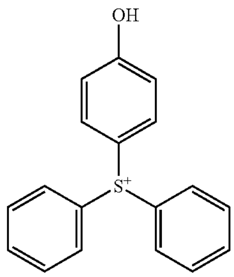
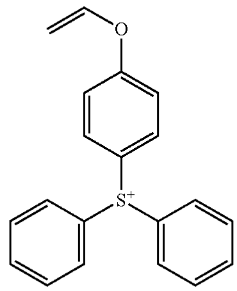
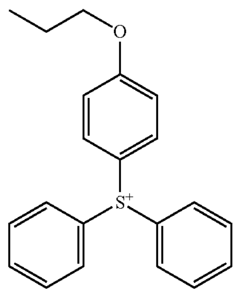
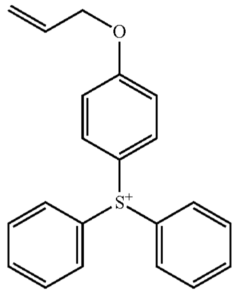
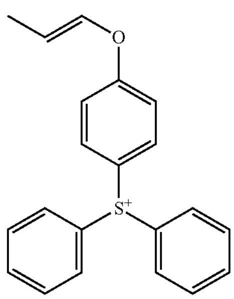
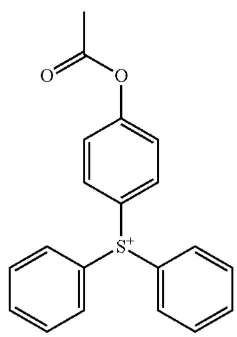
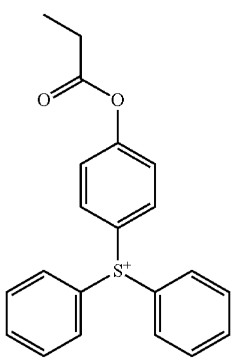
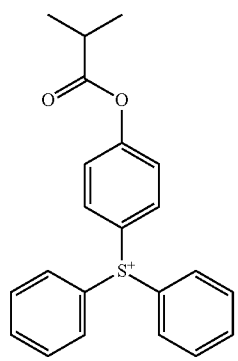
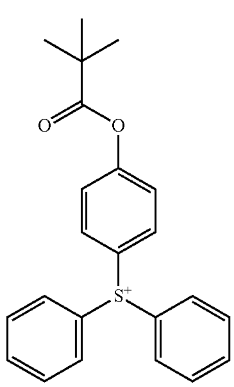
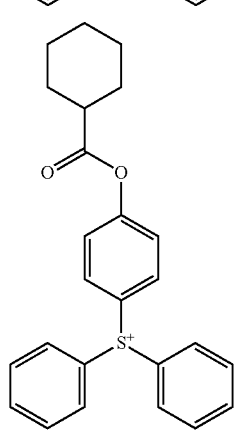
-continued
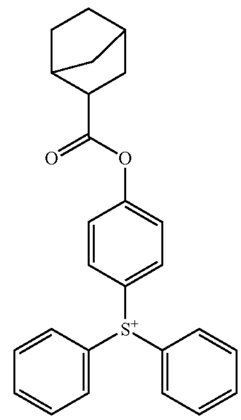
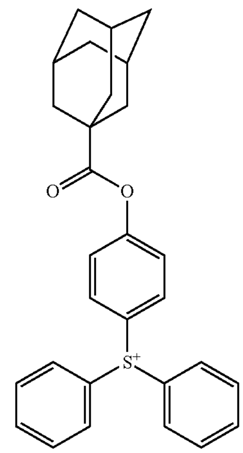
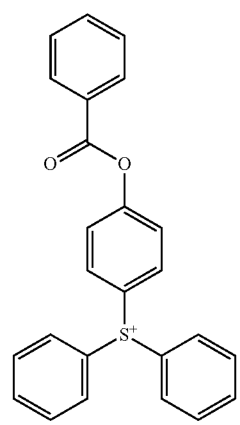
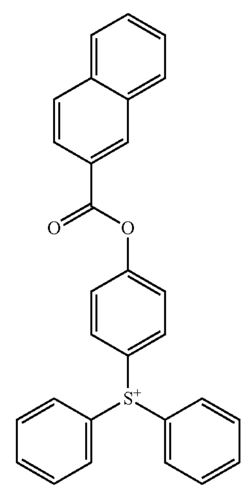
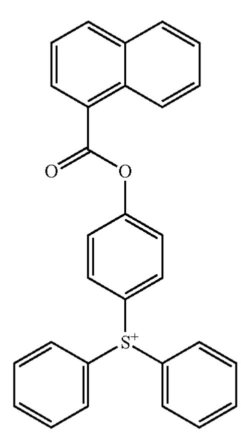
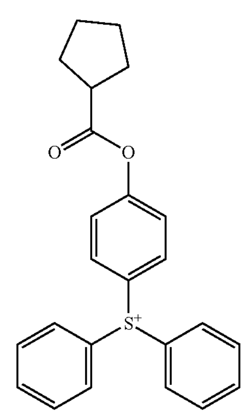

-continued
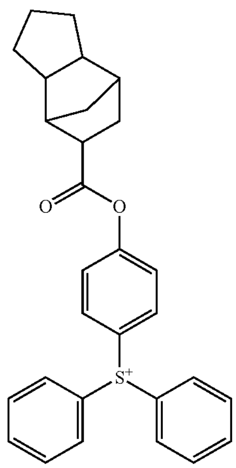
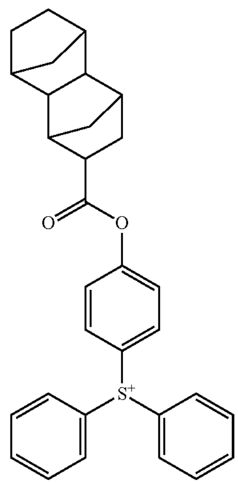
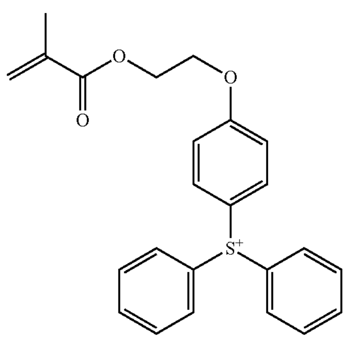
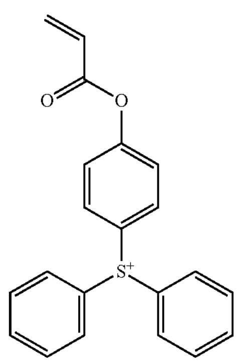
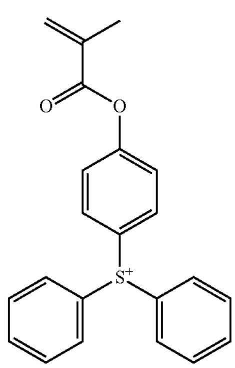
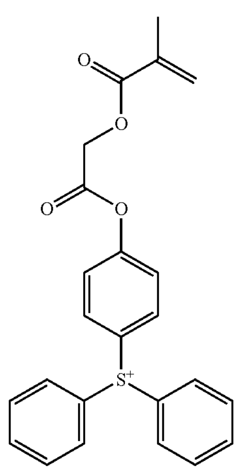
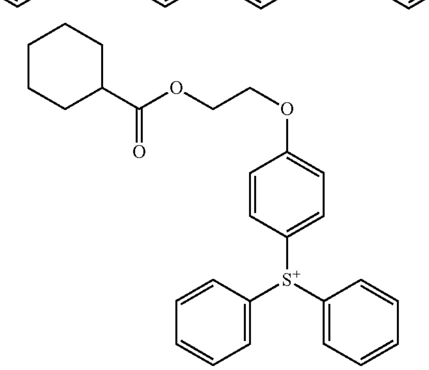
-continued
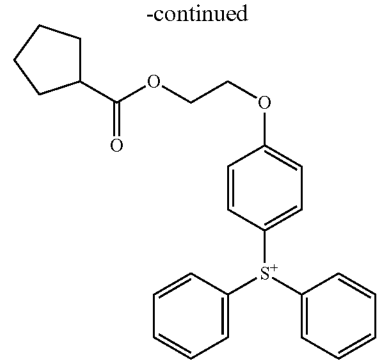
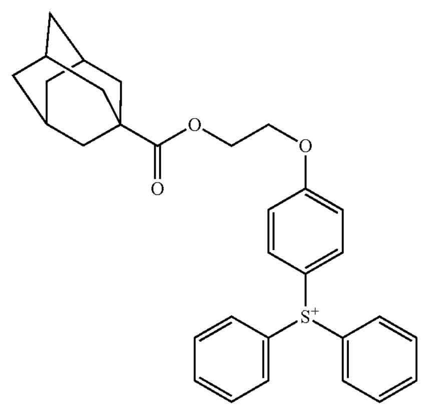
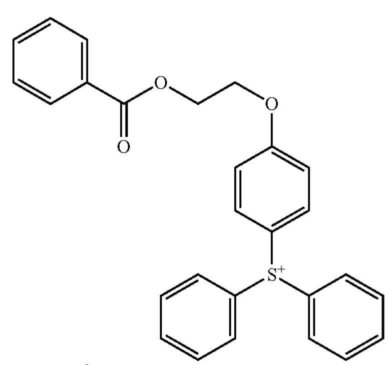
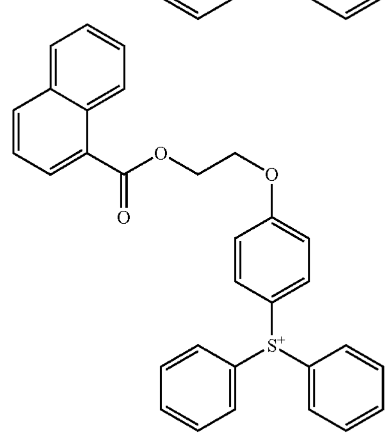

-continued
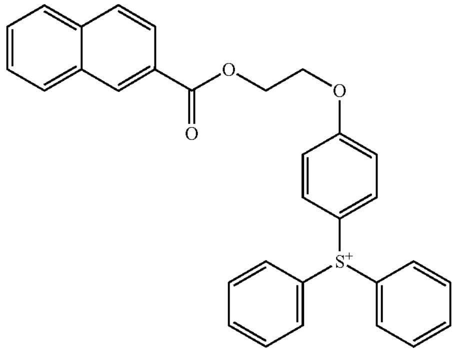
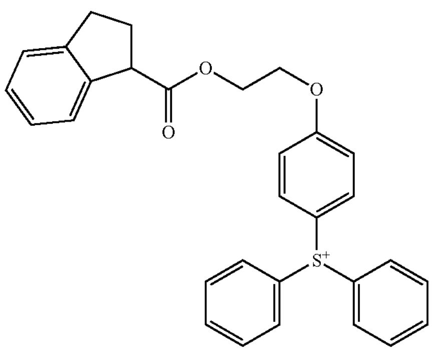
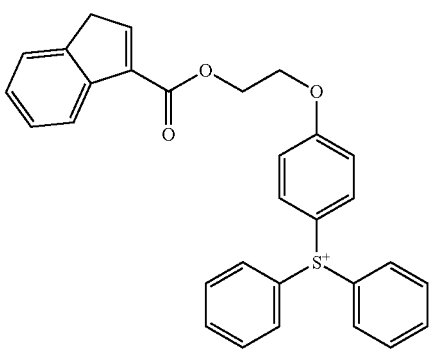
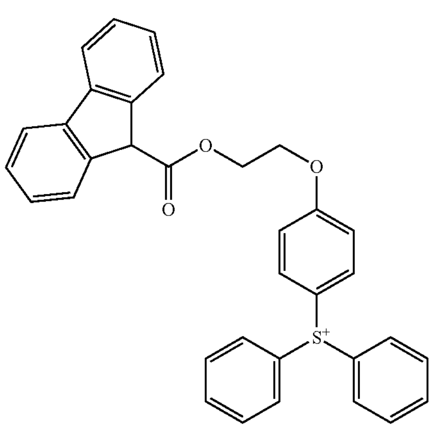
-continued
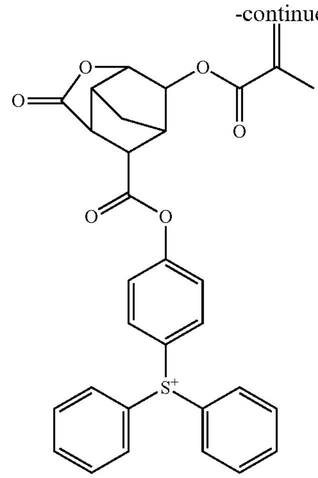
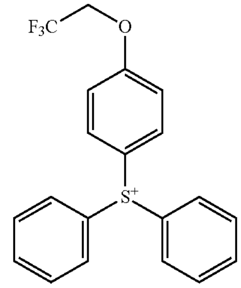
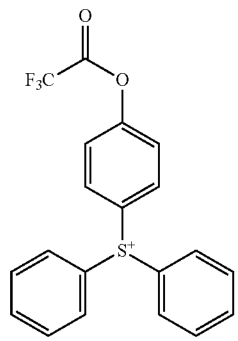
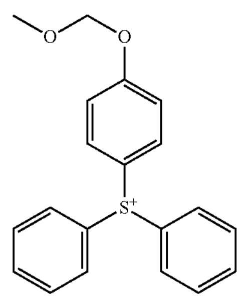
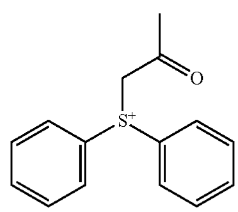
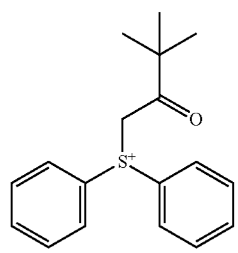
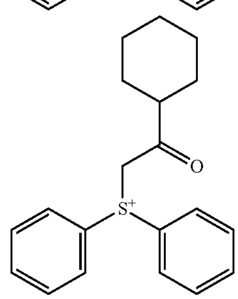
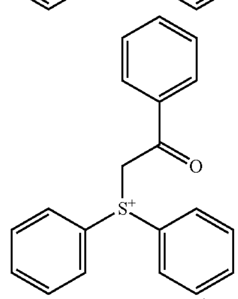
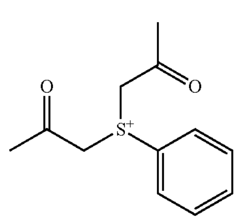
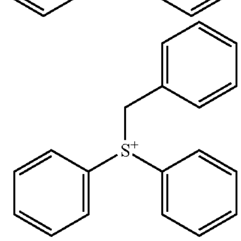

-continued
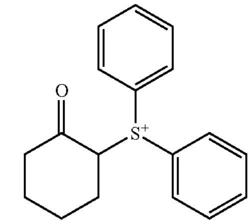
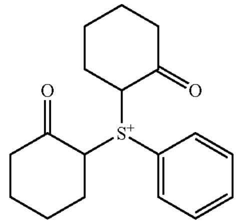
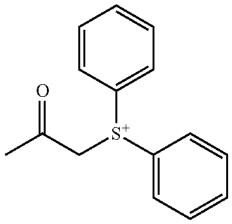
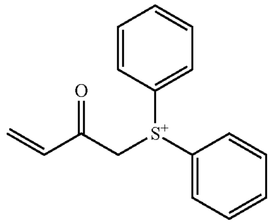
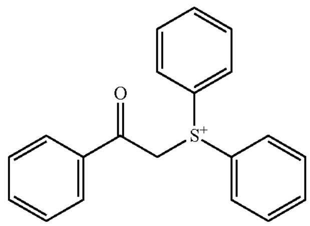
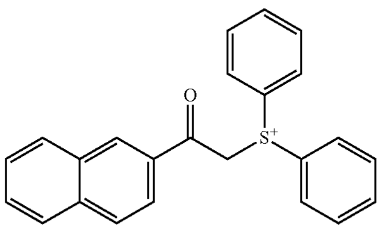
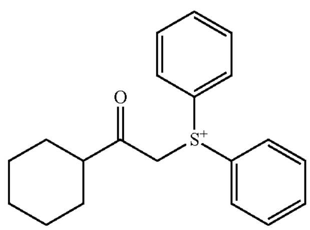
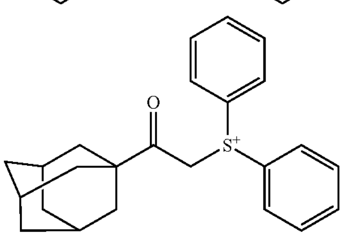
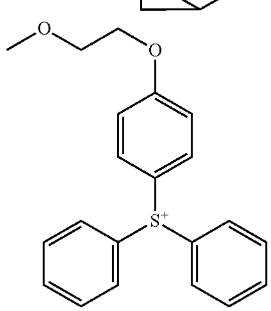
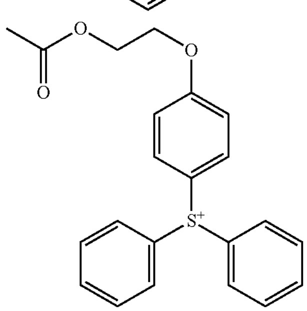
-continued
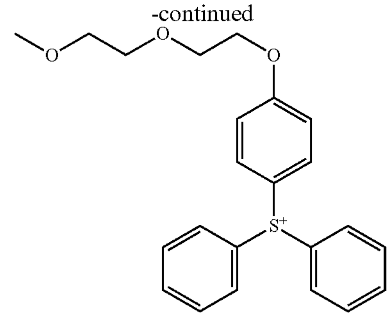
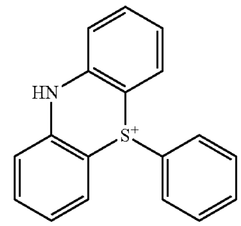
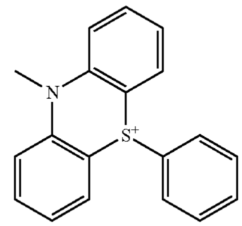
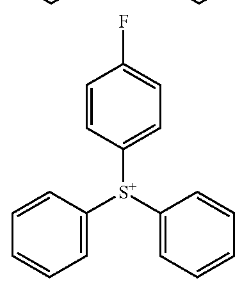
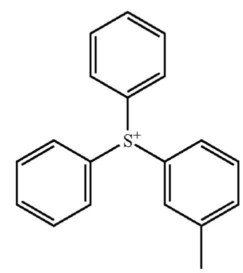
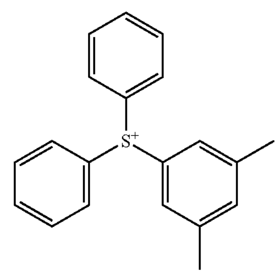
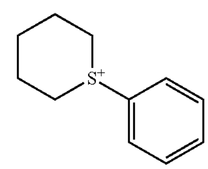
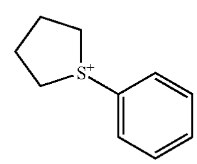
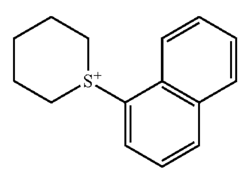
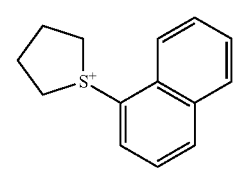
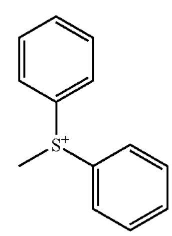
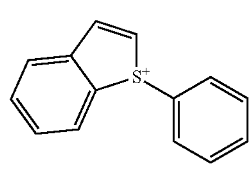
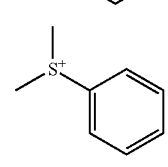

-continued
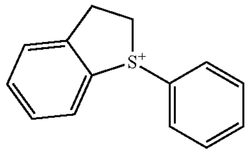
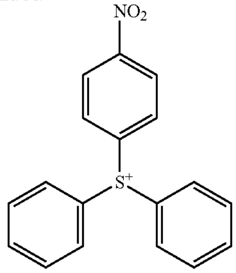
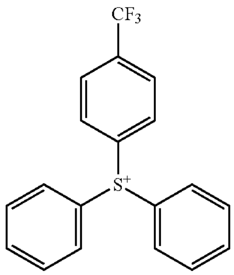
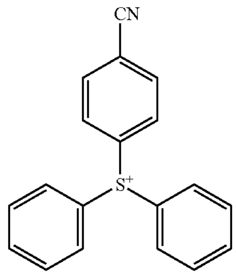
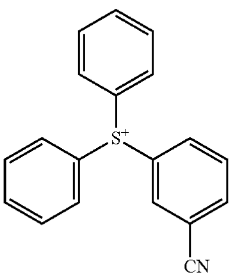
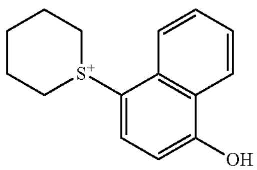
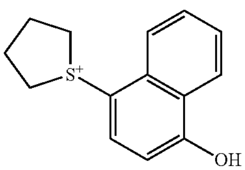
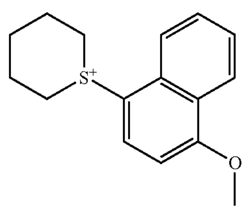
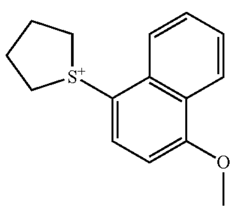
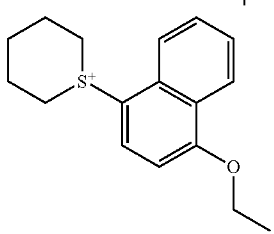
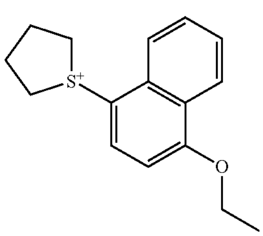
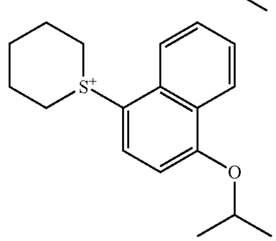
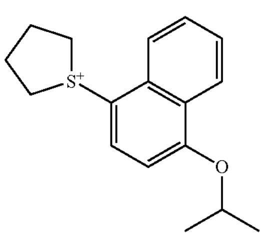
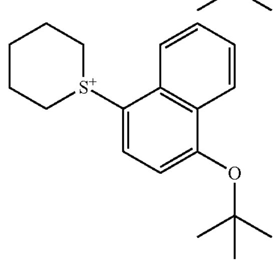
-continued
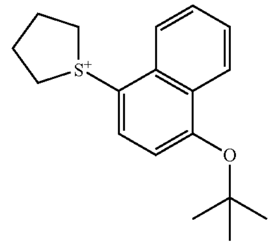
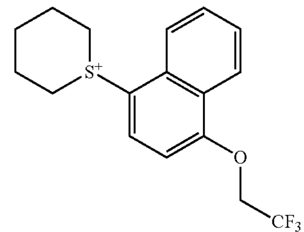
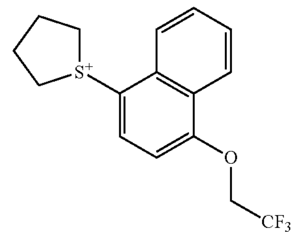
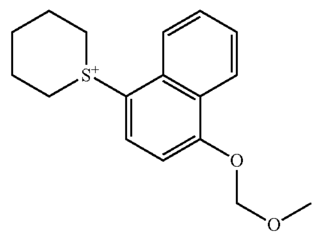
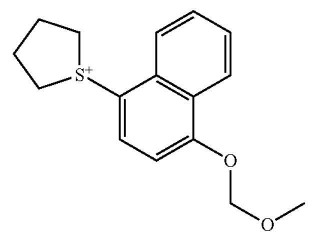
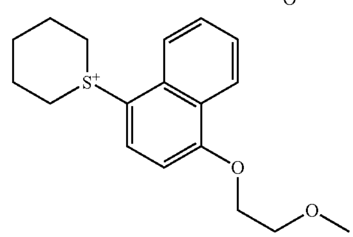
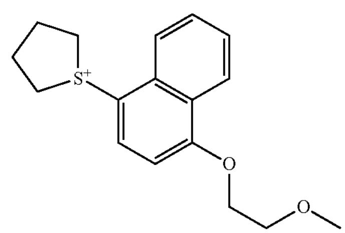
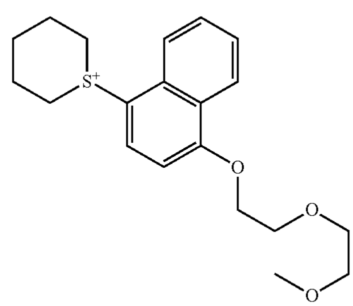

-continued
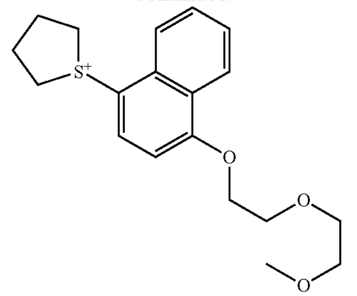
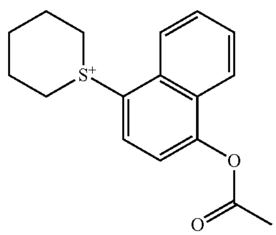
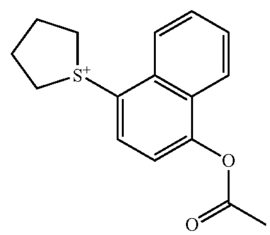
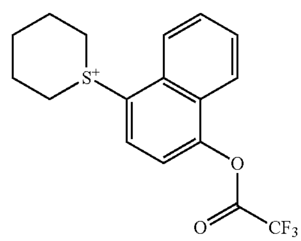
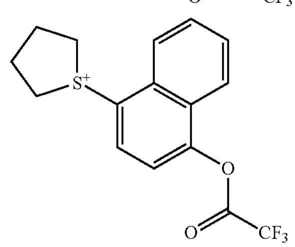
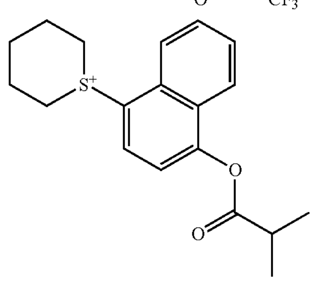
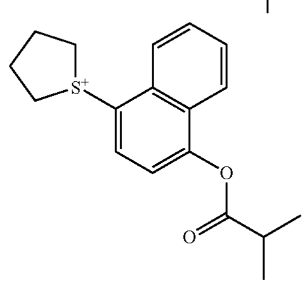
-continued
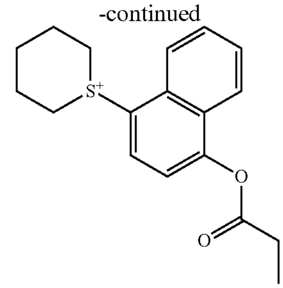
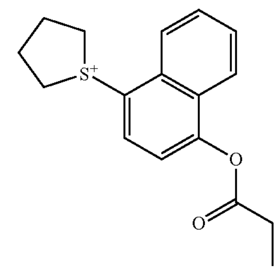
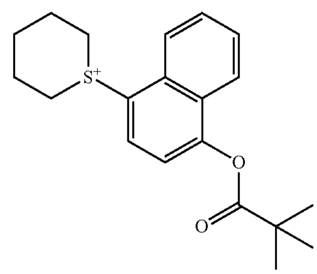
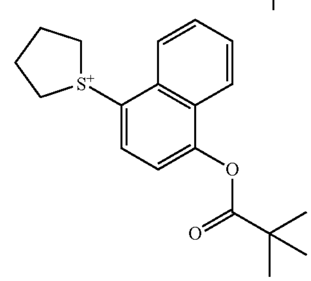
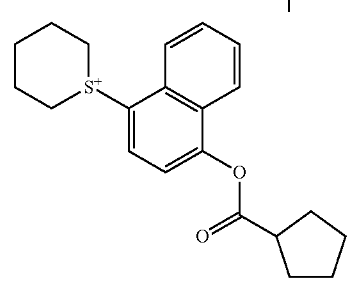
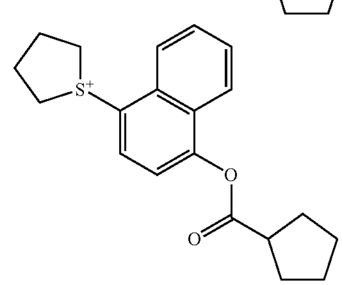

-continued
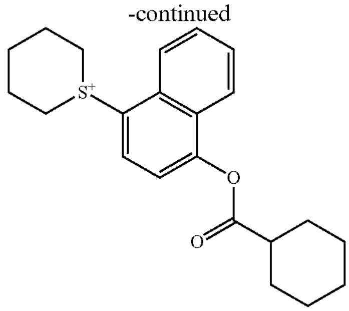
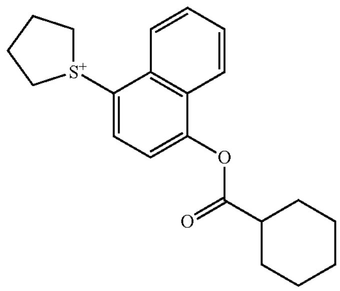
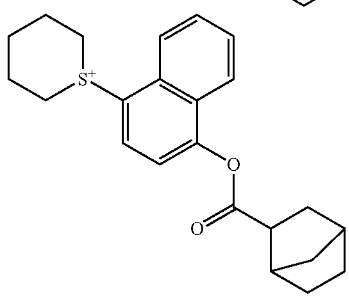
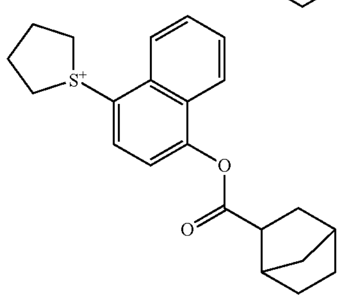
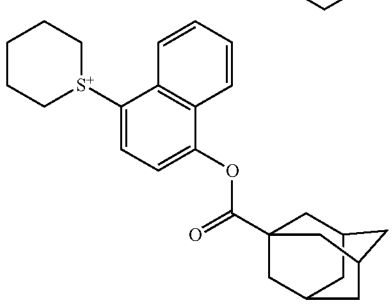
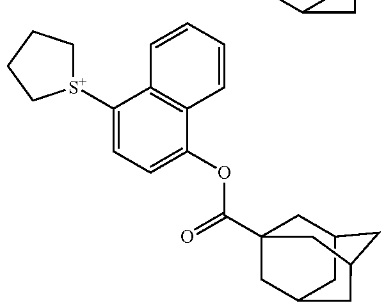
-continued
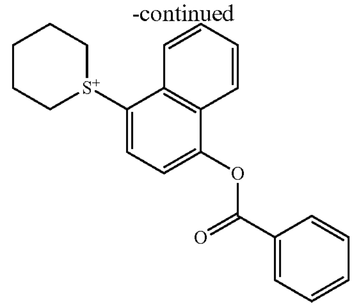
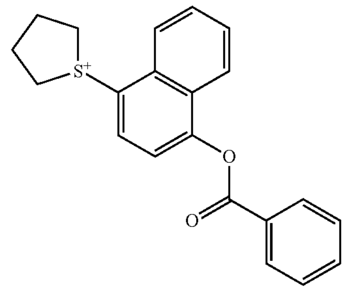
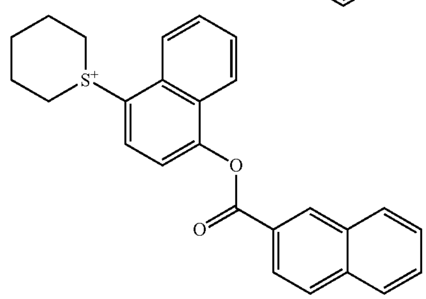
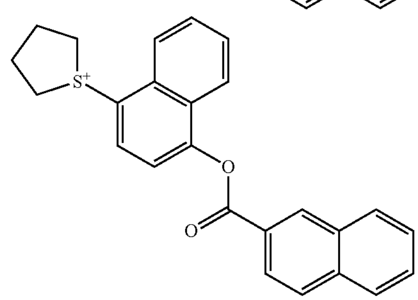
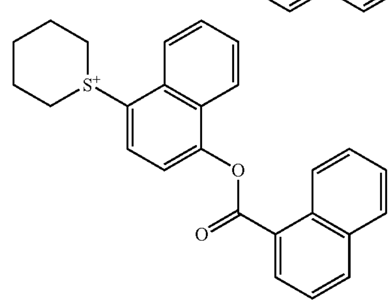
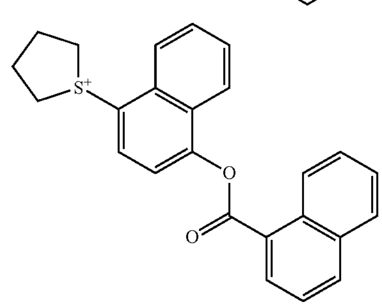

-continued
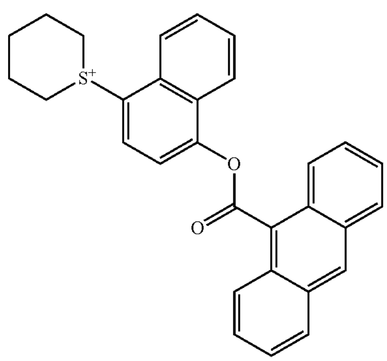
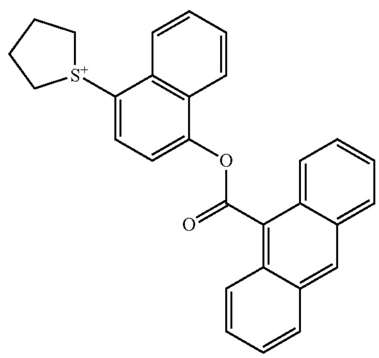
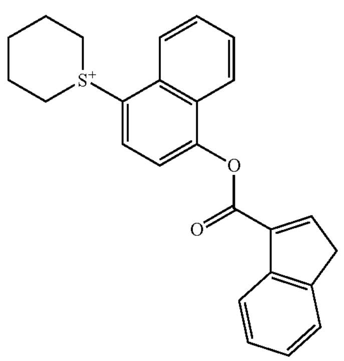
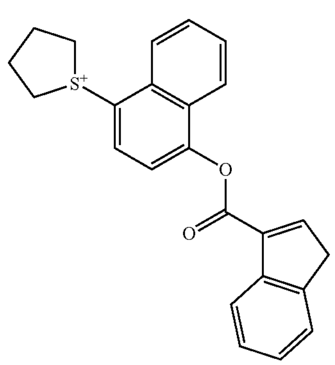
-continued
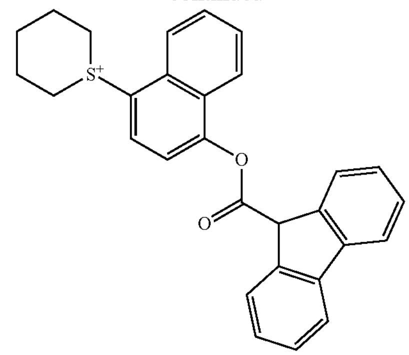
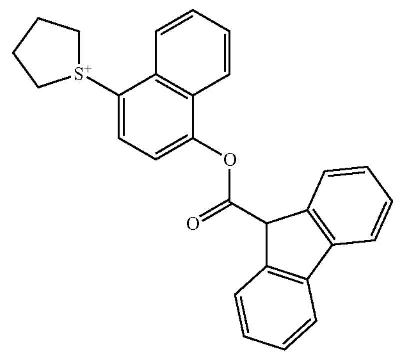
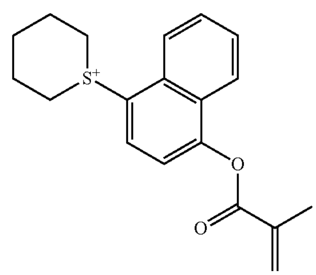
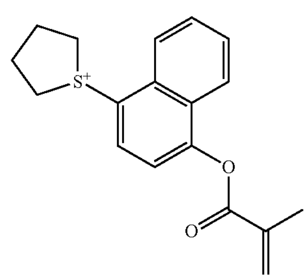
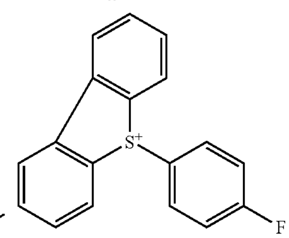
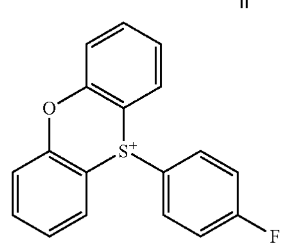
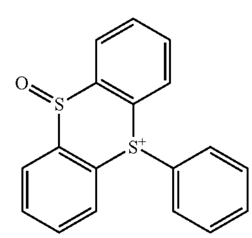
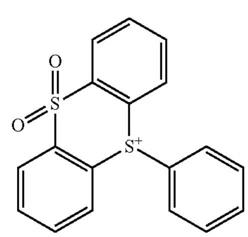
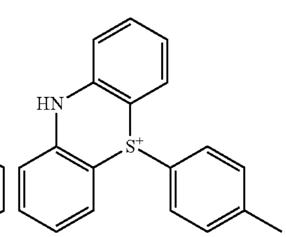

-continued
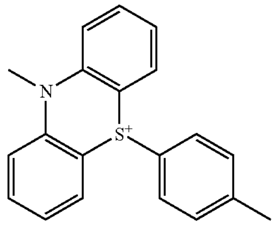
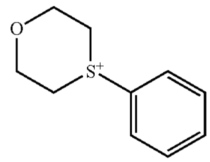
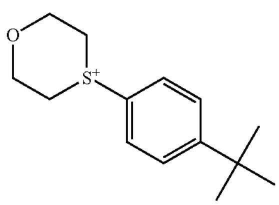
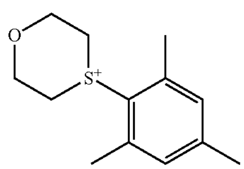
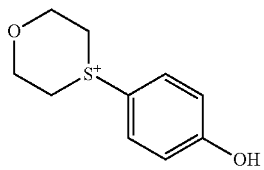
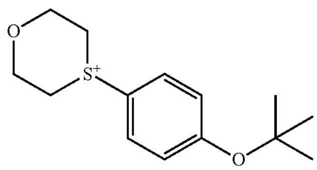
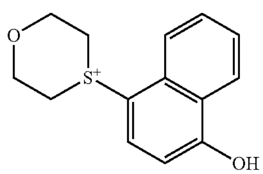
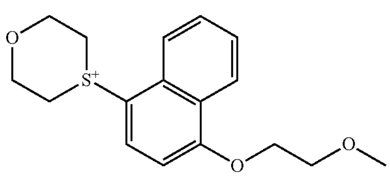
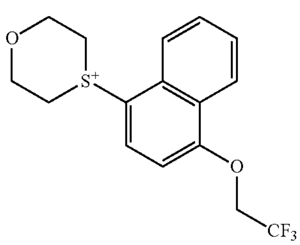
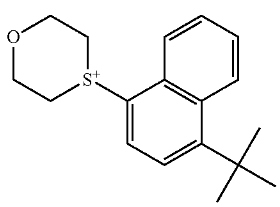
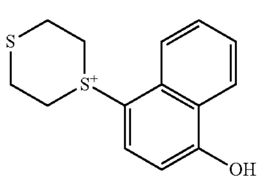
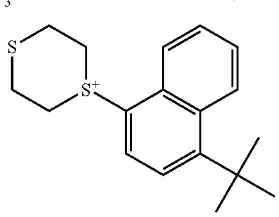
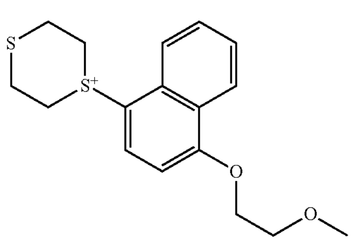
-continued
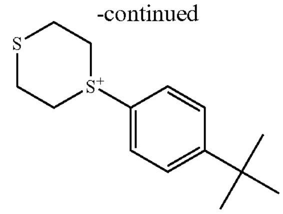
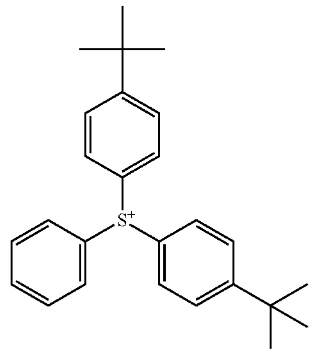
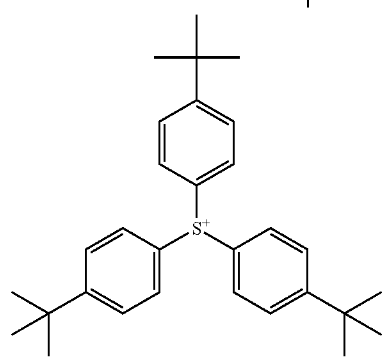
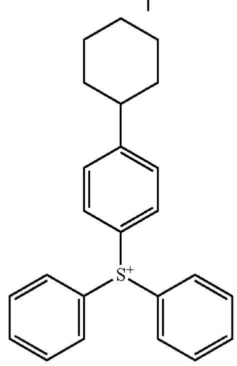
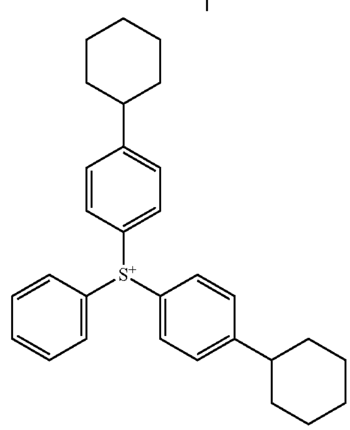
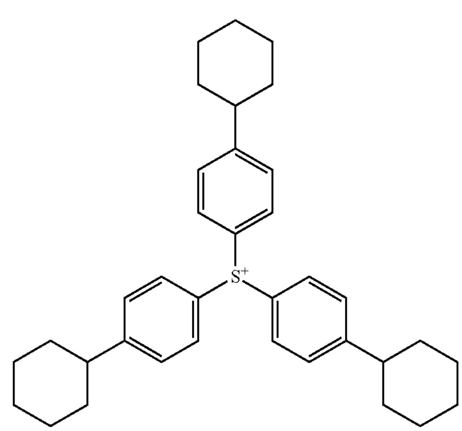

-continued
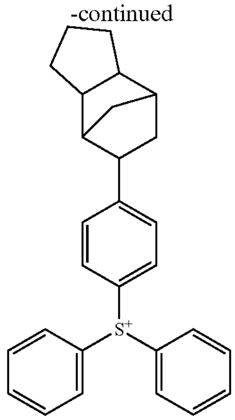
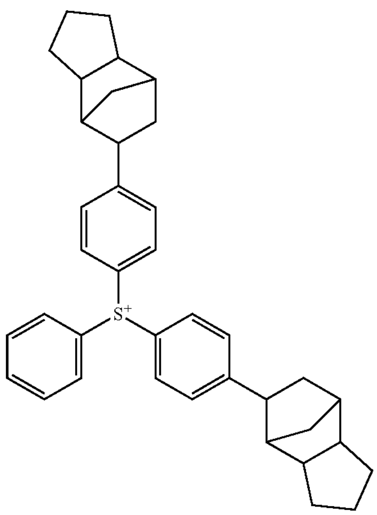
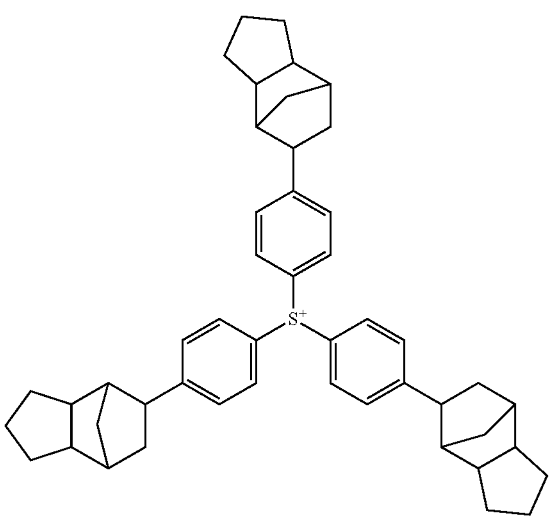
-continued
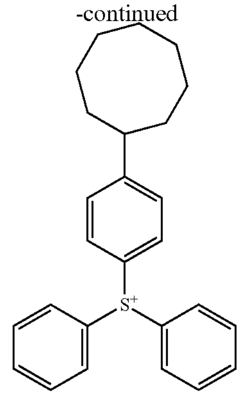
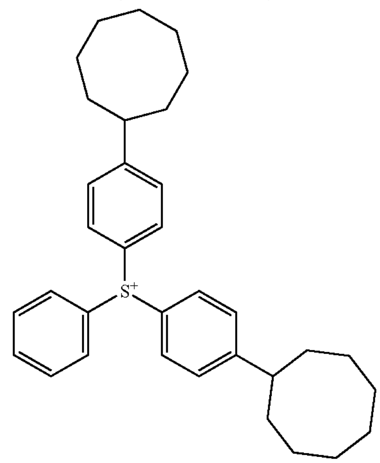
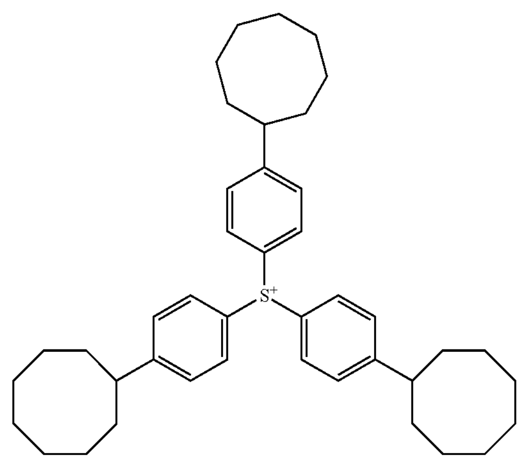
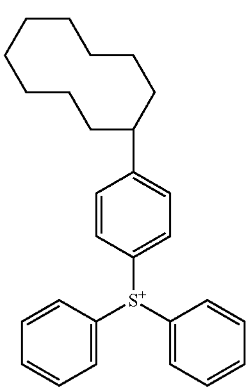

-continued
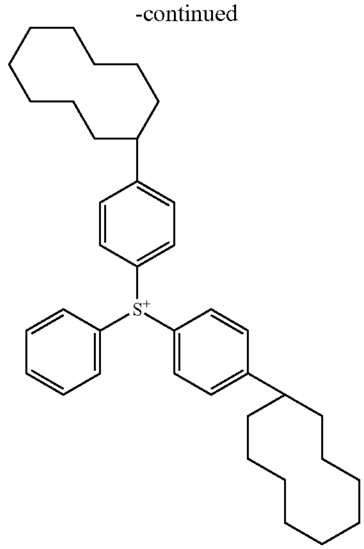
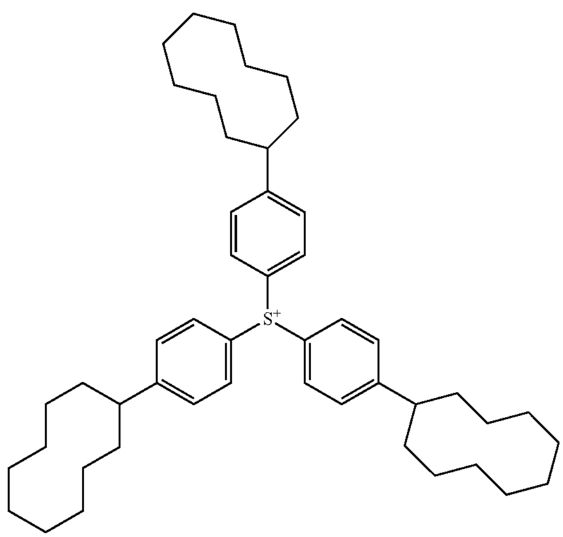
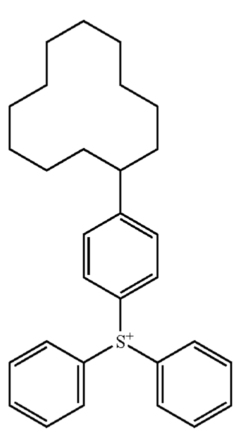
-continued
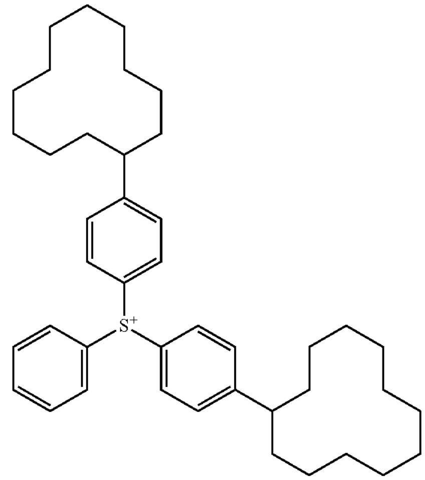
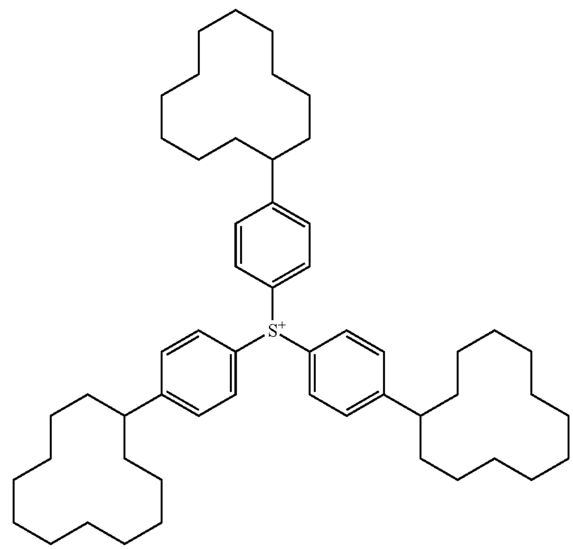
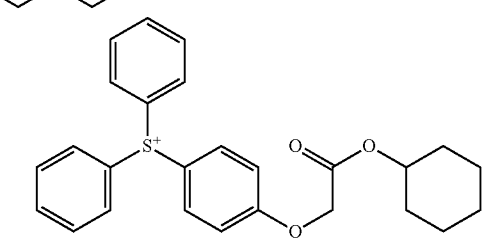
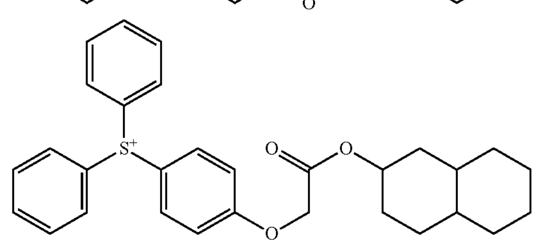
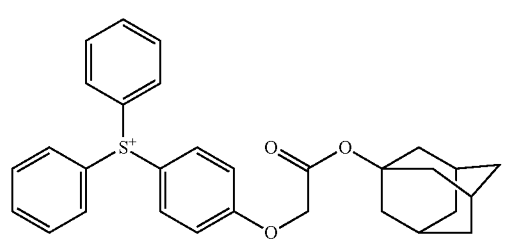

-continued
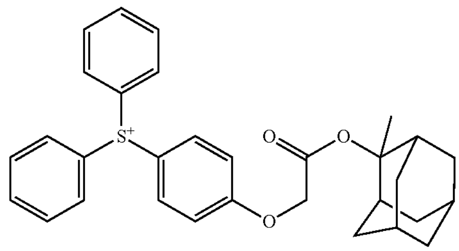
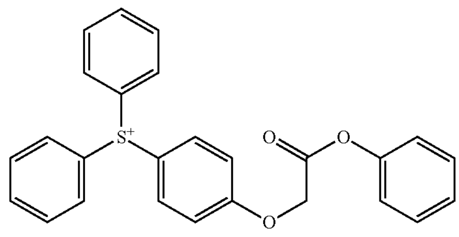
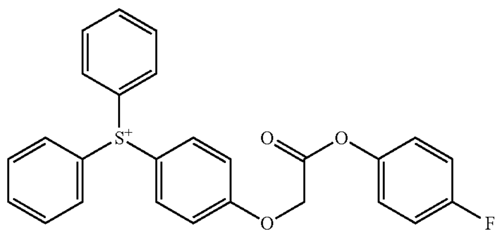
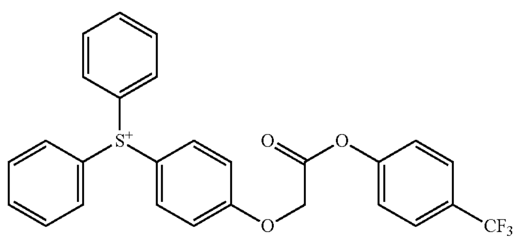
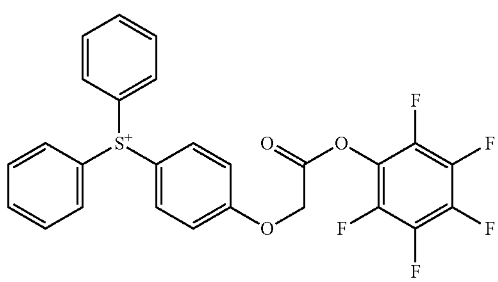
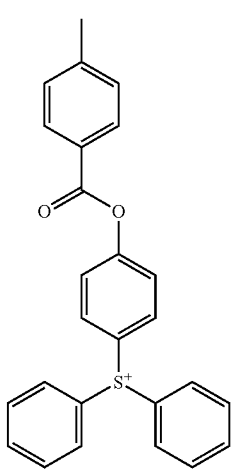
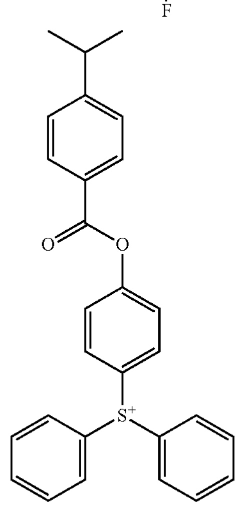
-continued
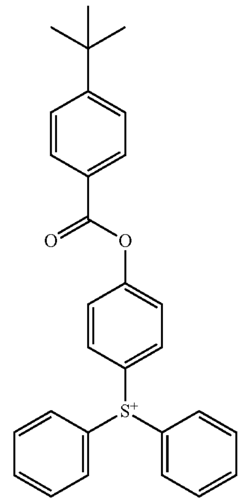
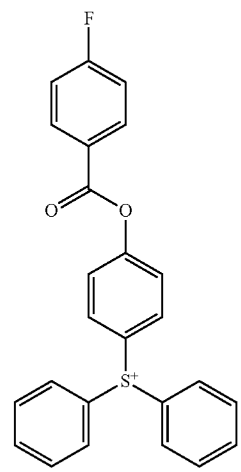
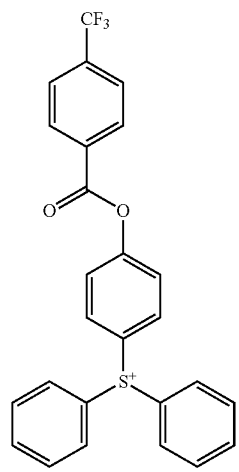
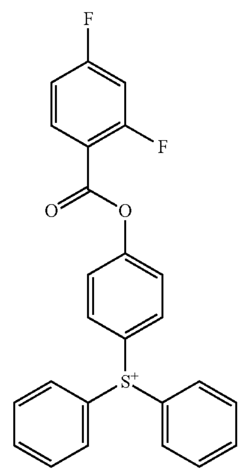
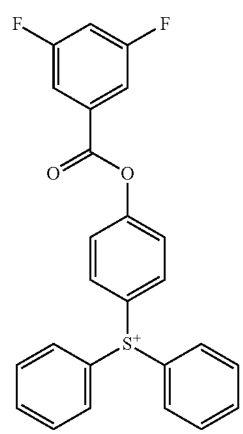
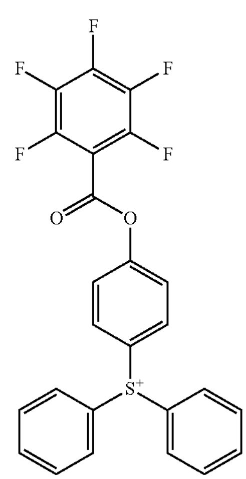
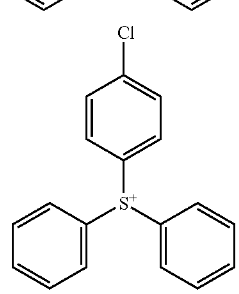
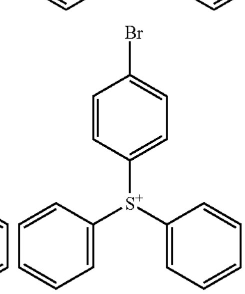

-continued
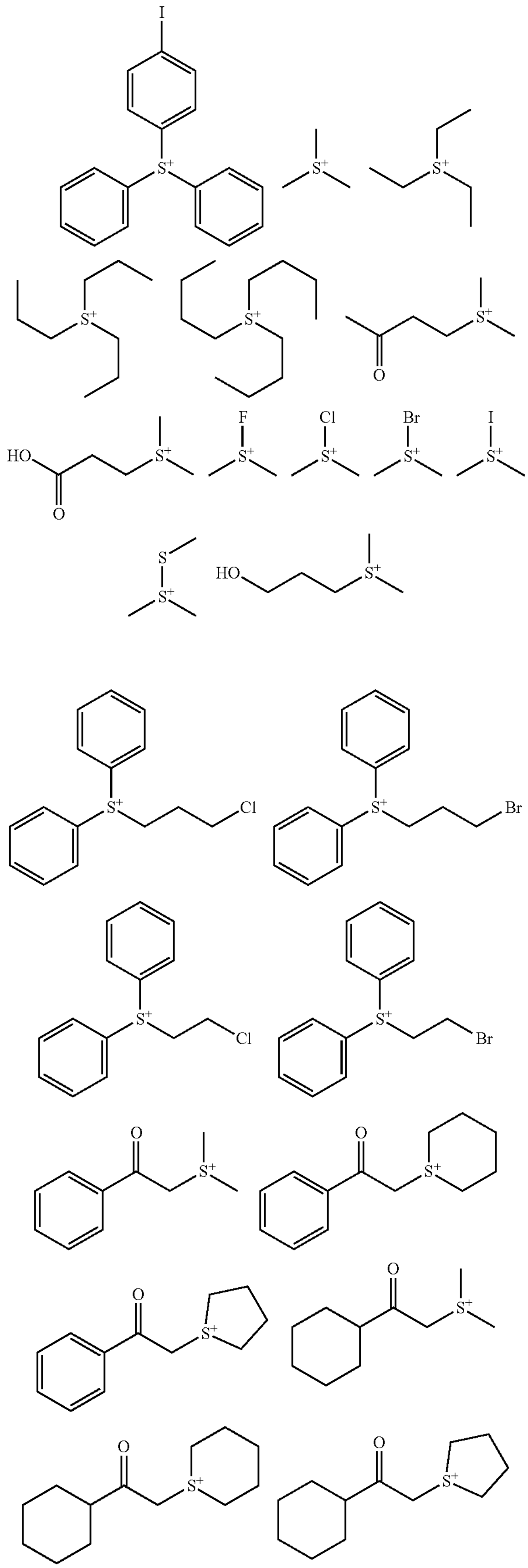
-continued
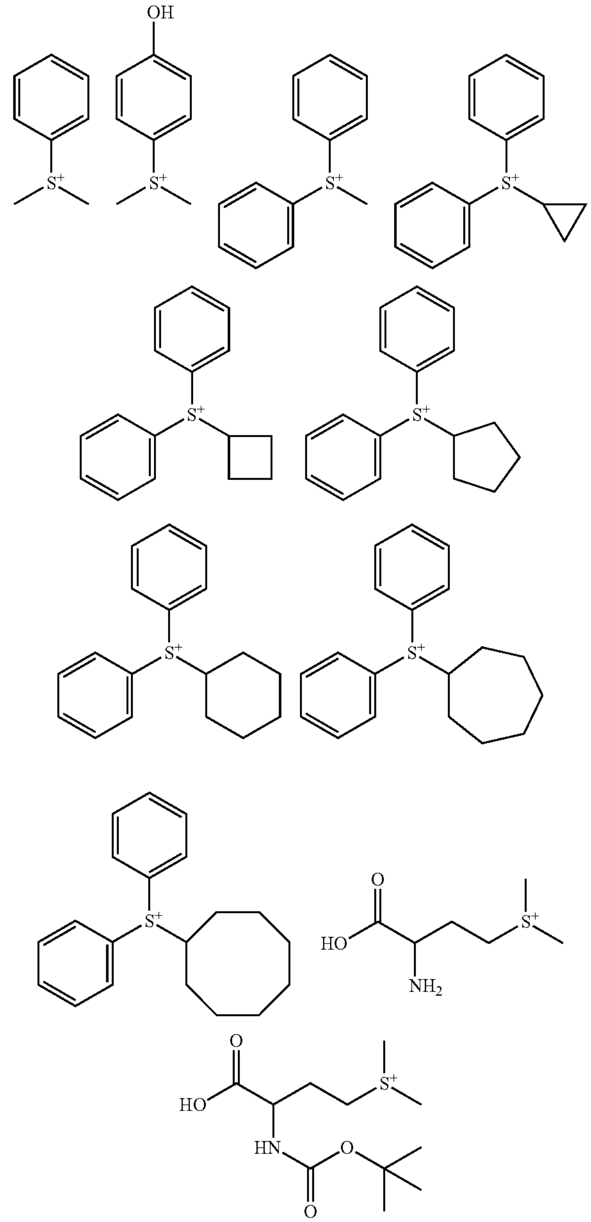
Examples of the cation in the iodonium salt having formula (1-2) are shown below, but not limited thereto.
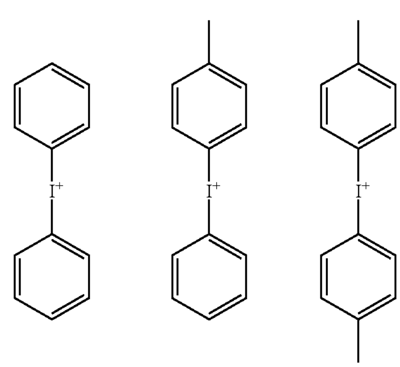

-continued
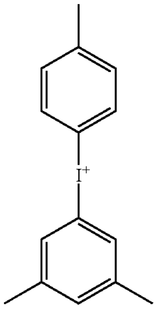
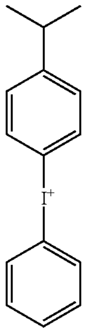
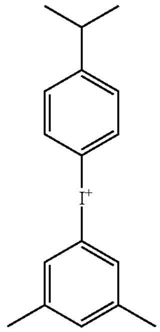
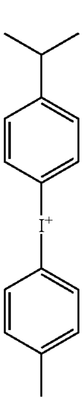
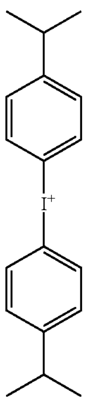
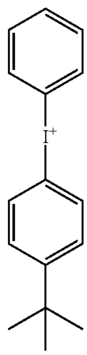 [SMILES: CC(C)(C)c1ccc([I+]c2ccccc2)cc1]
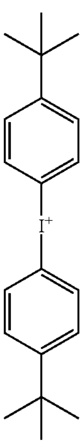
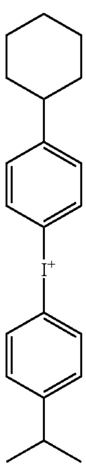
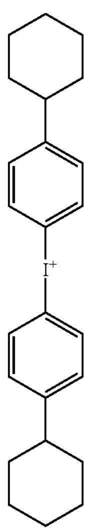
-continued
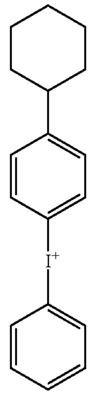
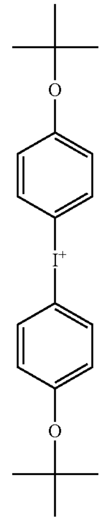
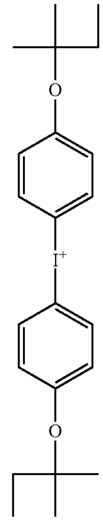
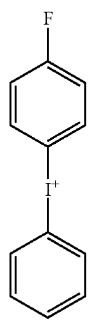
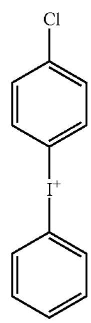
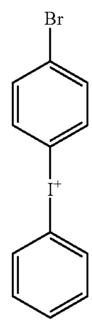
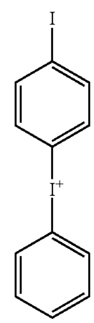
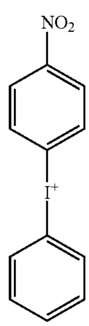
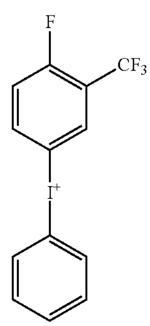
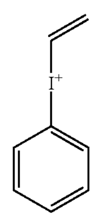
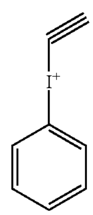
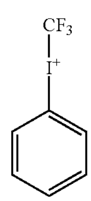
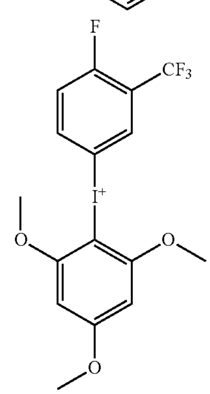

-continued

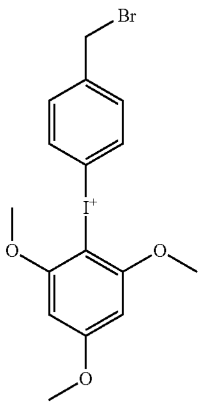

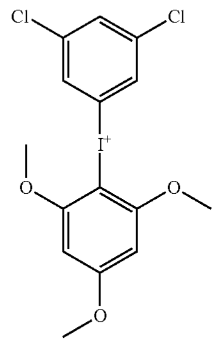

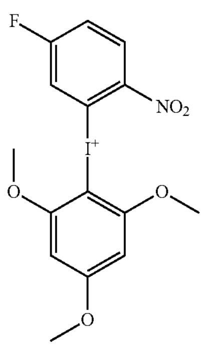

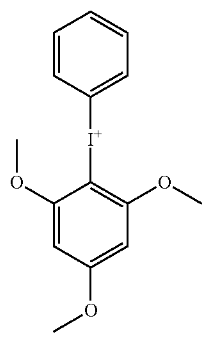

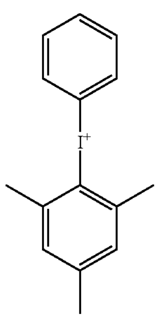

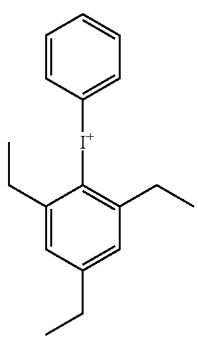

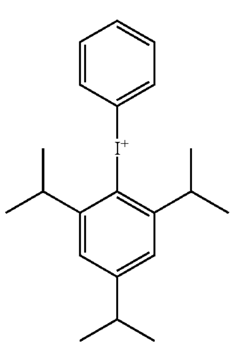

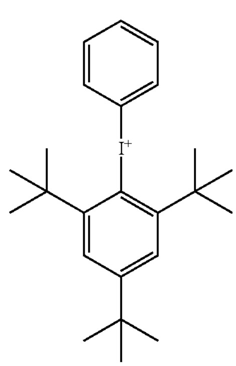

-continued

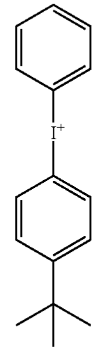

In formulae (1-1) and (1-2). $X^-$ is an anion of the following formula (1A), (1B), (1C) or (1D).

$$R^{fa}—CF_2—SO_3^- \quad (1A)$$

(1B)

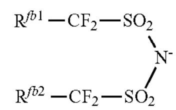

(1C)

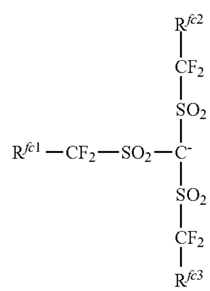

(1D)

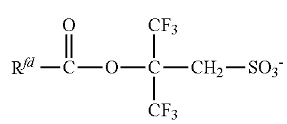

In formula (1A), $R^{fa}$ is fluorine or a $C_1$-$C_{40}$ monovalent hydrocarbon group which may contain a heteroatom. The monovalent hydrocarbon group may be straight, branched or cyclic, and examples thereof include those exemplified later for $R^{107}$.

Of the anions of formula (1A), an anion having the formula (1A') is preferred.

(1A')

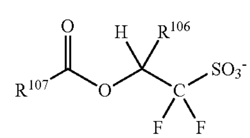

In formula (1A'), $R^{106}$ is hydrogen or trifluoromethyl, preferably trifluoromethyl.

$R^{107}$ is a $C_1$-$C_{38}$ monovalent hydrocarbon group which may contain a heteroatom. As the heteroatom, oxygen, nitrogen, sulfur and halogen atoms are preferred, with oxygen being most preferred. Of the monovalent hydrocarbon groups represented by $R^{107}$, those groups of 6 to 30 carbon atoms are preferred from the aspect of achieving a high resolution in forming patterns of fine feature size. The monovalent hydrocarbon groups may be straight, branched or cyclic. Examples thereof include, but are not limited to, straight or branched alkyl groups such as methyl, ethyl, propyl, isopropyl, butyl, isobutyl, sec-butyl, tert-butyl, pentyl, neopentyl, hexyl, heptyl, 2-ethylbhexyl, nonyl, undecyl, tridecyl, pentadecyl, heptadecyl, and eicosanyl, monovalent saturated alicyclic hydrocarbon groups such as cyclopentyl, cyclohexyL 1-adamantyl, 2-adamantyl, 1-adamantylmethyl, norbomyl, norbomylmethyl, tricyclodecanyl, tetracyclododecanyl, tetracyclododecanylmnethyl, and dicyclohexylmethyl, monovalent unsaturated aliphatic hydrocarbon groups such as allyl and 3-cyclohexenyl; aryl groups such as phenyl, 1-naphthyl and 2-naphthyl; and aralkyl groups such as benzyl and diphenylmethyl. Examples of the monovalent hydrocarbon group having a heteroatom include tetrahydrofuryl, methoxymethyl, ethoxymethyl, methylthiomethyl, acetamidomethyl, trifluoroethyl, (2-methoxyethoxy)methyl, acetoxymethyl, 2-carboxy-1-cyclohexyl, 2-oxopropyl, 4-oxo-1-adamantyl, and 3-oxocyclohexyl. In these groups, some hydrogen may be substituted by a moiety containing a heteroatom such as oxygen, sulfur, nitrogen or halogen, or some carbon may be replaced by a moiety containing a heteroatom such as oxygen, sulfur or nitrogen, so that the group may contain a hydroxyl, cyano, carbonyl, ether bond, ester bond, sulfonic acid ester bond, carbonate moiety, lactone ring, sultone ring, carboxylic anhydride or haloalkyl moiety.

With respect to the synthesis of the sulfonium salt having an anion of formula (1A'), reference may be made to JP-A 2007-145797, JP-A 2008-106045, JP-A 2009-007327, and JP-A 2009-258695. Also useful are the sulfonium salts described in JP-A 2010-215608, JP-A 2012-041320, JP-A 2012-106986, and JP-A 2012-153644.

Examples of the anion having formula (1A) are shown below, but not limited thereto.

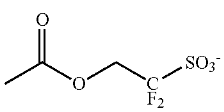
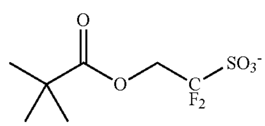
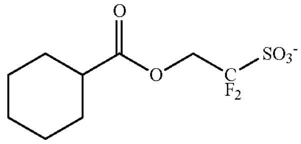
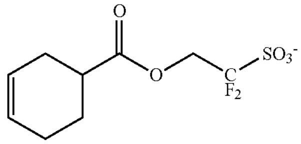
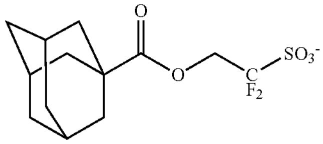
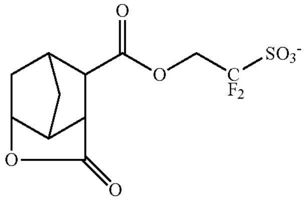

-continued

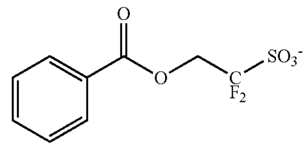
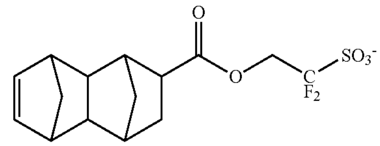
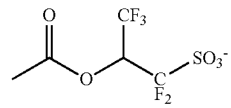
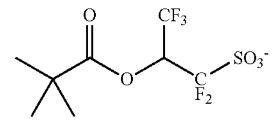
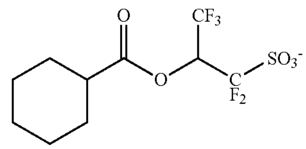
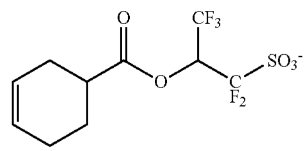
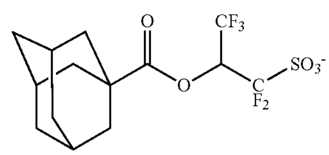
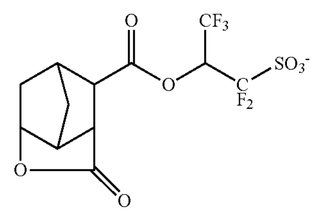
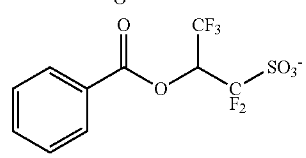
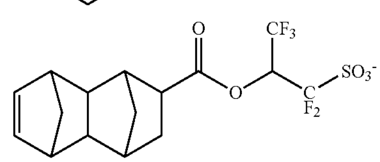
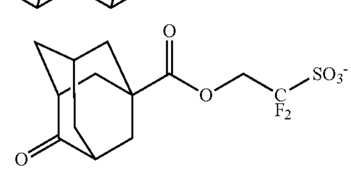
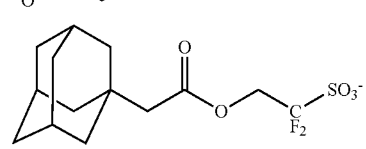

-continued

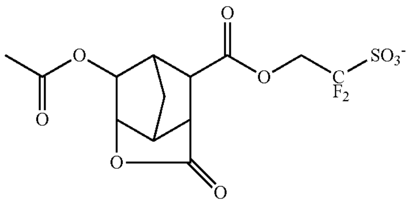

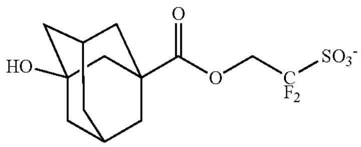

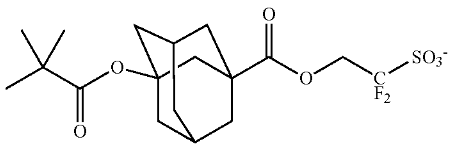

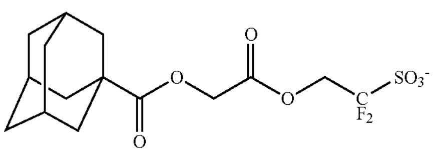

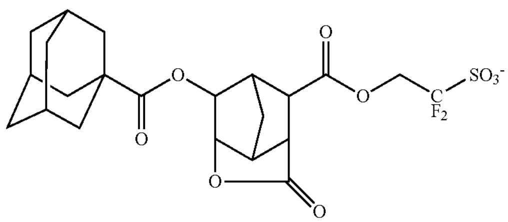

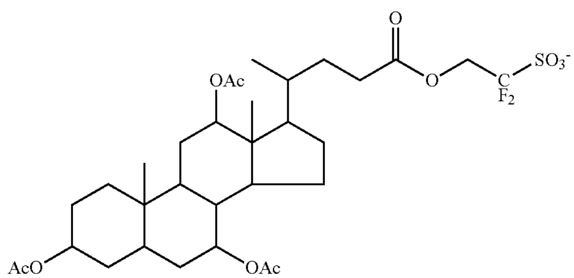

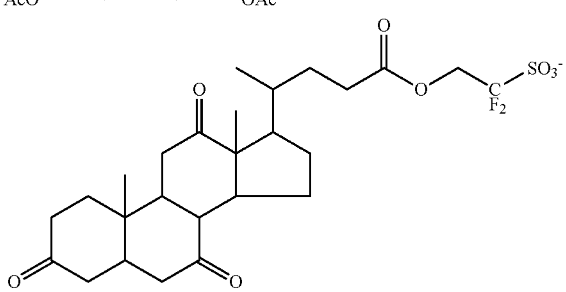

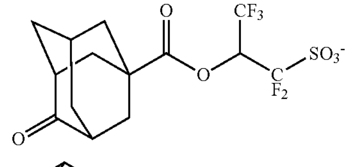

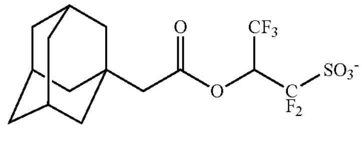

-continued

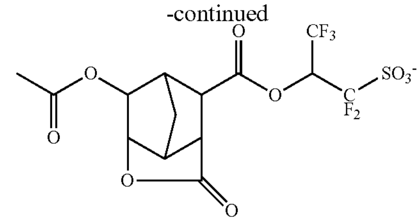

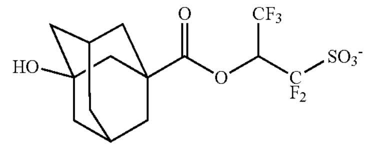

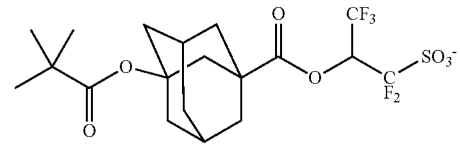

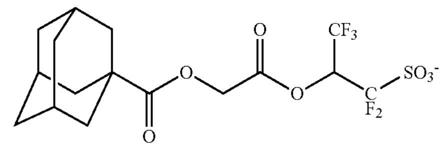

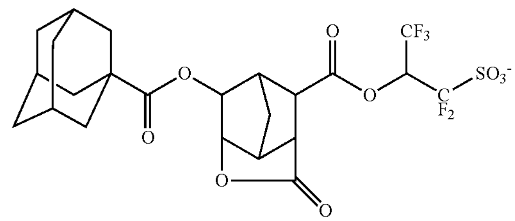

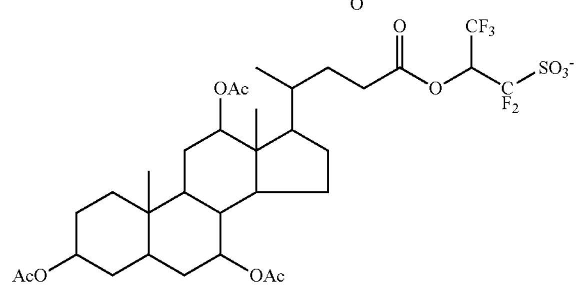

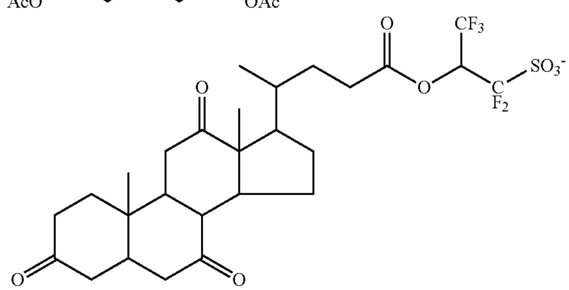

In formula (1B), $R^{fb1}$ and $R^{fb2}$ are each independently fluorine or a $C_1$-$C_{40}$ monovalent hydrocarbon group which may contain a heteroatom. The monovalent hydrocarbon group may be straight, branched or cyclic, and examples thereof are as exemplified above for $R^{107}$. Preferably $R^{fb1}$ and $R^{fb2}$ are fluorine or $C_1$-$C_4$ straight fluorinated alkyl groups. Also, $R^{fb1}$ and $R^{fb2}$ may bond together to form a ring with the linkage: $—CF_2—SO_2—N^-—SO_2—CF_2—$ to which they are attached. It is preferred that a combination of $R^{fb1}$ and $R^{fb2}$ be a fluorinated ethylene or fluorinated propylene group.

In formula (1C), $R^{fc1}$, $R^{fc2}$ and $R^{fc3}$ are each independently fluorine or a $C_1$-$C_{40}$ monovalent hydrocarbon group which may contain a heteroatom. The monovalent hydrocarbon group may be straight, branched or cyclic, and examples thereof are as exemplified above for $R^{107}$. Preferably $R^{fc1}$, $R^{fc2}$ and $R^{fc3}$ are fluorine or $C_1$-$C_4$ straight fluorinated alkyl groups. Also, $R^{fc1}$ and $R^{fc2}$ may bond together to form a ring with the linkage: —$CF_2$—$SO_2$—$C^-$—$SO_2$—$CF_2$— to which they are attached. It is preferred that a combination of $R^{fc1}$ and $R^{fc2}$ be a fluorinated ethylene or fluorinated propylene group.

In formula (1D), $R^{fd}$ is a $C_1$-$C_{40}$ monovalent hydrocarbon group which may contain a heteroatom. The monovalent hydrocarbon group may be straight, branched or cyclic, and examples thereof are as exemplified above for $R^{107}$.

With respect to the synthesis of the sulfonimn salt having an anion of formula (1D), reference may be made to JP-A 2010-215608 and JP-A 2014-133723.

Examples of the anion having formula (1D) are shown below, but not limited thereto.

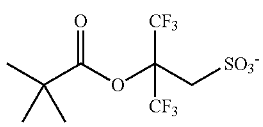

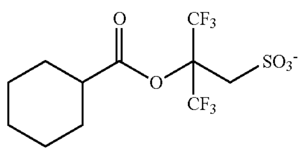

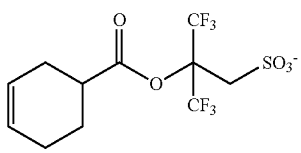

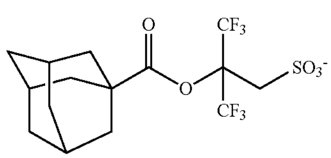

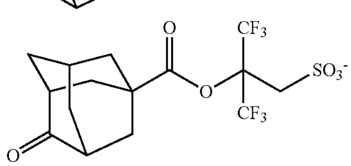

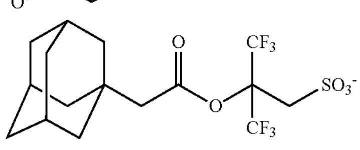

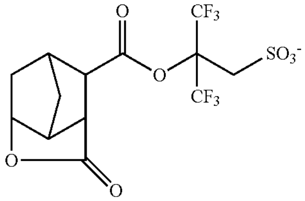

-continued

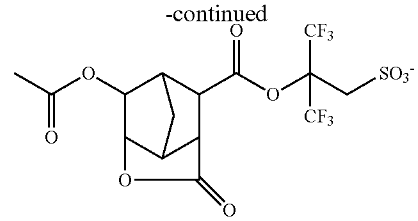

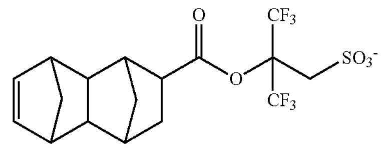

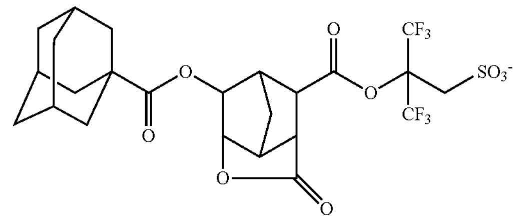

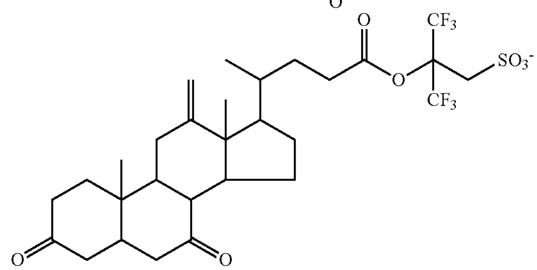

Notably, the compound having the anion of formula (1D) does not have fluorine at the α-position relative to the sulfo group, but two trifluoromethyl groups at the β-position. For this reason, it has a sufficient acidity to sever the acid labile groups in the resist polymer. Thus the compound is an effective PAG.

Another preferred PAG is a compound having the formula (2).

$$R^{201}-\underset{\displaystyle R^{202}}{\underset{|}{S^+}}-R^{203}-L^A-\left(\begin{array}{c}X^C\\|\\C\\|\\X^D\end{array}\right)_k-\begin{array}{c}X^A\\|\\C\\|\\X^B\end{array}-SO_3^- \qquad (2)$$

In formula (2), $R^{201}$ and $R^{202}$ are each independently a $C_1$-$C_{30}$ monovalent hydrocarbon group which may contain a heteroatom. $R^{203}$ is a $C_1$-$C_{30}$ divalent hydrocarbon group which may contain a heteroatom. Any two of $R^{201}$, $R^{202}$ and $R^{203}$ may bond together form a ring with the sulfur atom to which they are attached. $L^A$ is a single bond, ether bond or a $C_1$-$C_{20}$ divalent hydrocarbon group which may contain a heteroatom. $X^A$, $X^B$, $X^C$ and $X^D$ are each independently hydrogen, fluorine or trifluoromethyl, with the proviso that at least one of $X^A$, $X^B$, $X^C$ and $X^D$ is fluorine or trifluoromethyl, and k is an integer of 0 to 3.

The monovalent hydrocarbon groups may be straight, branched or cyclic. Examples thereof include, but are not limited to, straight or branched alkyl groups such as methyl, ethyl, propyl, isopropyl, n-butyl, sec-butyl, tert-butyl, n-pentyl, tert-pentyl, n-hexyl, n-octyl, n-nonyl, n-decyl, and 2-ethylhexyl; monovalent saturated cyclic hydrocarbon groups such as cyclopentyl, cyclohexyl, cyclopentylmethyl, cyclopentylethyl, cyclopentylbutyl, cyclohexylmethyl, cyclohexylethyl, cyclohexylbutyl, norbomyl, oxanorbornyl, tricyclo[5.2.1.0$^{2,6}$]decanyl, and adamantyl; and aryl groups such as phenyl, naphthyl and anthracenyl. In these groups, some hydrogen may be substituted by a moiety containing a heteroatom such as oxygen, sulfur, nitrogen or halogen, or some carbon may be replaced by a moiety containing a heteroatom such as oxygen, sulfur or nitrogen, so that the group may contain a hydroxyl, cyano, carbonyl, ether bond, ester bond, sulfonic acid ester bond, carbonate moiety, lactone ring, sultone ring, carboxylic anhydride or haloalkyl moiety.

The divalent hydrocarbon groups may be straight, branched or cyclic. Examples thereof include straight or branched alkanediyl groups such as methylene, ethylene, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, mundecane-1,11-diyl, dodecane-1,12-diyl, tridecane-1,13-diyl, tetradecane-1,14-diyl, pentadecane-1,15-diyl, hexadecane-1,16-diyl, and heptadecane-1,17-diyl; divalent saturated cyclic hydrocarbon groups such as cyclopentanediyl, cyclohexanediyl, norbornanediyl and adamantanediyl; and divalent unsaturated cyclic hydrocarbon groups such as phenylene and naphthylene. In these groups, some hydrogen may be substituted by an alkyl moiety such as methyl, ethyl, propyl, n-butyl or t-butyl: some hydrogen may be substituted by a moiety containing a heteroatom such as oxygen, sulfur, nitrogen or halogen; or some carbon may be replaced by a moiety containing a heteroatom such as oxygen, sulfur or nitrogen, so that the group may contain a hydroxyl, cyano, carbonyl, ether bond, ester bond, sulfonic acid ester bond, carbonate, lactone ring, sultone ring, carboxylic anhydride or haloalkyl moiety. Of the heteroatoms, oxygen is preferred.

Of the PAGs having formula (2), those having formula (2') are preferred.

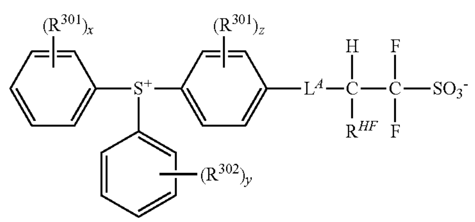

(2')

In formula (2'), $L^A$ is as defined above. $R^{HF}$ is hydrogen or trifluoromethyl, preferably trifluoromethyl. $R^{301}$, $R^{302}$ and $R^{303}$ are each independently hydrogen or a $C_1$-$C_{20}$ monovalent hydrocarbon group which may contain a heteroatom. The monovalent hydrocarbon groups may be straight, branched or cyclic, and examples thereof are as exemplified above for $R^{107}$. The subscripts x and y are each independently an integer of 0 to 5, and z is an integer of 0 to 4.

Examples of the PAG having formula (2) are shown below, but not limited thereto. Notably, $R^{HF}$ is as defined above.

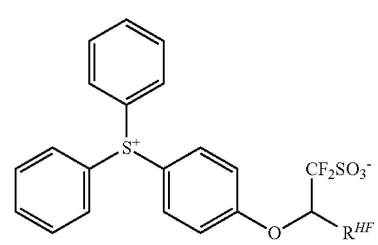

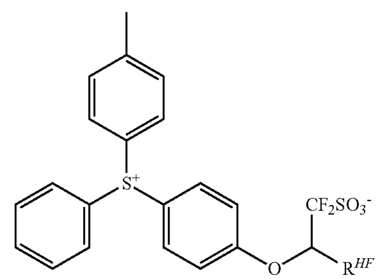

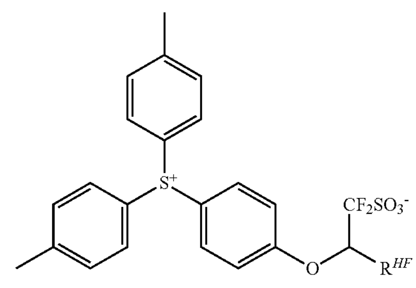

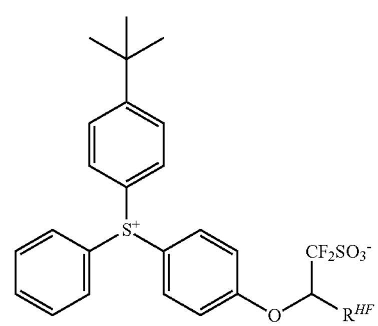

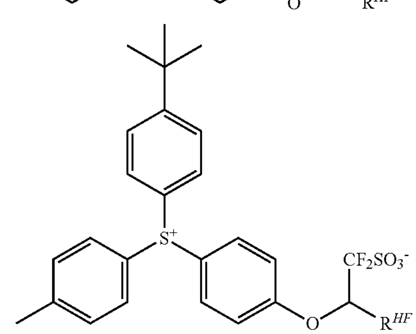

-continued
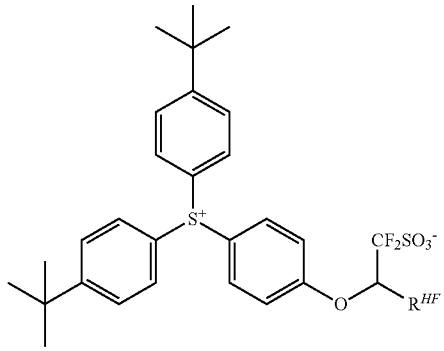
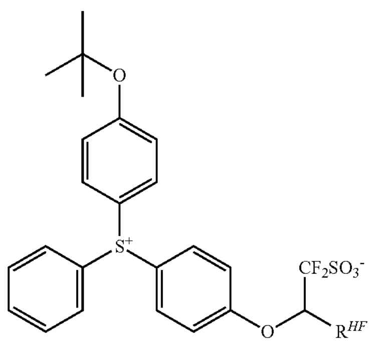
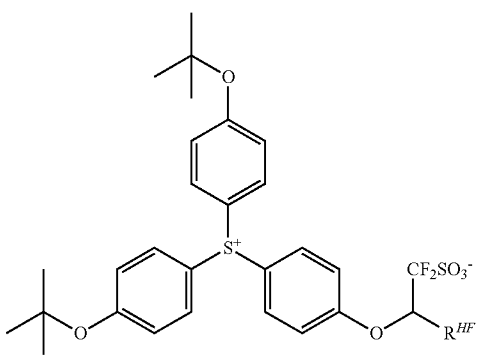
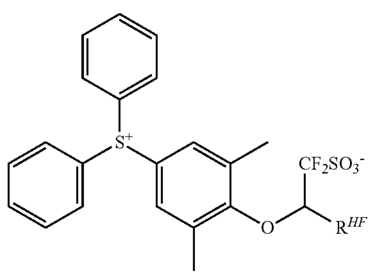
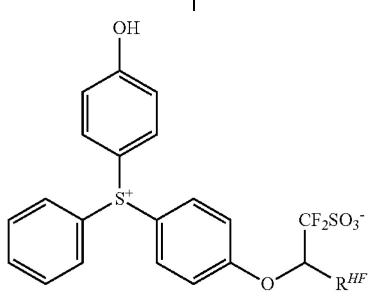
-continued
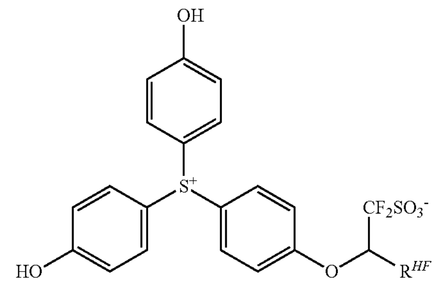
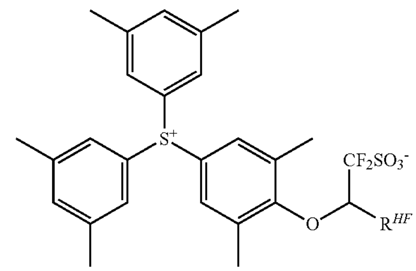
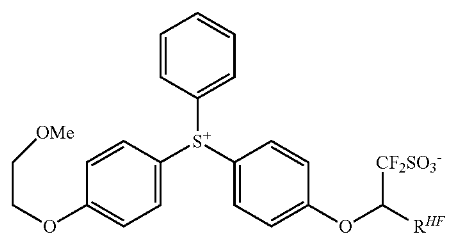
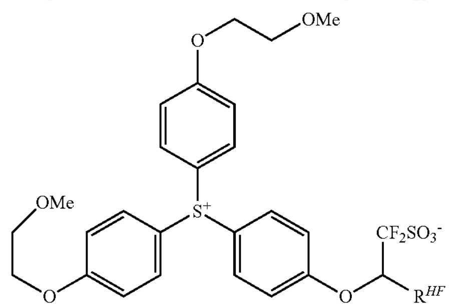
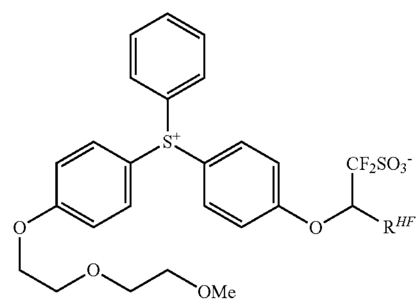
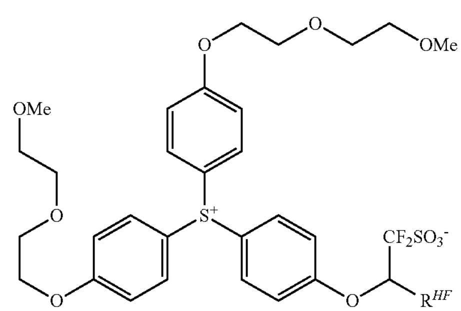

-continued
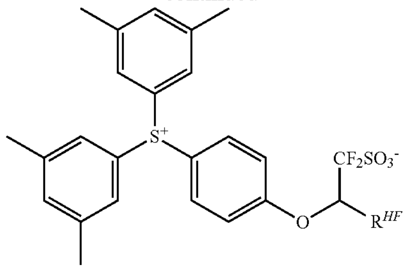
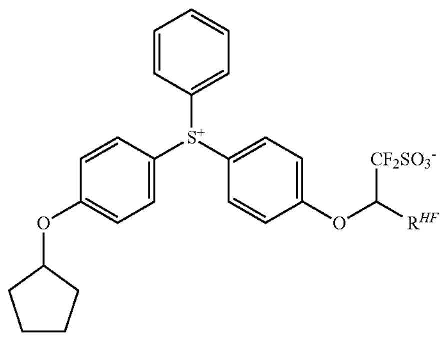
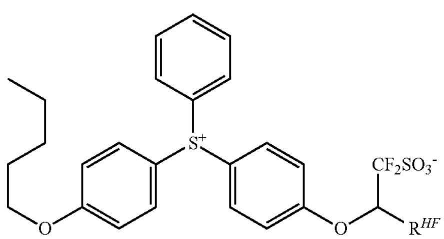
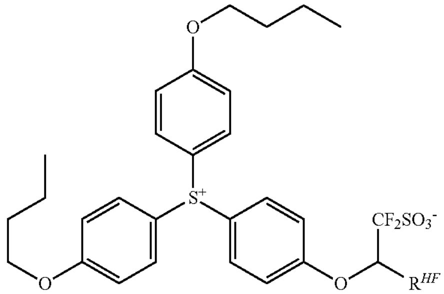
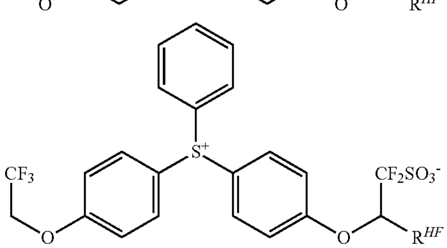
-continued
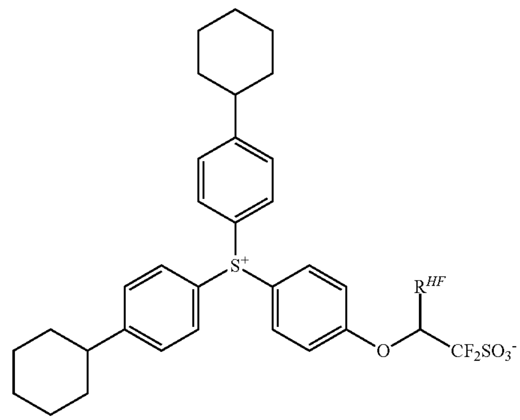
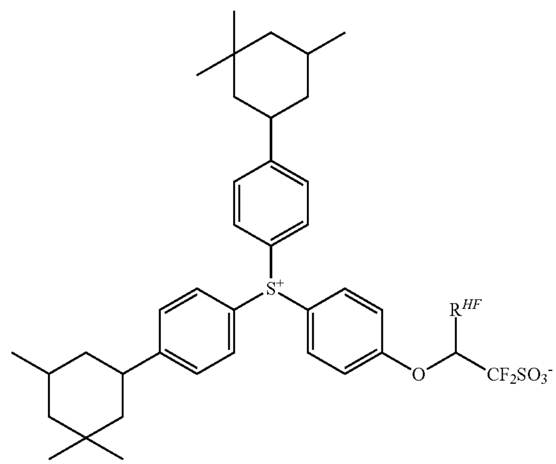
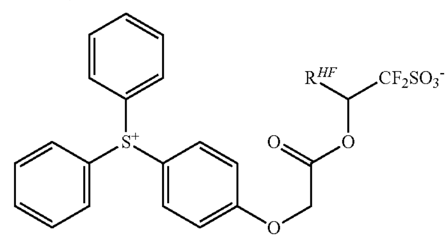
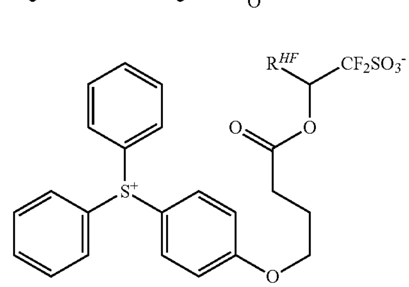
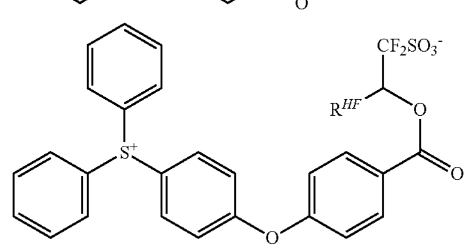

-continued

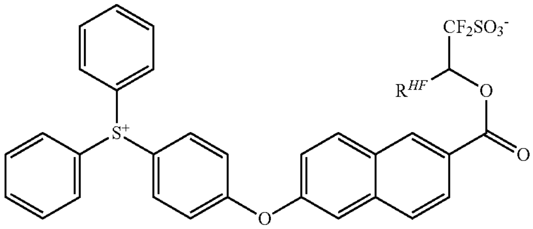

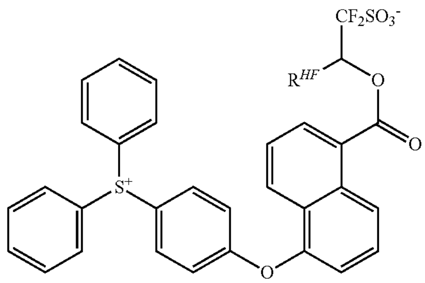

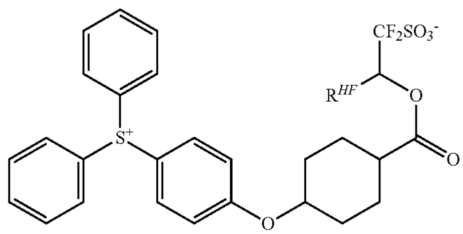

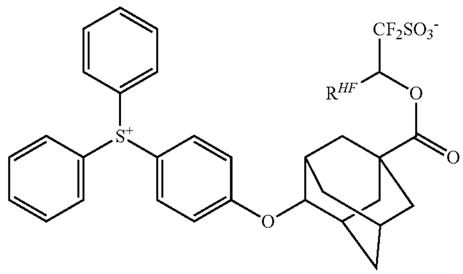

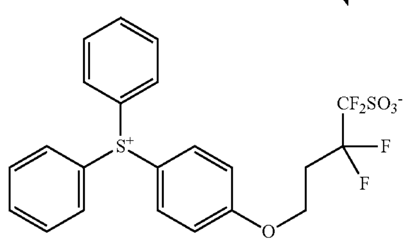

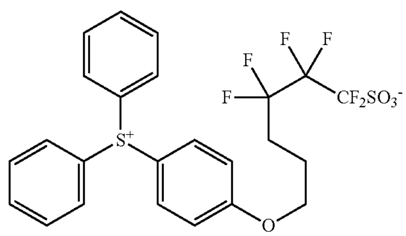

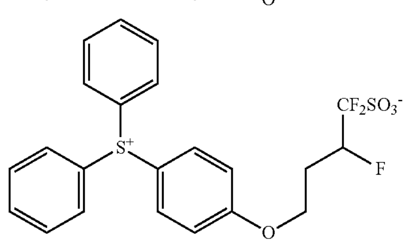

-continued

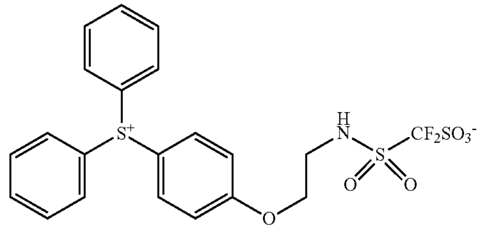

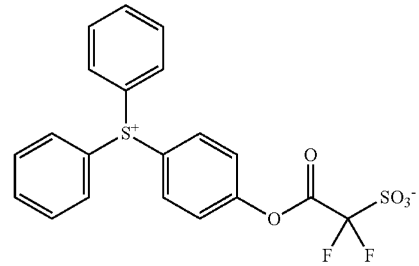

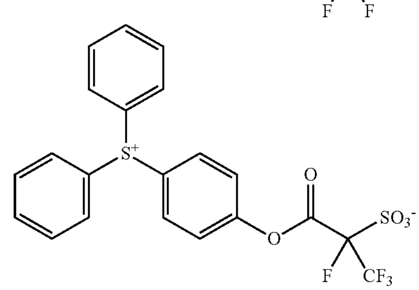

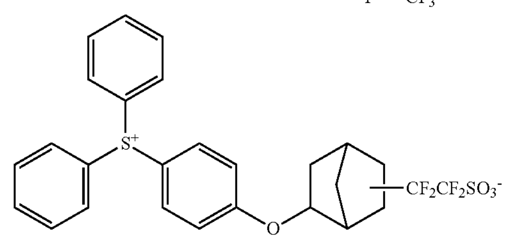

Of the foregoing PAGs, those having an anion of formula (1A') or (1D) are especially preferred because of reduced acid diffusion and high solubility in the resist solvent. Also those having an anion of formula (2') are especially preferred because of extremely reduced acid diffusion.

When used, the acid generator of addition type is preferably added in an amount of 0.1 to 50 parts, and more preferably 1 to 40 parts by weight per 100 parts by weight of the base polymer. When the base polymer has recurring units (f) incorporated therein and/or when the acid generator of addition type is added, the resist composition functions as a chemically amplified resist composition.

Organic Solvent

An organic solvent may be added to the resist composition. The organic solvent used herein is not particularly limited as long as the foregoing and other components are soluble therein. Examples of the organic solvent are described in JP-A 2008-111103, paragraphs [0144]-[0145] (U.S. Pat. No. 7,537,880). Exemplary solvents include ketones such as cyclohexanone, cyclopentanone and methyl-2-n-pentyl ketone; alcohols such as 3-methoxybutano 3-methyl-3-methoxybutanol, 1-methoxy-2-propanol, 1-ethoxy-2-propanol and diacetone alcohol (DAA); ethers such as propylene glycol monomethyl ether (PGME), ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pynrvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, which may be used alone or in admixture.

The organic solvent is preferably added in an amount of 100 to 10,000 parts, and more preferably 200 to 8,000 parts by weight per 100 parts by weight of the base polymer.

Other Components

With the foregoing components, other components such as a surfactant, dissolution inhibitor, and crosslinker may be blended in any desired combination to formulate a chemically amplified positive or negative resist composition. This positive or negative resist composition has a very high sensitivity in that the dissolution rate in developer of the base polymer in exposed areas is accelerated by catalytic reaction. In addition, the resist film has a high dissolution contrast, resolution, exposure latitude, and process adaptability, and provides a good pattern profile after exposure, and minimal proximity bias because of restrained acid diffusion. By virtue of these advantages, the composition is fully useful in commercial application and suited as a pattern-forming material for the fabrication of VLSIs.

Exemplary surfactants are described in JP-A 2008-111103, paragraphs [0165]-[0166]. Inclusion of a surfactant may improve or control the coating characteristics of the resist composition. While the surfactant may be used alone or in admixture, it is preferably added in an amount of 0.0001 to 10 parts by weight per 100 parts by weight of the base polymer.

In the case of positive resist compositions, inclusion of a dissolution inhibitor may lead to an increased difference in dissolution rate between exposed and unexposed areas and a further improvement in resolution. The dissolution inhibitor which can be used herein is a compound having at least two phenolic hydroxyl groups on the molecule, in which an average of from 0 to 100 mol % of all the hydrogen atoms on the phenolic hydroxyl groups are replaced by acid labile groups or a compound having at least one carboxyl group on the molecule, in which an average of 50 to 100 mol % of all the hydrogen atoms on the carboxyl groups are replaced by acid labile groups, both the compounds having a molecular weight of 100 to 1,000, and preferably 150 to 800. Typical are bisphenol A, trisphenol, phenolphthalein, cresol novolac, naphthalenecarboxylic acid, adamantanecarboxylic acid, and cholic acid derivatives in which the hydrogen atom on the hydroxyl or carboxyl group is replaced by an acid labile group, as described in U.S. Pat. No. 7,771,914 (JP-A 2008-122932, paragraphs [0155]-[0178]).

In the positive resist composition, the dissolution inhibitor is preferably added in an amount of 0 to 50 parts, more preferably 5 to 40 parts by weight per 100 parts by weight of the base polymer. The dissolution inhibitor may be used alone or in admixture.

In the case of negative resist compositions, a negative pattern may be formed by adding a crosslinker to reduce the dissolution rate of a resist film in exposed area. Suitable crosslinkers which can be used herein include epoxy compounds, melamine compounds, guanamine compounds, glycoluril compounds and urea compounds having substituted thereon at least one group selected from among methylol, alkoxymethyl and acyloxymiethyl groups, isocyanate compounds, azide compounds, and compounds having a double bond such as an alkenyl ether group. These compounds may be used as an additive or introduced into a polymer side chain as a pendant. Hydroxy-containing compounds may also be used as the crosslinker. The crosslinker may be used alone or in admixture.

Of the foregoing crosslinkers, examples of the epoxy compound include tris(2,3-epoxypropyl) isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guammnine compounds having 1 to 4 methylol groups methoxymethylated and mixtures thereof, tetramethoxyethyl guanamine, tetraacyloxyguanmnine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycohluril, tetramethylol glycoluril compounds having 1 to 4 methylol groups methoxymethylated and mixtures thereof tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Suitable isocyanate compounds inchlude tolylene diisocyanate, diphenylmethane diisocyanate, hexamethylene diisocyanate and cyclohexane diisocyanate. Suitable azide compounds include 1,1'-biphenyl-4,4'-bisazide, 4,4'-methylidenebisazide, and 4,4'-oxybisazide. Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

In the negative resist composition, the crosslinker is preferably added in an amount of 0.1 to 50 parts, more preferably 1 to 40 parts by weight per 100 parts by weight of the base polymer.

In the resist composition of the invention, a quencher other than the inventive cyclic ammonium salt may be blended. The other quencher is typically selected from conventional basic compounds. Conventional basic compounds include primary, secondary, and tertiary aliphatic amines, mixed amines, aromatic amines, heterocyclic amines, nitrogen-containing to compounds with carboxyl group, nitrogen-containing compotmds with sulfonyl group, nitrogen-containing compounds with hydroxyl group, nitrogen-containing compounds with hydroxyphenyl group, alcoholic nitrogen-containing compounds, amide derivatives, imide derivatives, and carbamate derivatives. Also included are primary, secondary, and tertiary amine compounds, specifically amine compounds having a hydroxyl group, ether bond, ester bond, lactone ring, cyano group, or sulfonic acid ester bond as described in JP-A 2008-111103, paragraphs [0146]-[0164], and compounds having a carbamate group as described in JP 3790649. Addition of a basic compound may be effective for further suppressing the diffusion rate of acid in the resist film or correcting the pattern profile.

Onium salts such as sulfonium salts, iodonium salts and ammonium salts of sulfonic acids which are not fluorinated at α-position as described in U.S. Pat. No. 8,795,942 (JP-A 2008-158339) and similar onium salts of carboxylic acid may also be used as the other quencher. While an α-fluorinated sulfonic acid, imide acid, and methide acid are necessary to deprotect the acid labile group of carboxylic acid ester, an α-anon-fluorinated sulfonic acid and a carboxylic acid are released by salt exchange with an α-non-fluorinated onium salt. An α-non-fluorinated sulfonic acid and a carboxylic acid function as a quencher because they do not induce deprotection reaction.

Also useful are quenchers of polymer type as described in U.S. Pat. No. 7,598,016 (JP-A 2008-239918). The polymeric quencher segregates at the resist surface after coating and thus enhances the rectangularity of resist pattern. When a protective film is applied as is often the case in the immersion lithography, the polymeric quencher is also effective for preventing a film thickness loss of resist pattern or rounding of pattern top.

The other quencher is preferably added in an amount of 0 to 5 parts, more preferably 0 to 4 parts by weight per 100 parts by weight of the base polymer. The other quencher may be used alone or in admixture.

To the resist composition, a water repellency improver may also be added for improving the water repellency on surface of a resist film as spin coated. The water repellency improver may be used in the topcoatless immersion lithography. Suitable water repellency improvers include polymers having a fluoroalkyl group and polymers having a specific structure with a 1,1,1,3,3,3-hexafluoro-2-propanol residue and are described in JP-A 2007-297590 and JP-A 2008-111103, for example. The water repellency improver to be added to the resist composition should be soluble in the alkaline developer and organic solvent developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB, thus preventing any hole pattern opening failure after development. The water repellency improver may be used alone or in admixture. An appropriate amount of the water repellency improver is 0 to 20 parts, more preferably 0.5 to 10 parts by weight per 100 parts by weight of the base polymer.

Also, an acetylene alcohol may be blended in the resist composition. Suitable acetylene alcohols are described in JP-A 2008-122932, paragraphs [0179]-[0182]. An appropriate amount of the acetylene alcohol blended is 0 to 5 parts by weight per 100 parts by weight of the base polymer.

Pattern Forming Process

The resist composition is used in the fabrication of various integrated circuits. Pattern formation using the resist composition may be performed by well-known lithography processes. The process generally involves coating, exposure, and development. If necessary, any additional steps may be added.

For example, the resist composition is first applied onto a substrate on which an integrated circuit is to be formed (e.g., Si. $SiO_2$, SiN, SiON, TIN, WSi, BPSG, SOG, or organic antireflective coating) or a substrate on which a mask circuit is to be formed (e.g., Cr, CrO, CrON, $MoSi_2$, or $SiO_2$) by a suitable coating technique such as spin coating, roll coating, flow coating, dipping, spraying or doctor coating. The coating is prebaked on a hot plate at a temperature of 60 to 150° C. for 10 seconds to 30 minutes, preferably at 80 to 120° C. for 30 seconds to 20 minutes. The resulting resist fihn is generally 0.01 to 2 μm thick.

The resist film is then exposed to a desired pattern of high-energy radiation such as UV, deep-UV, EB, EUV, x-ray, soft x-ray, excimer laser light, γ-ray or synchrotron radiation. When UV, deep-UV, EUV, x-ray, soft x-ray, excimer laser light, γ-ray or synchrotron radiation is used as the high-energy radiation, the resist film is exposed thereto through a mask having a desired pattern in a dose of preferably about 1 to 200 $mJ/cm^2$, more preferably about 10 to 100 $mJ/cm^2$. When EB is used as the high-energy radiation, the resist film is exposed thereto through a mask having a desired pattern or directly in a dose of preferably about 0.1 to 100 $\mu C/cm^2$, more preferably about 0.5 to 50 $\mu C/cm^2$. It is appreciated that the inventive resist composition is suited in micropatterning using KrF excimer laser, ArF excimer laser, EB, EUV, x-ray, soft x-ray, γ-ray or synchrotron radiation, especially in micropatterning using EB or EUV.

After the exposure, the resist film may be baked (PEB) on a hot plate or in an oven at 30 to 150° C. for 10 seconds to 30 minutes, preferably at 50 to 120° C. for 30 seconds to 20 minutes.

After the exposure or PEB, in the case of positive resist, the resist film is developed in a developer in the form of an aqueous base solution for 3 seconds to 3 minutes, preferably 5 seconds to 2 minutes by conventional techniques such as dip, puddle and spray techniques. A typical developer is a 0.1 to 10 wt %, preferably 2 to 5 wt % aqueous solution of tetramethylammonium hydroxide (TMAH), tetraethylammonium hydroxide (TEAH), tetrapropylammonium hydroxide (TPAH), or tetrabutylammonium hydroxide (TBAH). The resist film in the exposed area is dissolved in the developer whereas the resist film in the unexposed area is not dissolved. In this way, the desired positive pattern is formed on the substrate. Inversely in the case of negative resist, the exposed area of resist film is insolubilized and the unexposed area is dissolved in the developer.

In an alternative embodiment, a negative pattern may be formed via organic solvent development using a positive resist composition comprising a base polymer having an acid labile group. The developer used herein is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-pentyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable aromatic solvents include toluene, xylene, ethylbenzene, isopropylbenzene, tert-butylbenzene and mesitylene. The solvents may be used alone or in admixture.

Rinsing is effective for minimizing the risks of resist pattern collapse and defect formation. However, rinsing is not essential. If rinsing is omitted, the amount of solvent used may be reduced.

A hole or trench pattern after development may be shnmk by the thermal flow, RELACS® or DSA process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the hole pattern. The bake is preferably at a temperature of 70 to 180° C., more preferably 80 to 170° C., for a time of 10 to 300 seconds. The extra shrink agent is stripped and the hole pattern is shrunk.

EXAMPLES

Examples of the invention are given below by way of illustration and not by way of limitation. The abbreviation "pbw" is parts by weight.

Quenchers 1 to 35 used in resist compositions have the structure shown below. They were synthesized by esterifying a compound having a carboxyl group with an amino compound having a tertiary hydroxyl group and mixing the resulting compound with a carboxylic acid or sulfonamide compound.

Quencher 1

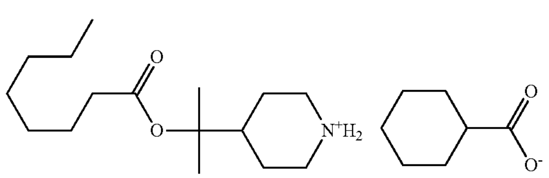

-continued

Quencher 2

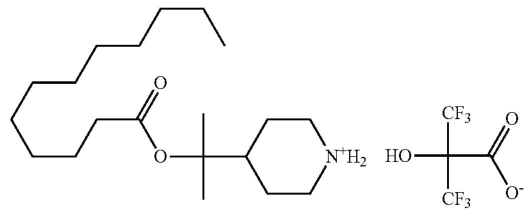

Quencher 3

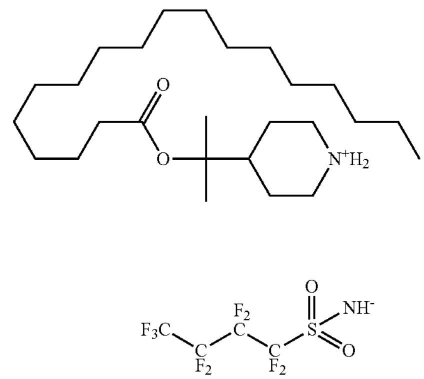

Quencher 4

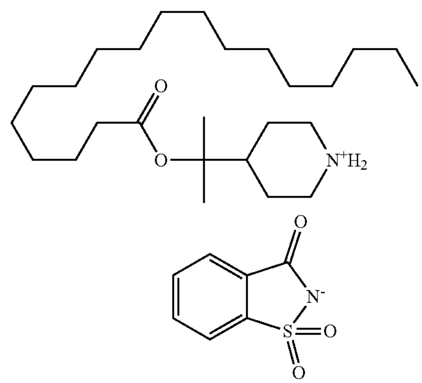

Quencher 5

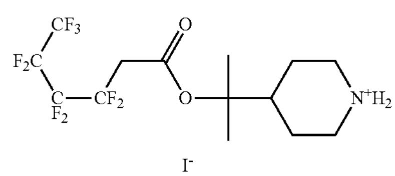

Quencher 6

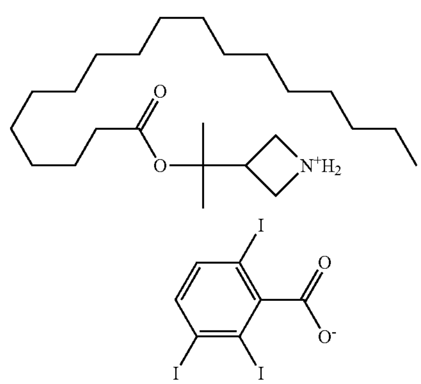

-continued
Quencher 7
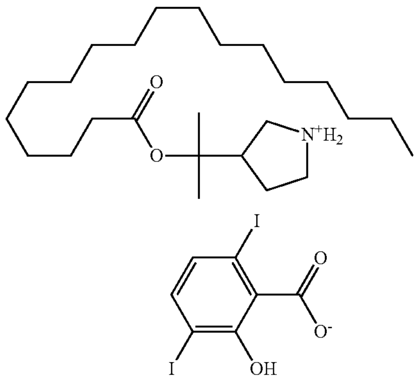
Quencher 8
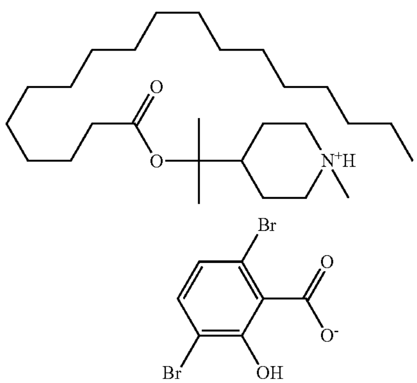
Quencher 9
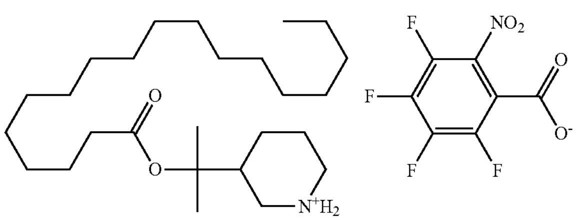
Quencher 10
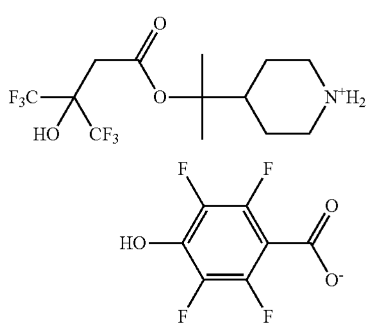
Quencher 11
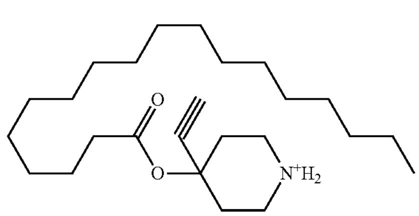
-continued
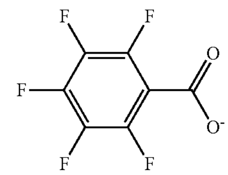
Quencher 12
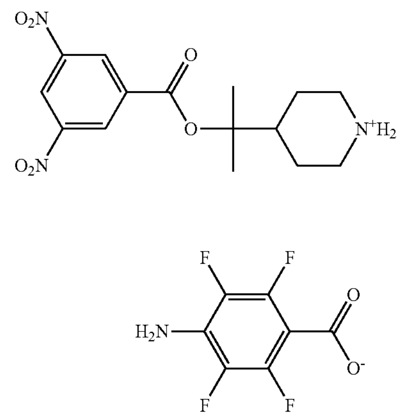
Quencher 13
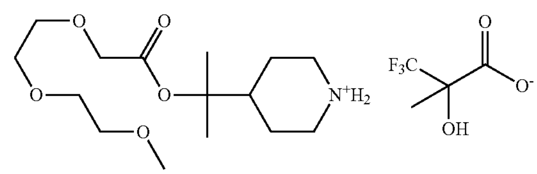
Quencher 14
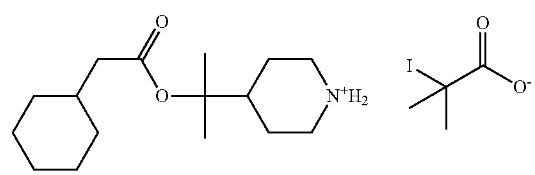
Quencher 15
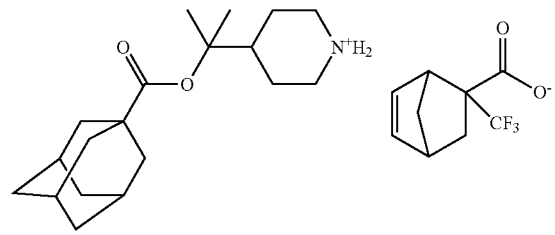
Quencher 16
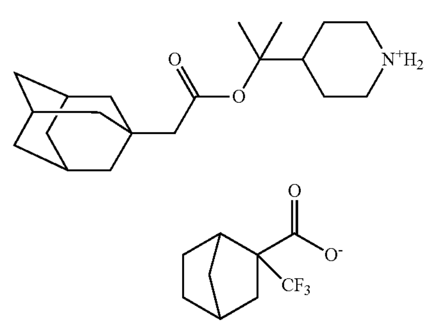

-continued
Quencher [17]
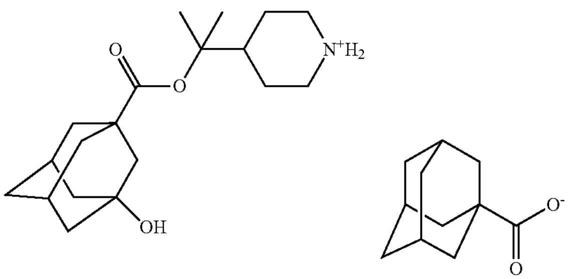
Quencher [18]
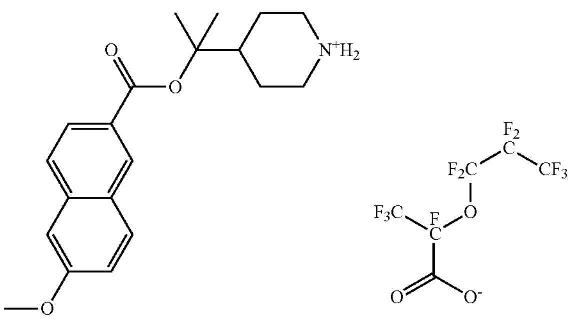
Quencher [19]
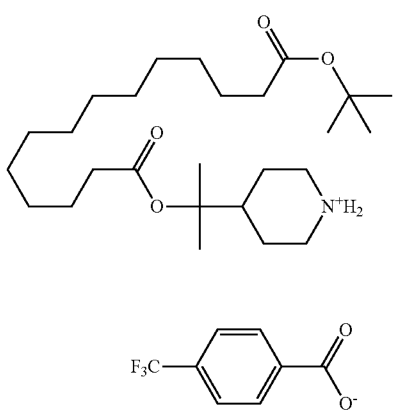
Quencher [20]
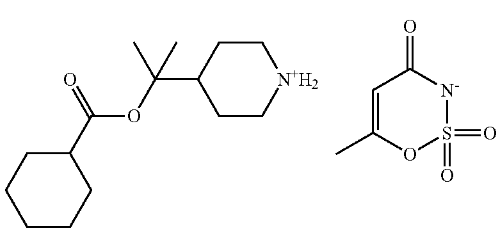
Quencher [21]
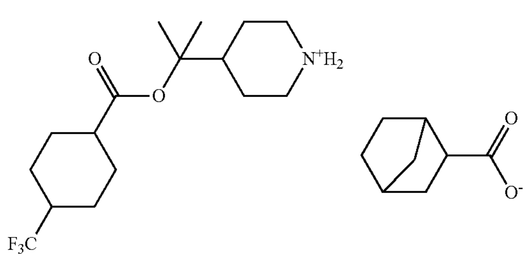
-continued
Quencher [22]
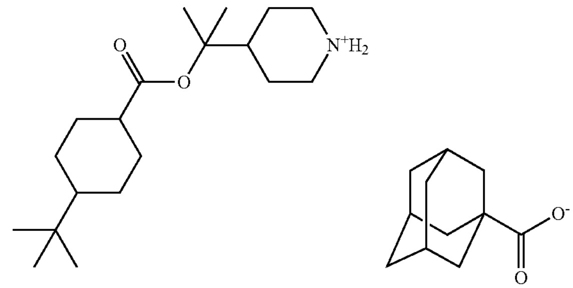
Quencher [23]
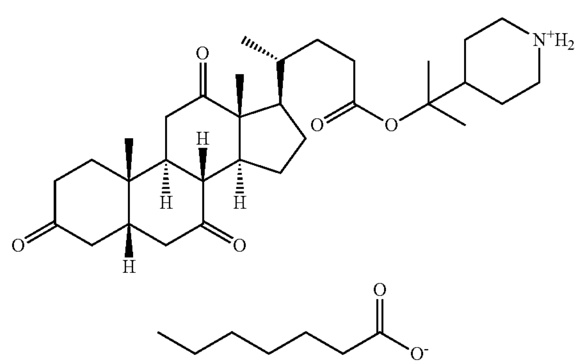
Quencher [24]
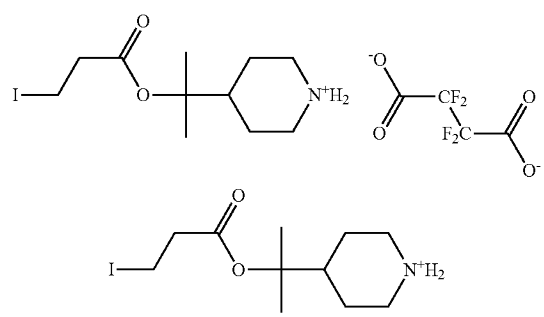
Quencher [25]
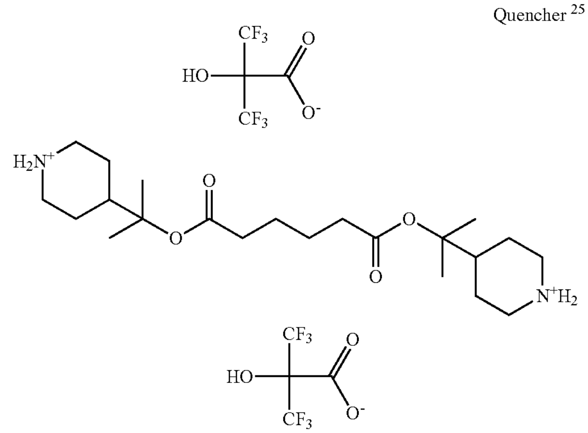

-continued
Quencher 26
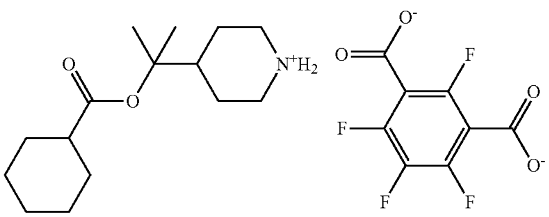
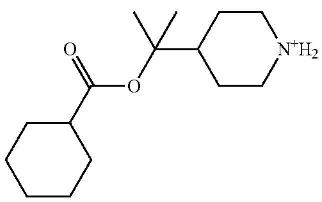
Quencher 27
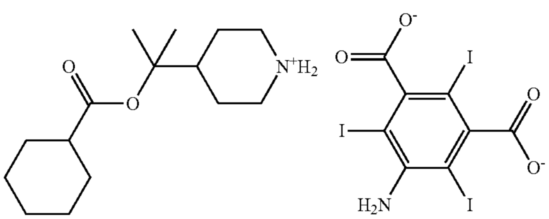
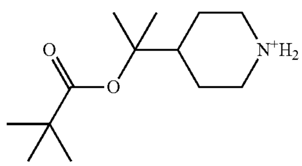
Quencher 28
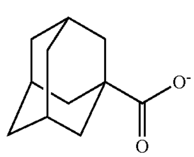
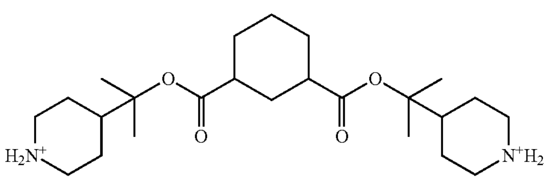
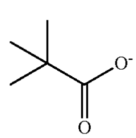
Quencher 29
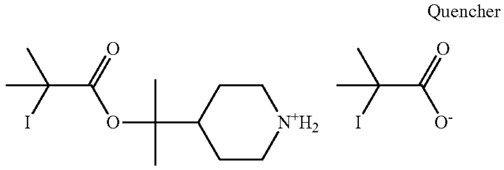
-continued
Quencher 30
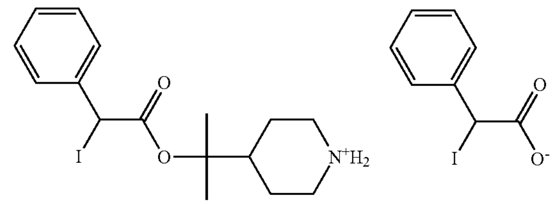
Quencher 31
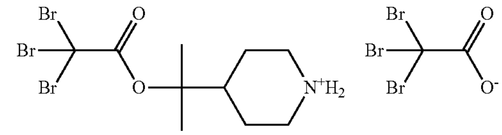
Quencher 32
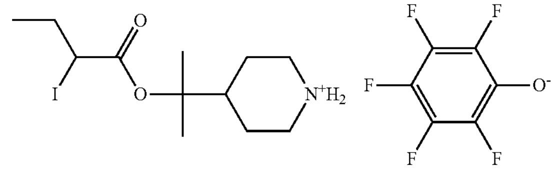
Quencher 33
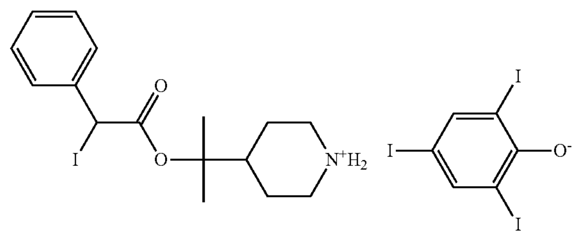
Quencher 34
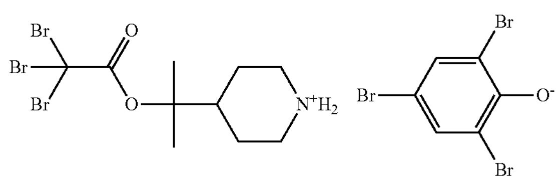
Quencher 35
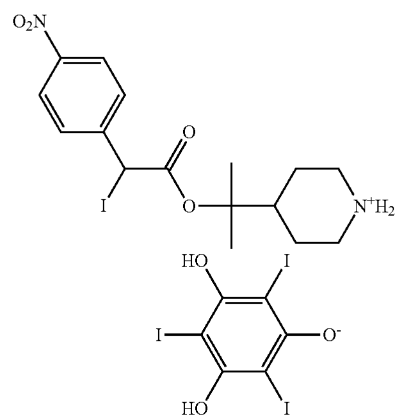
Synthesis Example
Synthesis of Base Polymers (Polymers 1 to 3)
A base polymer was prepared by combining suitable monomers, effecting copolymerization reaction thereof in tetrahydrofuran (THF) solvent, pouring the reaction solution into methanol for crystallization, repeatedly washing with hexane, isolation, and drying. The resulting polymer, designated Polymer 1, 2 or 3, was analyzed for composition by $^{1}$H-NMR spectroscopy, and for Mw and Mw/Mn by GPC versus polystyrene standards using THF solvent.

Polymer 1
Mw = 9,300
Mw/Mn = 1.77

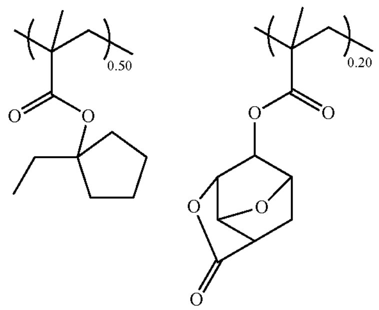

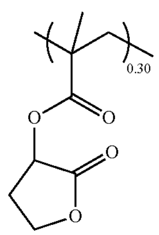

Polymer 2
Mw = 8,900
Mw/Mn = 1.89

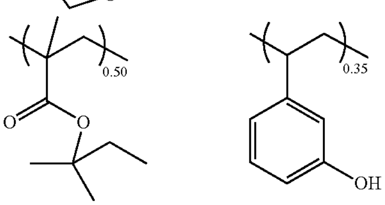

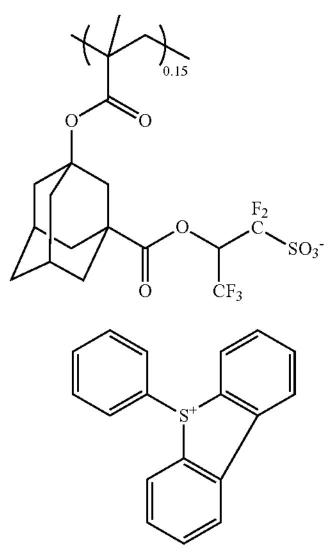

-continued

Polymer 3
Mw = 6,900
Mw/Mn = 1.62

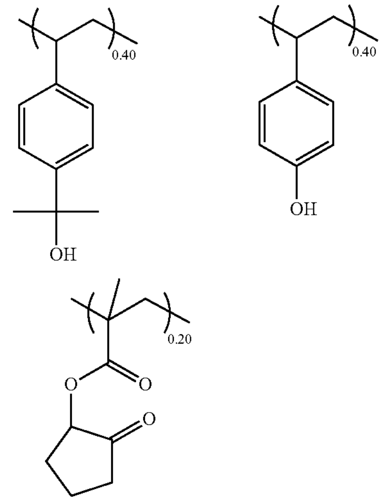

Examples 1-1 to 1-31 and Comparative Examples 1-1 to 1-6

(1) Preparation of Resist Compositions

Resist compositions were prepared by dissolving various components in a solvent in accordance with the recipe shown in Tables 1 to 3, and filtering through a filter having a pore size of 0.2 μm. The solvent contained 100 ppm of surfactant Polyfox PF-636 (Omnova Solutions Inc.).

The components in Tables 1 to 3 are as identified below.

Organic Solvent:

PGMEA (propylene glycol monomethyl ether acetate)

DAA (diacetone alcohol)

Acid generators: PAG 1 and PAG 2 of the following structural formulae

PAG 1

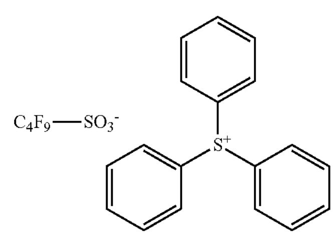

PAG 2

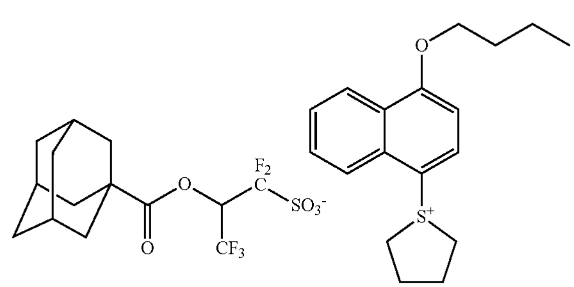

Water repellent polymer: Water repellent polymer 1 of the following structural formula

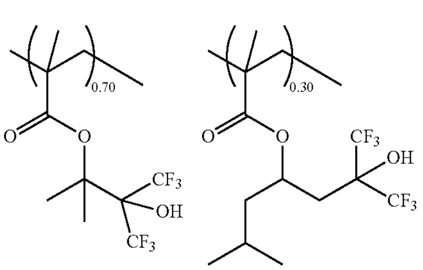

Water repellent polymer 1
Mw = 10,200
Mw/Mn = 1.67

Comparative Quenchers 1 to 6 of the Following Structural Formulae

Comparative Quencher 1

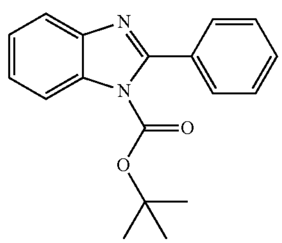

Comparative Quencher 2

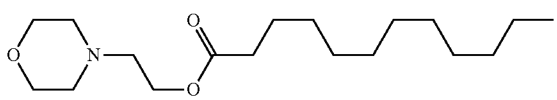

Comparative Quencher 3

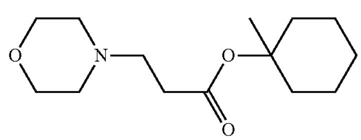

Comparative Quencher 4

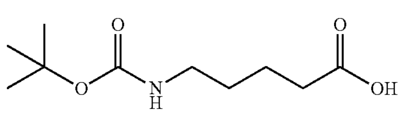

Comparative Quencher 5

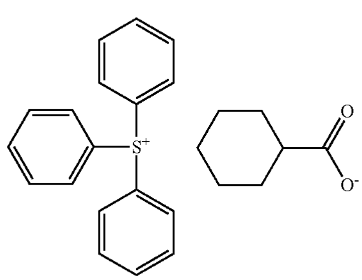

-continued

Comparative Quencher 6

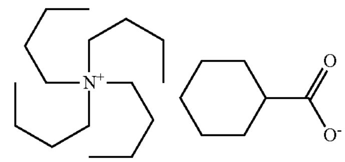

Additional Quenchers 1 and 2 of the Following Structural Formulae

Additional Quencher 1

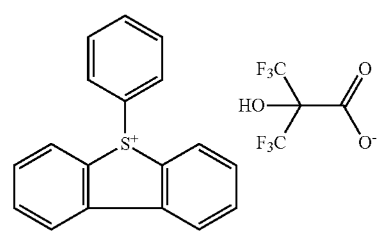

Additional Quencher 2

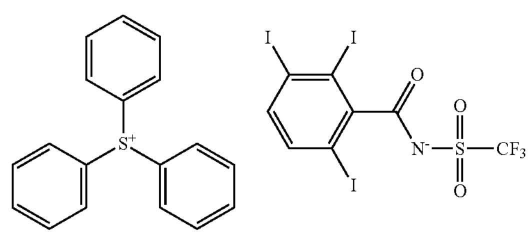

(2) ArF Immersion Lithography Test

Each of the resist compositions in Tables 1 to 3 was spin coated on a silicon wafer having an antireflective coating of 78 nm thick (ARC-29A by Nissan Chemical Industries, Ltd.), and baked on a hotplate at 100° C. for 60 seconds to form a resist film of 300 unm thick. Using an ArF excimer laser immersion lithography scanner NSR-S610C (Nikon Corp., NA 1.00, σ0.98/0.78, annular ilhmination), the resist film was exposed to ArF radiation through a 6% halftone phase shift mask bearing a pattern with a hole size of 100 nm and a pitch of 300 nm (on-wafer size). Water was used as the immersion liquid. The resist film was baked (PEB) at the temperature shown in Tables 1 to 3 for 60 seconds and developed in a 2.38 wt % tetramethylammoniun hydroxide (TMAH) aqueous solution for 30 seconds, yielding a hole pattern with a size of 100 nm and a pitch of 300 nm.

The hole pattern was observed under CD-SEM (CG-4000 by Hitachi High-Technologies Corp.). The exposure dose (mJ/cm$^2$) to form a hole pattern with a size of 100 nm was determined and reported as sensitivity. The size of 50 holes was measured, from which a three-fold value (3σ) of a standard variation (σ) was computed as a variation of hole size and reported as CDU. The results are also shown in Tables 1 to 3.

TABLE 1

| | Polymer (pbw) | Acid generator (pbw) | Quencher (pbw) | Water repellent polymer (pbw) | Organic solvent (pbw) | PEB temp. ° C. | Sensitivity (mJ/cm$^2$) | CDU (nm) |
|---|---|---|---|---|---|---|---|---|
| Example 1-1 | Polymer 1 (100) | PAG 1 (5.0) | Quencher 1 (3.97) | Water repellent polymer 1 (4.0) | PGMEA (1,500) | 90 | 40 | 3.2 |
| 1-2 | Polymer 1 (100) | PAG 1 (5.0) | Quencher 2 (5.37) | Water repellent polymer 1 (4.0) | PGMEA (1,500) | 90 | 39 | 3.3 |
| 1-3 | Polymer 1 (100) | PAG 1 (5.0) | Quencher 3 (7.08) | Water repellent polymer 1 (4.0) | PGMEA (1,500) | 90 | 41 | 3.1 |
| 1-4 | Polymer 1 (100) | PAG 1 (5.0) | Quencher 4 (5.92) | Water repellent polymer 1 (4.0) | PGMEA (1,500) | 90 | 44 | 3.5 |
| 1-5 | Polymer 1 (100) | PAG 1 (5.0) | Quencher 5 (5.31) | Water repellent polymer 1 (4.0) | PGMEA (1,500) | 90 | 38 | 3.6 |
| 1-6 | Polymer 1 (100) | PAG 1 (5.0) | Quencher 6 (8.81) | Water repellent polymer 1 (4.0) | PGMEA (1,500) | 90 | 42 | 3.4 |
| 1-7 | Polymer 1 (100) | PAG 1 (5.0) | Quencher 7 (7.85) | Water repellent polymer 1 (4.0) | PGMEA (1,500) | 90 | 46 | 3.5 |
| 1-8 | Polymer 1 (100) | PAG 1 (5.0) | Quencher 8 (7.19) | Water repellent polymer 1 (4.0) | PGMEA (1,500) | 90 | 44 | 3.4 |
| 1-9 | Polymer 1 (100) | PAG 1 (5.0) | Quencher 9 (6.48) | Water repellent polymer 1 (4.0) | PGMEA (1,500) | 90 | 44 | 3.1 |
| 1-10 | Polymer 1 (100) | PAG 1 (5.0) | Quencher 10 (5.61) | Water repellent polymer 1 (4.0) | PGMEA (1,500) | 90 | 39 | 3.0 |
| 1-11 | Polymer 1 (100) | PAG 1 (5.0) | Quencher 11 (6.03) | Water repellent polymer 1 (4.0) | PGMEA (1,500) | 90 | 42 | 3.5 |
| 1-12 | Polymer 1 (100) | PAG 1 (5.0) | Quencher 12 (5.46) | Water repellent polymer 1 (4.0) | PGMEA (1,500) | 90 | 46 | 3.4 |
| 1-13 | Polymer 1 (100) | PAG 1 (5.0) | Quencher 13 (4.61) | Water repellent polymer 1 (4.0) | PGMEA (1,500) | 90 | 40 | 3.3 |
| 1-14 | Polymer 1 (100) | PAG 1 (5.0) | Quencher 14 (4.67) | Water repellent polymer 1 (4.0) | PGMEA (1,500) | 90 | 37 | 3.5 |
| 1-15 | Polymer 1 (100) | PAG 1 (5.0) | Quencher 15 (5.11) | Water repellent polymer 1 (4.0) | PGMEA (1,500) | 90 | 42 | 3.5 |
| 1-16 | Polymer 1 (100) | PAG 1 (5.0) | Quencher 16 (5.27) | Water repellent polymer 1 (4.0) | PGMEA (1,500) | 90 | 41 | 3.6 |
| 1-17 | Polymer 1 (100) | PAG 1 (5.0) | Quencher 17 (5.01) | Water repellent polymer 1 (4,0) | PGMEA (1,500) | 90 | 44 | 3.7 |
| 1-18 | Polymer 1 (100) | PAG 1 (5.0) | Quencher 18 (6.57) | Water repellent polymer 1 (4.0) | PGMEA (1,500) | 90 | 46 | 3.3 |
| 1-19 | Polymer 1 (100) | PAG 2 (9.0) | Quencher 19 (6.29) | Water repellent polymer 1 (4.0) | PGMEA (1,500) | 90 | 41 | 3.5 |
| 1-20 | Polymer 1 (100) | PAG 1 (5.0) | Quencher 20 (4.16) | Water repellent polymer 1 (4.0) | PGMEA (1,500) | 90 | 36 | 3.8 |
| 1-21 | Polymer 1 (100) | PAG 1 (5.0) | Quencher 21 (4.61) | Water repellent polymer 1 (4.0) | PGMEA (1,500) | 90 | 37 | 3.2 |
| 1-22 | Polymer 1 (100) | PAG 1 (5.0) | Quencher 22 (4.75) | Water repellent polymer 1 (4.0) | PGMEA (1,500) | 90 | 38 | 3.3 |
| 1-23 | Polymer 1 (100) | PAG 1 (5.0) | Quencher 23 (4.57) | Water repellent polymer 1 (4.0) | PGMEA (1,500) | 90 | 46 | 3.6 |
| 1-24 | Polymer 1 (100) | PAG 1 (5.0) | Quencher 24 (4.20) | Water repellent polymer 1 (4.0) | PGMEA (1,500) | 90 | 32 | 3.6 |
| 1-25 | Polymer 1 (100) | PAG 1 (5.0) | Quencher 25 (4.10) | Water repellent polymer 1 (4.0) | PGMEA (1,500) | 90 | 33 | 3.5 |
| 1-26 | Polymer 1 (100) | PAG 1 (5.0) | Quencher 26 (3.72) | Water repellent polymer 1 (4.0) | PGMEA (1,500) | 90 | 31 | 3.6 |
| 1.27 | Polymer 1 (100) | PAG 1 (5.0) | Quencher 27 (5.20) | Water repellent polymer 1 (4.0) | PGMEA (1,500) | 90 | 33 | 3.6 |
| 1-28 | Polymer 1 (100) | PAG 1 (5.0) | Quencher 28 (3.52) | Water repellent polymer 1 (4.0) | PGMEA (1,500) | 90 | 32 | 3.7 |

TABLE 2

| | Polymer (pbw) | Acid generator (pbw) | Quencher (pbw) | Water repellent polymer (pbw) | Organic solvent (pbw) | PEB temp. (° C.) | Sensitivity (mJ/cm$^2$) | (CDU) (nm) |
|---|---|---|---|---|---|---|---|---|
| Example 1-29 | Polymer 1 (100) | PAG 1 (5.0) | Quencher 29 (5.53) | Water repellent polymer 1 (4.0) | PGMEA (1,500) | 90 | 34 | 3.5 |
| 1-30 | Polymer 1 (100) | PAG 1 (5.0) | Quencher 30 (6.49) | Water repellent polymer 1 (4.0) | PGMEA (1,500) | 90 | 38 | 32 |
| 1-31 | Polymer 1 (100) | PAG 1 ( 5.0) | Quencher 31 (7.18) | Water repellent polymer 1 (4.0) | PGMEA (1,500) | 90 | 34 | 3.7 |

TABLE 3

| | | Polymer (pbw) | Acid generator (pbw) | Quencher (pbw) | Water repellent polymer (pbw) | Organic solvent (pbw) | PEB temp. (° C.) | Sensitivity (mJ/cm²) | CDU (nm) |
|---|---|---|---|---|---|---|---|---|---|
| Comparative Example | 1-1 | Polymer 1 (100) | PAG 1 (5.0) | Comparative Quencher 1 (2.94) | Water repellent polymer 1 (4.0) | PGMEA (1,500) | 90 | 44 | 4.5 |
| | 1-2 | Polymer 1 (100) | PAG 1 (5.0) | Comparative Quencher 2 (4.03) | Water repellent polymer 1 (4.0) | PGMEA (1,500) | 90 | 48 | 4.2 |
| | 1-3 | Polymer 1 (100) | PAG 1 (5.0) | Comparative Quencher 3 (2.55) | Water repellent polymer 1 (4.0) | PGMEA (1,500) | 90 | 42 | 4.8 |
| | 1-4 | Polymer 1 (100) | PAG 1 (5.0) | Comparative Quencher 4 (2.17) | Water repellent polymer 1 (4.0) | PGMEA (1,500) | 90 | 40 | 4.1 |
| | 1-5 | Polymer 1 (100) | PAG 1 (5.0) | Comparative Quencher 5 (3.90) | Water repellent polymer 1 (4.0) | PGMEA (1,500) | 90 | 48 | 5.0 |
| | 1-6 | Polymer 1 (100) | PAG 1 (5.0) | Comparative Quencher 6 (3.69) | Water repellent polymer 1 (4.0) | PGMEA (1,500) | 90 | 42 | 5.2 |

Examples 2-1 to 2-8 and Comparative Examples 2-1 to 2-3

(1) Preparation of Resist Compositions

Resist compositions in solution form were prepared by dissolving various components in a solvent in accordance with the recipe shown in Table 4, and filtering through a filter having a pore size of 0.2 μm. The solvent contained 100 ppm of surfactant Polyfox PF-636 (Omnova Solutions Inc.). In Table 4, PAG 3 is as identified below, and the other components are as described above.

PAG 3

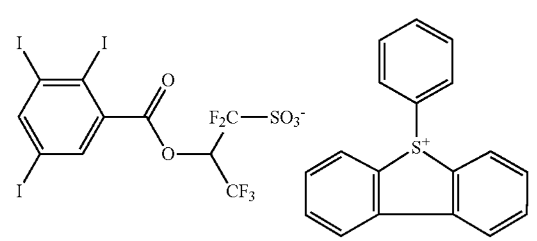

(2) EUV Lithography Test

Each of the resist compositions in Table 4 was spin coated on a silicon substrate having a 20-nm coating of silicon-containing spin-on hard mask SHB-A940 (Shin-Etsu Chemical Co., Ltd., silicon content 43 wt %) and prebaked on a hotplate at 105° C. for 60 seconds to form a resist film of 50 nm thick. Using an EUV scanner NXE3300 (ASML, NA 0.33, σ0.9/0.6, quadrupole illumination), the resist film was exposed to EUV through a mask bearing a hole pattern at a pitch 46 nm (on-wafer size) and +20% bias. The resist film was baked (PEB) on a hotplate at the temperature shown in Table 4 for 60 seconds and developed in a 2.38 wt % TMAH aqueous solution for 30 seconds to form a hole pattern having a size of 23 nm in Examples 2-1 to 2-7 and Comparative Examples 2-1 and 2-2 or a dot pattern having a size of 23 nm in Example 2-8 and Comparative Example 2-3.

The hole or dot pattern was observed under CD-SEM (CG-4000). The exposure dose (mJ/cm²) to form a hole or dot pattern with a size of 23 nm was determined and reported as sensitivity. The size of 50 holes or dots was measured, from which a three-fold value (3σ) of a standard variation (σ) was computed as a variation of hole or dot size and reported as CDU. The results are also shown in Table 4.

TABLE 4

| | | Polymer (pbw) | Acid generator (pbw) | Quencher (pbw) | Organic solvent (pbw) | PEB temp. (° C.) | Sensitivity (mJ/cm²) | CDU (nm) |
|---|---|---|---|---|---|---|---|---|
| Example | 2-1 | Polymer 2 (100) | — | Quencher 32 (5.23) | PGMEA (2,000) DAA (700) | 85 | 35 | 3.2 |
| | 2-2 | Polymer 2 (100) | — | Quencher 33 (8.59) | PGMEA (2,000) DAA (700) | 85 | 34 | 3.3 |
| | 2-3 | Polymer 2 (100) | — | Quencher 34 (7.53) | PGMEA (2,000) DAA (700) | 85 | 33 | 3.3 |
| | 2-4 | Polymer 2 (100) | — | Quencher 35 (8.91) | PGMEA (2,000) DAA (700) | 85 | 34 | 3.3 |
| | 2-5 | Polymer 2 (100) | — | Quencher 35 (4.55) Quencher 12 (2.73) | PGMEA (2,000) DAA (700) | 85 | 33 | 3.2 |

TABLE 4-continued

| | | Polymer (pbw) | Acid generator (pbw) | Quencher (pbw) | Organic solvent (pbw) | PEB temp. (° C.) | Sensitivity (mJ/cm$^2$) | CDU (nm) |
|---|---|---|---|---|---|---|---|---|
| | 2-6 | Polymer 2 (100) | — | Quencher 35 (4.55) Additional Quencher 1 (2.36) | PGMEA (2,000) DAA (700) | 85 | 34 | 3.0 |
| | 2-7 | Polymer 2 (100) | — | Quencher 35 (4.55) Additional Quencher 2 (4.46) | PGMEA (2,000) DAA (700) | 85 | 33 | 3.0 |
| | 2-8 | Polymer 3 (100) | PAG 3 (20) | Quencher 35 (4.55) | PGMEA (2,000) DAA (700) | 110 | 35 | 4.0 |
| Comparative Example | 2-1 | Polymer 2 (100) | — | Comparative Quencher 3 (4.00) | PGMEA (2,000) DAA (700) | 85 | 37 | 3.6 |
| | 2-2 | Polymer 2 (100) | — | Comparative Quencher 4 (3.80) | PGMEA (2,000) DAA (700) | 85 | 38 | 3.7 |
| | 2-3 | Polymer 3 (100) | PAG 3 (20) | Comparative Quencher 4 (3.80) | PGMEA (2,000) DAA (700) | 110 | 45 | 5.1 |

It is evident from Tables 1 to 4 that the inventive resist compositions comprising a cyclic ammonium salt having a tertiary ester structure exhibit reduced values of CDU.

Japanese Patent Application No. 2019-033684 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising a base polymer and a quencher, the quencher containing a salt of a cyclic ammonium cation having the formula (A-1) or (A-2) with a carboxylate, sulfonamide, halogenated phenoxide or halide anion, (A-1)

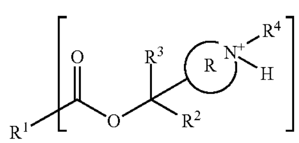

(A-2)

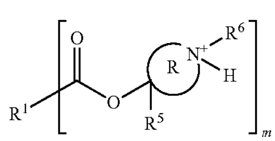

wherein $R^1$ is a single bond or a $C_1$-$C_{30}$ m-valent hydrocarbon group which may contain at least one moiety selected from among hydroxyl, thiol, ester bond, thioester bond, thionoester bond, ether bond, sulfide bond, halogen, nitro, amino, amide bond, sulfonyl, sulfonate bond, sultone ring, lactam ring, and carbonate, exclusive of an aromatic group having iodine bonded to the aromatic ring, $R^2$ and $R^3$ are each independently a $C_1$-$C_6$ alkyl group, $R^2$ and $R^3$ may bond together to form a ring with the carbon atom to which they are attached, $R^4$ and $R^6$ are each independently hydrogen, a $C_1$-$C_4$ straight or branched alkyl group, or $C_2$-$C_{12}$ Straight or branched alkoxycarbonyl group, $R^5$ is a $C_1$-$C_6$ alkyl group, $C_2$-$C_6$ alkenyl group, $C_2$-$C_6$ alkynyl group or $C_6$-$C_{12}$ aryl group, R is a $C_2$-$C_{10}$ alicyclic group to form a ring with the nitrogen atom, and m is an integer of 1 to 6.

2. The resist composition of claim 1 wherein the carboxylate anion has the formula (B-1) or (B-2), the sulfonamide anion has the formula (B-3), and the halogenated phenoxide anion has the formula (B-4), shown below, (B-1)

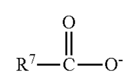

(B-2)

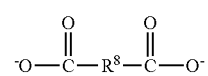

(B-3)

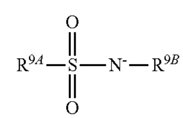

(B-4)

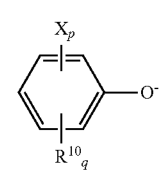

wherein $R^7$ is hydrogen or a $C_1$-$C_{30}$ monovalent hydrocarbon group which may contain a heteroatom, $R^8$ is a $C_1$-$C_{30}$ divalent hydrocarbon group which may contain a heteroatom, $R^{9A}$ is fluorine, or a $C_1$-$C_{10}$ fluorinated alkyl group or fluorinated phenyl group which may contain a hydroxyl, ether bond or ester bond, $R^{9B}$ is hydrogen or a $C_1$-$C_{10}$ monovalent hydrocarbon group which may contain a hydroxyl, ether bond or ester bond, $R^{9A}$ and $R^{9B}$ may bond together to form a ring with the atoms to which they are attached, X is fluorine, trifluoromethyl, 1,1,1,3,3,3-hexafluoro-2-propanol, chlorine, bromine or iodine, $R^{10}$ is hydrogen, hydroxyl, an optionally halogenated $C_1$-$C_6$ alkyl group, optionally halogenated $C_1$-$C_6$ alkoxy group, optionally halogenated $C_2$-$C_6$ acyloxy group, optionally halogenated $C_1$-$C_4$ alkylsulfonyloxy group, fluorine, chlorine, bromine, amino, nitro, cyano, —NR$^{10A}$—C(═O)—R$^{10B}$, or —NR$^{10A}$—C(═O)—O—R$^{10B}$, R$^{10A}$ is hydrogen or a $C_1$-$C_6$ alkyl group, R$^{10B}$ is a $C_1$-$C_6$ alkyl group or $C_2$-$C_8$ alkenyl group, p is an integer of 1 to 5, q is an integer of 0 to 3, 1≤p+q≤5.

3. The resist composition of claim 1, further comprising an acid generator capable of generating a sulfonic acid, imide acid or methide acid.

4. The resist composition of claim 1, further comprising an organic solvent.

5. The resist composition of claim 1 wherein the base polymer comprises recurring units having the formula (a1) or recurring units having the formula (a2):

(a1)

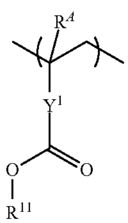

(a2)

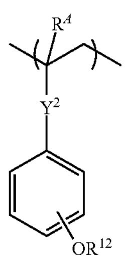

wherein R$^A$ is each independently hydrogen or methyl, R$^{11}$ and R$^{12}$ each are an acid labile group, Y$^1$ is a single bond, phenylene group, naphthylene group, or $C_1$-$C_{12}$ linking group containing at least one moiety selected from ester bond and lactone ring, and Y$^2$ is a single bond or ester bond.

6. The resist composition of claim 5 which is a chemically amplified positive resist composition.

7. The resist composition of claim 1 wherein the base polymer is free of an acid labile group.

8. The resist composition of claim 7 which is a chemically amplified negative resist composition.

9. The resist composition of claim 1, further comprising a surfactant.

10. The resist composition of claim 1 wherein the base polymer further comprises recurring units of at least one type selected from recurring units having the formulae (f1) to (f3):

(f1)

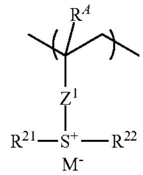

-continued (f2)

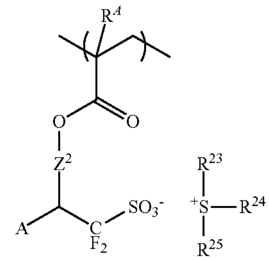

(f3)

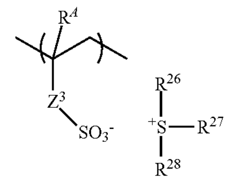

wherein R$^A$ is each independently hydrogen or methyl,

Z$^1$ is a single bond, phenylene group, —O—Z$^{11}$—, —C(═O)—O—Z$^{11}$— or —C(═O)—NH—Z$^{11}$—, Z$^{11}$ is a $C_1$-$C_6$ alkanediyl group, $C_2$-$C_6$ alkenediyl group, or phenylene group, which may contain a carbonyl, ester bond, ether bond or hydroxyl moiety, Z$^2$ is a single bond, —Z$^{21}$—C(═O)—O—, —Z$^{21}$—O— or —Z$^{21}$—O—C(═O)—, Z$^{21}$ is a $C_1$-$C_{12}$ alkanediyl group which may contain a carbonyl moiety, ester bond or ether bond, Z$^3$ is a single bond, methylene, ethylene, phenylene, fluorinated phenylene, —O—Z$^{31}$—, C(═O)—O—Z$^{31}$—, or —C(═O)—NH—Z$^{31}$—, Z$^{31}$ is a $C_1$-$C_6$ alkanediyl group, $C_2$-$C_6$ alkenediyl group, phenylene group, fluorinated phenylene group, or trifluoromethyl-substituted phenylene group, which may contain a carbonyl moiety, ester bond, ether bond or hydroxyl moiety, R$^{21}$ to R$^{28}$ are each independently a $C_1$-$C_{20}$ monovalent hydrocarbon group which may contain a heteroatom, any two of R$^{23}$, R$^{24}$ and R$^{25}$ or any two of R$^{26}$, R$^{27}$ and R$^{28}$ may bond together to form a ring with the sulfur atom to which they are attached, A is hydrogen or trifluoromethyl, and M$^-$ is a non-nucleophilic counter ion.

11. A process for forming a pattern comprising the steps of applying the resist composition of claim 1 to form a resist film on a substrate, exposing the resist film to high-energy radiation, and developing the exposed resist film in a developer.

12. The process of claim 11 wherein the high-energy radiation is i-line of wavelength 365 nm, ArF excimer laser radiation of wavelength 193 nm or KrF excimer laser radiation of wavelength 248 nm.

13. The process of claim 11 wherein the high-energy radiation is EB or EUV of wavelength 3 to 15 nm.

* * * * *